US012796313B2

(12) United States Patent
Kim et al.

(10) Patent No.: US 12,796,313 B2
(45) Date of Patent: Nov. 10, 2026

(54) ORGANOMETALLIC COMPOUND, LIGHT-EMITTING DEVICE INCLUDING THE ORGANOMETALLIC COMPOUND, AND ELECTRONIC APPARATUS AND ELECTRONIC DEVICE INCLUDING THE LIGHT-EMITTING DEVICE

(71) Applicant: Samsung Display Co., Ltd., Yongin-si (KR)

(72) Inventors: Sohae Kim, Yongin-si (KR); Sooryun Cho, Yongin-si (KR); Gyeongheon Kim, Yongin-si (KR); Dongsun Yoo, Yongin-si (KR); Jihye Kim, Yongin-si (KR); Hoilim Kim, Yongin-si (KR); Saerom Park, Yongin-si (KR); Youngmi Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 841 days.

(21) Appl. No.: 18/322,464

(22) Filed: May 23, 2023

(65) Prior Publication Data

US 2024/0040926 A1 Feb. 1, 2024

(30) Foreign Application Priority Data

Jul. 13, 2022 (KR) ........................ 10-2022-0086546

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .......................... H10K 85/346; C07F 15/0086
See application file for complete search history.

(56) References Cited

U.S. PATENT DOCUMENTS 10,144,867 B2 12/2018 Ma et al.
10,937,975 B2 3/2021 Kwak et al.
(Continued)

FOREIGN PATENT DOCUMENTS

CN 113793910 A 12/2021
KR 10-2021-0142080 A 11/2021

*Primary Examiner* — Vu A Nguyen
(74) *Attorney, Agent, or Firm* — Womble Bond Dickinson (US) LLP

(57) ABSTRACT

The disclosure provides an organometallic compound represented by Formula 1, a light-emitting device including the organometallic compound, and an electronic apparatus and an electronic device including the light-emitting device.

Formula 1

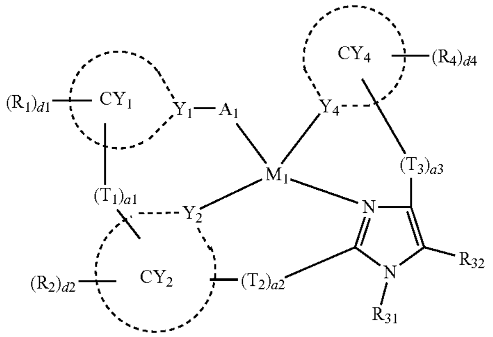

20 Claims, 7 Drawing Sheets

(51) Int. Cl.
*C09K 11/06* (2006.01)
*H10K 50/12* (2023.01)

(52) U.S. Cl.
CPC *C09K 2211/1059* (2013.01); *C09K 2211/185* (2013.01); *H10K 50/12* (2023.02)

(56) References Cited

U.S. PATENT DOCUMENTS

| | | | | |
|---|---|---|---|---|
| 11,081,658 | B2 | 8/2021 | Boudreault et al. | |
| 11,127,906 | B2 | 9/2021 | Boudreault et al. | |
| 2005/0031903 | A1 | 2/2005 | Park et al. | |
| 2016/0240800 | A1* | 8/2016 | Ma | C07F 15/0033 |
| 2021/0380617 | A1 | 12/2021 | Dyatkin et al. | |

* cited by examiner

ORGANOMETALLIC COMPOUND, LIGHT-EMITTING DEVICE INCLUDING THE ORGANOMETALLIC COMPOUND, AND ELECTRONIC APPARATUS AND ELECTRONIC DEVICE INCLUDING THE LIGHT-EMITTING DEVICE

CROSS-REFERENCE TO RELATED APPLICATION

This application claims priority to and the benefit of Korean Patent Application No. 10-2022-0086546, filed on Jul. 13, 2022, in the Korean Intellectual Property Office, the content of which is incorporated by reference herein in its entirety.

BACKGROUND

1. Field

One or more embodiments of the present disclosure relate to an organometallic compound, a light-emitting device including the organometallic compound, and an electronic apparatus and an electronic device including the light-emitting device.

2. Description of the Related Art

Self-emissive devices (for example, organic light-emitting devices) in light-emitting devices have relatively wide viewing angles, high contrast ratios, short response times, and excellent or suitable characteristics in terms of luminance, driving voltage, and response speed.

In a light-emitting device, a first electrode is located on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition and relax from an excited state to a ground state to thereby generate light.

SUMMARY

One or more aspects of embodiments of present disclosure are directed toward an organometallic compound having high emission efficiency and long lifespan, a light-emitting device including the organometallic compound, and an electronic apparatus and an electronic device including the light-emitting device.

Additional aspects will be set forth in part in the description which follows and, in part, will be apparent from the description, or may be learned by practice of the presented embodiments of the disclosure.

According to one or more embodiments of the present disclosure, an organometallic compound may be represented by Formula 1

Formula 1

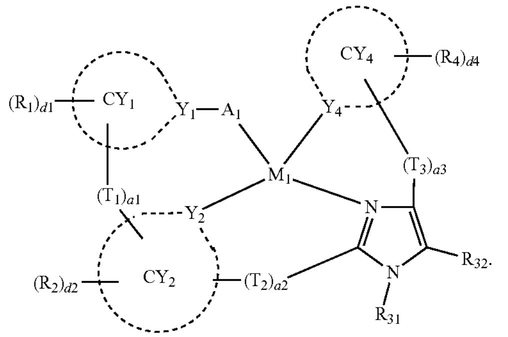

In Formula 1, $M_1$ may be a transition metal, $CY_1$, $CY_2$, and $CY_4$ may each independently be a $C_3$-$C_{60}$ carbocyclic group or a $C_1$-$C_{60}$ heterocyclic group, $Y_1$, $Y_2$, and $Y_4$ may each independently be C or N, $A_1$ may be O or S, $T_1$ to $T_3$ may each independently be a single bond, a double bond, *—N[($L_1$)$_{b1}$-($R_{1a}$)]—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(=O)—*', *—S(=O)—*', *—S(=O)$_2$—*', *—C($R_{1a}$)=*', *=C($R_{1a}$)—*', *—C($R_{1a}$)=C($R_{1b}$)—*', *—C(=S)—*', or *—C≡C—*', a1 to a3 may each independently be an integer from 1 to 3,

* and *' each indicate a binding site to a neighboring atom, $L_1$ may be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b1 may be an integer from 1 to 3, $R_1$, $R_2$, $R_{31}$, $R_{32}$, $R_4$, $R_{1a}$, and $R_{1b}$ may each independently be hydrogen, deuterium (D), —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_1$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), d1, d2, and d4 may each independently be an integer from 0 to 20, neighboring two or more groups of $R_1$, $R_2$, $R_{31}$, $R_{32}$, $R_4$, $R_{1a}$, and $R_{1b}$ may optionally be bonded to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ arylalkyl group, or a $C_2$-$C_{60}$ heteroarylalkyl group.

According to one or more embodiments of the present disclosure, a light-emitting device may include a first electrode, a second electrode facing the first electrode, an interlayer between the first electrode and the second electrode and including an emission layer, and at least one of the organometallic compound.

According to one or more embodiments of the present disclosure, an electronic apparatus may include the light-emitting device.

According to one or more embodiments of the present disclosure, an electronic device may include the light-emitting device.

BRIEF DESCRIPTION OF THE DRAWINGS

The accompanying drawings are included to provide a further understanding of the present disclosure and are incorporated in and constitute a part of the present disclosure. The drawings illustrate embodiments of the present disclosure and, together with the description, serve to explain principles of the present disclosure. The above and other aspects, features, and advantages of certain embodiments of the disclosure will be more apparent from the following description taken in conjunction with the accompanying drawings, in which.

DETAILED DESCRIPTION

Figure 1:
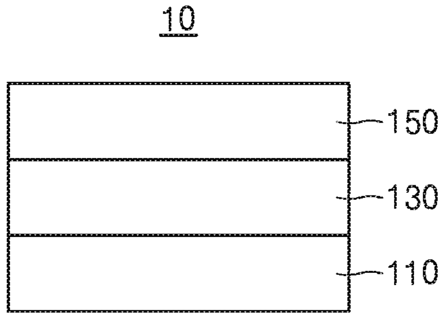
FIG. 1 is a schematic view of a structure of a light-emitting device according to one or more embodiments of the present disclosure.

Reference will now be made in more detail to embodiments, examples of which are illustrated in the accompanying drawings, wherein like reference numerals refer to like elements throughout the present disclosure, and duplicative descriptions thereof may not be provided for conciseness. In this regard, embodiments of the present disclosure may have different forms and should not be construed as being limited to the descriptions set forth herein. Accordingly, embodiments of the present disclosure are merely described, by referring to the drawings, to explain aspects of the present disclosure. As utilized herein, the terms "and/or" or "or" may include any and all combinations of one or more of the associated listed items. Throughout the present disclosure, the expression "at least one of a, b or c", "at least one selected from a, b, and c", etc., may indicate only a, only b, only c, both (e.g., simultaneously) a and b, both (e.g., simultaneously) a and c, both (e.g., simultaneously) b and c, all of a, b, and c, or variations thereof.

In one or more embodiments, an organometallic compound may be represented by Formula 1:

Formula 1

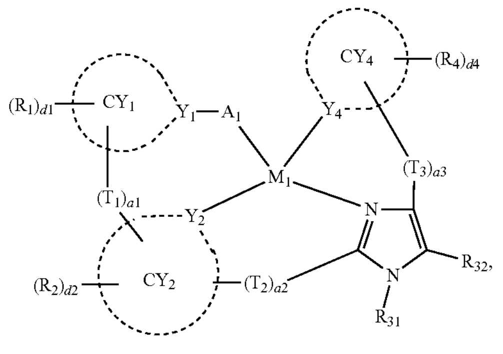

wherein, in Formula 1, $M_1$ may be a transition metal.

In one or more embodiments, $M_1$ may be platinum (Pt), palladium (Pd), copper (Cu), silver (Ag), gold (Au), rhodium (Rh), iridium (Ir), ruthenium (Ru), or osmium (Os).

$CY_1$, $CY_2$, and $CY_4$ may each independently be a $C_3$-$C_{60}$ carbocyclic group or a $C_1$-$C_{60}$ heterocyclic group.

In one or more embodiments, $CY_1$ and $CY_2$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzotriazole, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, $CY_1$ may be a group represented by one selected from among Formulae CY1-1 to CY1-70, and CY2 may be a group represented by one selected from among Formulae CY2-1 to CY2-14:

CY1-1

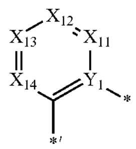

CY1-2

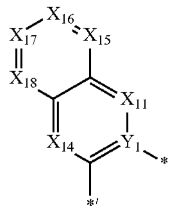

CY1-3

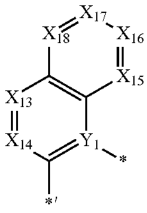

-continued

CY1-4

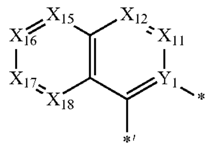

CY1-5

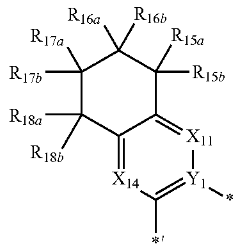

CY1-6

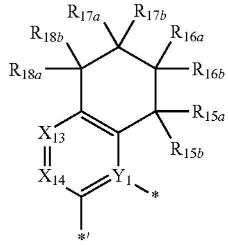

CY1-7

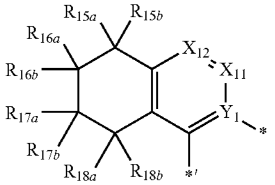

CY1-8

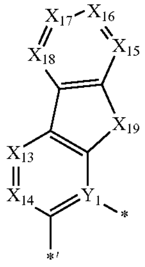

CY1-9

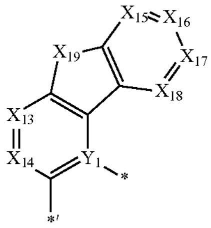

CY1-10

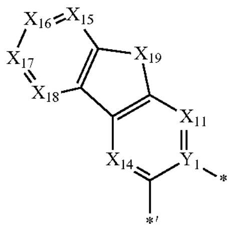

-continued
CY1-11
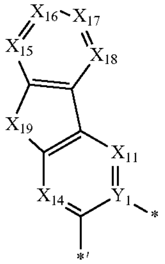
CY1-12
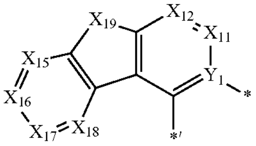
CY1-13
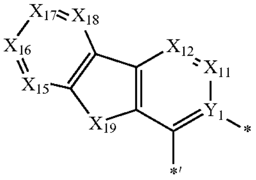
CY1-14
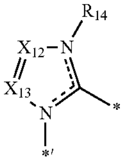
CY1-15
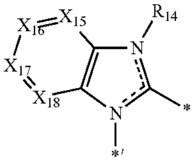
CY1-16
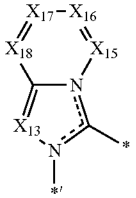
CY1-17
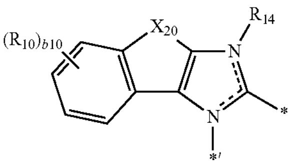
CY1-18
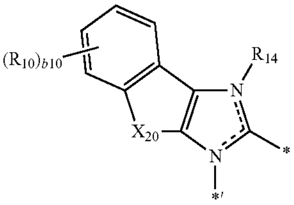
-continued
CY1-19
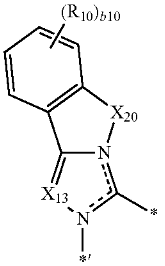
CY1-20
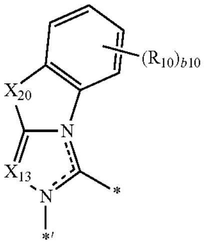
CY1-21
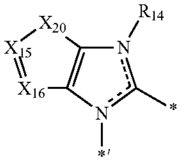
CY1-22
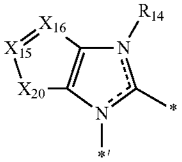
CY1-23
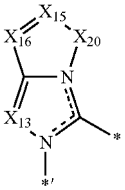
CY1-24
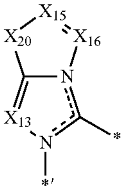
CY1-25
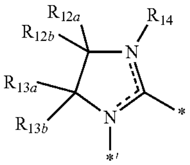

-continued
CY1-26
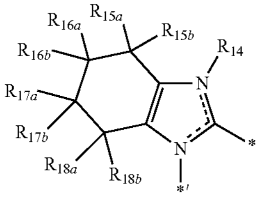
CY1-27
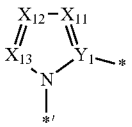
CY1-28
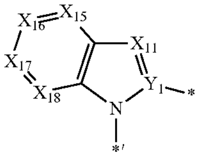
CY1-29
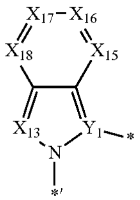
CY1-30
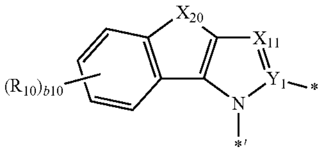
CY1-31
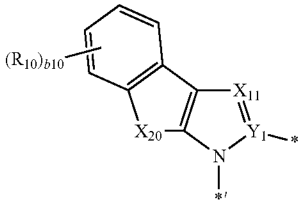
CY1-32
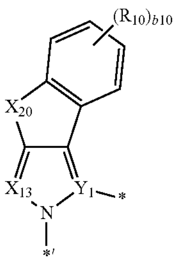
CY1-33
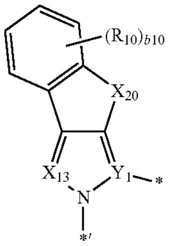
-continued
CY1-34
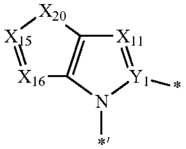
CY1-35
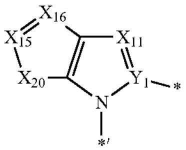
CY1-36
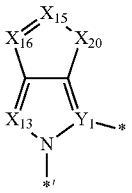
CY1-37
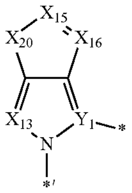
CY1-38
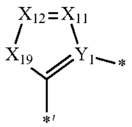
CY1-39
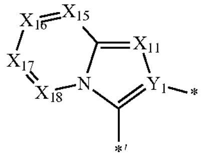
CY1-40
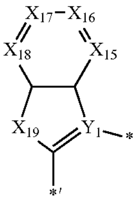
CY1-41
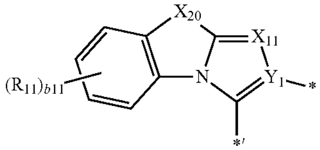
CY1-42
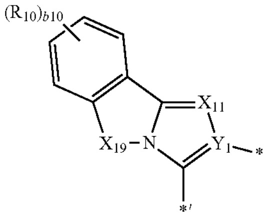

-continued
CY1-43
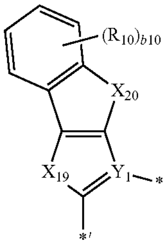
CY1-44
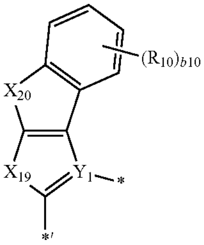
CY1-45
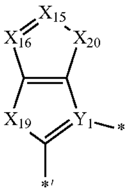
CY1-46
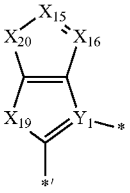
CY1-47
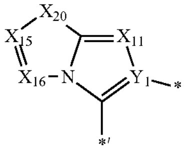
CY1-48
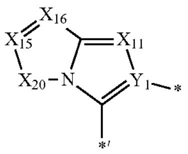
CY1-49
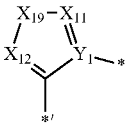
CY1-50
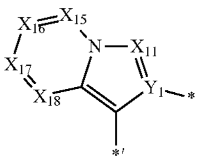
-continued
CY1-51
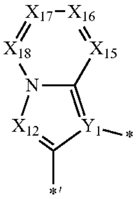
CY1-52
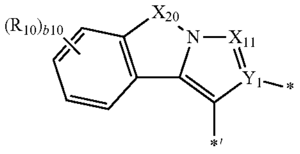
CY1-53
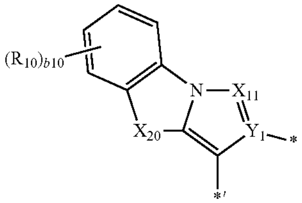
CY1-54
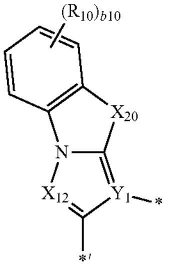
CY1-55
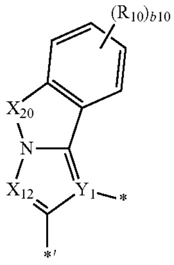
CY1-56
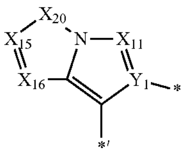
CY1-57
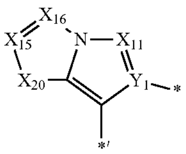

CY1-58
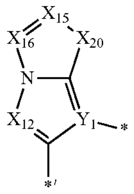
CY1-59
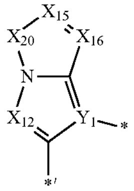
CY1-60
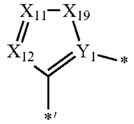
CY1-61
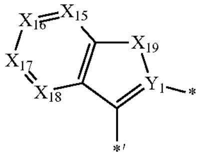
CY1-62
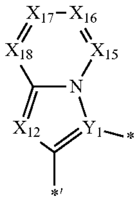
CY1-63
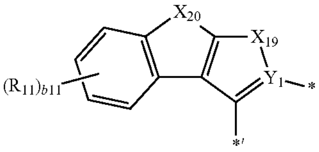
CY1-64
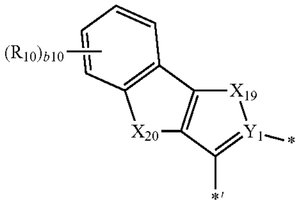
CY1-65
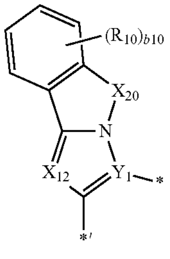
CY1-66
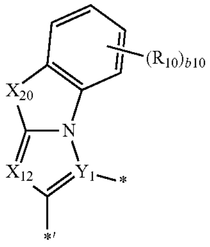
CY1-67
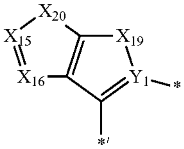
CY1-68
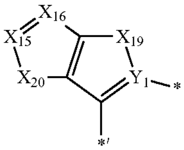
CY1-69
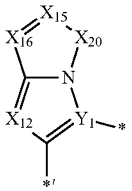
CY1-70
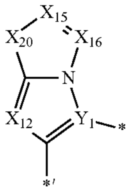
CY2-1
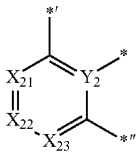
CY2-2
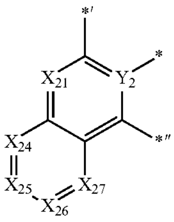
CY2-3
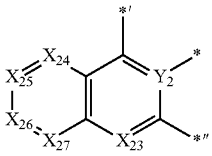

-continued

CY2-4

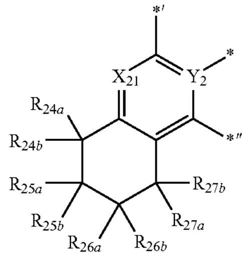

CY2-5

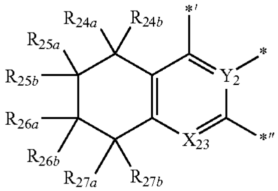

CY2-6

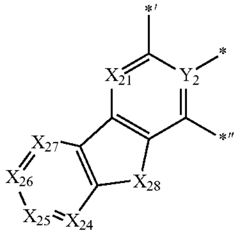

CY2-7

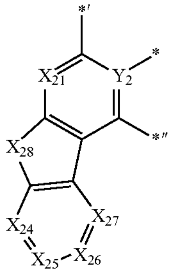

CY2-8

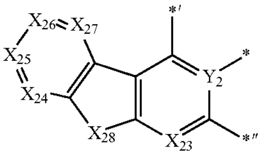

CY2-9

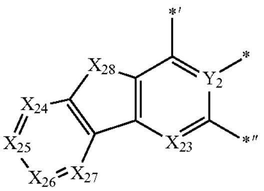

CY2-10

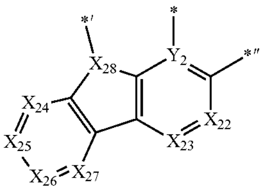

-continued

CY2-11

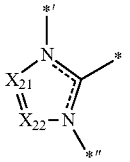

CY2-12

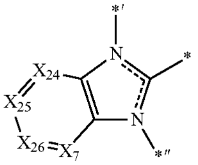

CY2-13

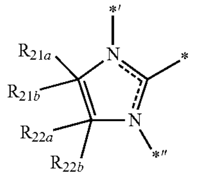

CY2-14

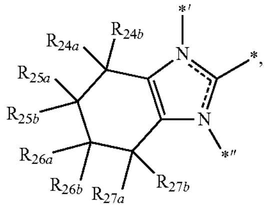

wherein, in Formula CY1-1 to CY1-70 and Formulae CY2-1 to CY2-14, $Y_1$ and $Y_2$ may each independently be C or N, $X_{11}$ may be $C(R_{11})$ or N, $X_{12}$ may be $C(R_{12})$ or N, $X_{13}$ may be $C(R_{13})$ or N, $X_{14}$ may be $C(R_{14})$ or N, $X_{15}$ may be $C(R_{15})$ or N, $X_{16}$ may be $C(R_{16})$ or N, $X_{17}$ may be $C(R_{17})$ or N, and $X_{18}$ may be $C(R_{18})$ or N, $X_{19}$ may be $C(R_{19a})(R_{19b})$, $Si(R_{19a})(R_{19b})$, $N(R_{19})$, O, or S, $X_{20}$ may be $C(R_{20a})(R_{20b})$, $Si(R_{20a})(R_{20b})$, $N(R_{20})$, O, or S, $X_{21}$ may be $C(R_{21})$ or N, $X_{22}$ may be $C(R_{22})$ or N, $X_{23}$ may be $C(R_{23})$ or N, $X_{24}$ may be $C(R_{24})$ or N, $X_{25}$ may be $C(R_{25})$ or N, $X_{26}$ may be $C(R_{26})$ or N, and $X_{27}$ may be $C(R_{27})$ or N, $X_{28}$ may be $C(R_{28a})(R_{28b})$, $Si(R_{28a})(R_{28b})$, $N(R_{28})$, O, or S, $R_{10}$ to $R_{20}$, $R_{12a}$, $R_{13a}$, $R_{15a}$ to $R_{20a}$, $R_{12b}$, $R_{13b}$, and $R_{15b}$ to $R_{20b}$ may each independently be the same as in the description of $R_1$, $R_{21}$ to $R_{28}$, $R_{21a}$, $R_{22a}$, $R_{24a}$ to $R_{28a}$, $R_{21b}$, $R_{22b}$, and $R_{24b}$ to $R_{28b}$ may each independently be the same as in the description of $R_2$, b10 and b11 may each independently be an integer from 1 to 4,

* indicates a binding site to $M_1$, and

*' in Formulae CY1-1 to CY1-70 indicates a binding site to $T_1$, *' in Formulae CY2-1 to CY2-14 indicates a binding site to $T_1$, and *" in Formulae CY2-1 to CY2-14 indicates a binding site to $T_2$.

In one or more embodiments, $CY_4$ may be a polycyclic group including a condensed ring of at least two rings (for example, a benzene group, a pyridine group, a pyrimidine group, a triazine group, a tetrazine group, a cyclohexane group, etc.).

In one or more embodiments, $CY_4$ may be a group represented by Formula 4:

Formula 4

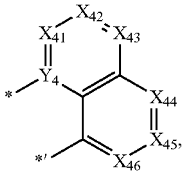

wherein, in Formula 4, $Y_4$ may be C or N, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $X_{45}$ may be $C(R_{45})$ or N, and $X_{46}$ may be $C(R_{46})$ or N, $R_{41}$ to $R_{46}$ may each be the same as in the description of $R_4$, two or more groups of $R_{41}$ to $R_{46}$ may optionally be bound to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, and

*' indicates a binding site to $T_3$ in Formula 1, and * indicates a binding site to $M_1$ in Formula 1.

In one or more embodiments, $CY_4$ may be a group represented by one selected from among Formulae 4-1 to 4-5:

4-1

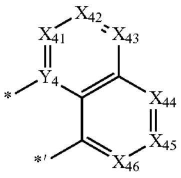

4-2

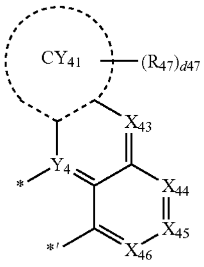

4-3

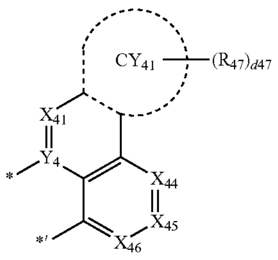

-continued 4-4

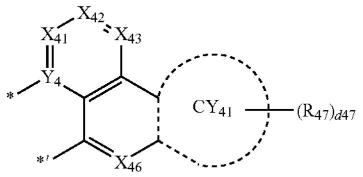

4-5

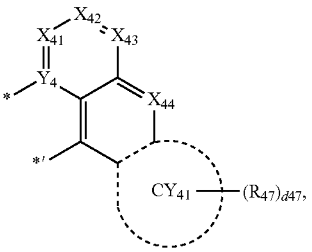

wherein, in Formulae 4-1 to 4-5, $Y_4$ may be Cor N, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $X_{45}$ may be $C(R_{45})$ or N, and $X_{46}$ may be $C(R_{46})$ or N, $CY_{41}$ may be a $C_3$-$C_{20}$ carbocyclic group or a $C_1$-$C_{20}$ heterocyclic group, $R_{41}$ to $R_{47}$ may each be the same as in the description of $R_4$, d47 may be an integer from 0 to 10, and

*' indicates a binding site to $T_3$ in Formula 1, and * indicates a binding site to $M_1$ in Formula 1.

$Y_1$, $Y_2$, and $Y_4$ may each independently be C or N.

$Y_1$ may be C, $Y_2$ may be N, and $Y_4$ may be C; $Y_1$ may be C, $Y_2$ may be C, and $Y_4$ may be N; $Y_1$ may be C, $Y_2$ may be N, and $Y_4$ may be N; $Y_1$ may be C, $Y_2$ may be C, and $Y_4$ may be C; $Y_1$ may be N, $Y_2$ may be N, and $Y_4$ may be C; $Y_1$ may be N, $Y_2$ may be C, and $Y_4$ may be N; $Y_1$ may be N, $Y_2$ may be N, and $Y_4$ may be N; or $Y_1$ may be N, $Y_2$ may be C, and $Y_4$ may be C.

In one or more embodiments, at least one selected from among $Y_2$ and $Y_4$ may be N.

For example, in some embodiments, $Y_2$ may be N and $Y_4$ may be C; in some embodiments, $Y_2$ may be C and $Y_4$ may be N; in some embodiments, $Y_2$ may be N and $Y_4$ may be N.

$A_1$ may be O or S.

$T_1$ to $T_3$ may each independently be a single bond, a double bond, $*-N[(L_1)_{b1}-(R_{1a})]-*'$, $*-B(R_{1a})-*'$, $*-P(R_{1a})-*'$, $*-C(R_{1a})(R_{1b})-*'$, $*-Si(R_{1a})(R_{1b})-*'$, $*-Ge(R_{1a})(R_{1b})-*'$, $*-S-*'$, $*-Se-*'$, $*-O-*'$, $*-C(=O)-*'$, $*-S(=O)-*'$, $*-S(=O)_2-*'$, $*-C(R_{1a})=*'$, $*=C(R_{1a})-*'$, $*-C(R_{1a})=C(R_{1b})-*'$, $*-C(=S)-*'$, or $*-C\equiv C-*'$.

In one or more embodiments, at least one selected from among $T_1$ to $T_3$ may be a single bond. For example, in some embodiments, $T_1$ and $T_3$ may be a single bond, in some embodiments, $T_2$ and $T_3$ may be a single bond, in some embodiments, $T_1$ to $T_3$ may each be a single bond.

a1 to a3 may each independently be an integer from 1 to 3.

* and *' each indicate a binding site to a neighboring atom.

$L_1$ may be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

b1 may be an integer from 1 to 3.

$R_1$, $R_2$, $R_{31}$, $R_{32}$, $R_4$, $R_{1a}$, and $R_{1b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$.

In one or more embodiments, $R_1$, $R_2$, $R_{31}$, $R_{32}$, $R_4$, $R_{1a}$, and $R_{1b}$ may each independently be: hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, or an azadibenzosilolyl group, each unsubstituted or substituted with deuterium, –F, –Cl, –Br, –I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a ($C_1$-$C_{10}$ alkyl)phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzothiazolyl group, a benzoisoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, wherein $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, $R_1$, $R_2$, $R_{31}$, $R_{32}$, $R_4$, $R_{1a}$, and $R_{1b}$ may each independently be:

hydrogen, deuterium, —F, —Cl, —Br, —I, —$CD_3$, —$CD_2H$, —$CDH_2$, —$CF_3$, —$CF_2H$, —$CFH_2$, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a group represented by one selected from among Formulae 9-1 to 9-61 or a group represented by one selected from among Formulae 10-1 to 10-246; or —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$,

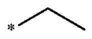
9-1

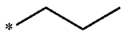
9-2

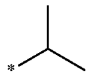
9-3

-continued
9-4
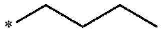
9-5
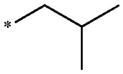
9-6
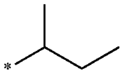
9-7
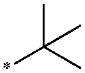
9-8
9-9
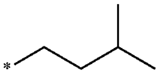
9-10
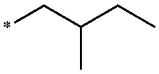
9-11
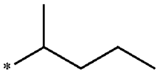
9-12
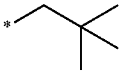
9-13
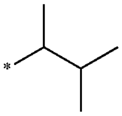
9-14
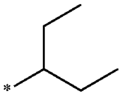
9-15
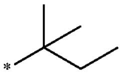
9-16
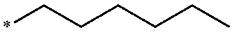
9-17
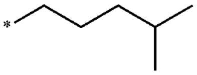
9-18
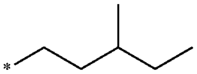
9-19
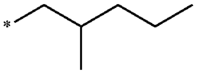
9-20
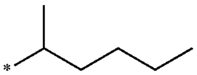
9-21
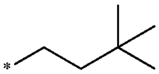
-continued
9-22
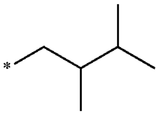
9-23
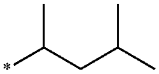
9-24
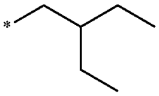
9-25
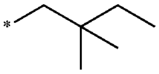
9-26
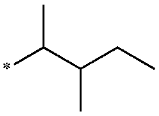
9-27
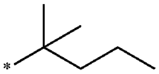
9-28
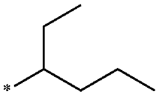
9-29
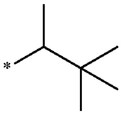
9-30
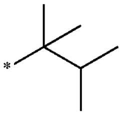
9-31
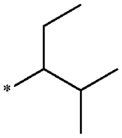
9-32
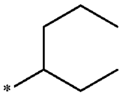
9-33
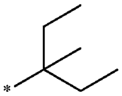
9-34
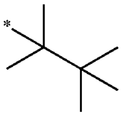
9-35
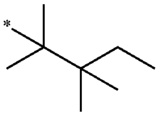

-continued
9-36
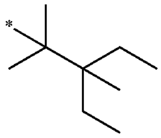
9-37
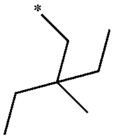
9-38
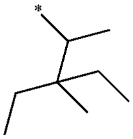
9-39
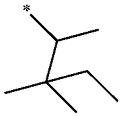
9-40
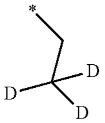
9-41
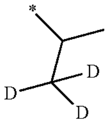
9-42
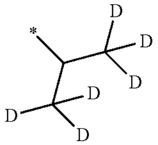
9-43
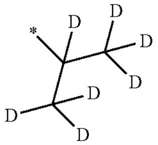
9-44
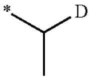
9-45
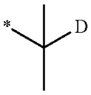
9-46
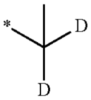
9-47
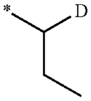
-continued
9-48
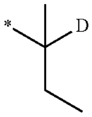
9-49
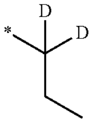
9-50
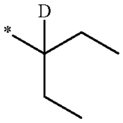
9-51
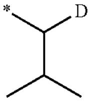
9-52
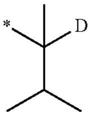
9-53
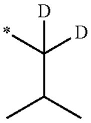
9-54
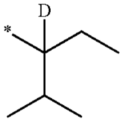
9-55
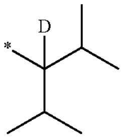
9-56
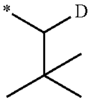
9-57
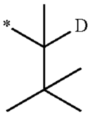
9-58
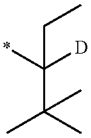
9-59
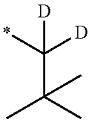

-continued
9-60
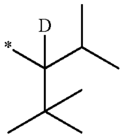
9-61
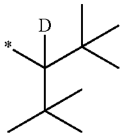
10-1
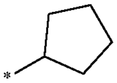
10-2
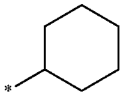
10-3
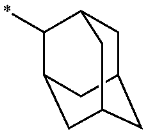
10-4
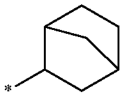
10-5
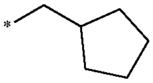
10-6
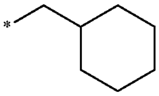
10-7
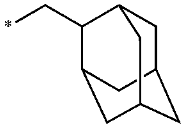
10-8
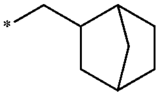
10-9
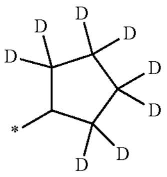
10-10
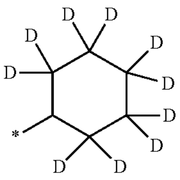
-continued
10-11
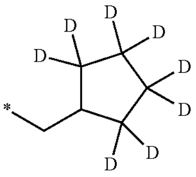
10-12
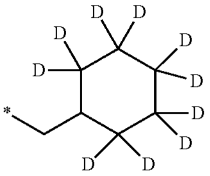
10-13
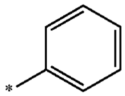
10-14
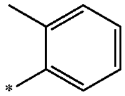
10-15
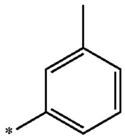
10-16
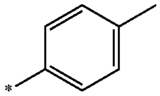
10-17
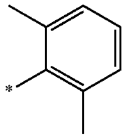
10-18
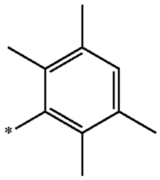
10-19
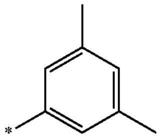
10-20
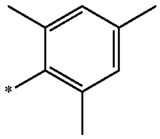
10-21
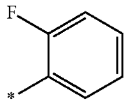

-continued
10-22
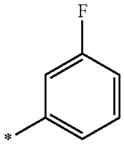
10-23
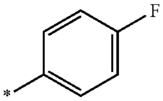
10-24
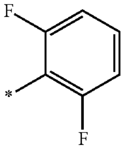
10-25
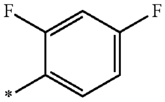
10-26
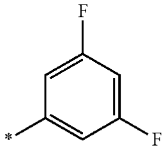
10-27
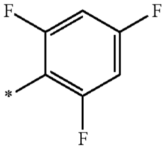
10-28
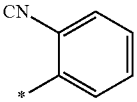
10-29
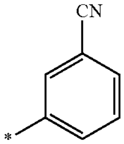
10-30
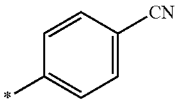
10-31
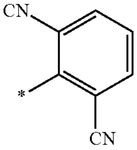
10-32
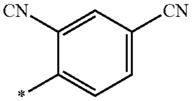
-continued
10-33
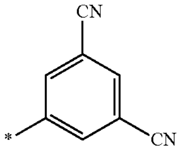
10-34
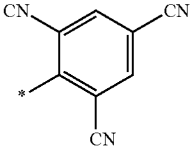
10-35
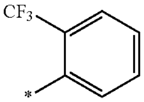
10-36
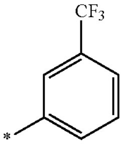
10-37
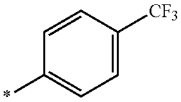
10-38
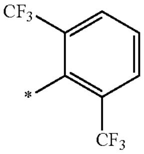
10-39
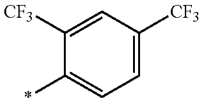
10-40
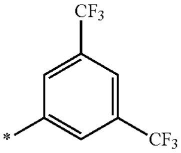
10-41
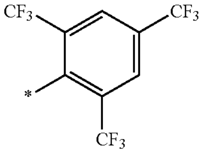
10-42
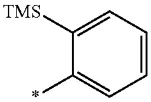
10-43
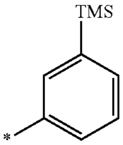

-continued
10-44
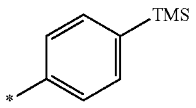
10-45
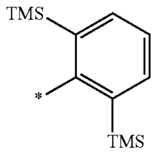
10-46
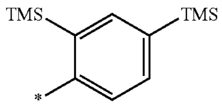
10-47
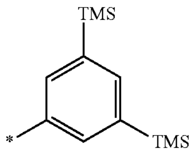
10-48
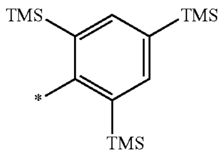
10-49
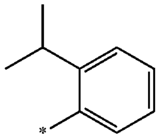
10-50
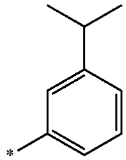
10-51
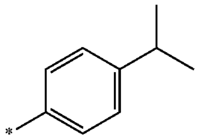
10-52
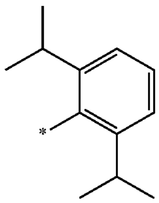
10-53
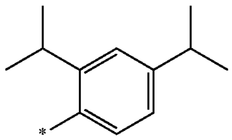
-continued
10-54
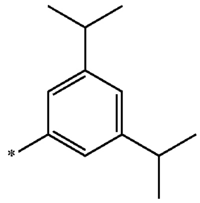
10-55
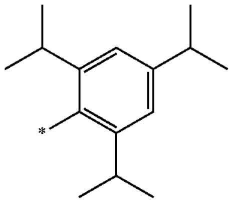
10-56
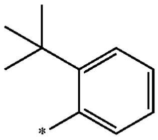
10-57
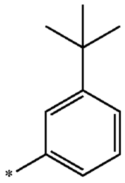
10-58
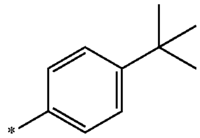
10-59
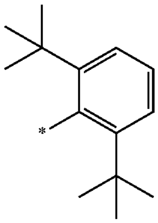
10-60
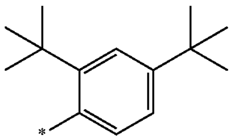
10-61
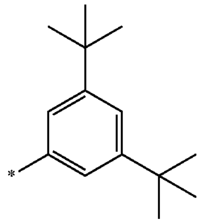

-continued
10-62
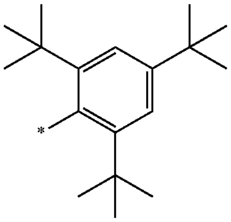
10-63
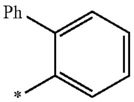
10-64
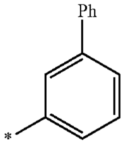
10-65
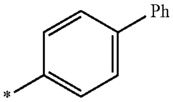
10-66
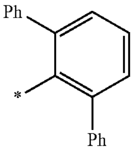
10-67
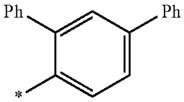
10-68
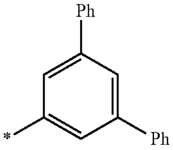
10-69
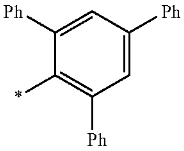
10-70
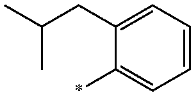
10-71
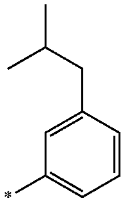
-continued
10-72
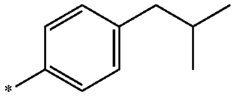
10-73
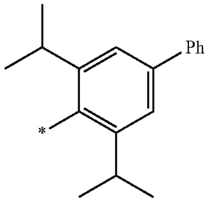
10-74
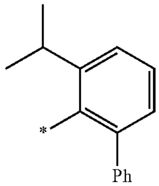
10-75
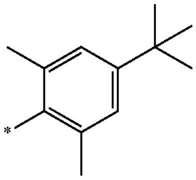
10-76
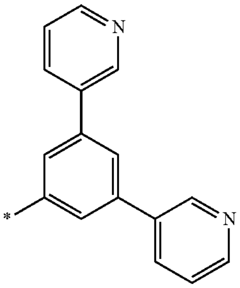
10-77
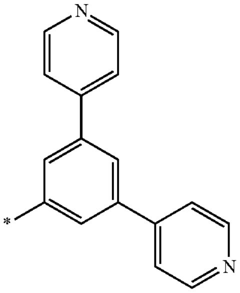
10-78
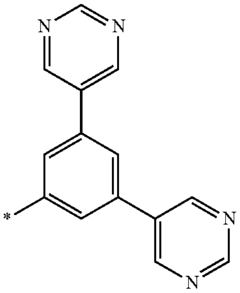

-continued
10-79
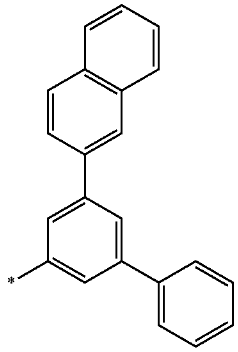
10-80
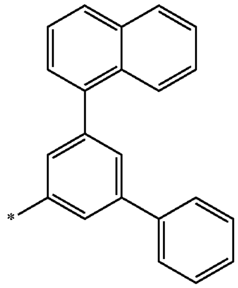
10-81
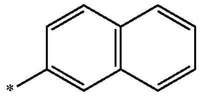
10-82
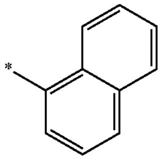
10-83
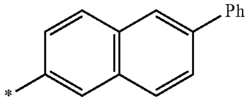
10-84
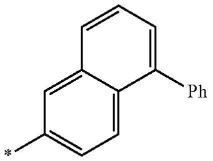
10-85
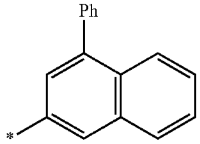
10-86
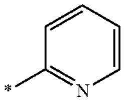
10-87
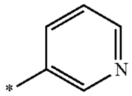
-continued
10-88
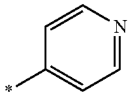
10-89
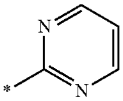
10-90
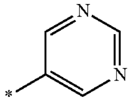
10-91
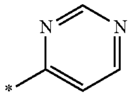
10-92
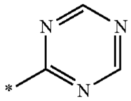
10-93
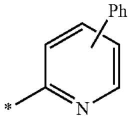
10-94
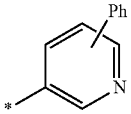
10-95
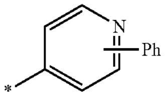
10-96
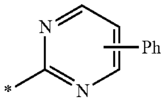
10-97
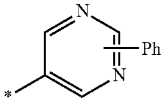
10-98
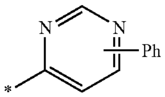
10-99
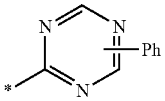
10-100
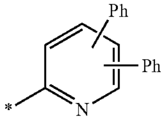

-continued
10-101
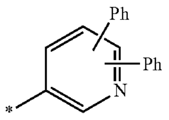
10-102
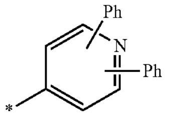
10-103
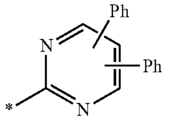
10-104
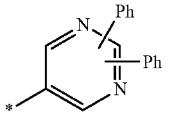
10-105
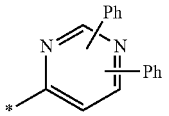
10-106
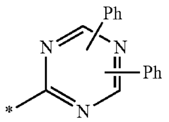
10-107
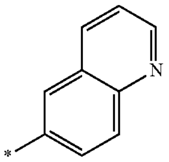
10-108
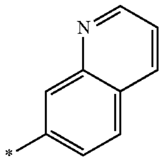
10-109
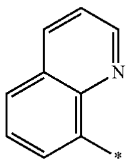
10-110
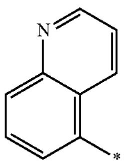
-continued
10-111
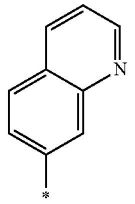
10-112
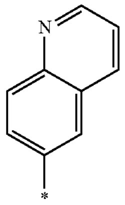
10-113
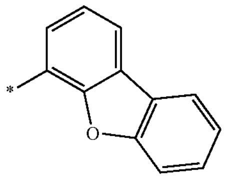
10-114
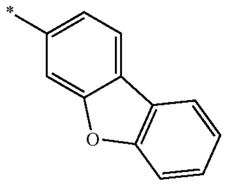
10-115
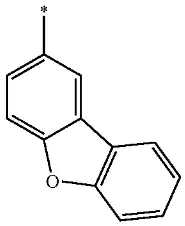
10-116
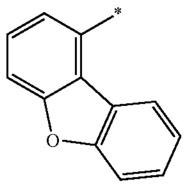
10-117
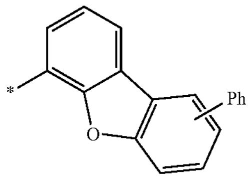
10-118
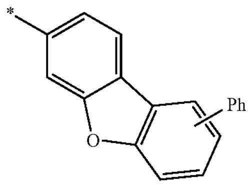

-continued
10-119
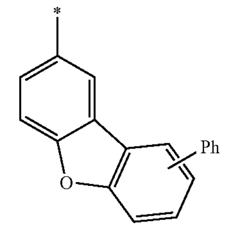
10-120
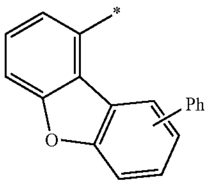
10-121
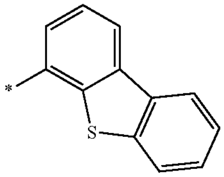
10-122
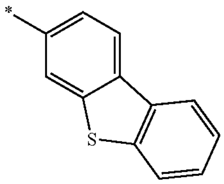
10-123
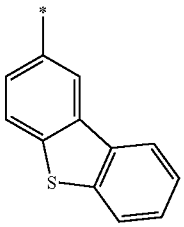
10-124
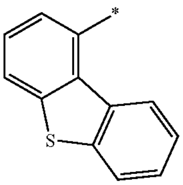
10-125
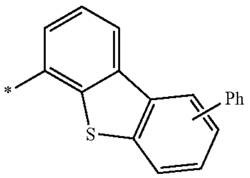
10-126
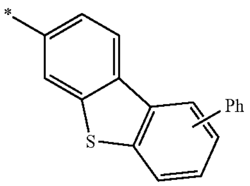
-continued
10-127
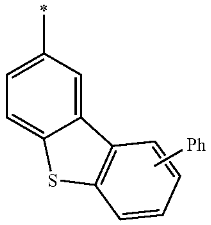
10-128
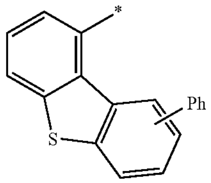
10-129
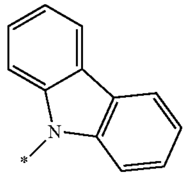
10-130
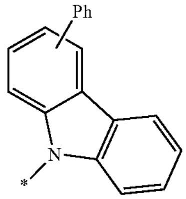
10-131
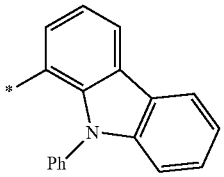
10-132
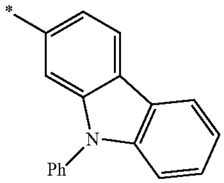
10-133
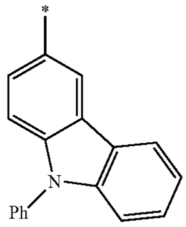
10-134
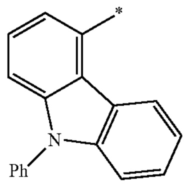

-continued
10-135
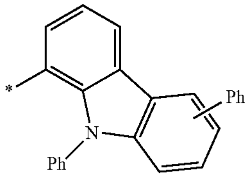
10-136
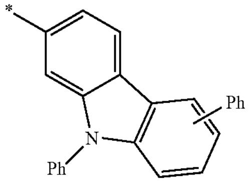
10-137
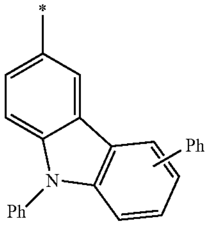
10-138
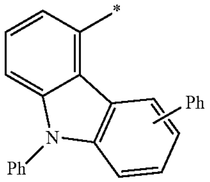
10-139
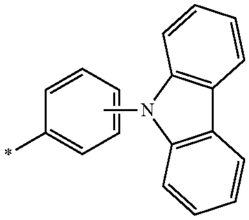
10-140
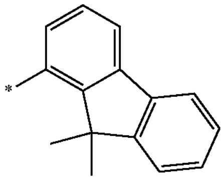
10-141
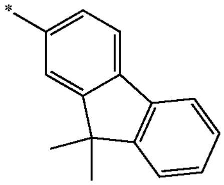
-continued
10-142
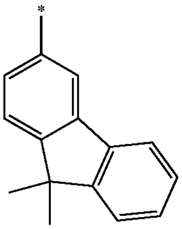
10-143
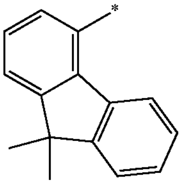
10-144
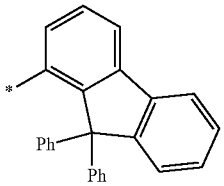
10-145
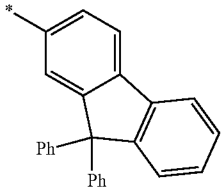
10-146
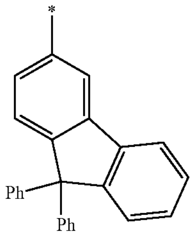
10-147
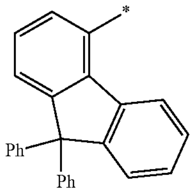
10-148
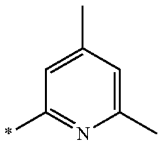
10-149
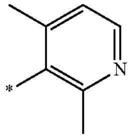

-continued
10-150
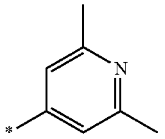
10-151
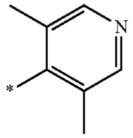
10-152
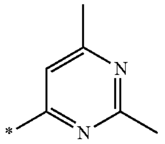
10-153
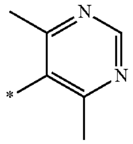
10-154
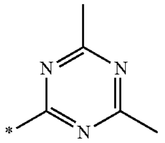
10-155
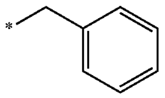
10-156
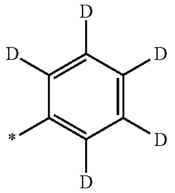
10-157
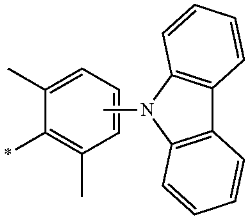
10-158
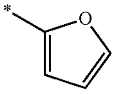
10-159
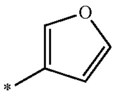
10-160
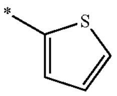
-continued
10-161
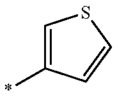
10-162
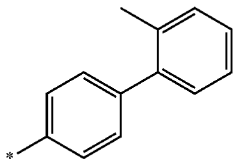
10-163
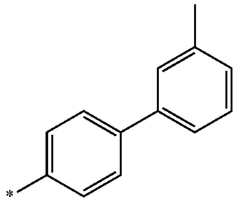
10-164
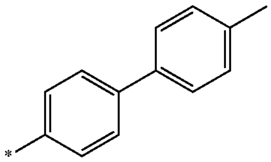
10-165
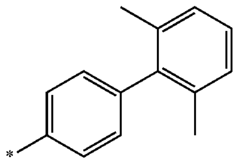
10-166
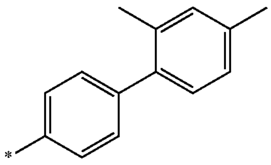
10-167
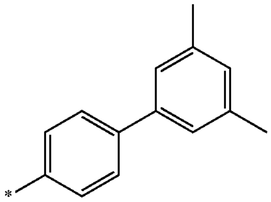
10-168
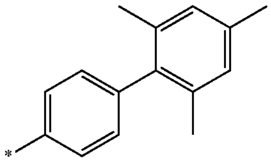
10-169
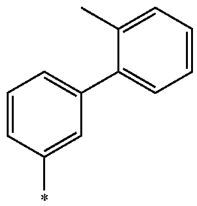

-continued
10-170
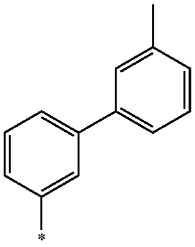
10-171
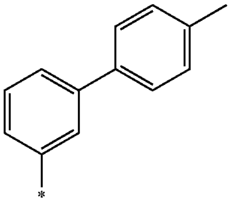
10-172
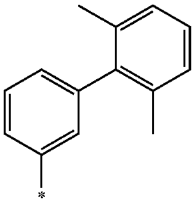
10-173
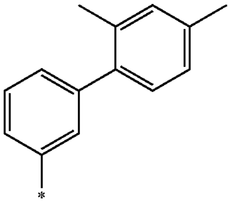
10-174
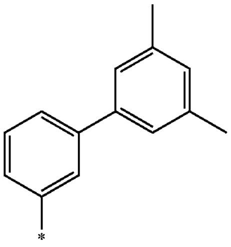
10-175
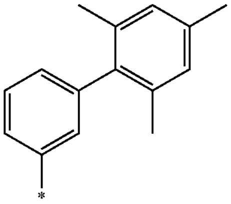
10-176
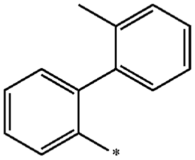
-continued
10-177
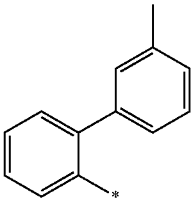
10-178
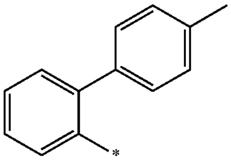
10-179
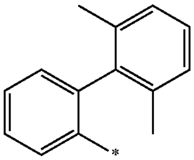
10-180
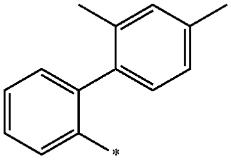
10-181
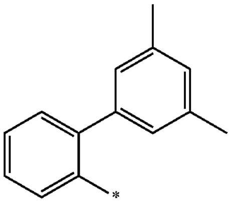
10-182
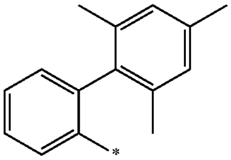
10-183
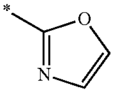
10-184
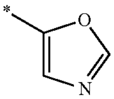
10-185
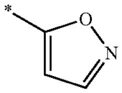
10-186
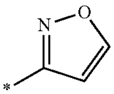

-continued
10-187
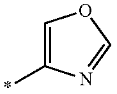
10-188
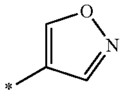
10-189
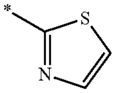
10-190
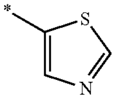
10-191
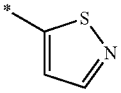
10-192
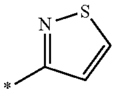
10-193
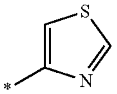
10-194
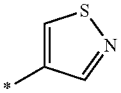
10-195
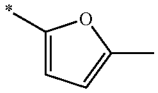
10-196
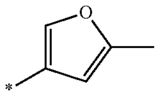
10-197
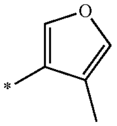
10-198
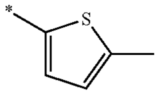
10-199
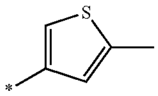
10-200
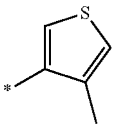
-continued
10-201
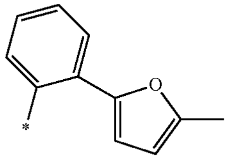
10-202
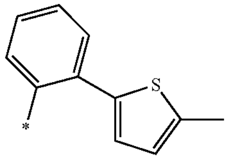
10-203
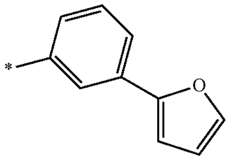
10-204
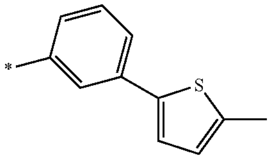
10-205
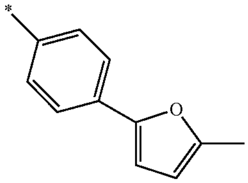
10-206
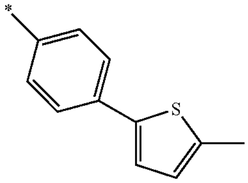
10-207
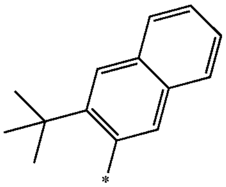
10-208
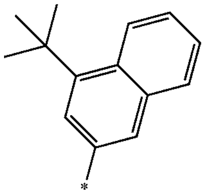

-continued
10-209
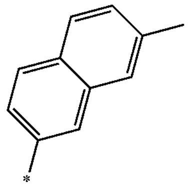
10-210
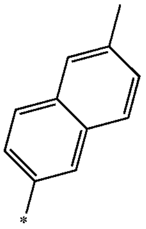
10-211
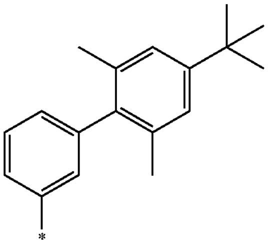
10-212
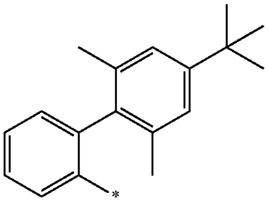
10-213
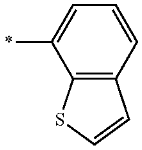
10-214
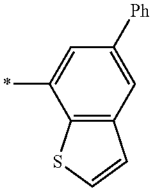
10-215
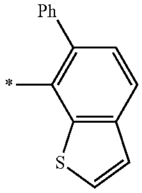
10-216
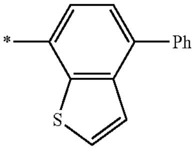
-continued
10-217
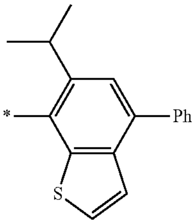
10-218
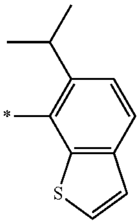
10-219
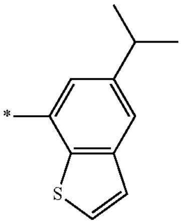
10-220
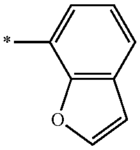
10-221
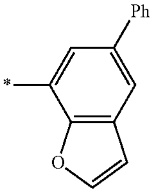
10-222
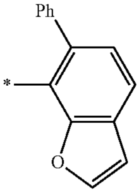
10-223
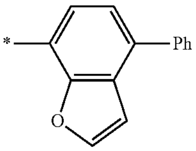

-continued
10-224
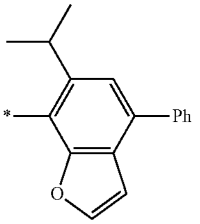
10-225
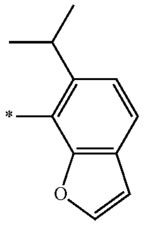
10-226
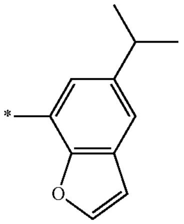
10-227
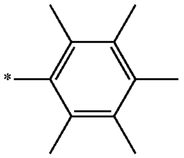
10-228
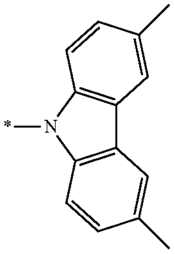
10-229
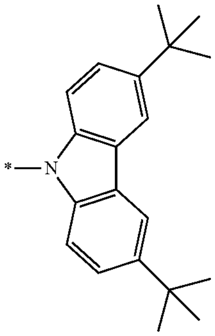
-continued
10-230
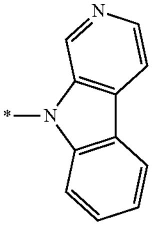
10-231
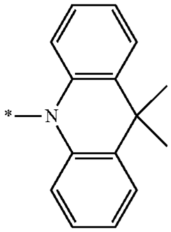
10-232
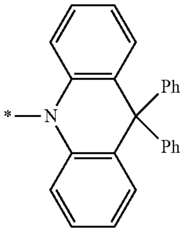
10-233
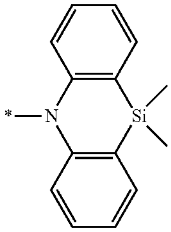
10-234
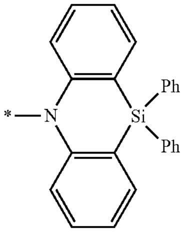
10-235
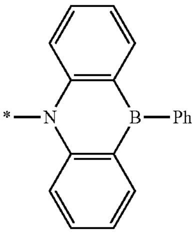
10-236
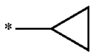

-continued 10-237

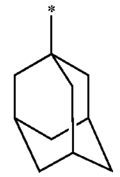

10-238

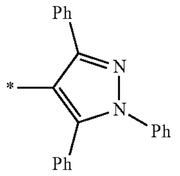

10-239

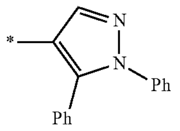

10-240

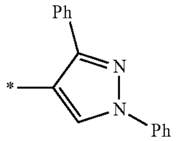

10-241

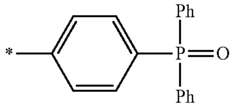

10-242

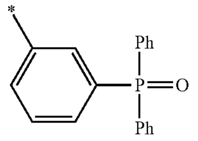

10-243

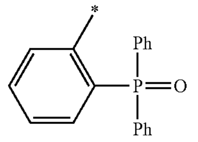

10-244

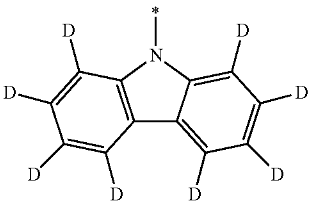

10-245

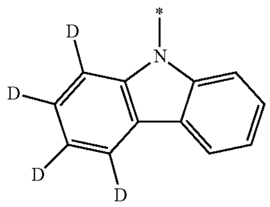

-continued 10-246

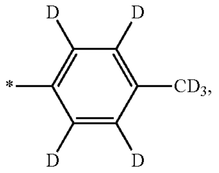

wherein, in Formulae 9-1 to 9-61 and 10-1 to 10-246, * indicates a binding site to an adjacent atom, "Ph" represents a phenyl group, and "TMS" represents a trimethylsilyl group.

d1, d2, and d4 may each independently be an integer from 0 to 20.

d1, d2, and d4 in Formula 1 indicate the number of $R_1$(s), $R_2$(s), and $R_4$(s), respectively, and may each independently be an integer from 0 to 20. When d1 is 2 or greater, two or more $R_1$(s) may be identical to or different from each other, when d2 is 2 or greater, two or more $R_2$(s) may be identical to or different from each other, and when d4 is 2 or greater, two or more $R_4$(s) may be identical to or different from each other.

Neighboring two or more groups of $R_1$, $R_2$, $R_{31}$, $R_{32}$, $R_4$, $R_{1a}$, and $R_{1b}$ may optionally be bonded to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$.

In Formula 1, i) two or more $R_1$(s) in the number of d1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, ii) two or more $R_2$(s) in the number of d2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iii) $R_{31}$ and $R_{32}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, iv) two or more $R_4$(s) in the number of d4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, v) $R_{1a}$ and $R_{1b}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, vi) at least one of $R_1$(s) in the number of d1 and at least one of $R_2$(s) in the number of d2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

The term "$R_{10a}$" as utilized herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

In one or more embodiments, $R_{31}$ may be a group represented by Formula 3:

Formula 3

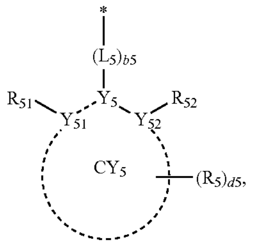

wherein, in Formula 3, $Y_5$, $Y_{51}$, and $Y_{52}$ may each independently be C or N, $CY_5$ may be a $C_3$-$C_{60}$ carbocyclic group or a $C_1$-$C_{60}$ heterocyclic group, $L_5$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b5 may be an integer from 1 to 3, $R_5$, $R_{51}$, and $R_{52}$ may each be the same as in the description of $R_1$, d5 may be an integer from 0 to 10, and

* indicates a binding site to a neighboring atom.

In one or more embodiments, $R_{51}$ and $R_{52}$ may not be hydrogen.

For example, in some embodiments, $R_{31}$ may be a group represented by Formula 3-1:

Formula 3-1

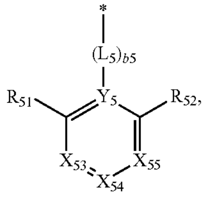

wherein, in Formula 3-1, $Y_5$ may be Cor N, $X_{53}$ may be C($R_{53}$) or N, $X_{54}$ may be C($R_{54}$) or N, $X_{55}$ may be C($R_{55}$) or N, $L_5$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b5 may be an integer from 1 to 3, $R_{51}$ to $R_{55}$ may each be the same as in the description of $R_1$, and $R_{51}$ and $R_{52}$ may not be hydrogen, and

* indicates a binding site to a neighboring atom.

In one or more embodiments, at least one of $R_1$ in the number of d1 and at least one of $R_2$ in the number of d2 may be linked to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, and $R_{10a}$ is the same as described herein.

In one or more embodiments, a group represented by

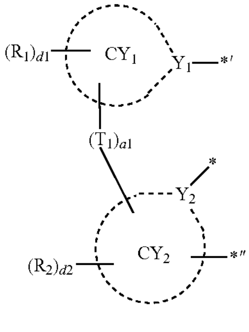

in Formula 1 may be represented by Formula 2-1 or 2-2:

Formula 2-1

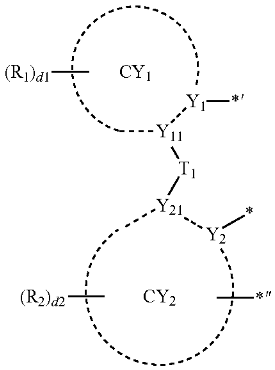

-continued

Formula 2-2

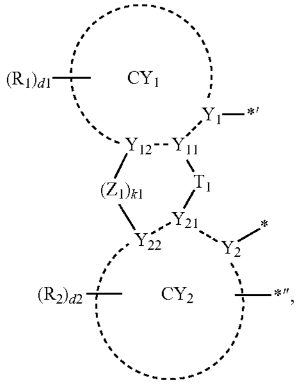

wherein, in Formulae 2-1 and 2-2, $CY_1$, $CY_2$, $Y_1$, $Y_2$, and $T_1$ may each be the same as described herein, $Y_{11}$, $Y_{12}$, $Y_{21}$, and $Y_{22}$ may each independently be C or N, $Z_1$ may be a single bond, a double bond, *'''—N[$(L_{60})_{b60}$-$(R_{60})$]—*'''', *'''—B($R_{60}$)—*'''', *'''—P($R_{60}$)—*'''', *'''—C($R_{60a}$)($R_{60b}$)—*'''', *'''—Si($R_{60a}$)($R_{60b}$)—*'''', *'''—Ge($R_{60a}$)($R_{60b}$)—*'''', *'''—S—*'''', *'''Se—*'''', *'''—C(═O)—*'''', *'''—S(═O)—*'''', *'''—S(═O)$_2$—*'''', *'''—C($R_{60}$)═*'''', or *'''═C($R_{60}$)—*'''', k1 may be an integer from 1 to 3, $L_{60}$ may be a single bond, a $C_5$-$C_{60}$ carbocyclic group unsubstituted or substituted with at least one $R_{10a}$, or a $C_1$-$C_{30}$ heterocyclic group unsubstituted or substituted with at least one $R_{10a}$, b60 may be an integer from 1 to 3, $R_{60}$, $R_{60a}$, and $R_{60b}$ may each be the same as in the description of $R_1$, $R_{10a}$ may be the same as described herein,

*' indicates a binding site to $A_1$ in Formula 1,

* indicates a binding site to $M_1$ in Formula 1,

*" indicates a binding site to $T_2$ in Formula 1, and

*''' and *'''' each indicate a binding site to a neighboring atom.

In one or more embodiments, a group represented by

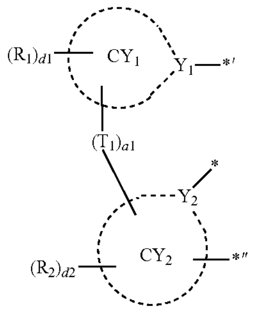

in Formula 1 may be a group represented by one selected from among Formulae 2-11 to 2-13:

2-11

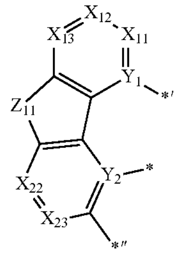

2-12

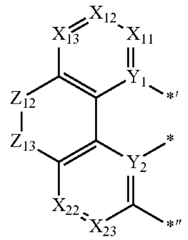

2-13

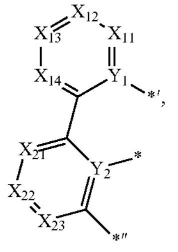

wherein, in Formulae 2-11 to 2-13, $Y_1$ and $Y_2$ may each be C or N, $X_{11}$ may be C($R_{11}$) or N, $X_{12}$ may be C($R_{12}$) or N, $X_{13}$ may be C($R_{13}$) or N, and $X_{14}$ may be C($R_{14}$) or N, $X_{21}$ may be C($R_{21}$) or N, $X_{22}$ may be C($R_{22}$) or N, and $X_{23}$ may be C($R_{23}$) or N, $R_{11}$ to $R_{14}$ may each be the same as in the description of $R_1$, $R_{21}$ to $R_{23}$ may each be the same as in the description of $R_2$, two or more neighboring groups of $R_{11}$ to $R_{14}$ or $R_{21}$ to $R_{23}$ may optionally be bonded to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, $Z_{11}$ may be *'''—N[$(L_{61})_{b61}$-$(R_{61})$]—*'''', *'''—O—*'''', *'''S*'''', *'''—Se—*'''', or *'''—C($R_{61a}$)($R_{61b}$)—*'''', $Z_{12}$ may be *'''—N[$(L_{62})_{b62}$-$(R_{62})$]—*'''', *'''—C($R_{62a}$)($R_{62b}$)—*'''', *'''—C($R_{62}$)═*'''', or *'''═C($R_{62}$)—*'''', $Z_{13}$ may be *'''—N[$(L_{63})_{b63}$-$(R_{63})$]—*'''', *'''—C($R_{63a}$)($R_{63b}$)—*'''', *'''—C($R_{63}$)═*'''', or *'''═C($R_{63}$)—*'''', $L_{61}$ to $L_{63}$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b61 to b63 may each independently be an integer from 1 to 3, $R_{61}$, $R_{61a}$, $R_{61b}$, $R_{62}$, $R_{62a}$, $R_{62b}$, $R_{63}$, $R_{63a}$, and $R_{63b}$ may each be the same as in the description of $R_1$, and $R_{10a}$ is the same as described herein,

*' indicates a binding site to $A_1$ in Formula 1,

* indicates a binding site to $M_1$ in Formula 1,

*" indicates a binding site to $T_2$ in Formula 1, and

*"' and *"" each indicate a binding site to a neighboring atom.

In one or more embodiments, a group represented by

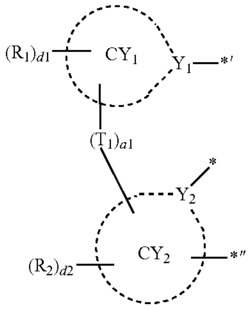

in Formula 1 may be a group represented by one selected from among Formulae 2-11A to 2-11E and 2-12A to 2-12D:

2-11A

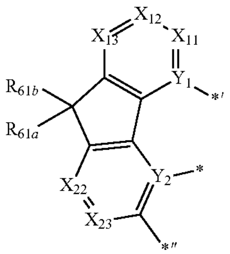

2-11B

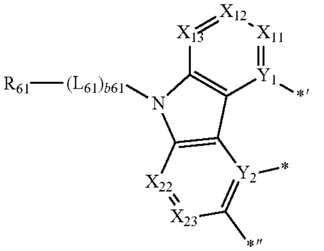

2-11C

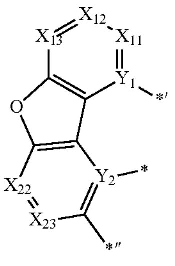

2-11D

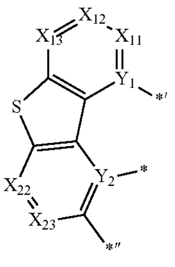

-continued 2-11E

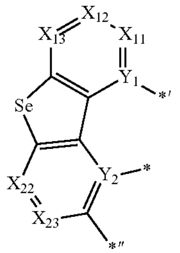

2-12A

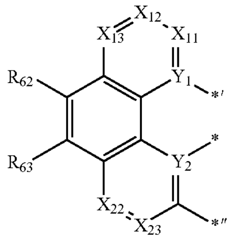

2-12B

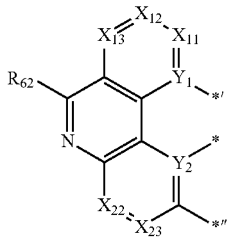

2-12C

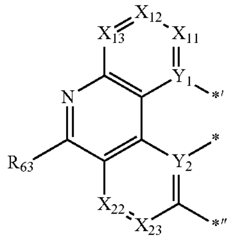

2-12D

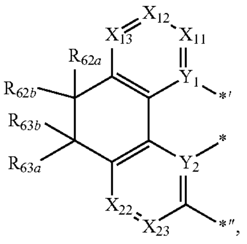

wherein, in Formulae 2-11A to 2-11E and 2-12A to 2-12D, $Y_1$ and $Y_2$ may each be C or N, $X_{11}$ may be $C(R_{11})$ or N, $X_{12}$ may be $C(R_{12})$ or N, and $X_{13}$ may be $C(R_{13})$ or N, $X_{22}$ may be $C(R_{22})$ or N, and $X_{23}$ may be $C(R_{23})$ or N, $R_{11}$ to $R_{13}$ may each be the same as in the description of $R_1$, $R_{22}$ to $R_{23}$ may each be the same as in the description of $R_2$, two or more neighboring groups of $R_{11}$ to $R_{13}$ or $R_{22}$ to $R_{23}$ may optionally be bonded to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, $L_{61}$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b61 may each independently be an integer from 1 to 3, $R_{61}$, $R_{61a}$, $R_{61b}$, $R_{62}$, $R_{62a}$, $R_{62b}$, $R_{63}$, $R_{63a}$, and $R_{63b}$ may each be the same as in the description of $R_1$, and $R_{10a}$ is the same as described herein,

*' indicates a binding site to $A_1$ in Formula 1,

* indicates a binding site to $M_1$ in Formula 1,

*" indicates a binding site to $T_2$ in Formula 1, and

*"' and *"" each indicate a binding site to a neighboring atom.

In one or more embodiments, the organometallic compound represented by Formula 1 may be represented by Formula 1-1:

Formula 1-1

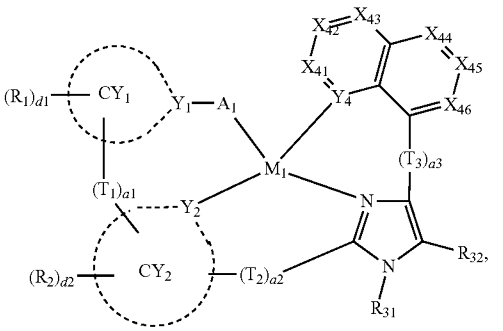

wherein, in Formula 1-1, $M_1$, $A_1$, $Y_1$, $Y_2$, $Y_4$, $CY_1$, $CY_2$, $R_1$, $R_2$, $R_{31}$, $R_{32}$, $T_1$ to $T_3$, and a1 to a3 may each be the same as described herein, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $X_{45}$ may be $C(R_{45})$ or N, and $X_{46}$ may be $C(R_{46})$ or N, $R_{41}$ to $R_{46}$ may each be the same as in the description of $R_4$, and two or more groups of $R_{41}$ to $R_{46}$ may optionally be bound to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$.

In one or more embodiments, an organometallic compound represented by Formula 1 may be represented by one of Formulae 1-11 to 1-13:

Formual 1-11

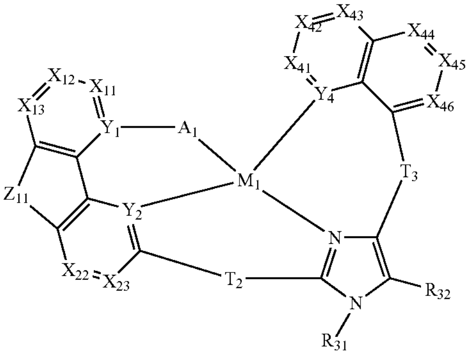

-continued

Formula 1-12

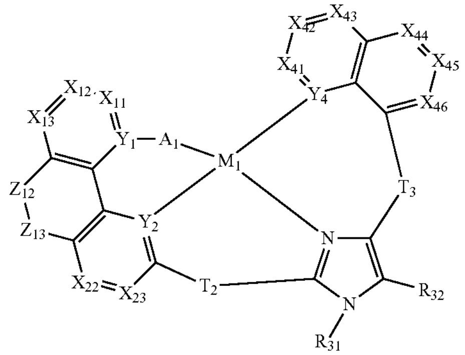

Formual 1-13

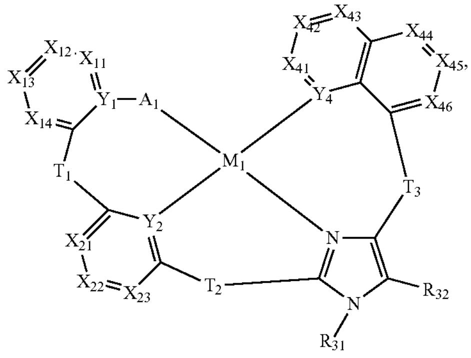

wherein, in Formulae 1-11 to 1-13, $M_1$, $A_1$, $Y_1$, $Y_2$, $Y_4$, $R_{31}$, $R_{32}$, and $T_1$ to $T_3$ may each be the same as described herein, $X_{11}$ may be $C(R_{11})$ or N, $X_{12}$ may be $C(R_{12})$ or N, $X_{13}$ may be $C(R_{13})$ or N, and $X_{14}$ may be $C(R_{14})$ or N, $X_{21}$ may be $C(R_{21})$ or N, $X_{22}$ may be $C(R_{22})$ or N, and $X_{23}$ may be $C(R_{23})$ or N, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $X_{45}$ may be $C(R_{45})$ or N, and $X_{46}$ may be $C(R_{46})$ or N, $R_{11}$ to $R_{14}$ may each be the same as in the description of $R_1$, $R_{21}$ to $R_{23}$ may each be the same as in the description of $R_2$, $R_{41}$ to $R_{46}$ may each be the same as in the description of $R_4$, and two or more groups of $R_{11}$ to $R_{14}$, $R_{21}$ to $R_{23}$, or $R_{41}$ to $R_{46}$ may optionally be bonded to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, $Z_{11}$ may be *"'—N[$(L_{61})_{b61}$-$(R_{61})$]—*"", *"'—O—*"", *"'—S—*"", *"'—Se—*"", or *"'—C($R_{61a}$)($R_{61b}$)—*"", $Z_{12}$ may be *"'—N[$(L_{62})_{b62}$-$(R_{62})$]—*"", *"'—C($R_{62a}$)($R_{62b}$)—*"", *"'—C($R_{62}$)=*"", or *"'=C($R_{62}$)—*"", $Z_{13}$ may be *"'—N[$(L_{63})_{b63}$-$(R_{63})$]—*"", *"'—C($R_{63a}$)($R_{63b}$)—*"", *"'—C($R_{63}$)=*"", or *"'=C($R_{63}$)—*"", $L_{61}$ to $L_{63}$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b61 to b63 may each independently be an integer from 1 to 3, and $R_{61}$, $R_{61a}$, $R_{61b}$, $R_{62}$, $R_{62a}$, $R_{62b}$, $R_{63}$, $R_{63a}$, and $R_{63b}$ may each be the same as in the description of $R_1$, and $R_{10a}$ is the same as described herein.

In one or more embodiments, a ratio of presence of triplet metal-to-ligand charge transfer state ($^3$MLCT) ($^3$MLCT value) of the organometallic compound represented by Formula 1 may be equal to or greater than 10%. For example, the $^3$MLCT value may be 10% or more, 11% or more, or 12% or more.

In one or more embodiments, the organometallic compound represented by Formula 1 may be one selected from among Compounds D01 to D36, but embodiments of the present disclosure are not limited thereto:

D01

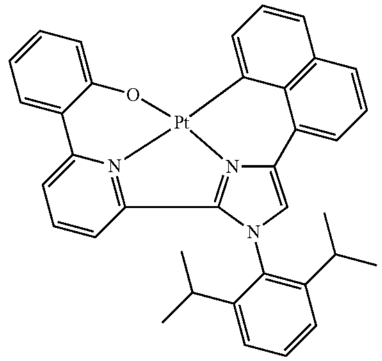

D02

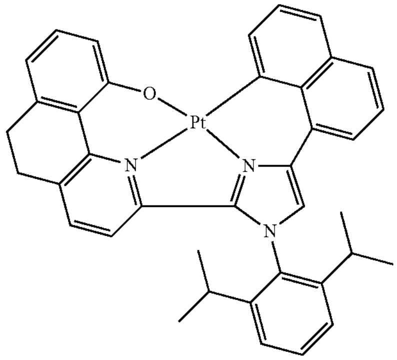

D03

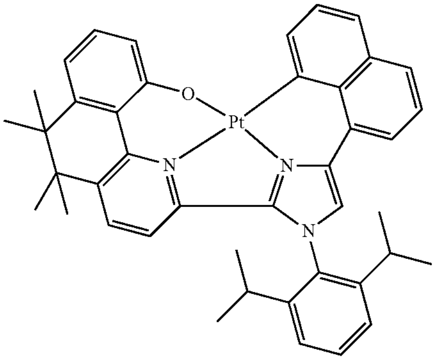

-continued

D04

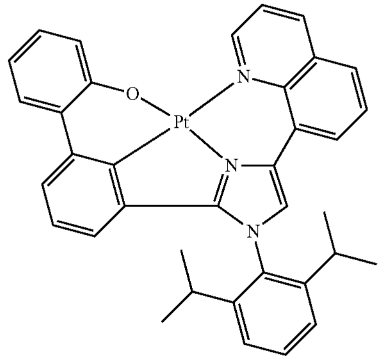

D05

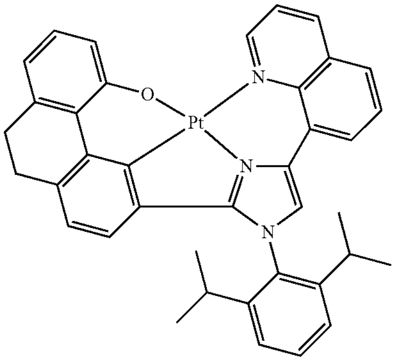

D06

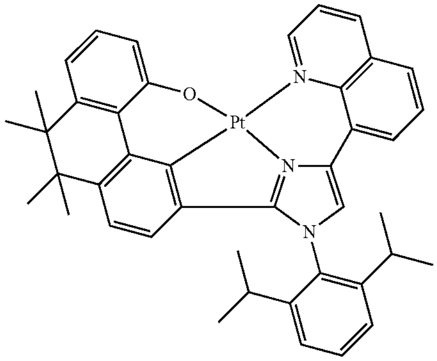

D07

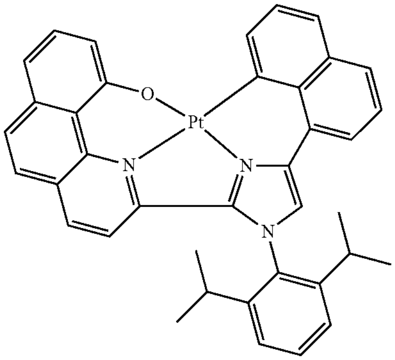

-continued
D08
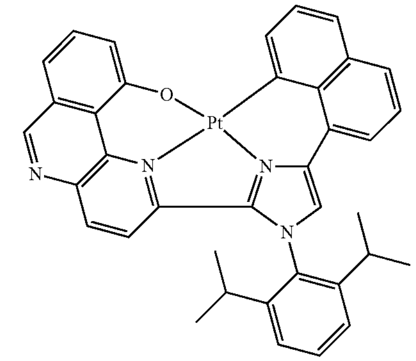
D09
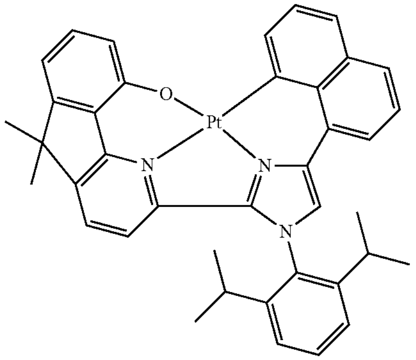
D10
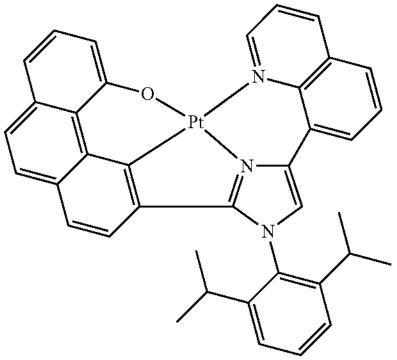
D11
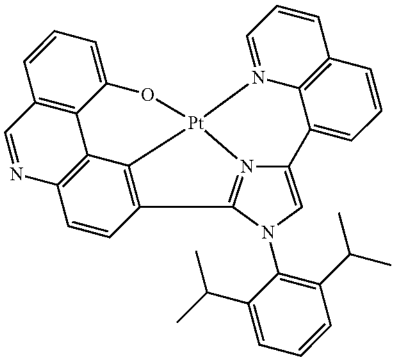
-continued
D12
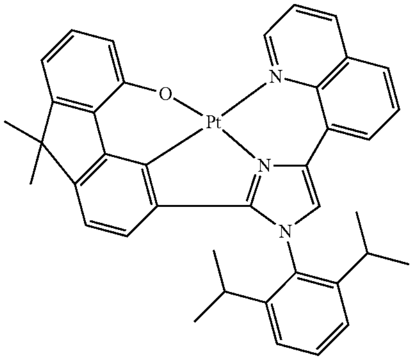
D13
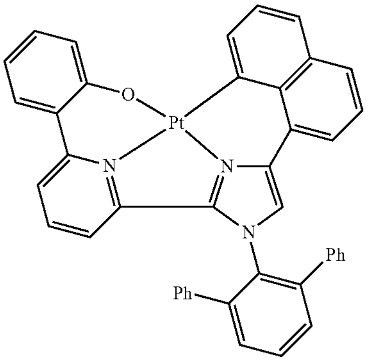
D14
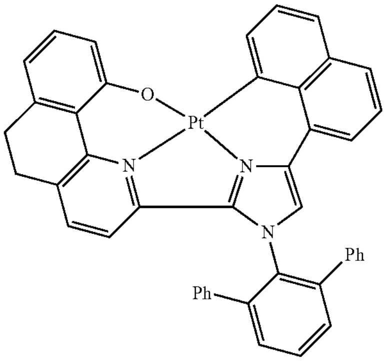
D15
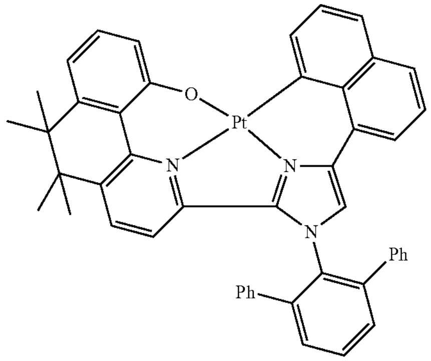

-continued
D16
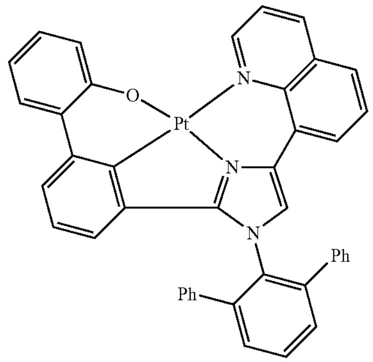
D17
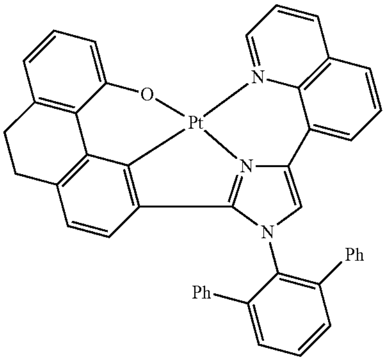
D18
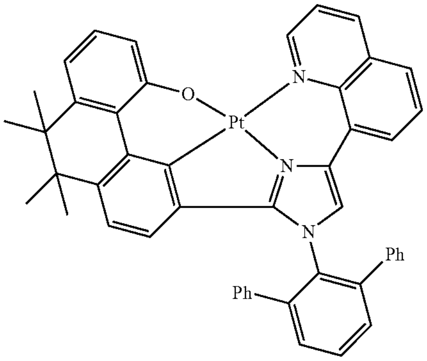
D19
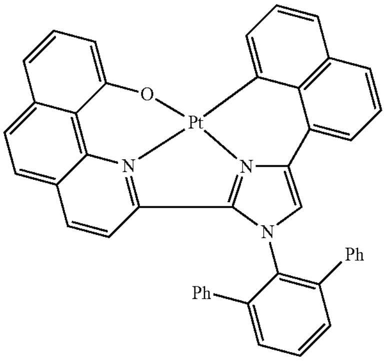
-continued
D20
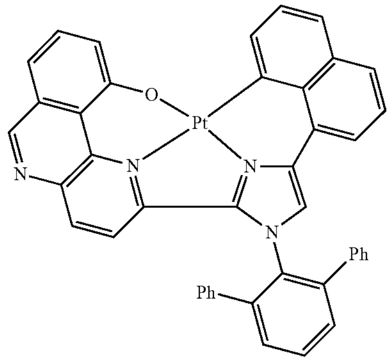
D21
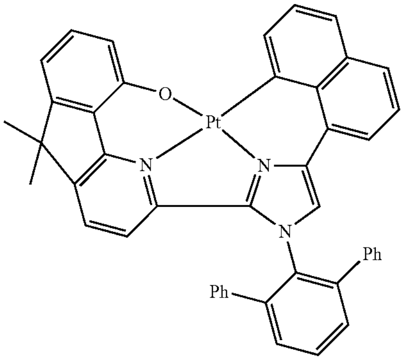
D22
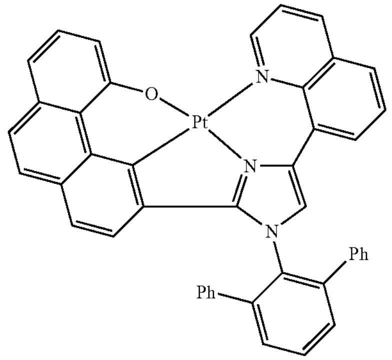
D23
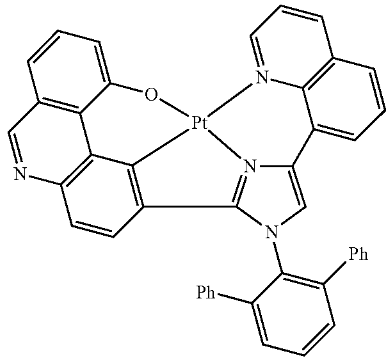

D24
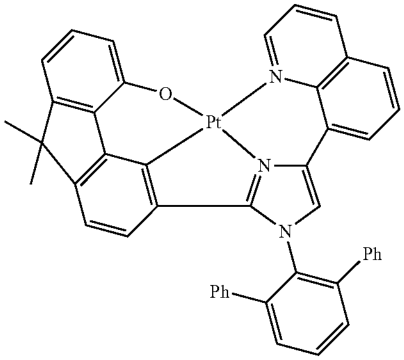
D25
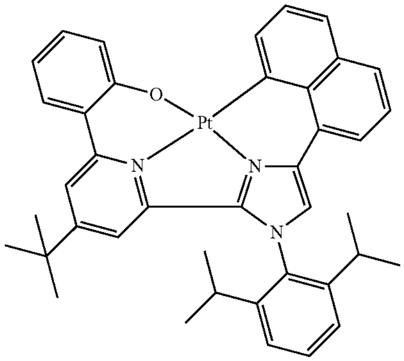
D26
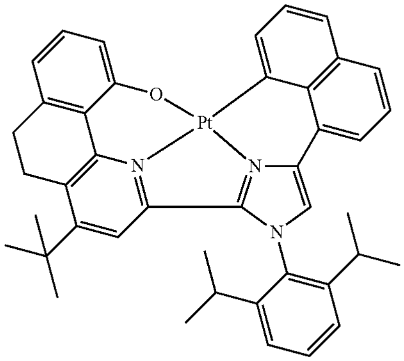
D27
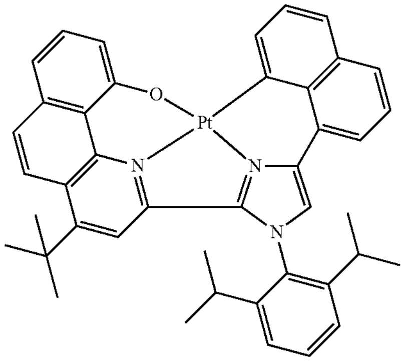
D28
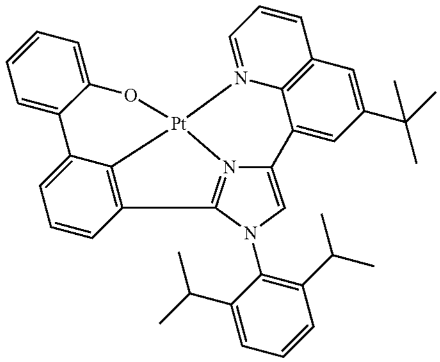
D29
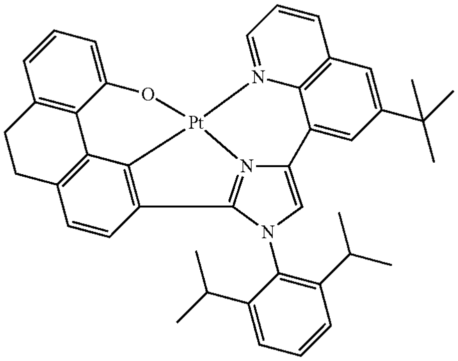
D30
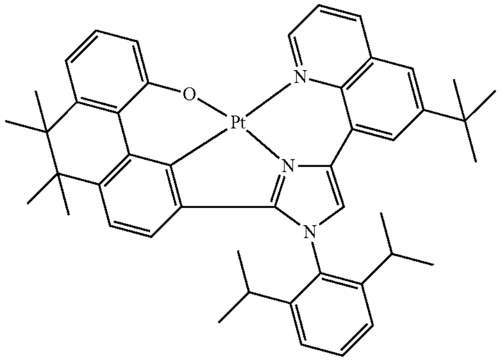
D31
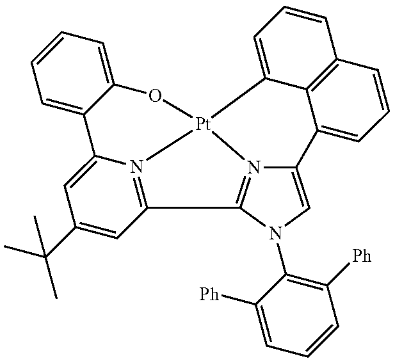

-continued

D32

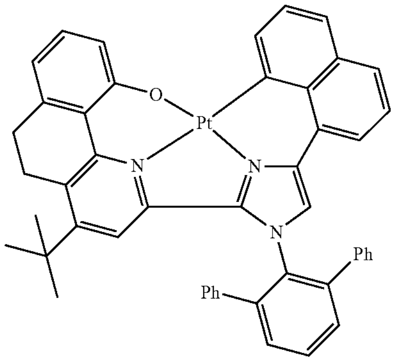

D33

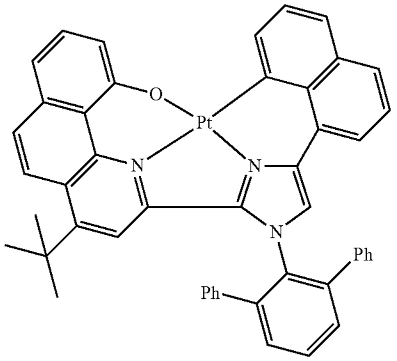

D34

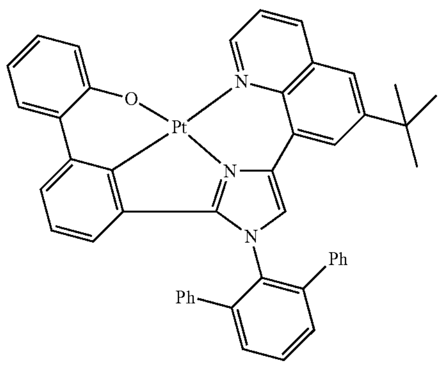

D35

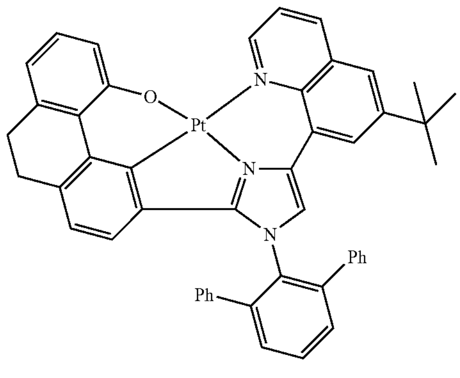

-continued

D36

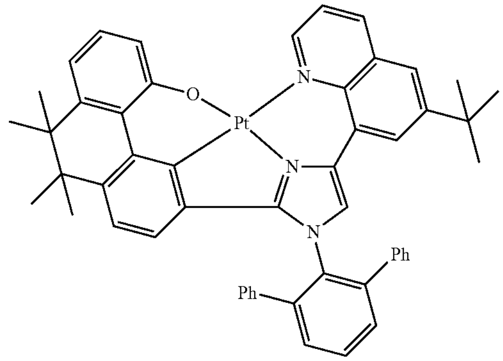

.

The organometallic compound represented by Formula 1 has a structure of a tetradentate organometallic compound including a moiety including both (e.g., simultaneously) an aromatic ring and an alkyl ring, for example, a condensed ring in which a cyclic group is additionally condensed to a tetrahydroquinoline-based group. As the organometallic compound includes the condensed cyclic moiety, structural stability of the compound may be increased. Therefore, a light-emitting device including the organometallic compound may have improved lifespan.

Also, because the organometallic compound includes the condensed cyclic moiety, horizontal orientation is improved, and thus, a light-emitting device including the organometallic compound may have low driving voltage and improved luminescence efficiency.

Therefore, an electronic device, for example, a light-emitting device, including the organometallic compound represented by Formula 1 may have low driving voltage, high emission efficiency, and long lifespan.

The highest occupied molecular orbital/lowest unoccupied molecular orbital (HOMO/LUMO) energy level, triplet energy ($T_1$) level, maximum emission wavelength (Amax), and a ratio of presence of triplet metal-to-ligand charge transfer state ($^3$MLCT) of Compounds D01, D02, D03, D09, D11, D13, D14, D15, D21, D23, D25, and D26 and Comparative Example Compounds R01 to R05 according to one or more embodiments were evaluated utilizing the DFT method of the Gaussian program, which is structure-optimized at the B3LYP/6-31G(d,p) level, and the evaluation result and a band gap value, which a HOMO/LUMO energy difference, are shown in Table 1.

TABLE 1

| Compound | HOMO (eV) | LUMO (eV) | Band gap (eV) | $\lambda_{max}$ (nm) | Luminescence $T_1$ (eV) | $^3$MLCT (%) |
|---|---|---|---|---|---|---|
| D01 | −4.89 | −2.12 | 2.77 | 642 | 1.93 | 13 |
| D02 | −4.84 | −2.00 | 2.84 | 629 | 1.97 | 13 |
| D03 | −4.83 | −1.96 | 2.87 | 626 | 1.98 | 14 |
| D09 | −4.88 | −2.03 | 2.85 | 626 | 1.98 | 15 |
| D11 | −4.68 | −2.53 | 2.15 | 667 | 1.86 | 35 |
| D13 | −4.83 | −2.09 | 2.74 | 646 | 1.92 | 13 |
| D14 | −4.79 | −1.98 | 2.81 | 629 | 1.97 | 13 |
| D15 | −4.77 | −1.93 | 2.84 | 626 | 1.98 | 14 |
| D21 | −4.83 | −2.00 | 2.83 | 626 | 1.98 | 17 |
| D23 | −4.64 | −2.47 | 2.17 | 663 | 1.87 | 36 |
| D25 | −4.83 | −2.06 | 2.77 | 639 | 1.94 | 13 |
| D26 | −4.78 | −1.95 | 2.83 | 626 | 1.98 | 12 |
| R01 | −5.01 | −1.88 | 3.13 | 534 | 2.32 | 5.84 |
| R02 | −4.87 | −1.76 | 3.11 | 517 | 2.40 | 1.06 |
| R03 | −4.86 | −2.29 | 2.57 | 663 | 1.87 | 9.23 |

TABLE 1-continued

| Compound | HOMO (eV) | LUMO (eV) | Band gap (eV) | $\lambda_{max}$ (nm) | Luminescence T[1] (eV) | [3]MLCT (%) |
|---|---|---|---|---|---|---|
| R04 | −4.77 | −1.49 | 3.28 | 517 | 2.40 | 12 |
| R05 | −4.91 | −1.72 | 3.19 | 620 | 2.00 | 10 |
| R06 | −4.87 | −1.44 | 3.43 | 557 | 2.26 | 15 |

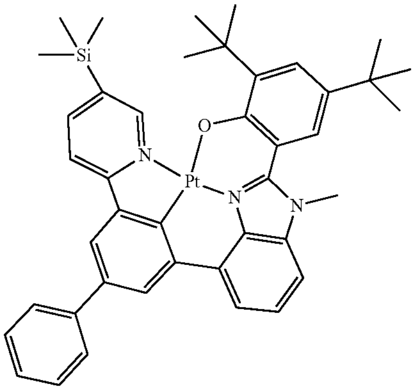

R01

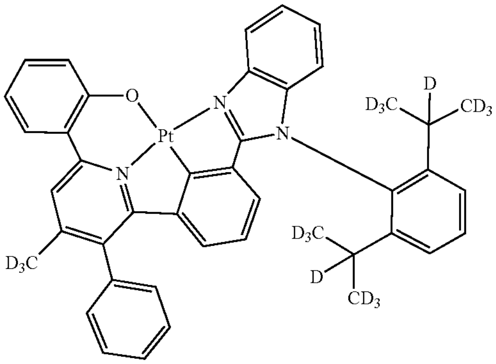

R02

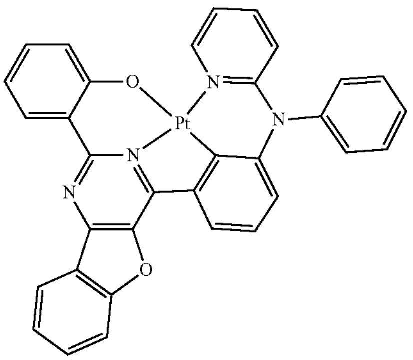

R03

TABLE 1-continued

| Compound | HOMO (eV) | LUMO (eV) | Band gap (eV) | $\lambda_{max}$ (nm) | Luminescence T[1] (eV) | [3]MLCT (%) |
|---|---|---|---|---|---|---|

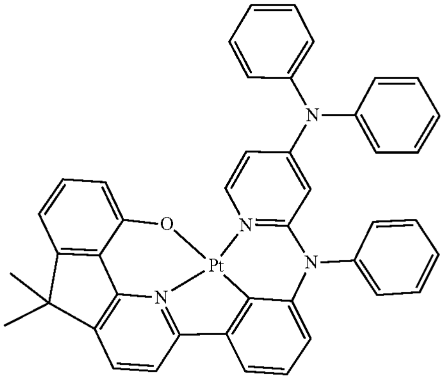

R04

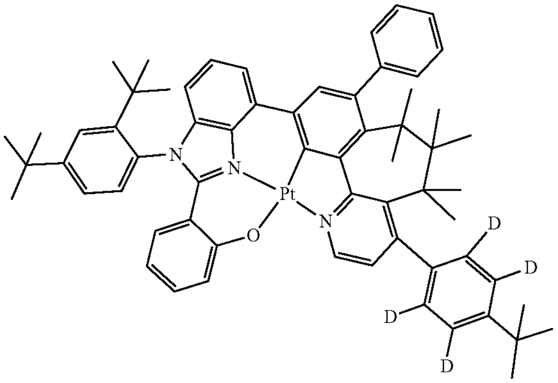

R05

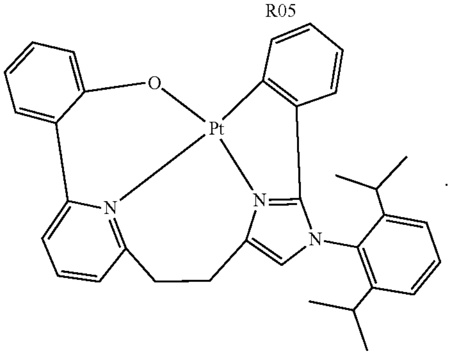

R06

Through Table 1, it is confirmed that Compounds D01, D02, D03, D09, D11, D13, D14, D15, D21, D23, D25, and D26 have a higher $^3$MLCT value than that of Compounds R01 to R05 of Comparative Examples, and that as the maximum emission wavelengths of R01, R02, R04, and R06 of Comparative Example Compounds do not satisfy the range of about 590 nm to about 670 nm, Compounds R01, R02, R04, and R06 are different from Compounds D01, D02, D03, D09, D11, D13, D14, D15, D21, D23, D25, and D26.

Synthesis methods of the organometallic compound represented by Formula 1 may be recognizable by one of ordinary skill in the art by referring to Synthesis Examples and/or Examples provided.

At least one organometallic compound represented by Formula 1 may be utilized in a light-emitting device (for example, an organic light-emitting device). Accordingly, in one or more embodiments, a light-emitting device is provided to include: a first electrode; a second electrode facing the first electrode; and an interlayer between the first electrode and the second electrode and including an emission layer, wherein the interlayer may include the organometallic compound represented by Formula 1.

In some embodiments, the first electrode of the light-emitting device may be an anode, the second electrode of the light-emitting device may be a cathode, the interlayer may include at least one organometallic compound represented by Formula 1, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

In one or more embodiments, the organometallic compound may be included between a pair of electrodes of the light-emitting device. Accordingly, the organometallic compound may be included in the interlayer of the light-emitting device, for example, in the emission layer of the interlayer.

In one or more embodiments, the emission layer may further include a host, and the amount of the organometallic compound may be from about 0.01 parts by weight to about 49.99 parts by weight based on 100 parts by weight of the emission layer.

In one or more embodiments, the emission layer of the light-emitting device may include a dopant and a host, and the dopant may include the organometallic compound. For example, the organometallic compound may act as a dopant. For example, in some embodiments, the emission layer may be to emit green light.

In one or more embodiments, the emission layer may be to emit blue light or blue-green light.

In one or more embodiments, the emission layer may be to emit light having a maximum emission wavelength range of about 590 nm to about 670 nm.

The wording "(interlayer and/or capping layer) includes an organometallic compound" as utilized herein may be understood as "(interlayer and/or capping layer) may include one kind or type of organometallic compound represented by Formula 1 or two different kinds or types of organometallic compounds, each represented by Formula 1."

For example, in one or more embodiments, the interlayer and/or capping layer may include Compound 1 only as the organometallic compound. In this regard, Compound 1 may be present in the emission layer of the light-emitting device. In one or more embodiments, the interlayer may include, as the organometallic compound, Compound 1 and Compound 2. In this regard, Compound 1 and Compound 2 may be present in substantially the same layer (for example, all of Compound 1 and Compound 2 may be present in the emission layer), or may be present in different layers (for example, Compound 1 may be present in the emission layer, and Compound 2 may be present in the electron transport region).

The term "interlayer" as utilized herein may refer to a single layer and/or all of a plurality of layers located between the first electrode and the second electrode of the light-emitting device.

one or more aspects of embodiments of the present disclosure provide an electronic apparatus including the light-emitting device. The electronic apparatus may further include a thin-film transistor. For example, in one or more embodiments, the electronic apparatus may further include a thin-film transistor including a source electrode and a drain electrode, wherein the first electrode of the light-emitting device may be electrically connected to the source electrode or the drain electrode of the thin-film transistor. In some embodiments, the electronic apparatus may further include a color filter, a color conversion layer, a touch screen layer, a polarizing layer, or any combination thereof. For more details on the electronic apparatus, related descriptions provided herein may be referred to.

One or more aspects of embodiments of the present disclosure provide an electronic device including the light-emitting device.

For example, in one or more embodiments, the electronic device may be a flat panel display, a curved display, a computer monitor, a medical monitor, a TV, a billboard, indoor or outdoor illuminations and/or signal light, a head-up display, a fully or partially transparent display, a flexible display, a rollable display, a foldable display, a stretchable display, a laser printer, a phone, a cell phone, a tablet, a phablet, a personal digital assistant (PDA), a wearable device, laptop computers, digital cameras, camcorders, viewfinders, micro displays, 3D displays, virtual or augmented reality displays, vehicles, a video wall including multiple displays tiled together, a theater or stadium screen, a phototherapy device, and/or a signage.

[Description of FIG. 1]

FIG. 1 is a schematic cross-sectional view of a light-emitting device 10 according to one or more embodiments of the present disclosure. The light-emitting device 10 may include a first electrode 110, an interlayer 130, and a second electrode 150.

Hereinafter, the structure of the light-emitting device 10 according to one or more embodiments and a method of manufacturing the light-emitting device 10 will be described with reference to FIG. 1.

[First Electrode 110]

In FIG. 1, in some embodiments, a substrate may be additionally provided and located under the first electrode 110 or on the second electrode 150. As the substrate, a glass substrate or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layered structure including (e.g., consisting of) a single layer or a multi-layered structure including a plurality of layers. For example, in one or more embodiments, the first electrode 110 may have a three-layered structure of ITO/Ag/ITO.

[Interlayer 130]

The interlayer 130 may be on the first electrode 110. The interlayer 130 may include an emission layer.

In one or more embodiments, the interlayer 130 may further include a hole transport region located between the first electrode 110 and the emission layer, and an electron transport region located between the emission layer and the second electrode 150.

In one or more embodiments, the interlayer 130 may further include, in addition to one or more suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

[Hole Transport Region in Interlayer 130]

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, in some embodiments, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110 in the stated order.

The hole transport region may include a compound represented by Formula 201, a compound represented by Formula 202, or any combination thereof:

Formula 201

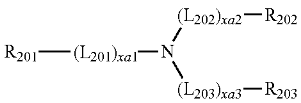

-continued

Formula 202

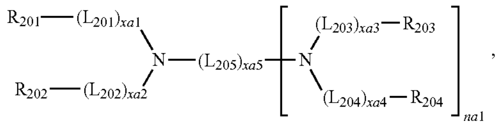

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from groups represented by Formulae CY201 to CY217:

CY201

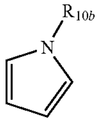

CY202

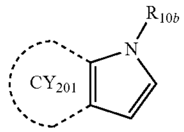

CY203

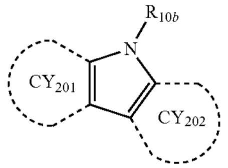

-continued

CY204

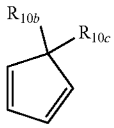

CY205

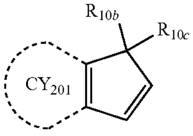

CY206

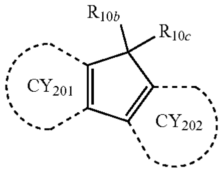

CY207

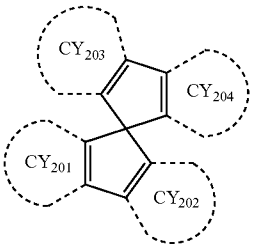

CY208

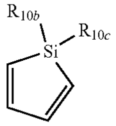

CY209

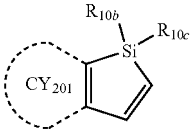

CY210

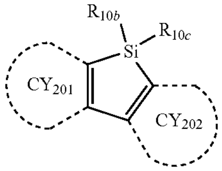

CY211

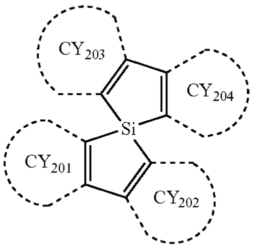

CY212

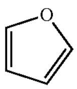

-continued

CY213

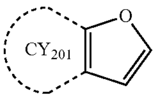

CY214

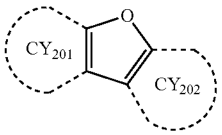

CY215

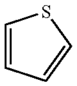

CY216

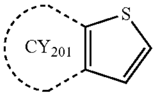

CY217

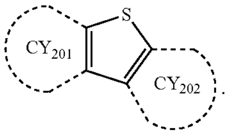

In Formulae CY201 to CY217, $R_{10b}$ and $R_{10c}$ may each be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In one or more embodiments, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one selected from groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{20}1$ may be a group represented by one selected from among Formulae CY201 to CY203, xa2 may be 0, and $R_{20}2$ may be a group represented by one selected from among Formulae CY204 to CY207.

In one or more embodiments, each of Formulae 201 and 202 may not include (e.g., may exclude) a group represented by one selected from among Formulae CY201 to CY203.

In one or more embodiments, each of Formulae 201 and 202 may not include (e.g., may exclude) a group represented by one selected from among Formulae CY201 to CY203, and may include at least one selected from the groups represented by Formulae CY204 to CY217.

In one or more embodiments, each of Formulae 201 and 202 may not include (e.g., may exclude) a group represented by one selected from among Formulae CY201 to CY217.

In one or more embodiments, the hole transport region may include one of Compounds HT1 to HT46, 4,4',4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), 4,4'-bis[N-(1-naphthyl)-N-phenylamino]biphenyl (NPB (or NPD)), β-NPB, N,N'-bis(3-methylphenyl)-N,N'-diphenyl-[1,1'-biphenyl]-4,4'-diamine (TPD), Spiro-TPD, Spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

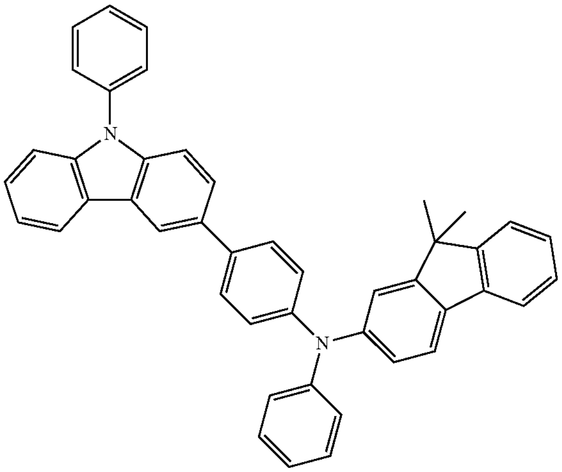

HT2

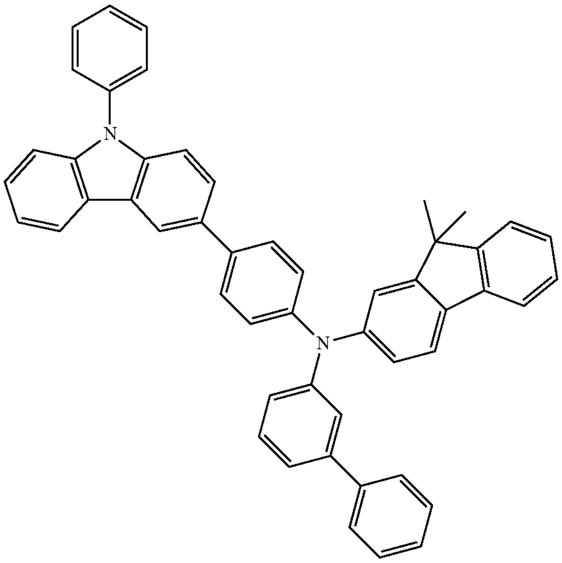

HT3

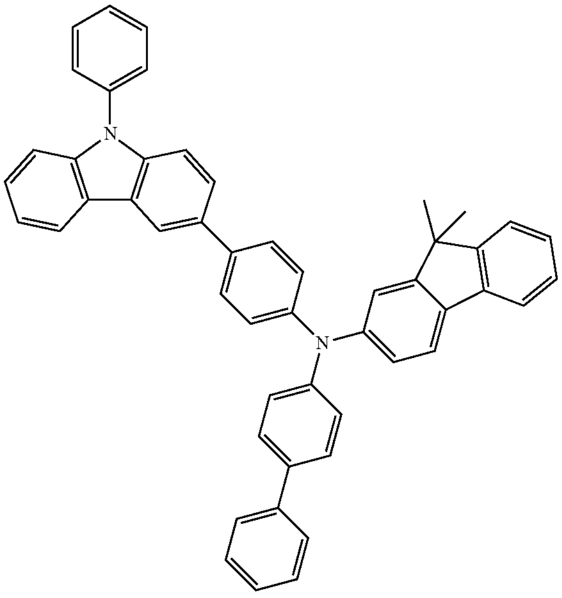

HT4

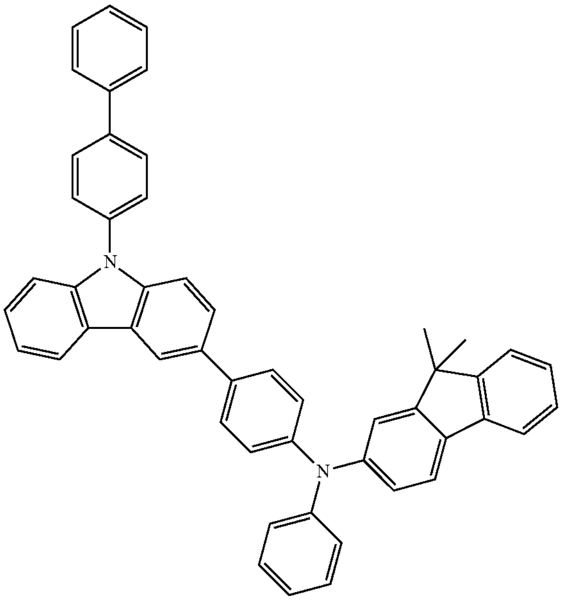

-continued
HT5
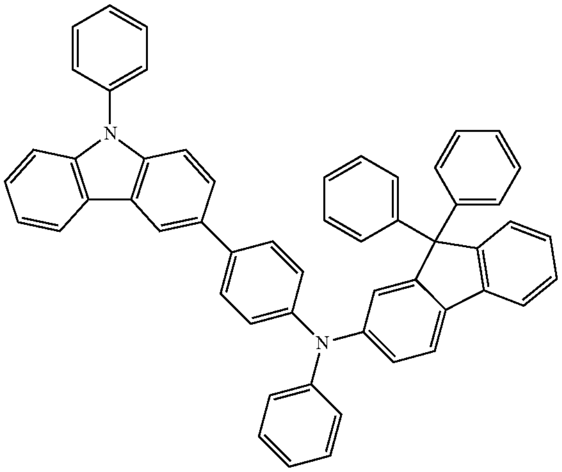
HT6
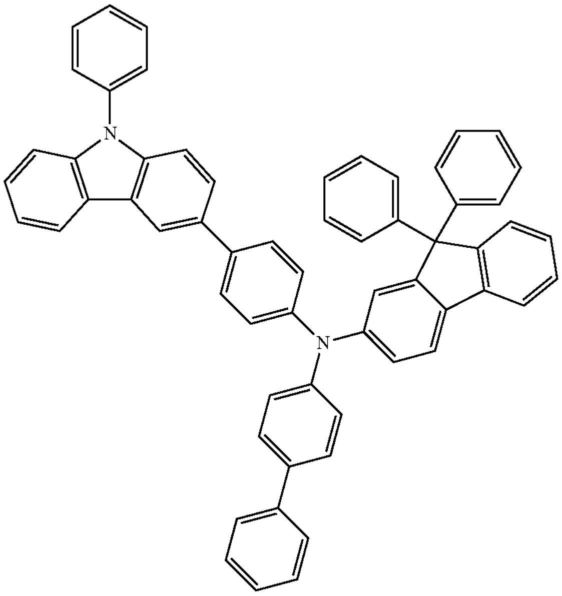
HT7
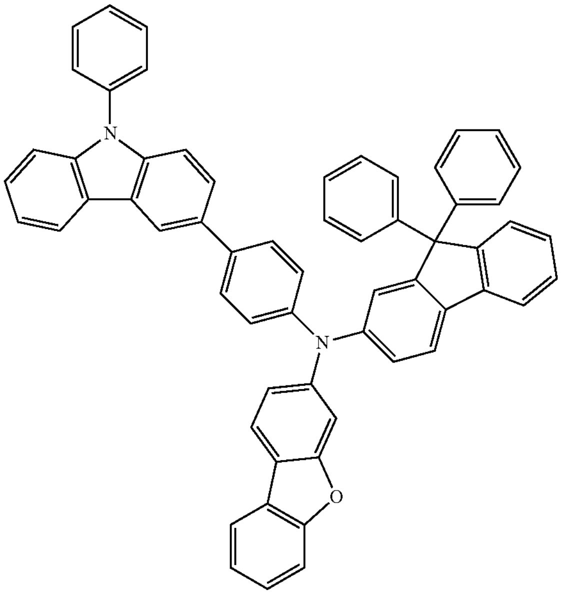
HT8
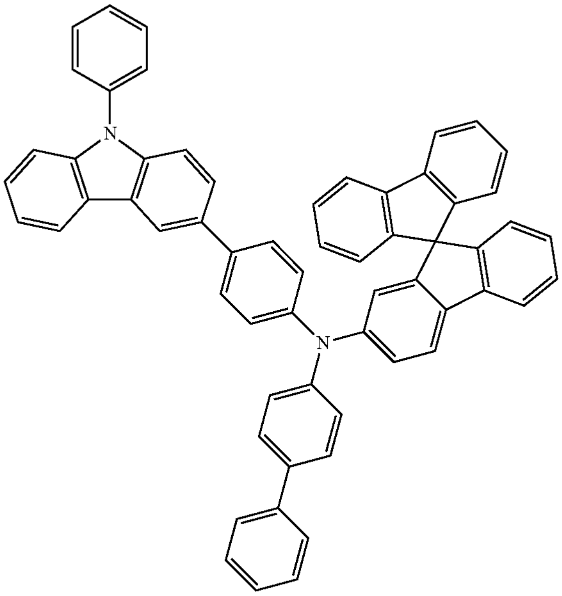

-continued
HT9
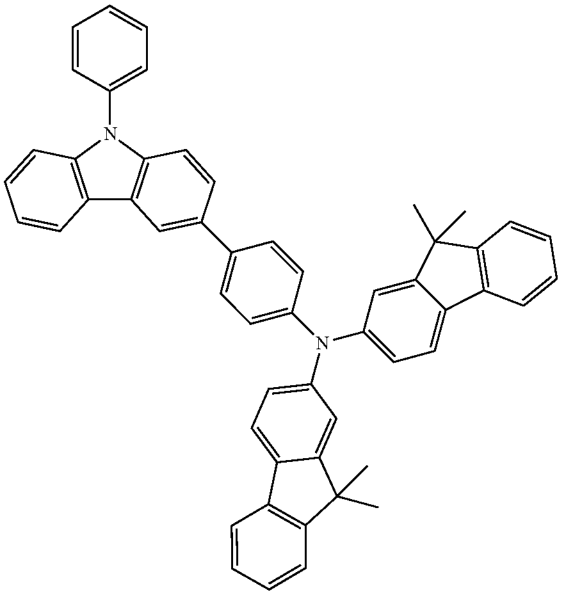
HT10
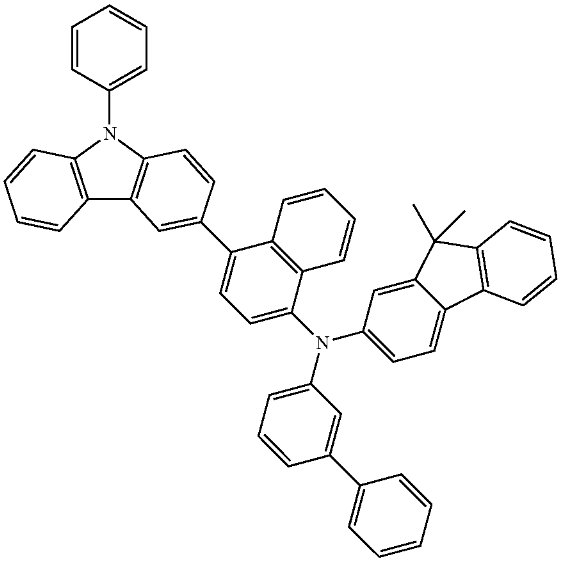
HT11
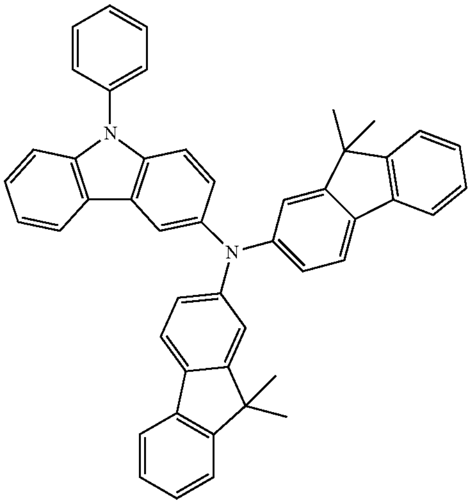
HT12
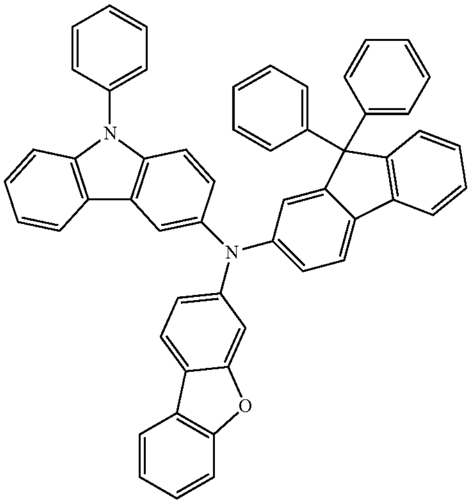

-continued
HT13
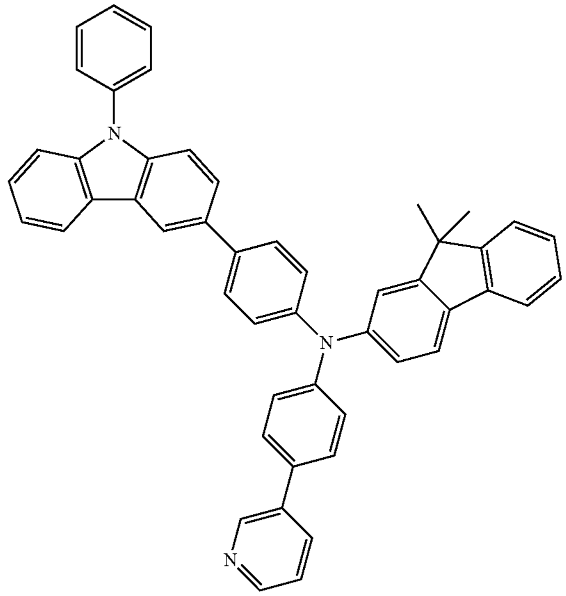
HT14
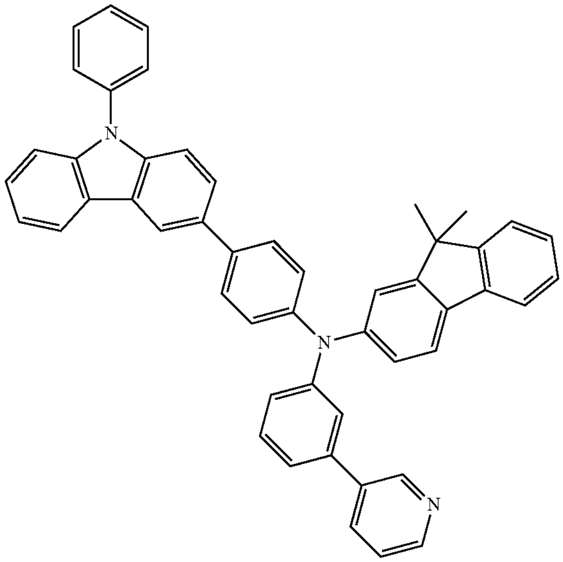
HT15
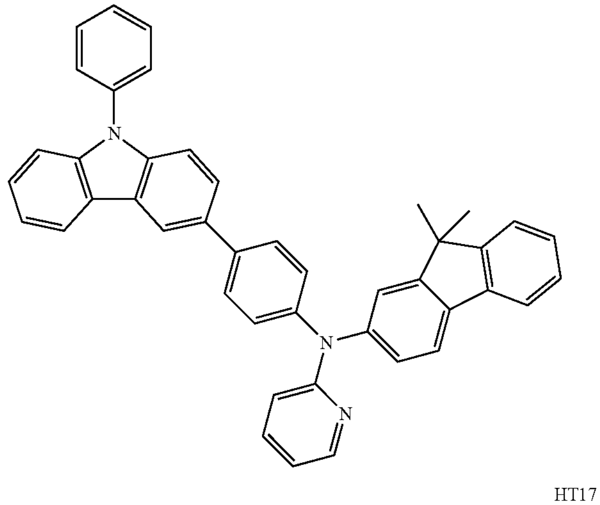
HT16
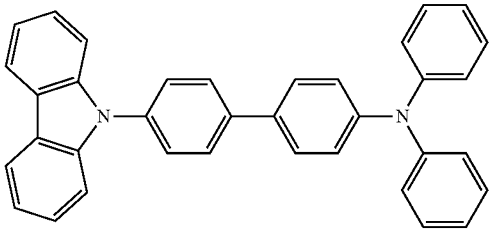
HT17
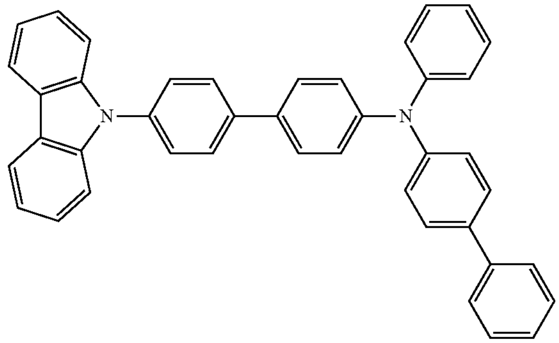
HT18
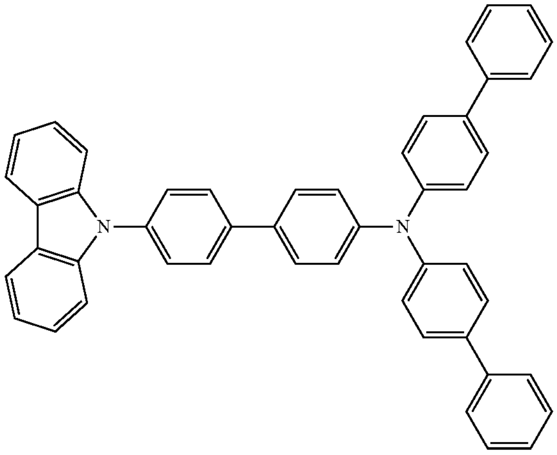

-continued
HT19
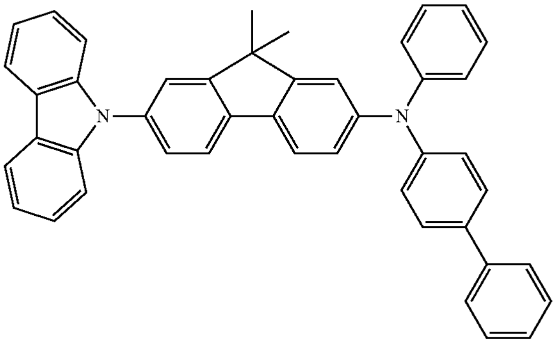
HT20
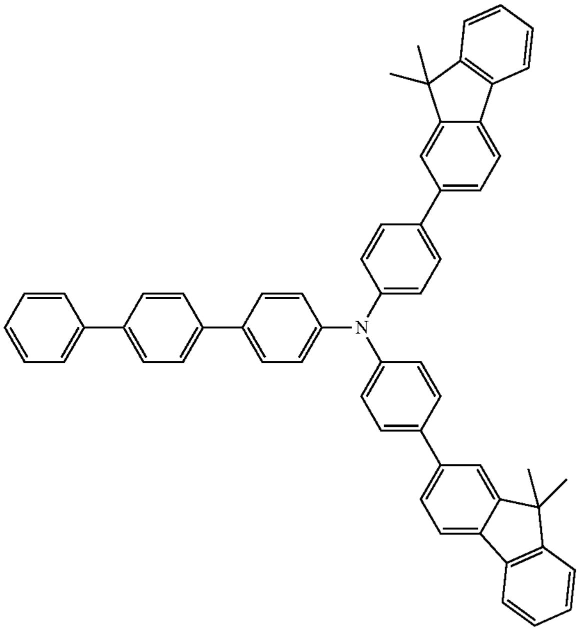
HT21
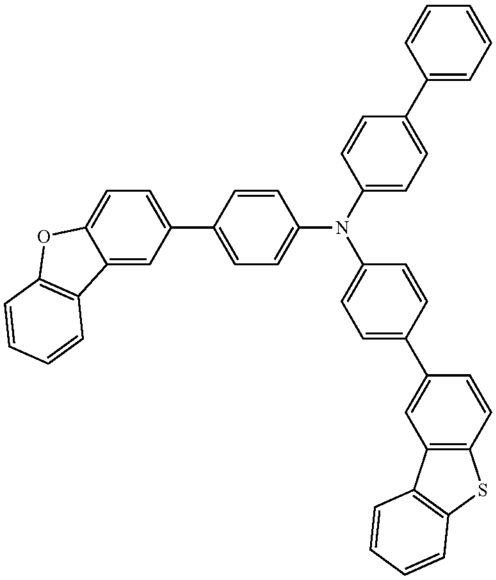
HT22
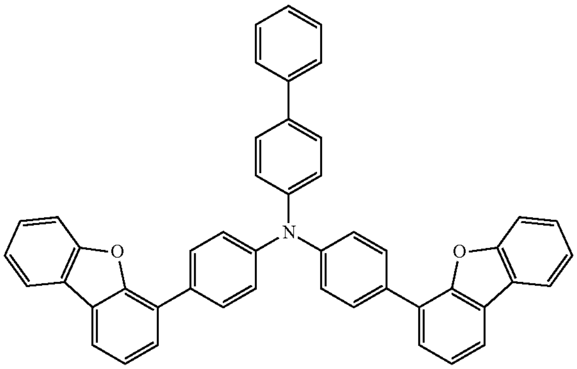

-continued
HT23
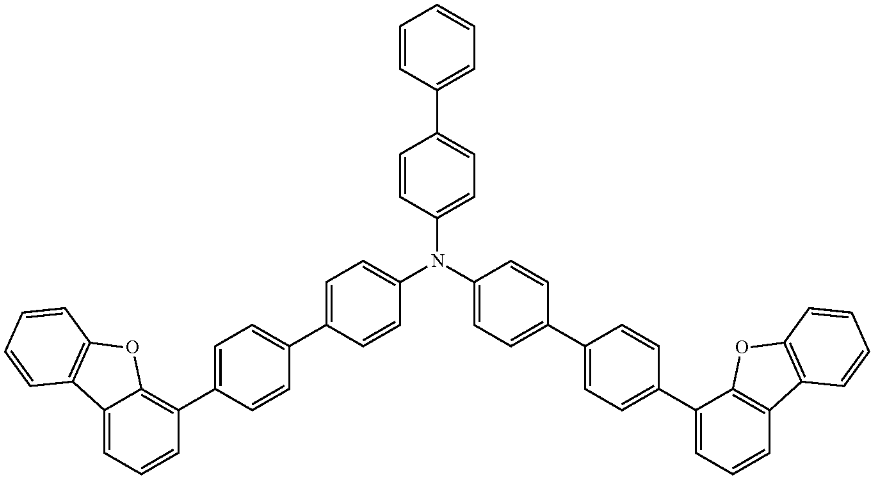
HT24
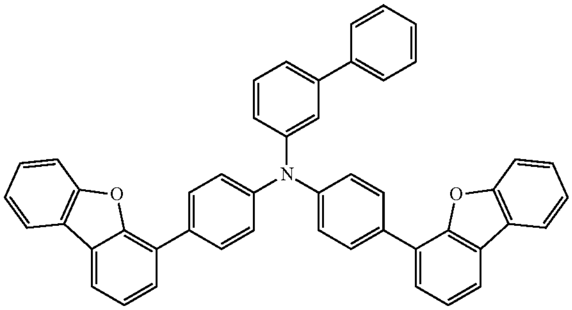
HT25
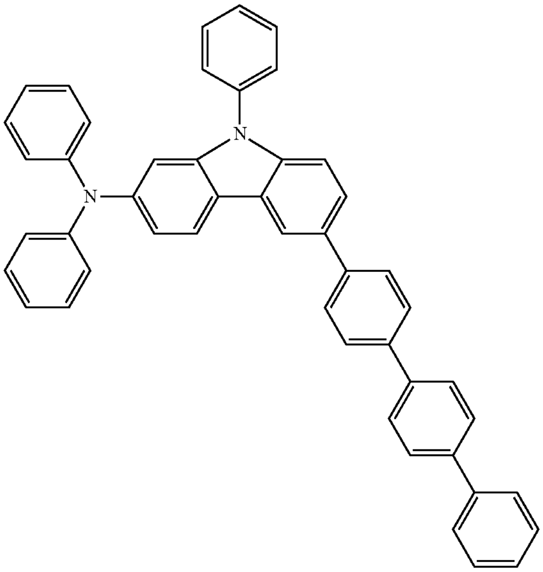
HT26
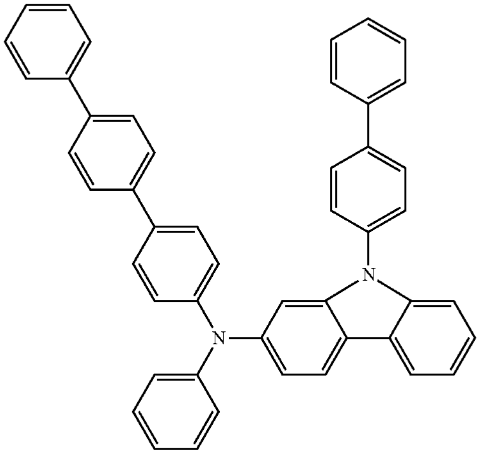
HT27
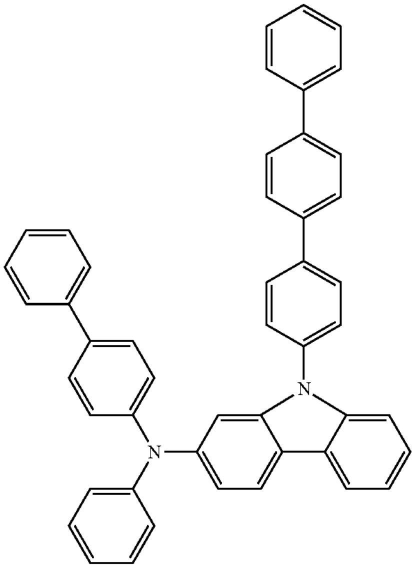

-continued
HT28
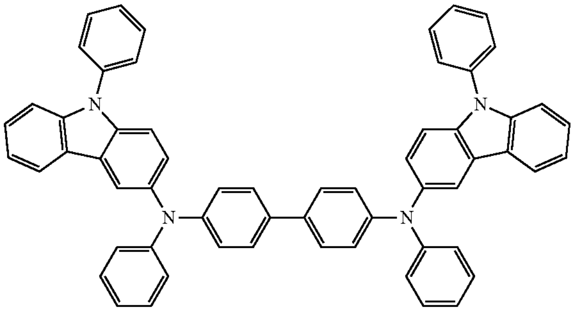
HT29
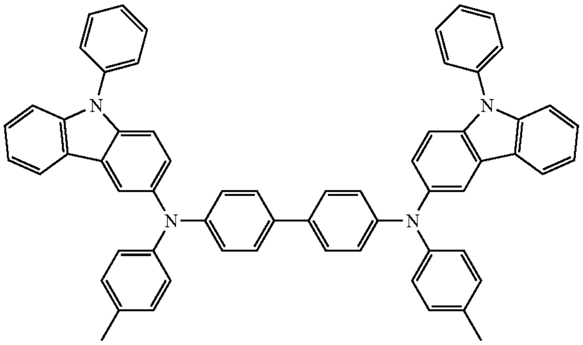
HT30
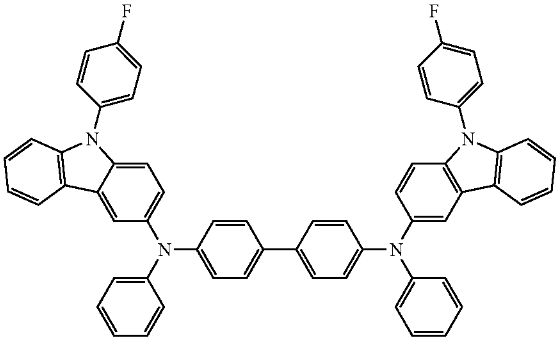
HT31
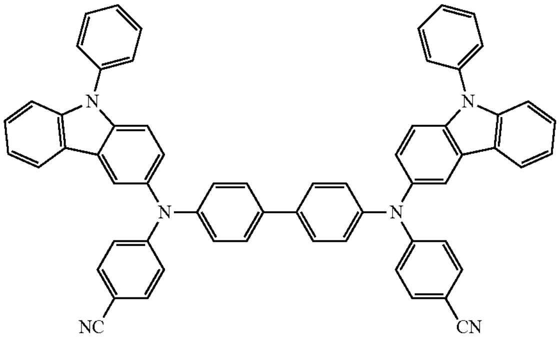
HT32
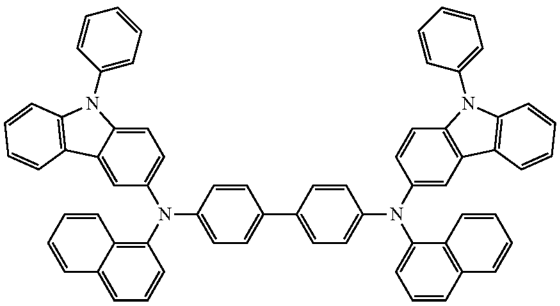
HT33
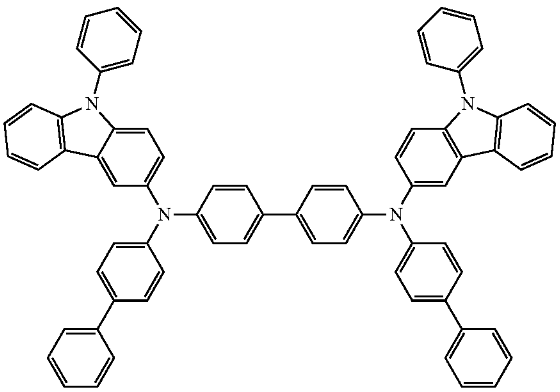

-continued
HT34
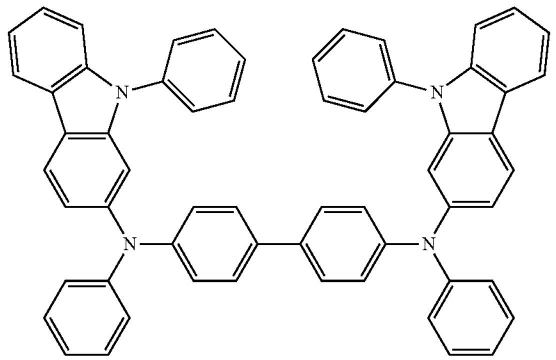
HT35
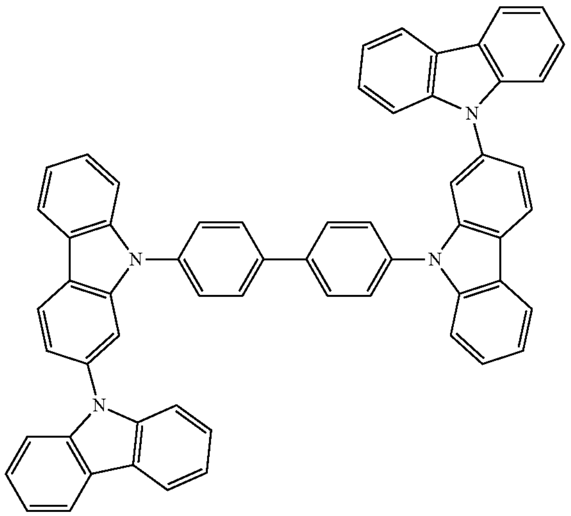
HT36
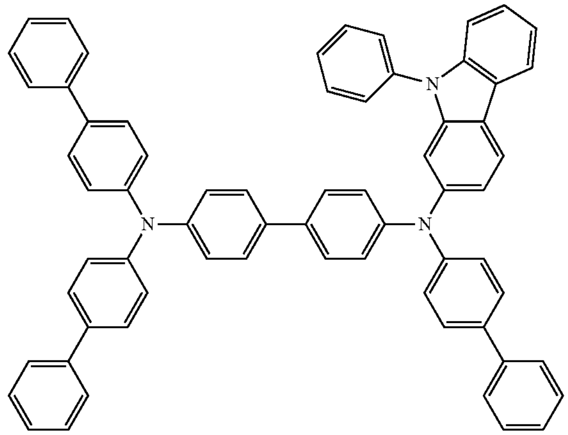
HT37
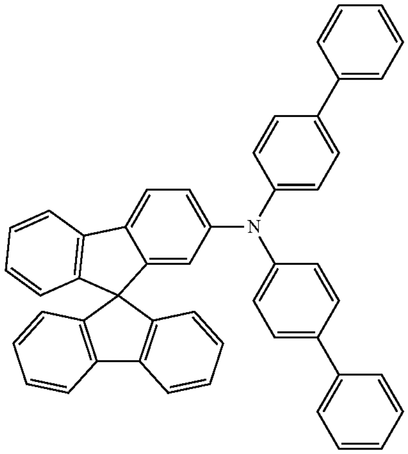
HT38
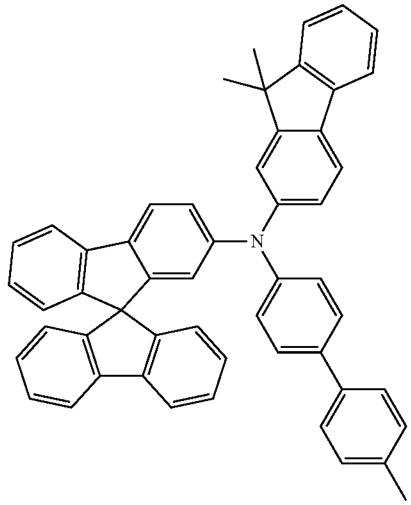
HT39
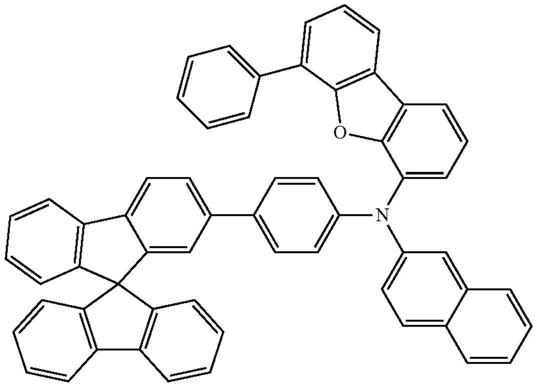

-continued
HT40
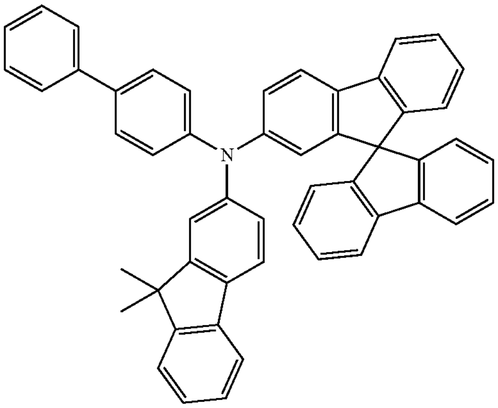
HT41
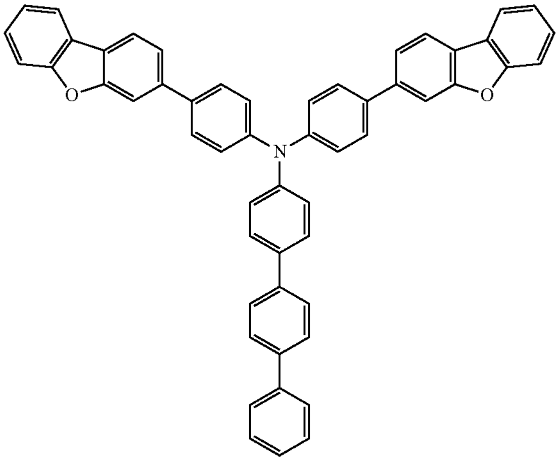
HT42
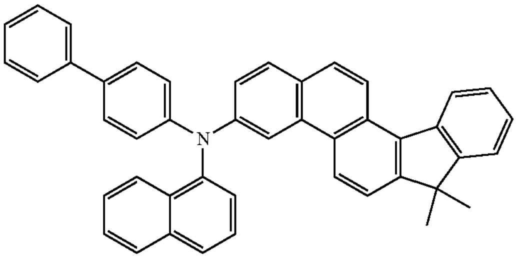
HT43
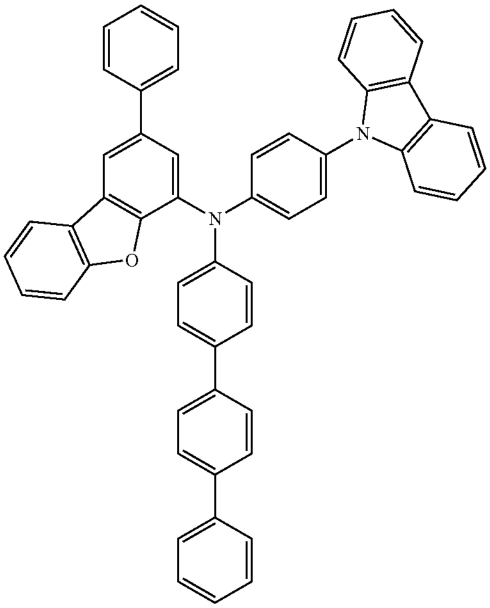
HT44
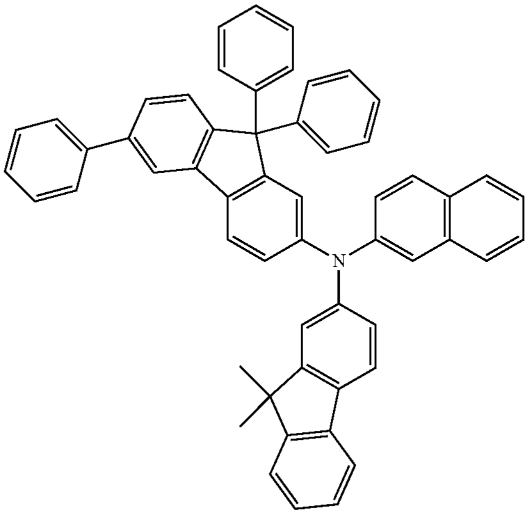
HT45
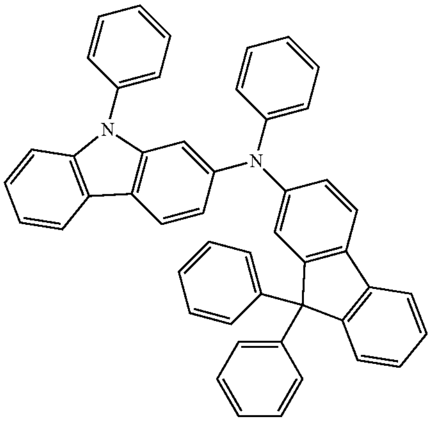

-continued
HT46
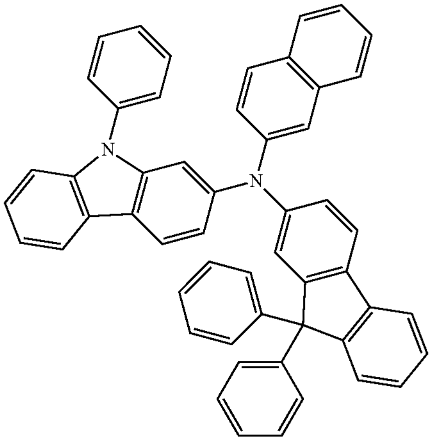
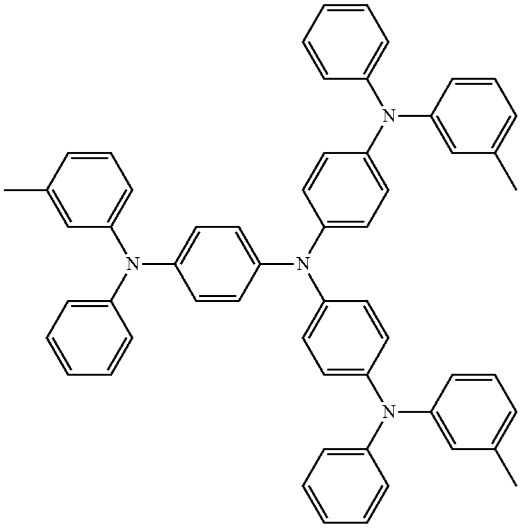
m-MTDATA
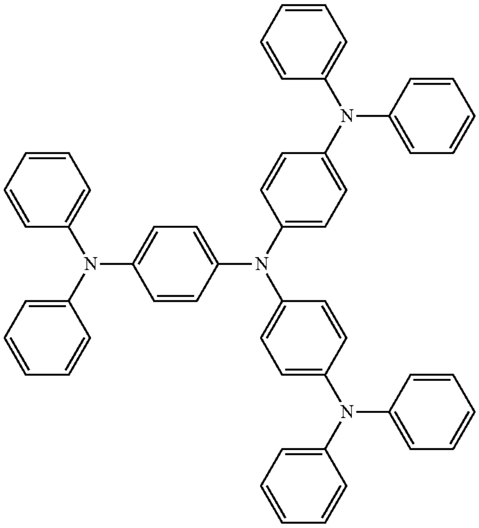
TDATA
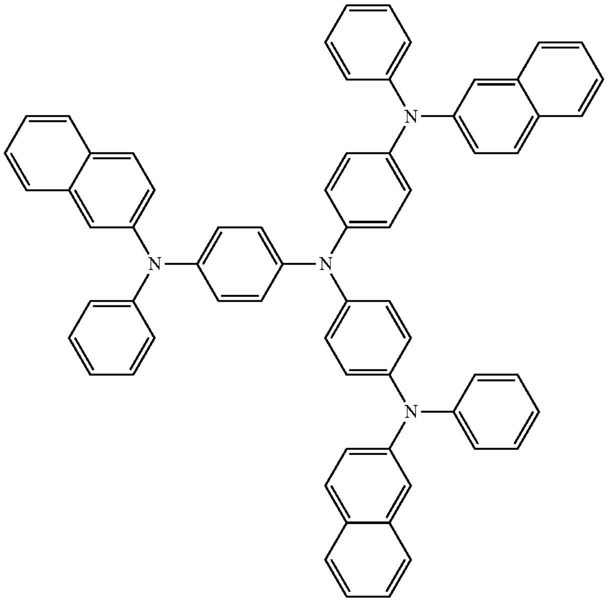
2-TNATA
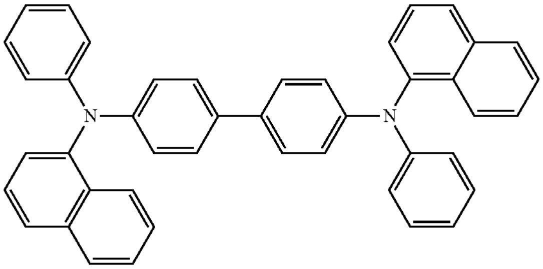
NPB -continued

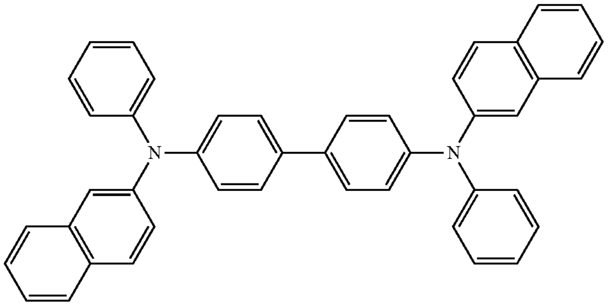

β-NPB

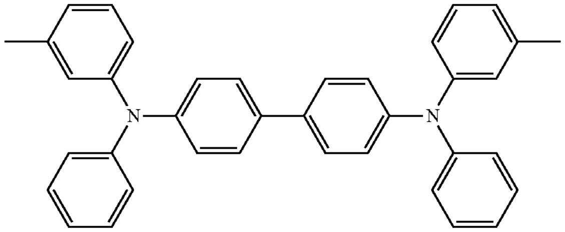

TPD

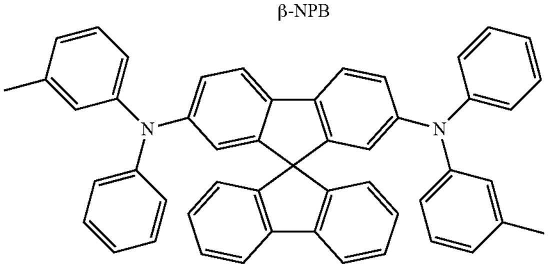

Spiro-TPD

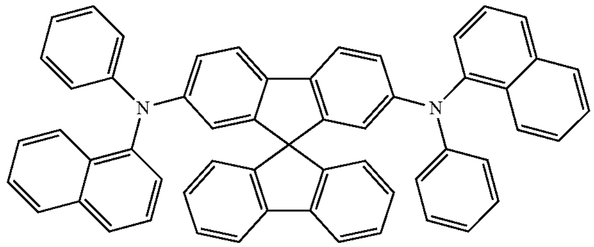

Spiro-NPB

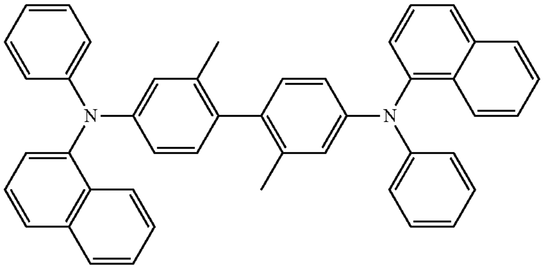

methylated-NPB

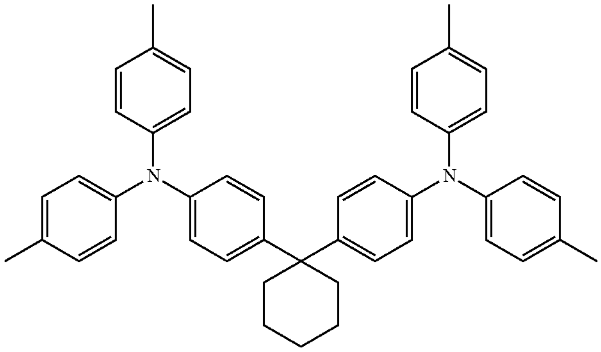

TAPC

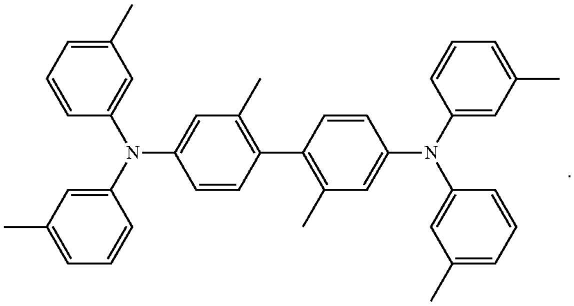

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may be included in the emission auxiliary layer and the electron blocking layer.

[p-Dopant]

In one or more embodiments, the hole transport region may further include, in addition to these materials, a charge-generation material for the improvement of conductive properties. The charge-generation material may be uniformly or non-uniformly dispersed in the hole transport region (for example, in the form of a single layer including (e.g., consisting of) a charge-generation material).

The charge-generation material may be, for example, a p-dopant.

For example, the lowest unoccupied molecular orbital (LUMO) energy level of the p-dopant may be −3.5 eV or less.

In one or more embodiments, the p-dopant may include a quinone derivative, a cyano group-containing compound, a compound including element EL1 and element EL2, or any combination thereof.

Non-limiting examples of the quinone derivative may be tetracyanoquinodimethane (TCNQ), 2,3,5,6-tetrafluoro-7,7',8,8-tetracyanoquinodimethane (F4-TCNQ), etc.

Non-limiting examples of the cyano group-containing compound may be dipyrazino[2,3-f: 2',3'-h]quinoxaline-2,3,6,7,10,11-hexacarbonitrile (HAT-CN) and a compound represented by Formula 221:

Formula 221

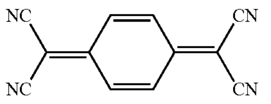

TCNQ

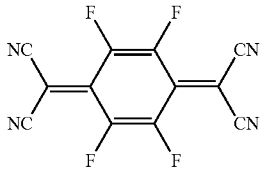

F4-TCNQ

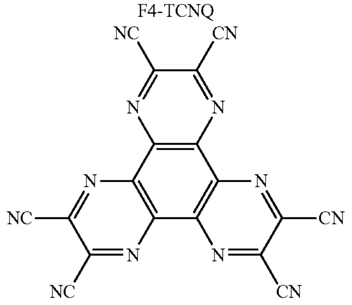

HAT-CN

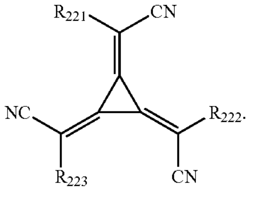

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Non-limiting examples of the metal may be an alkali metal (for example, lithium (Li), sodium (Na), potassium (K), rubidium (Rb), cesium (Cs), etc.); alkaline earth metal (for example, beryllium (Be), magnesium (Mg), calcium (Ca), strontium (Sr), barium (Ba), etc.); transition metal (for example, titanium ($T_1$), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); post-transition metal (for example, zinc (Zn), indium (In), tin (Sn), etc.); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Non-limiting examples of the metalloid may be silicon (Si), antimony (Sb), and tellurium (Te).

Non-limiting examples of the non-metal may be oxygen (O) and halogen (for example, F, Cl, Br, I, etc.).

Non-limiting examples of the compound including element EL1 and element EL2 may be metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Non-limiting examples of the metal oxide may be tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Non-limiting examples of the metal halide may be alkali metal halide, alkaline earth metal halide, transition metal halide, post-transition metal halide, and lanthanide metal halide.

Non-limiting examples of the alkali metal halogen may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Non-limiting examples of the alkaline earth metal halide may be $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Non-limiting examples of the transition metal halide may be titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfC_{14}$, $HfBr_4$, $Hfl_4$, etc.), vanadium halide (for example, $VF_3$, $VCl_3$, $VBr_3$, $VI_3$, etc.), niobium halide (for example, $NbF_3$, NbCls, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrO_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $COCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Non-limiting examples of the post-transition metal halide may be zinc halide (for example, $ZnF_2$, $ZnCl_2$, $ZnBr_2$, $ZnI_2$, etc.), indium halide (for example, $InI_3$, etc.), and tin halide (for example, $Sn_{12}$, etc.).

Non-limiting examples of the lanthanide metal halide may be YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $Sm_{13}$.

Non-limiting examples of the metalloid halide may be antimony halide (for example, $SbCl_5$, etc.).

Non-limiting examples of the metal telluride may be alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and/or a blue emission layer, in which the two or more layers contact each other or are separated from each other to emit white light. In one or more embodiments, the emission layer may include two or more materials of a red light-emitting material, a green light-emitting material, and/or a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be from about 0.01 part by weight to about 15 parts by weight based on 100 parts by weight of the host.

In one or more embodiments, the emission layer may include a quantum dot.

In some embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

In one or more embodiments, the host may include a compound represented by Formula 301:

$$[Ar_{301}]_{xb11}\text{-}[(L_{301})_{xb1}\text{-}R_{301}]_{xb21} \qquad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each be the same as described herein with respect to $Q_1$.

For example, when xb11 in Formula 301 is 2 or more, two or more $Ar_{301}$(s) may be linked to each other via a single bond.

In one or more embodiments, the host may include a compound represented by Formula 301-1, a compound represented by Formula 301-2, or any combination thereof:

Formula 301-1

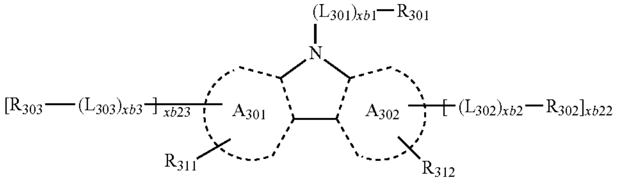

-continued

Formula 301-2

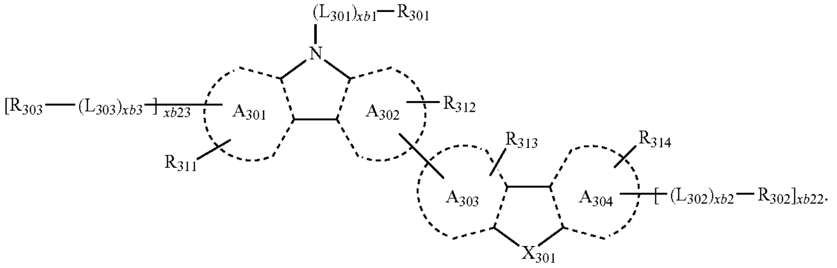

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described herein with respect to with $L_{301}$, xb2 to xb4 may each independently be the same as described herein with respect to xb1, and $R_{302}$ to $R_{305}$ and $R_{311}$ to $R_{314}$ may each be the same as described herein with respect to $R_{301}$.

In one or more embodiments, the host may include an alkaline earth metal complex, a post-transition metal complex, or any combination thereof. For example, in some embodiments, the host may include a Be complex (for example, Compound H55), an Mg complex, a Zn complex, or any combination thereof.

In one or more embodiments, the host may include one selected from among Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP) 1,3,5-tri(carbazol-9-yl)benzene (TCP), or any combination thereof:

H1

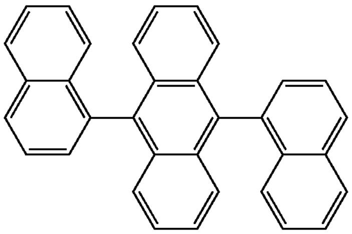

H2

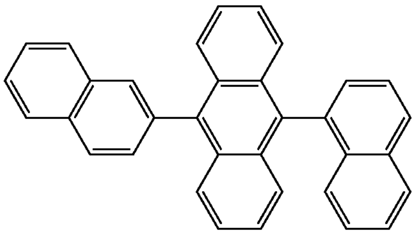

H3

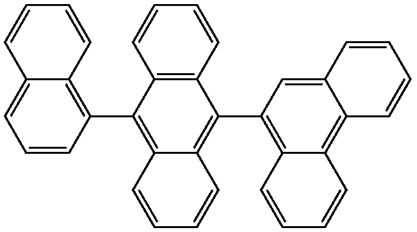

H4

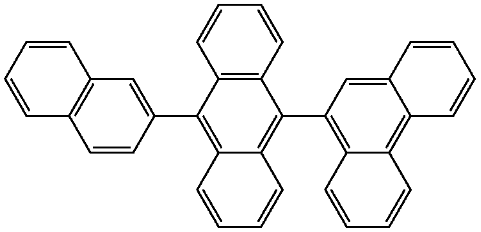

H5

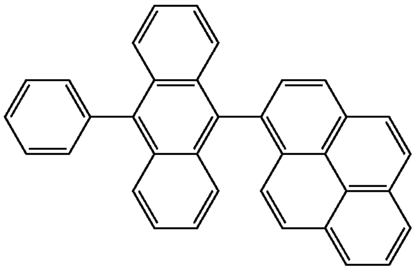

H6

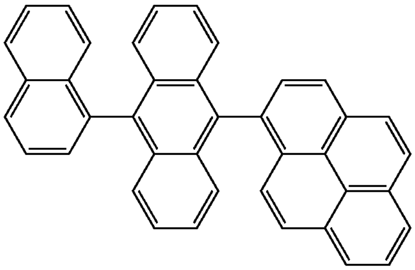

-continued
H7
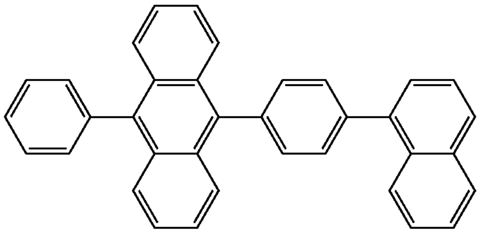
H8
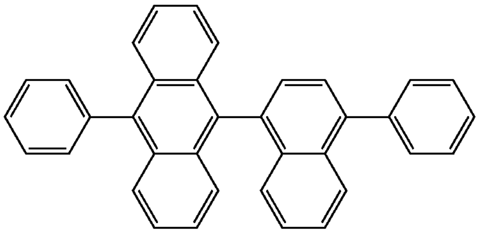
H9
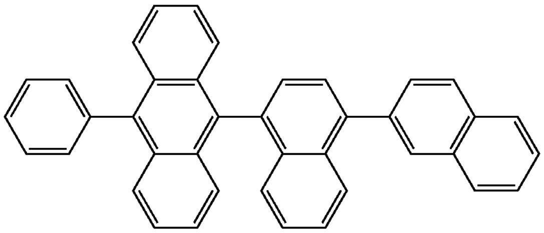
H10
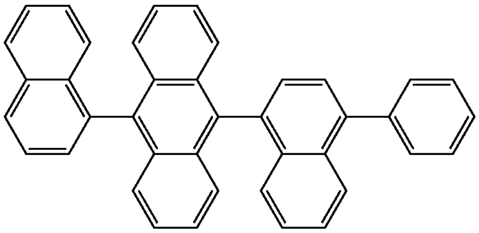
H11
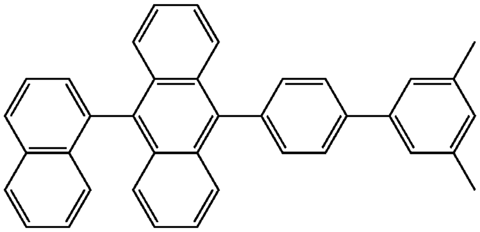
H12
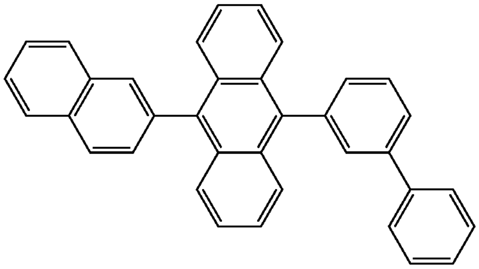
H13
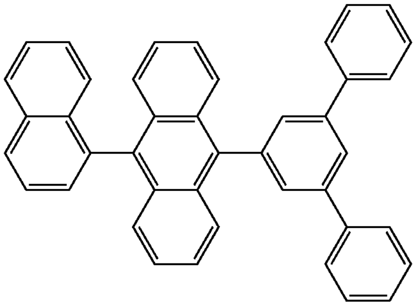
H14
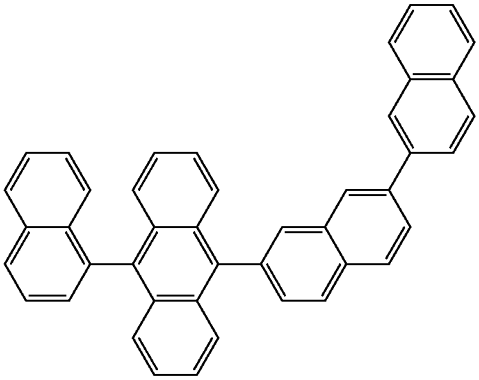
H15
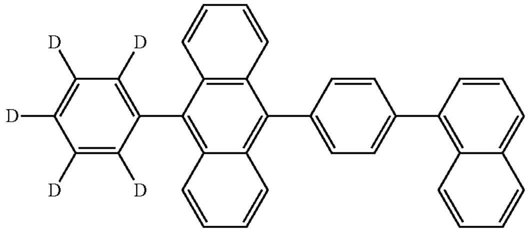
H16
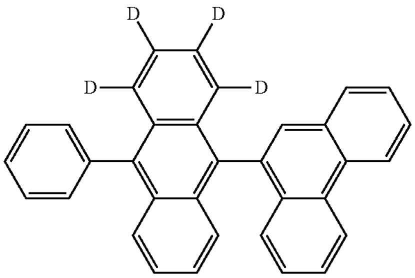

-continued
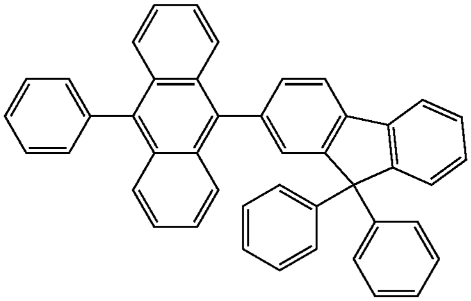
H17
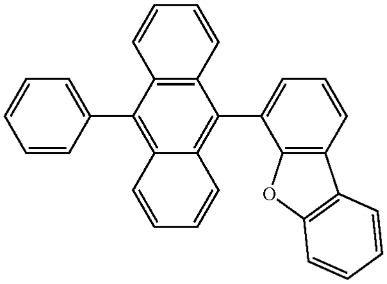
H18
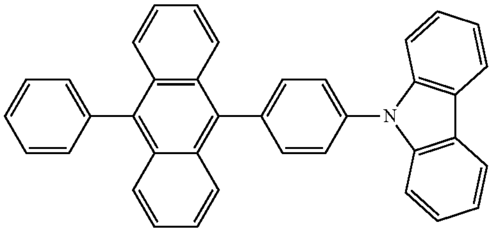
H19
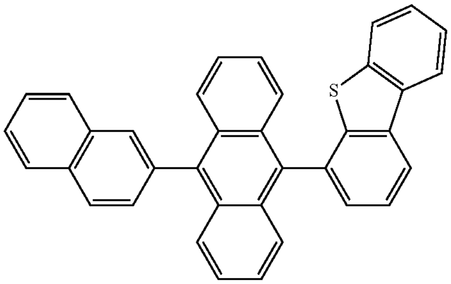
H20
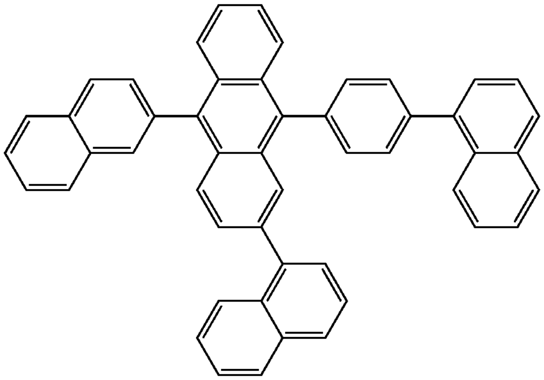
H21
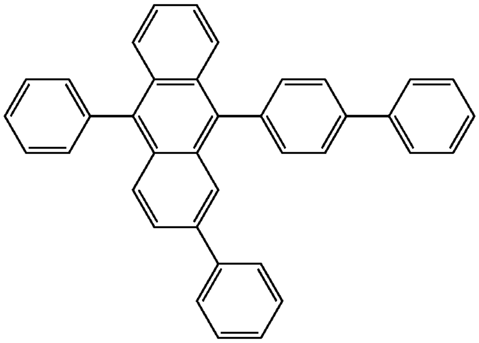
H22
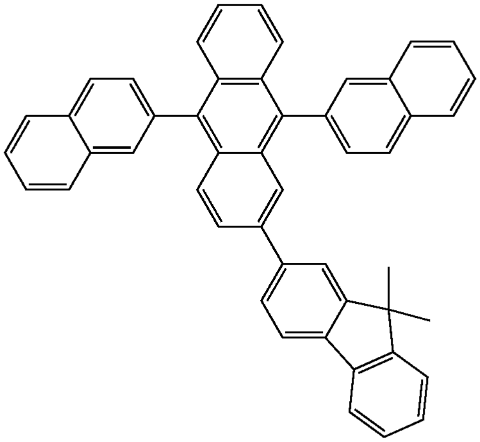
H23
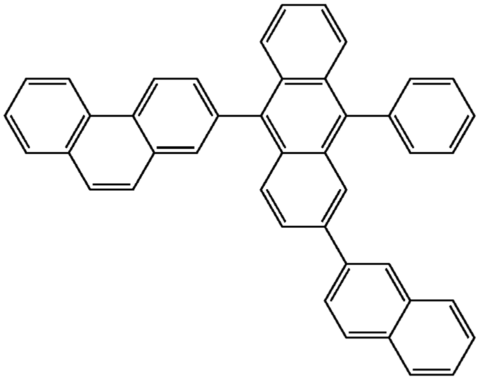
H24

-continued
H25
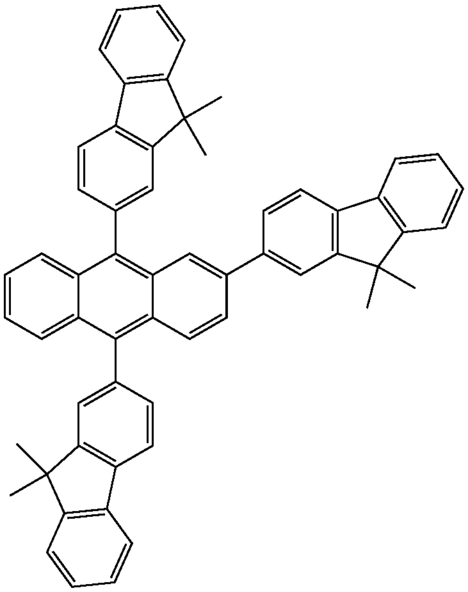
H26
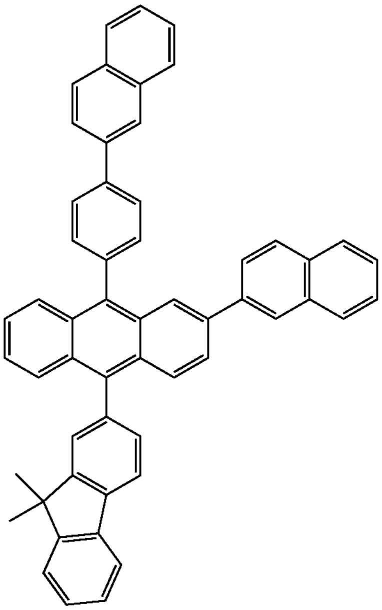
H27
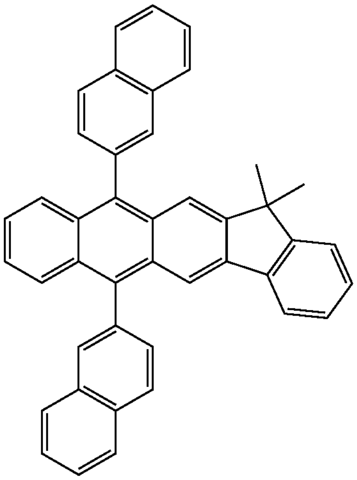
H28
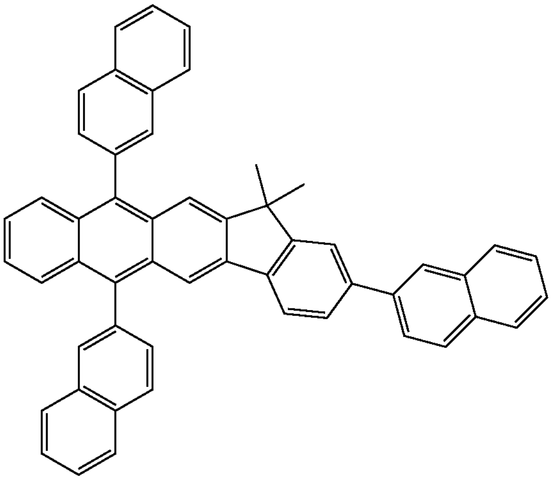
H29
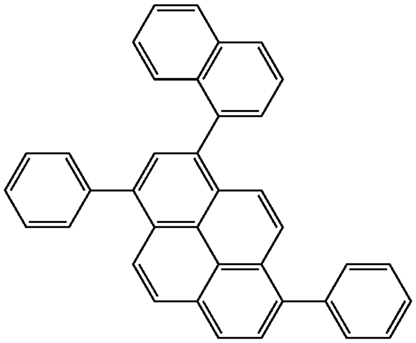
H30
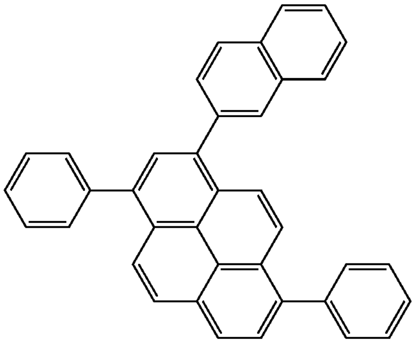

-continued
H31
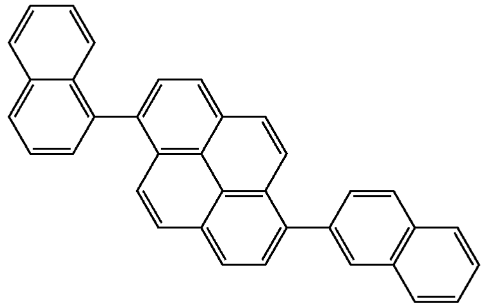
H32
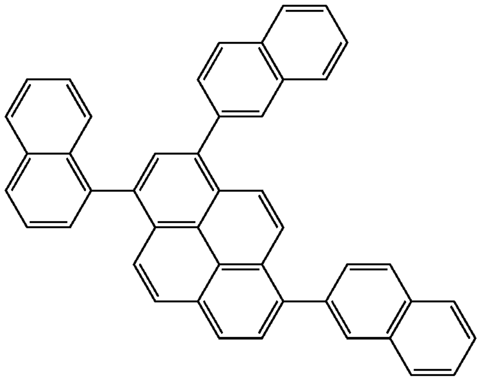
H33
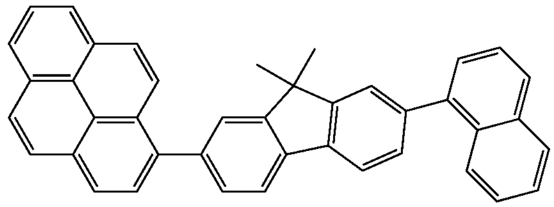
H34
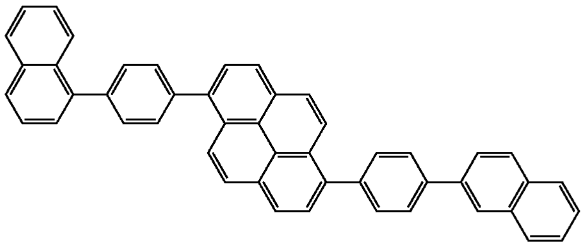
H35
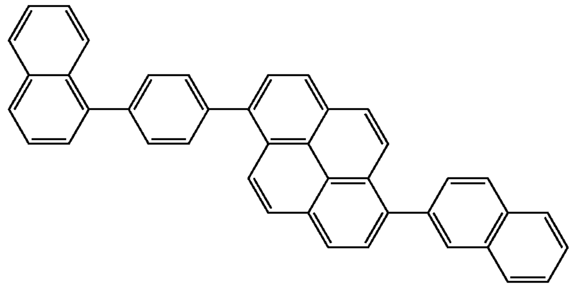
H36
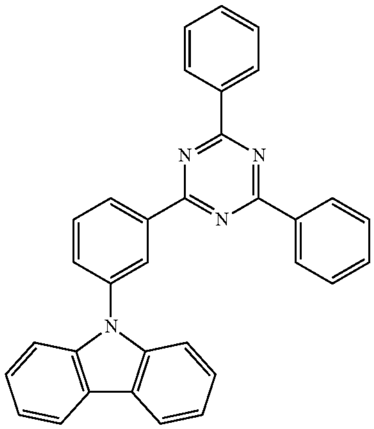
H37
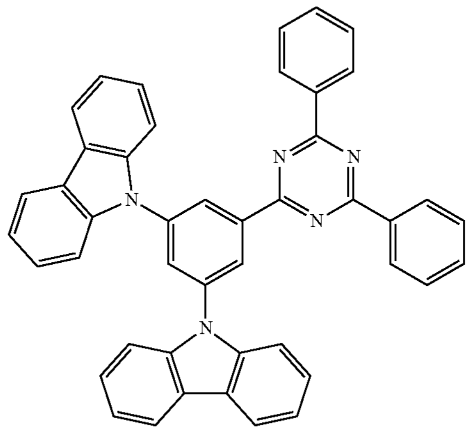
H38
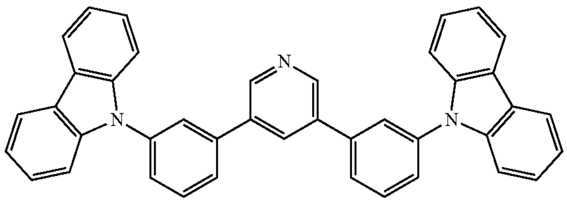

-continued
H39
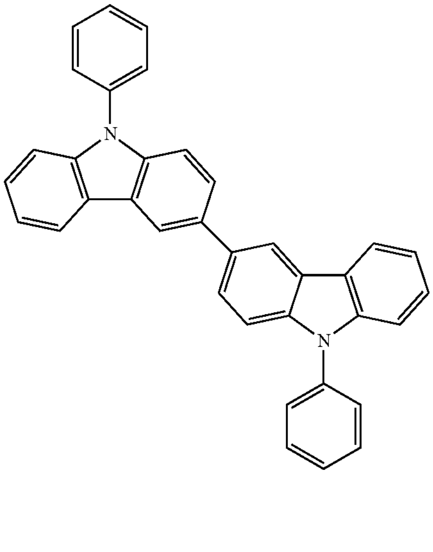
H40
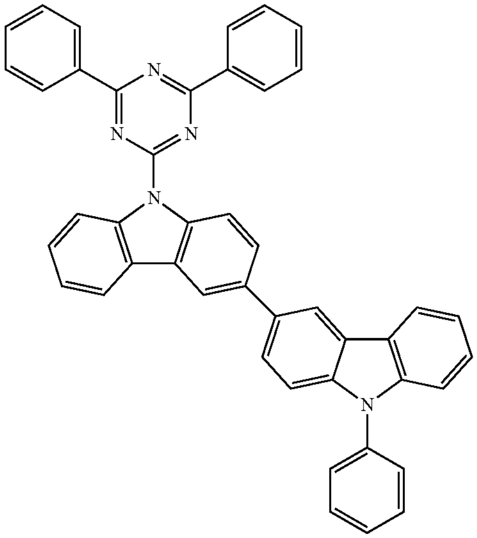
H41
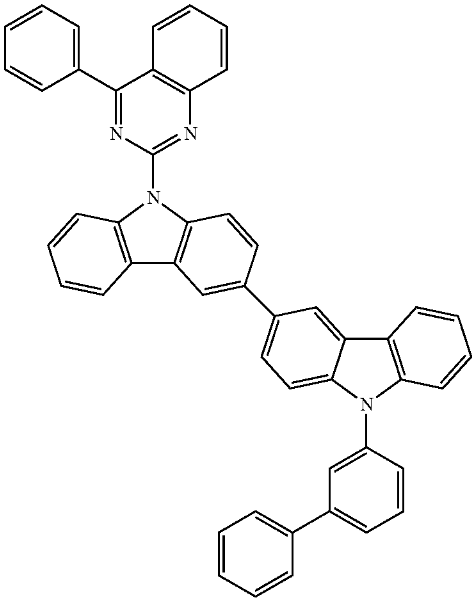
H42
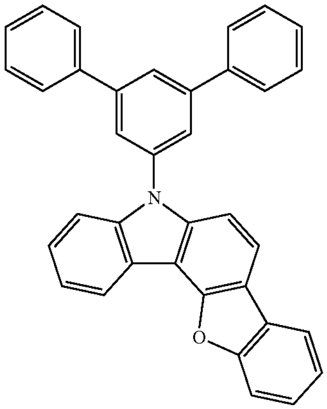
H43
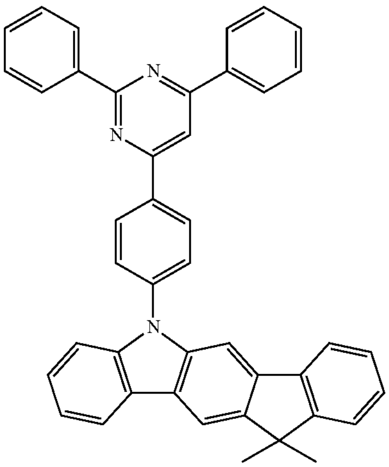
H44
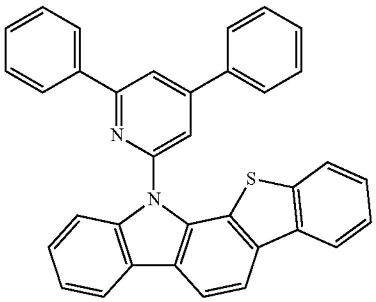

-continued
H45
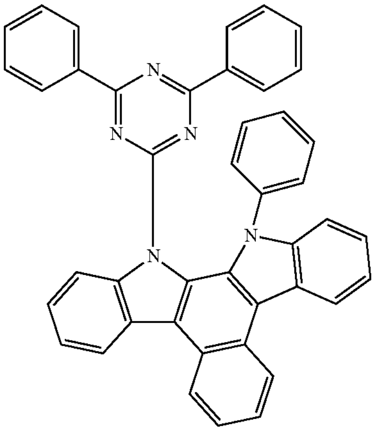
H46
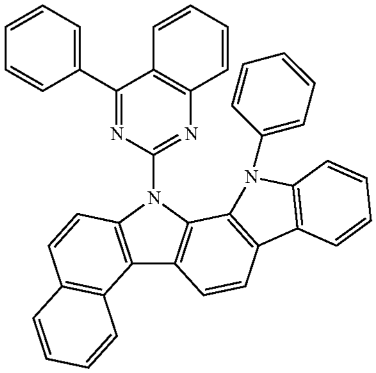
H47
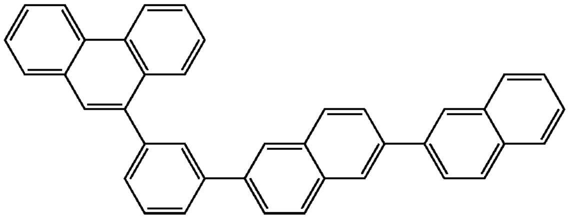
H48
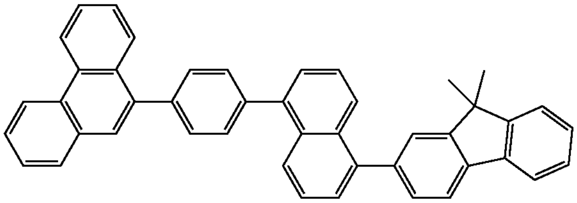
H49
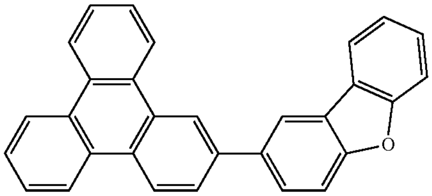
H50
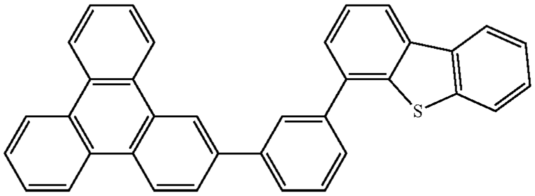
H51
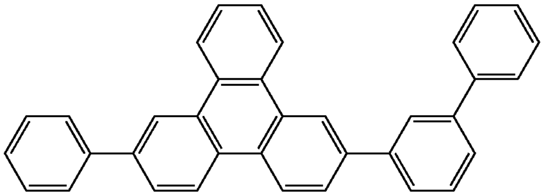
H52
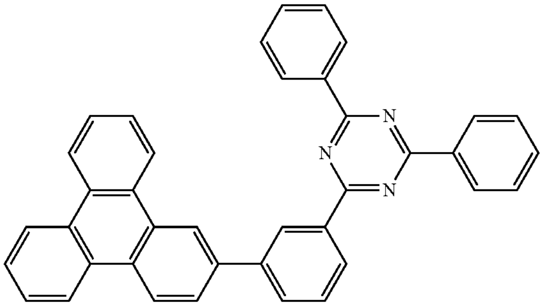
H53
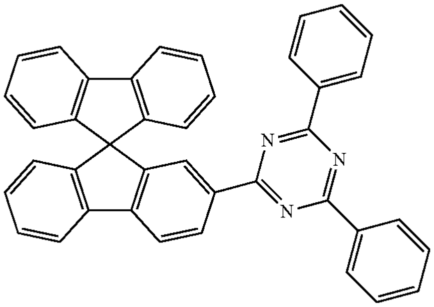
H54
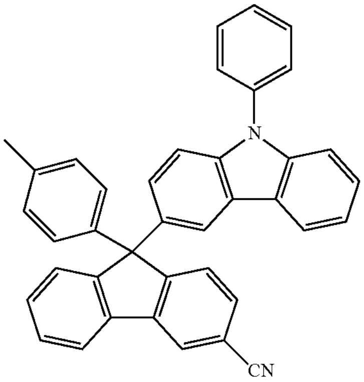

-continued
H55
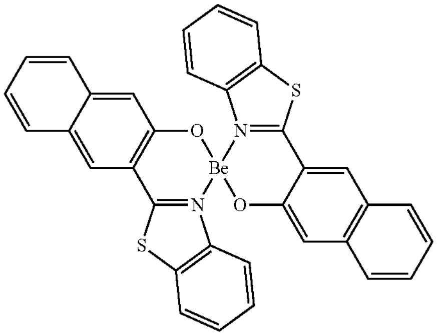
H56
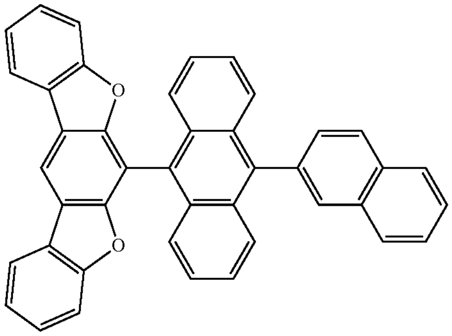
H57
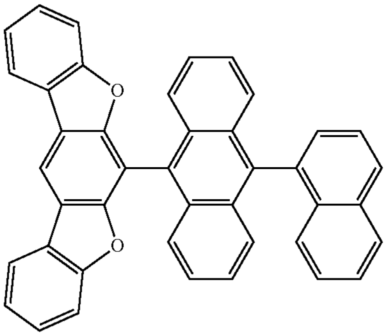
H58
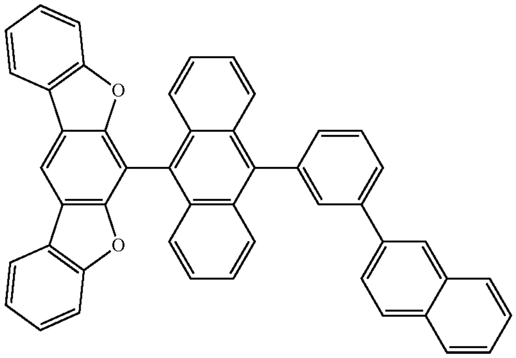
H59
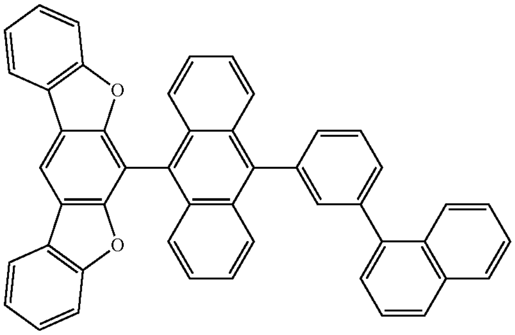
H60
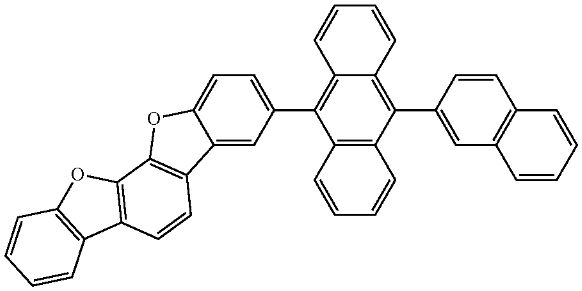
H61
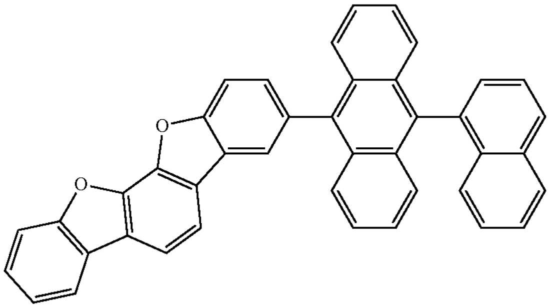
H62
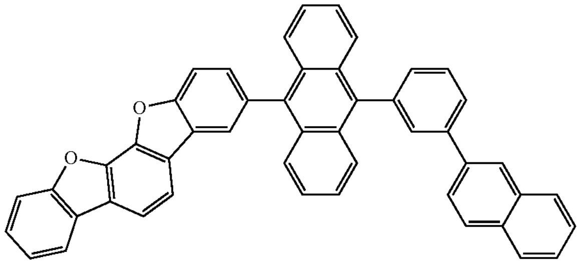

-continued
H63
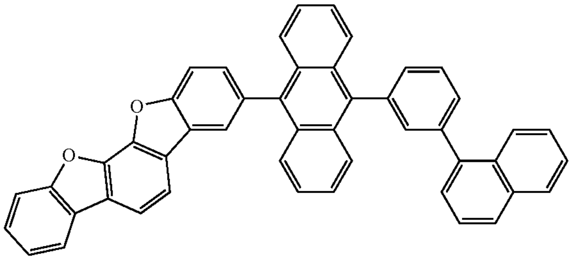
H64
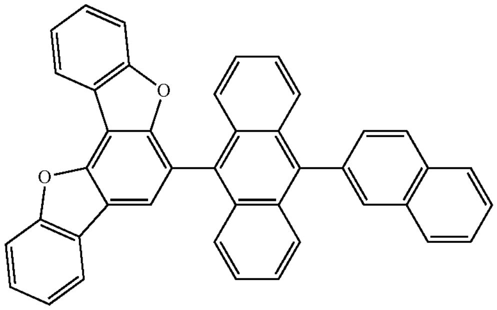
H65
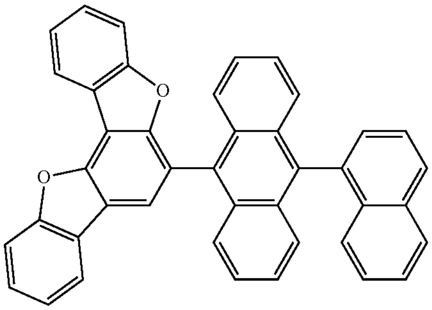
H66
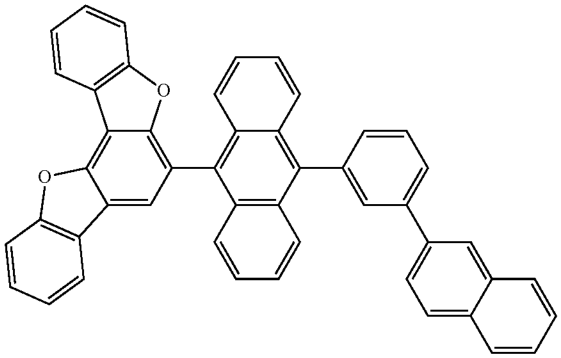
H67
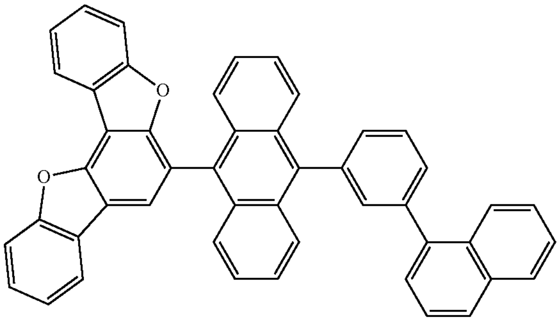
H68
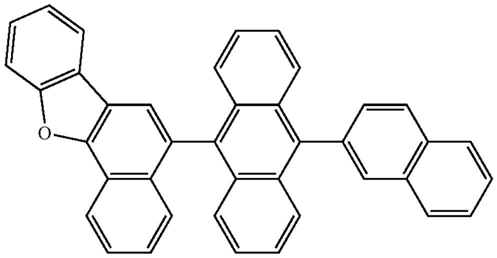
H69
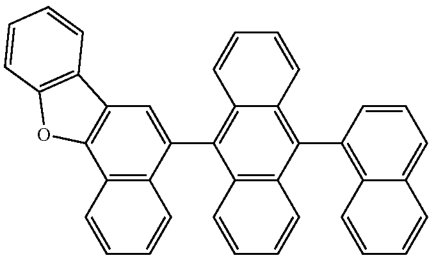
H70
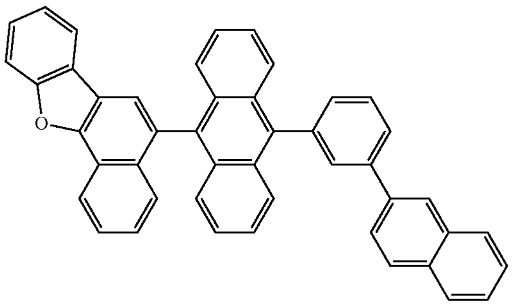

-continued
H71
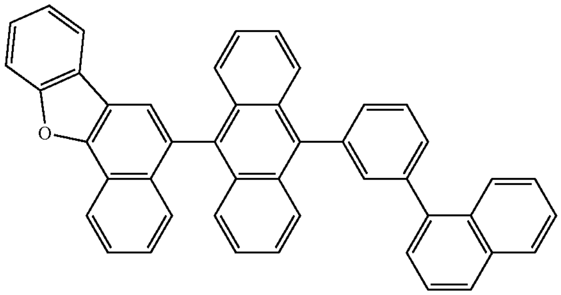
H72
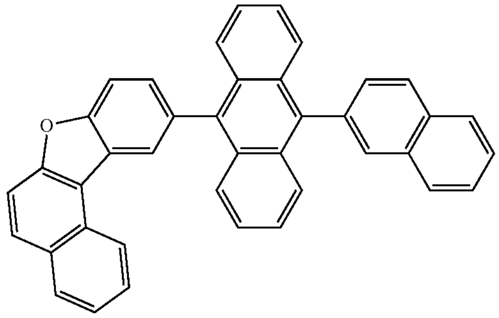
H73
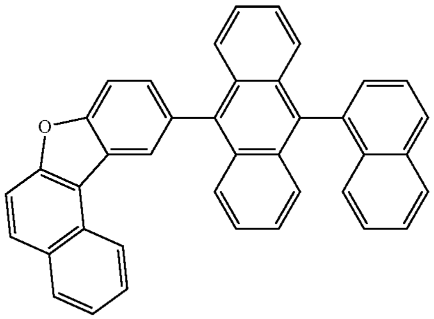
H74
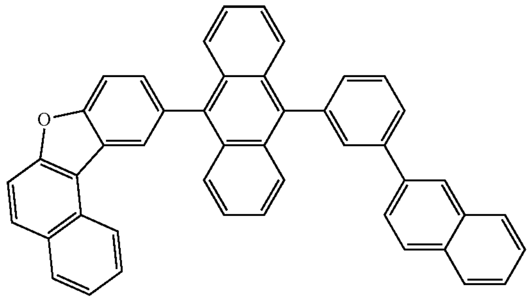
H75
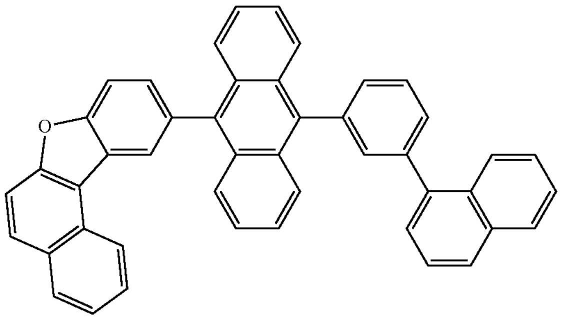
H76
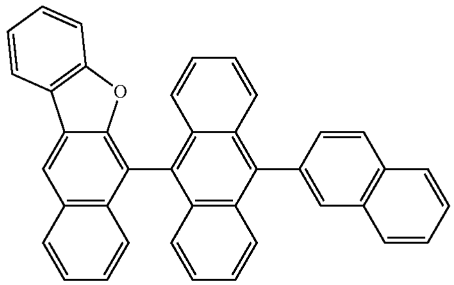
H77
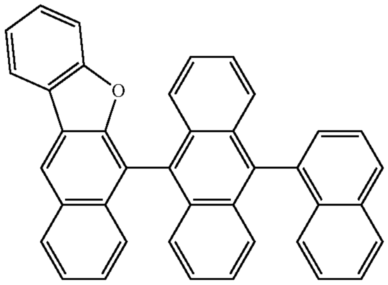
H78
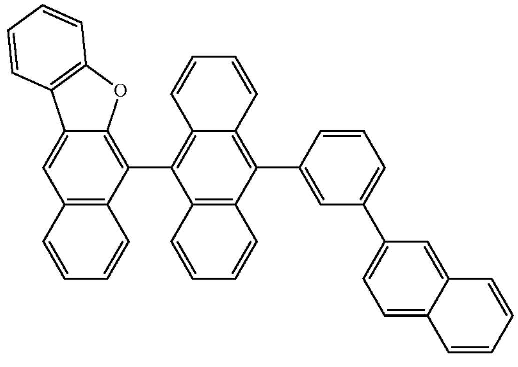

-continued
H79
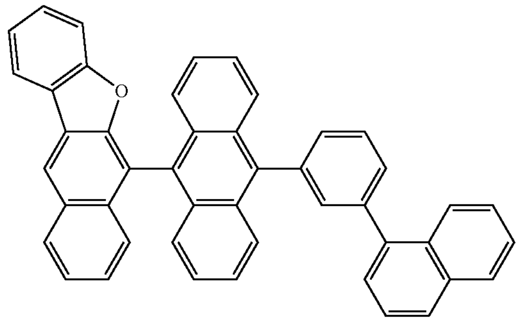
H80
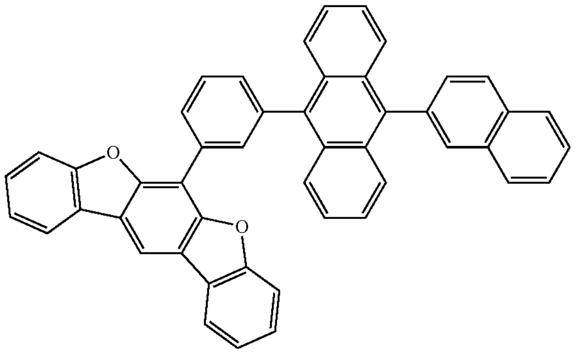
H81
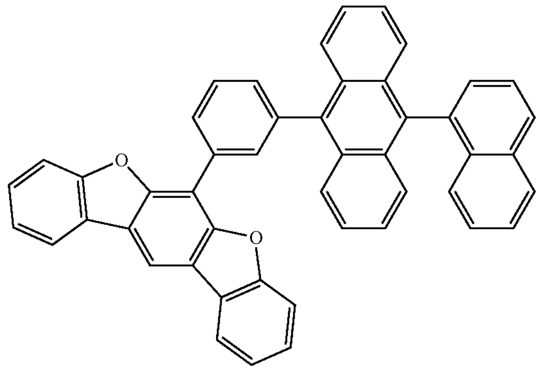
H82
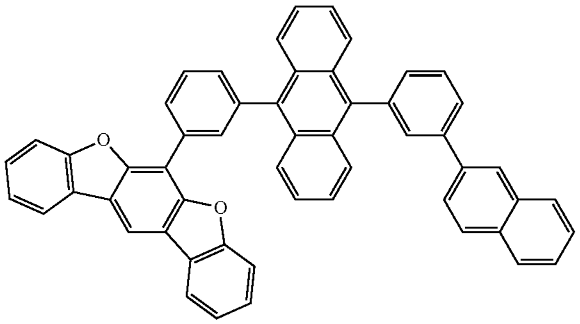
H83
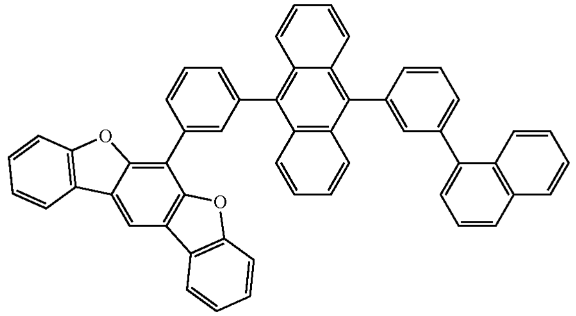
H84
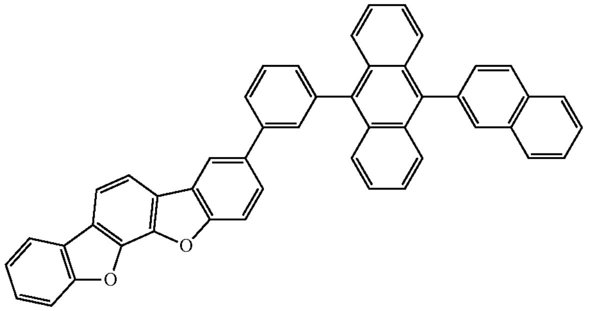
H85
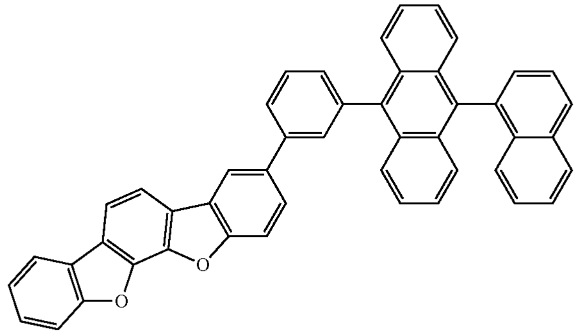
H86
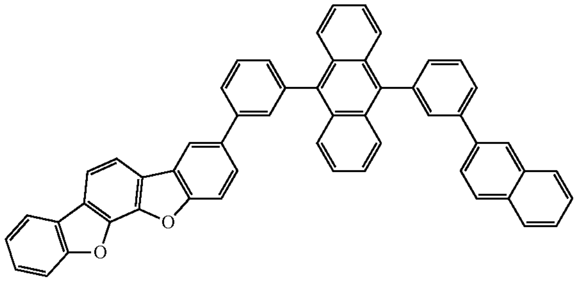

-continued
H87
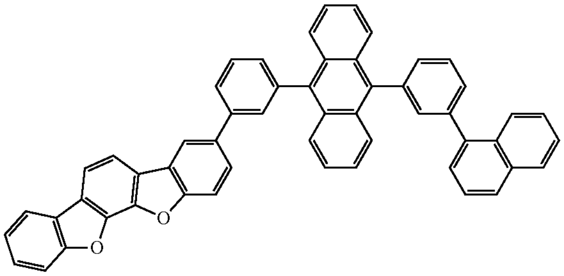
H88
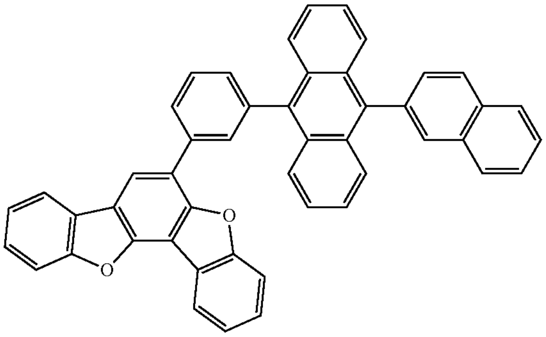
H89
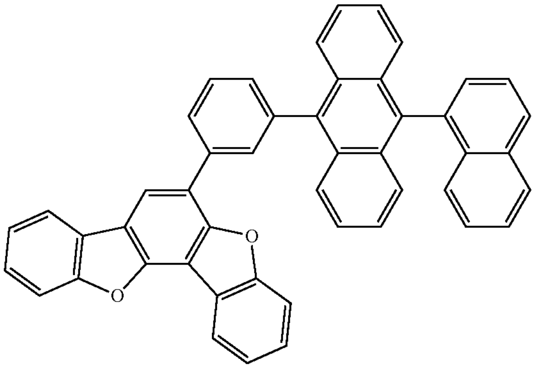
H90
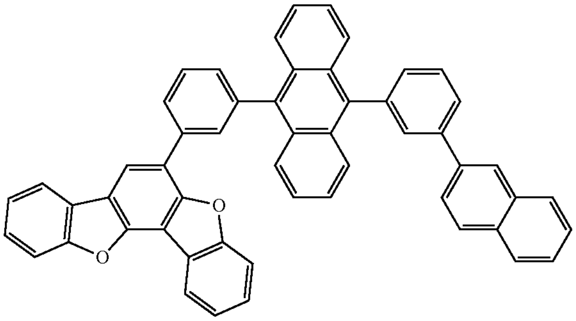
H91
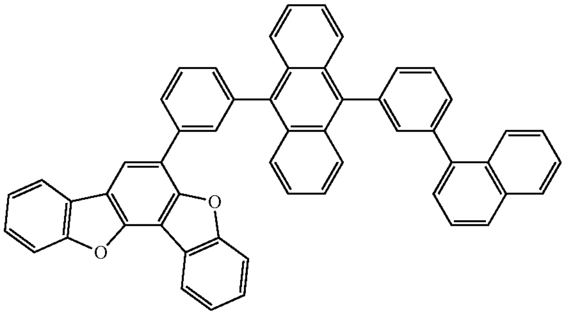
H92
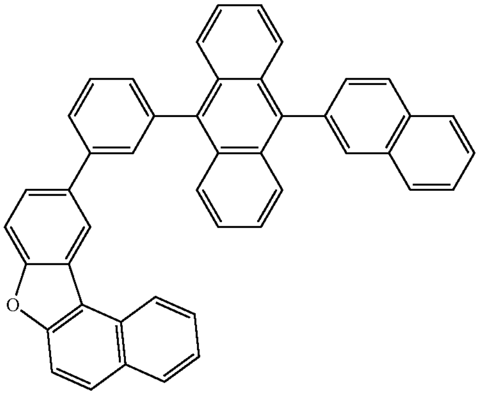
H93
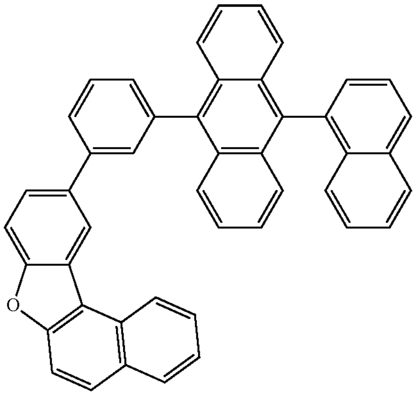
H94
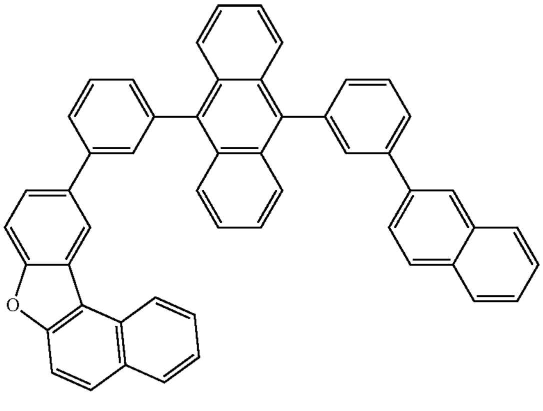

-continued
H95
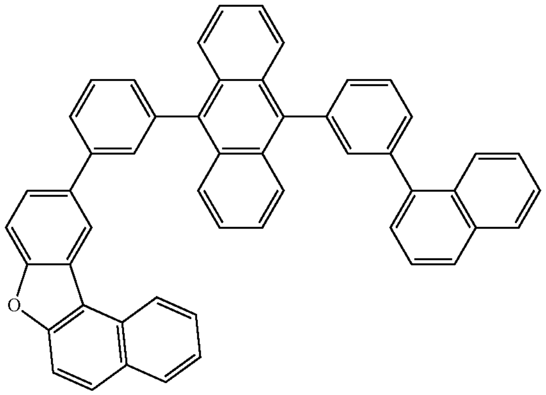
H96
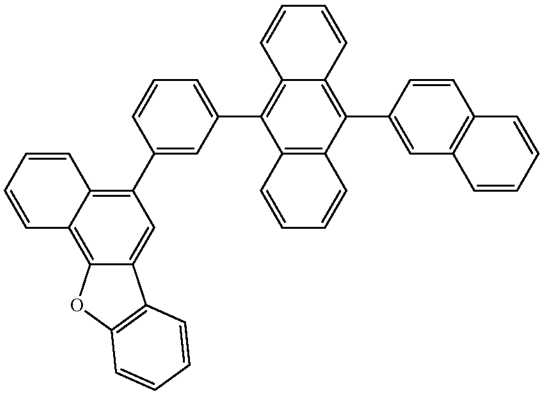
H97
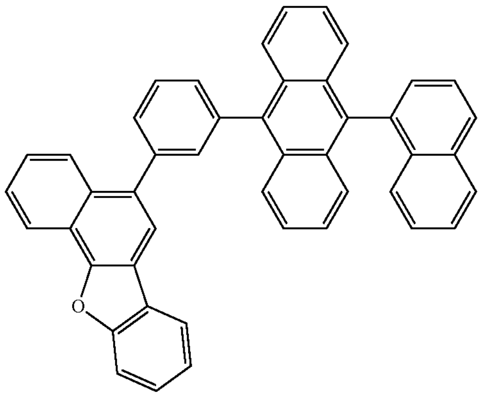
H98
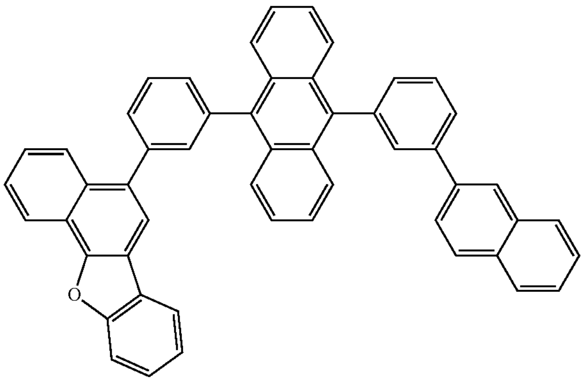
H99
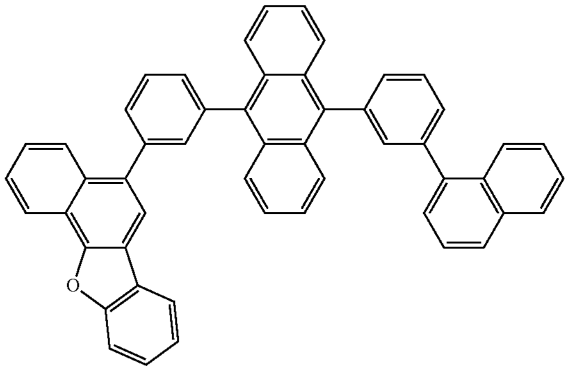
H100
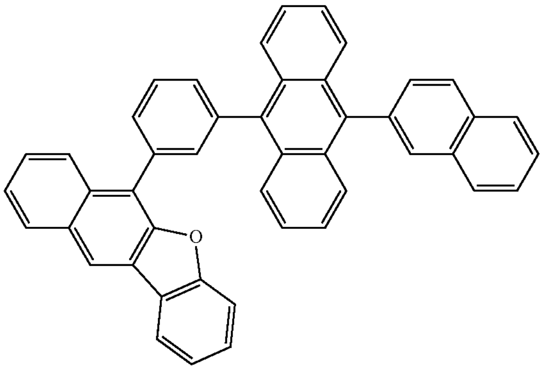
H101
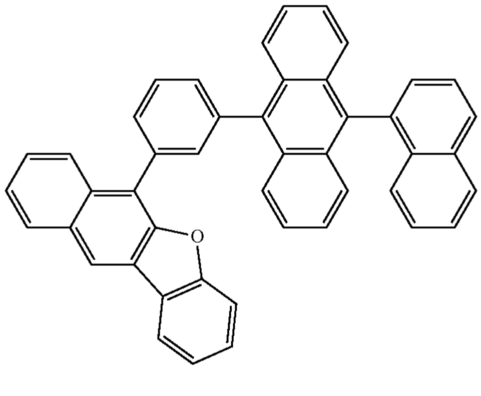
H102
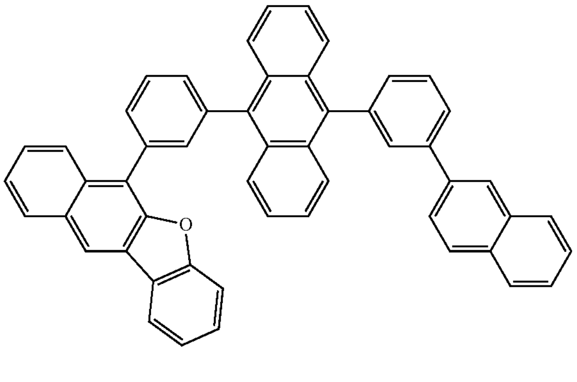

-continued
H103
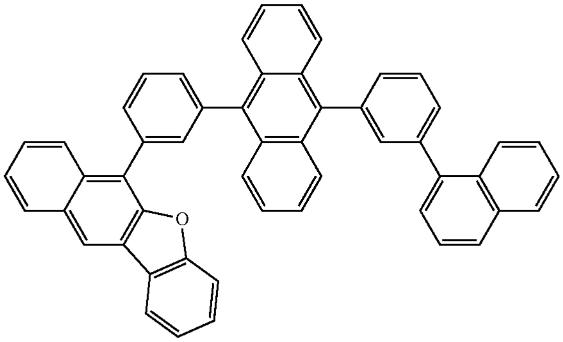
H104
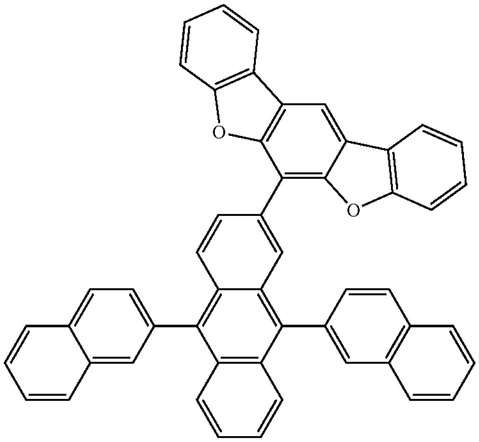
H105
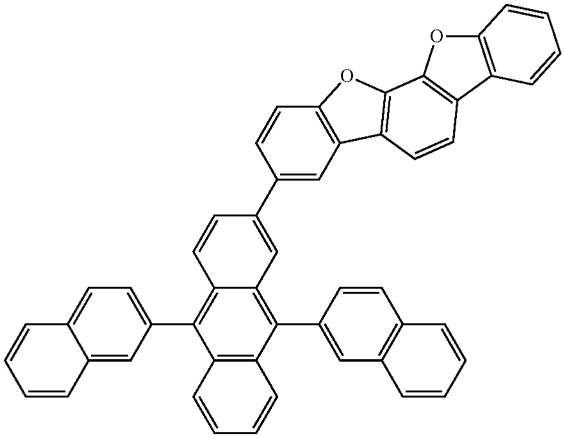
H106
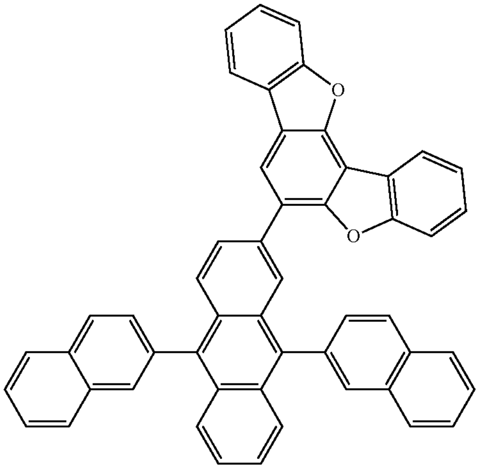
H107
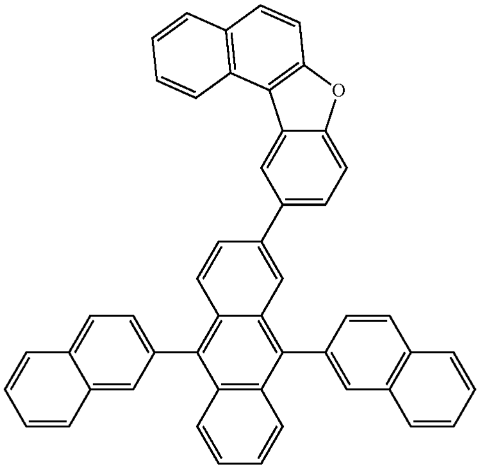
H108
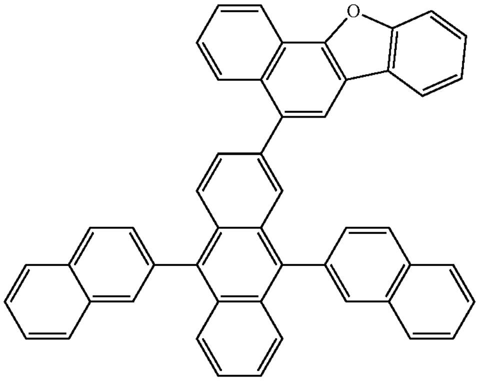

-continued
H109
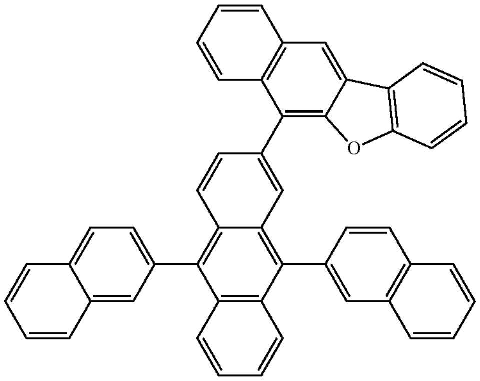
H110
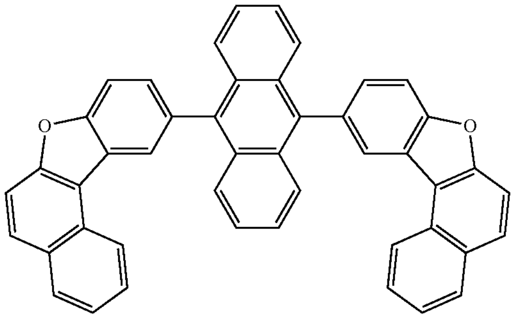
H111
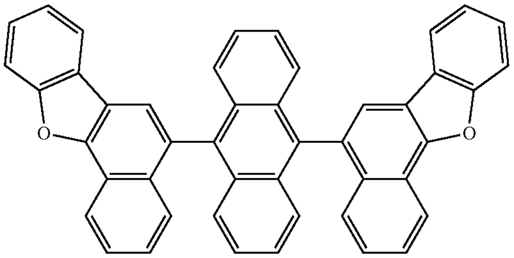
H112
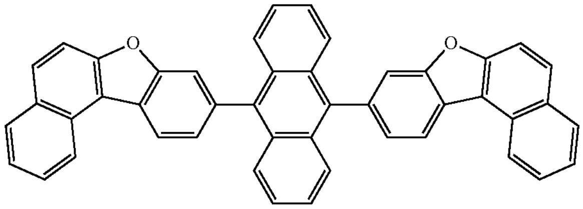
H113
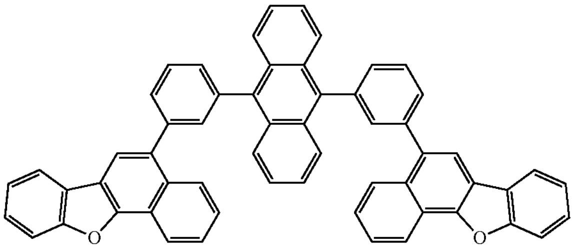
H114
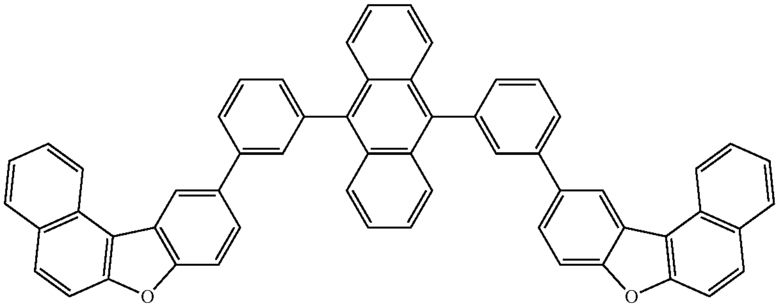

-continued
H115
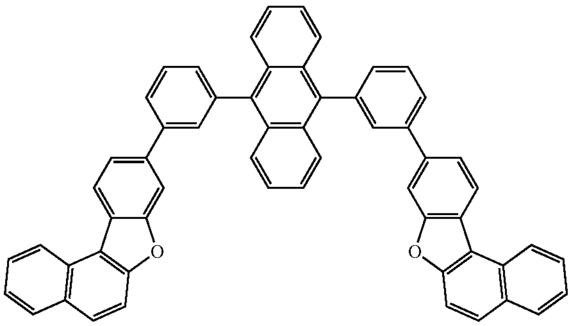
H116
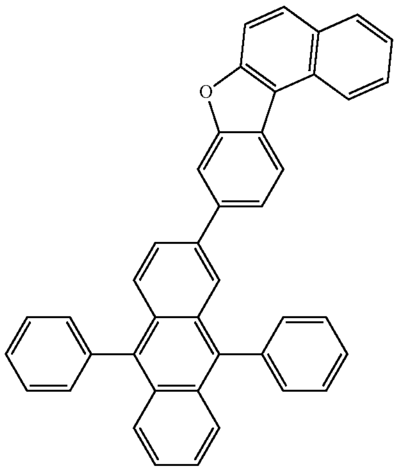
H117
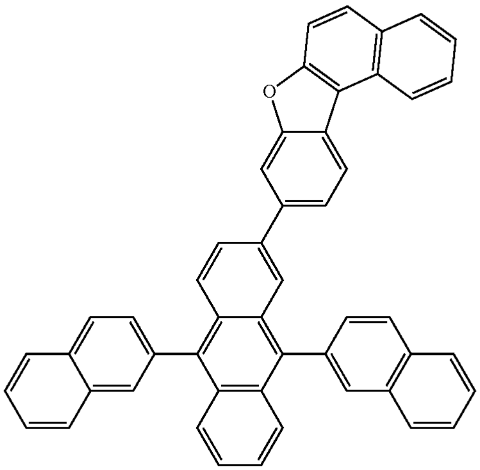
H118
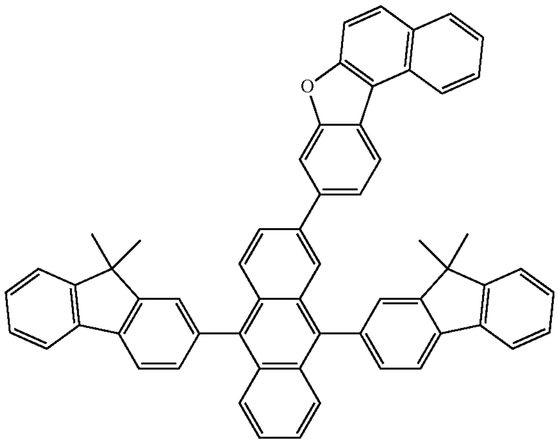
H119
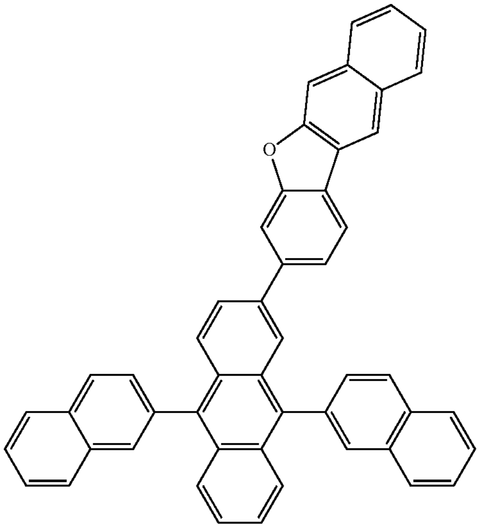
H120
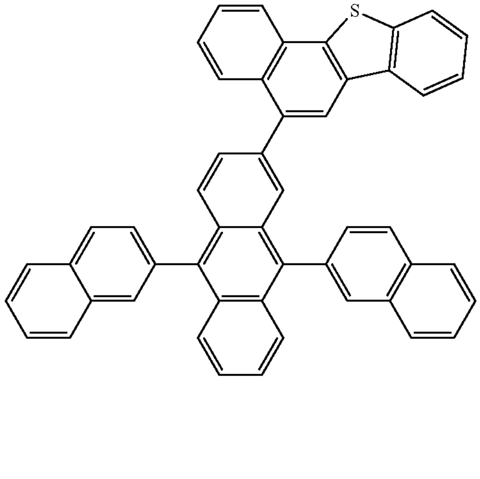

-continued

H121

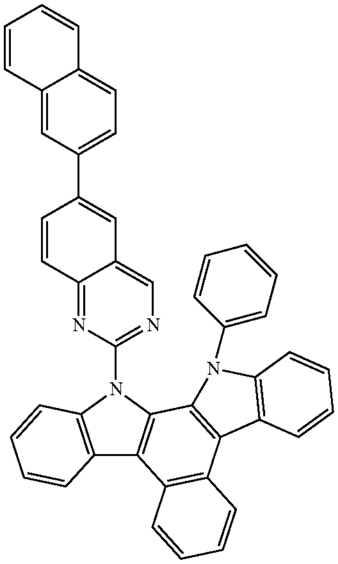

H122

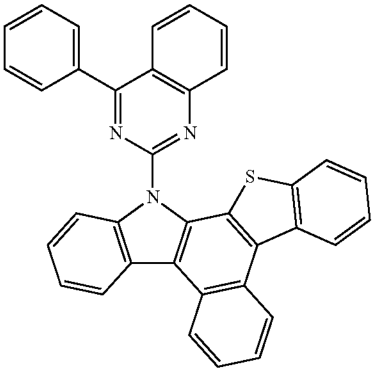

H123

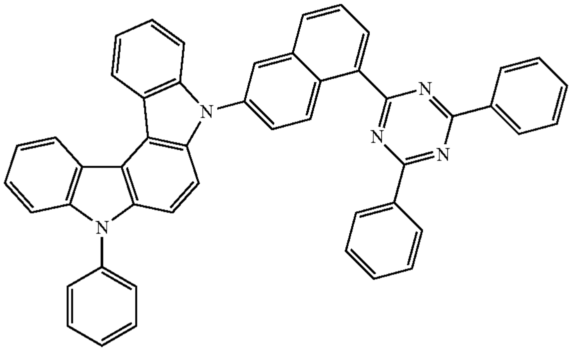

H124

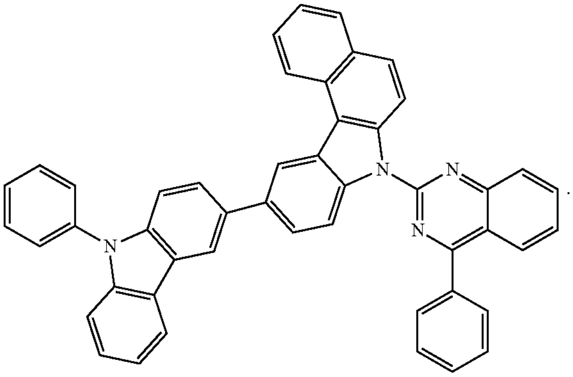

[Phosphorescent Dopant]

In one or more embodiments, the phosphorescent dopant may include at least one transition metal as a central metal.

In some embodiments, the phosphorescent dopant may include a monodentate ligand, a bidentate ligand, a tridentate ligand, a tetradentate ligand, a pentadentate ligand, a hexadentate ligand, or any combination thereof.

In some embodiments, the phosphorescent dopant may be electrically neutral.

For example, in some embodiments, the phosphorescent dopant may include an organometallic compound represented by Formula 401:

Formula 401

$$M(L_{401})_{xc1}(L_{402})_{xc2}$$

-continued

Formula 402

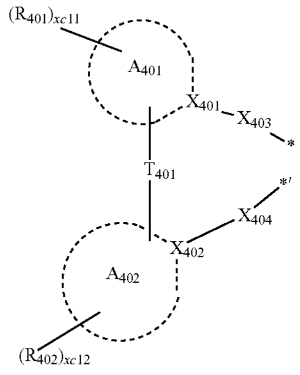

, wherein, in Formulae 401 and 402,

M may be a transition metal (for example, iridium (Ir), platinum (Pt), palladium (Pd), osmium (Os), titanium ($T_1$), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more $L_{401}$ (s) may be identical to or different from each other, $L_{402}$ may be an organic ligand, and xc2 may be 0, 1, 2, 3, or 4, and when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)*, *—C($Q_{411}$)($Q_{412}$)—*', *—C($Q_{411}$)═C($Q_{412}$)—*', *—C($Q_{411}$)═*', or *═C═*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described herein with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be the same as described herein with respect to $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$ (s) among two or more $L_{401}$ may optionally be bonded to each other via $T_{402}$, which is a linking group, and/or two ring $A_{402}$(s) among two or more $L_{401}$ may optionally be bonded to each other via $T_{403}$, which is a linking group (see Compounds PD1 to PD4 and PD7). $T_{402}$ and $T_{403}$ may each be the same as described herein with respect to $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.

In one or more embodiments, the phosphorescent dopant may include, for example, one selected from among compounds PD1 to PD39, or any combination thereof:

PD1

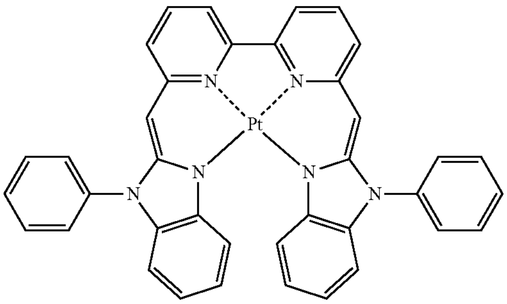

PD2

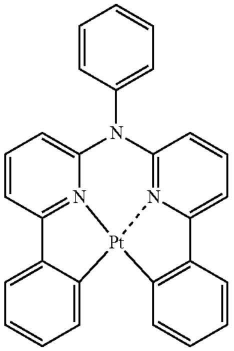

PD3

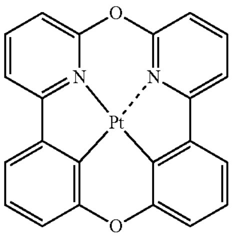

PD4

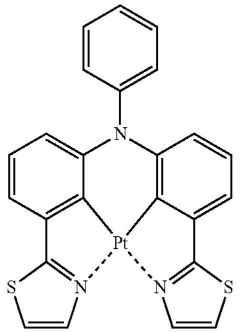

PD5

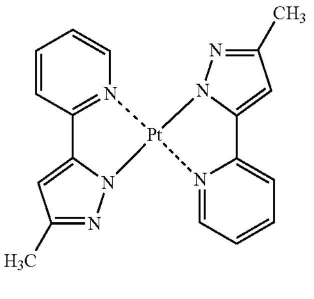

-continued
PD6
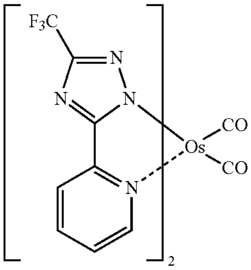
PD7
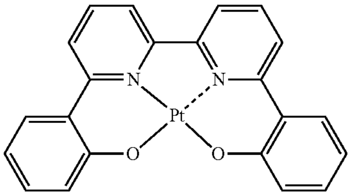
PD8
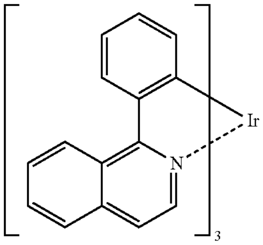
PD9
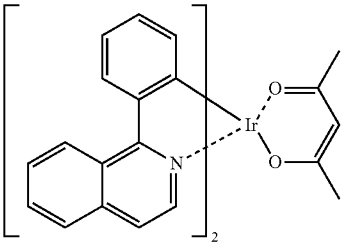
PD10
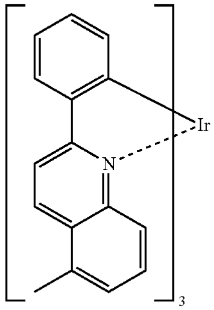
PD11
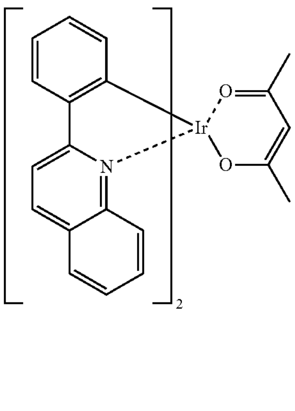
-continued
PD12
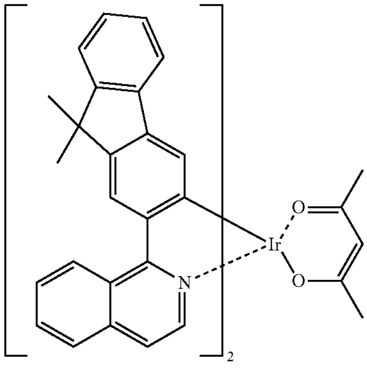
PD13
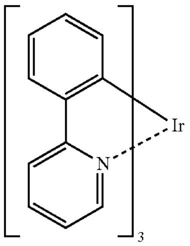
PD14
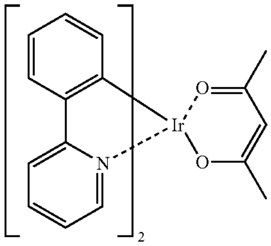
PD15
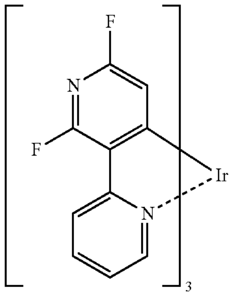
PD16
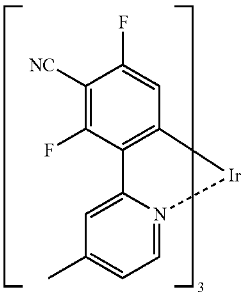

-continued
PD17
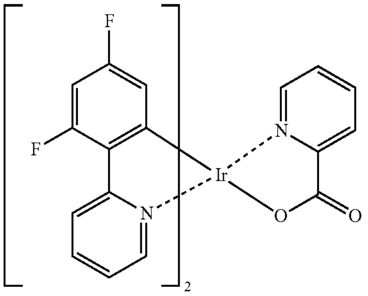
PD18
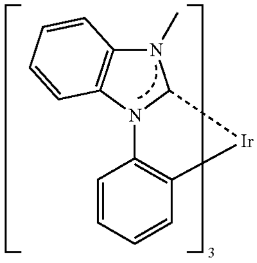
PD19
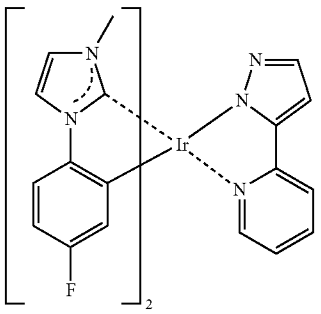
PD20
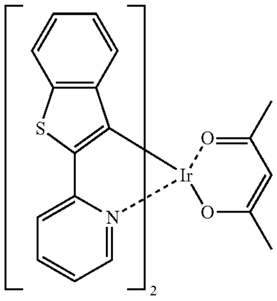
PD21
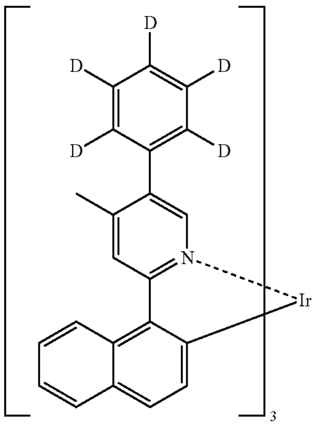
-continued
PD22
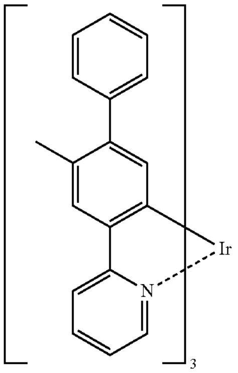
PD23
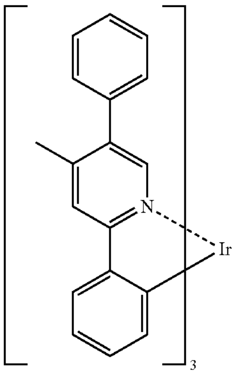
PD24
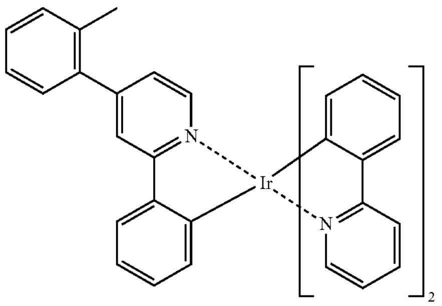
PD25
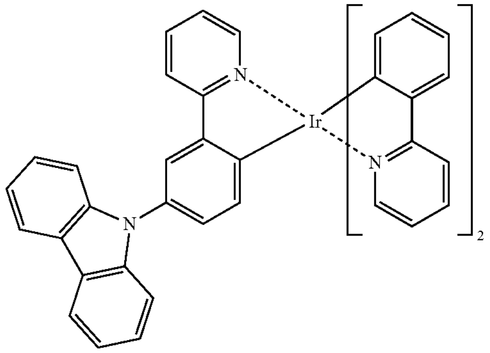

-continued
PD26
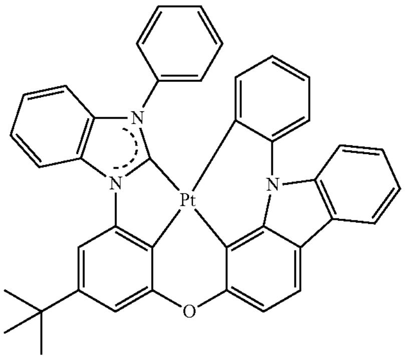
PD27
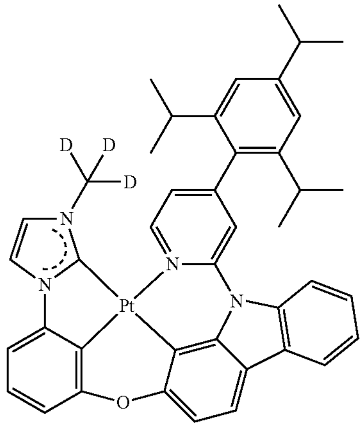
PD28
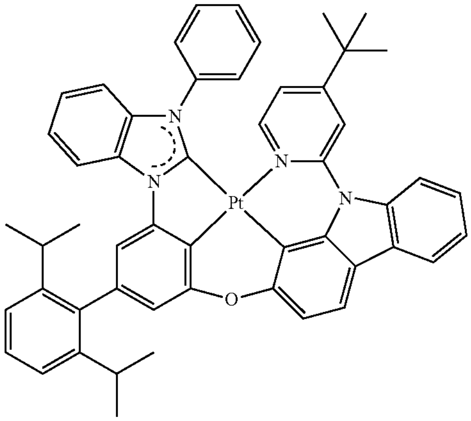
PD29
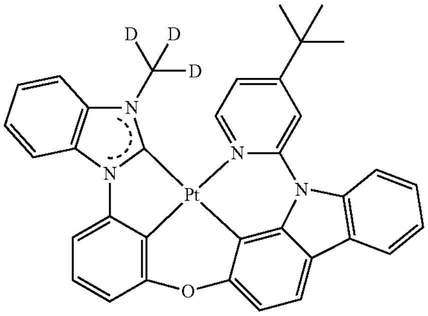
-continued
PD30
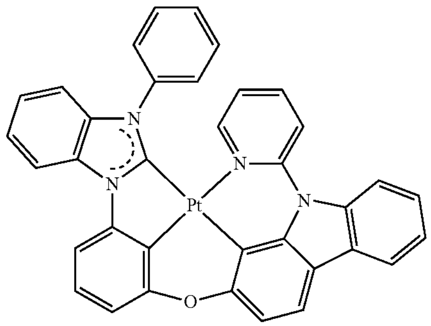
PD31
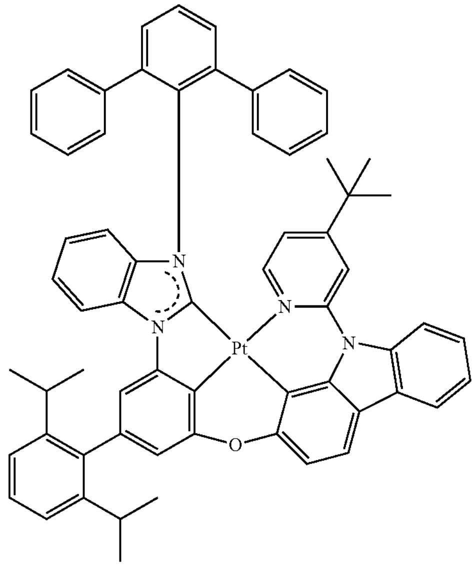
PD32
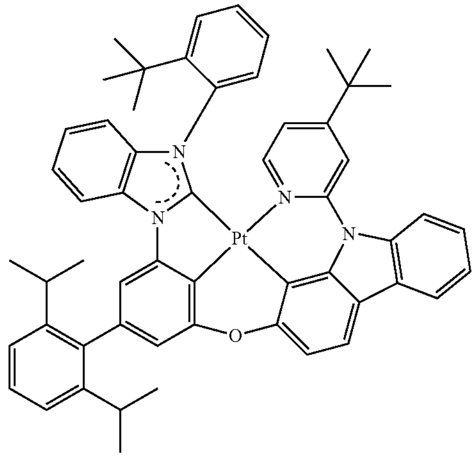

-continued
PD33
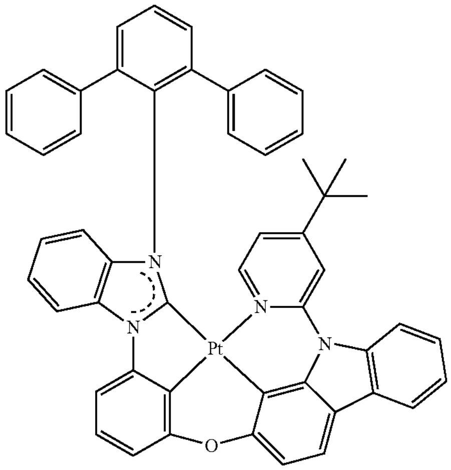
PD34
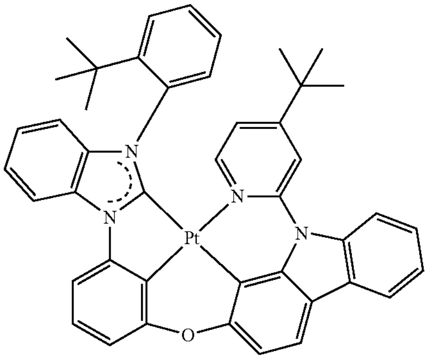
PD35
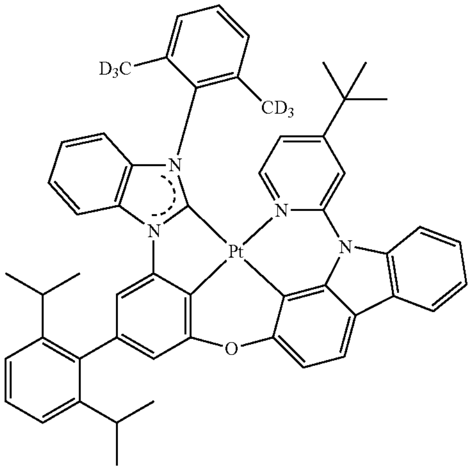
-continued
PD36
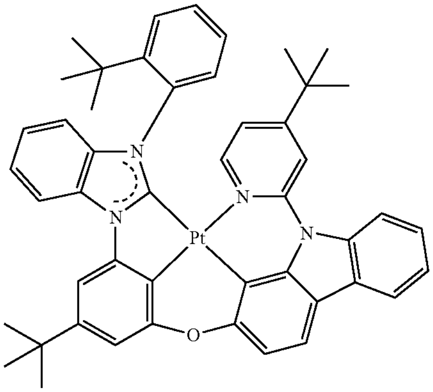
PD37
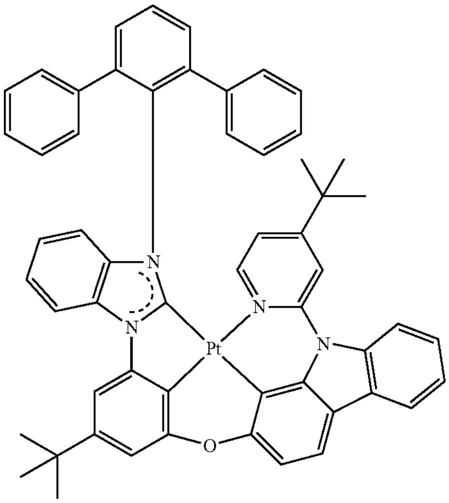
PD38
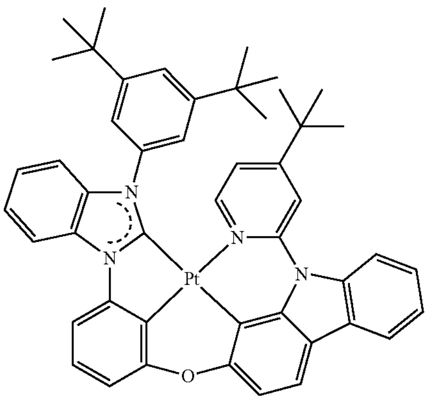

-continued

PD39

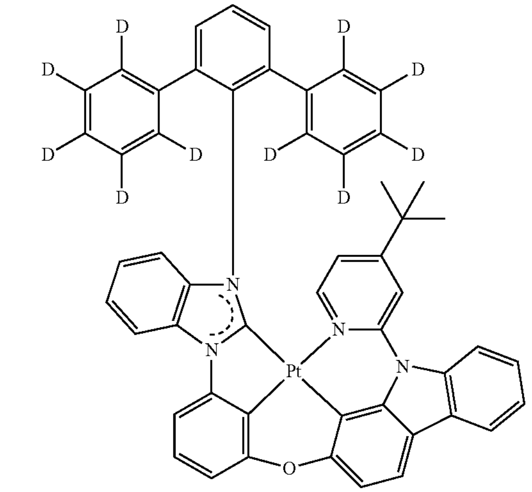

[Fluorescent Dopant]

In one or more embodiments, the fluorescent dopant may include an amine group-containing compound, a styryl group-containing compound, or any combination thereof.

For example, in some embodiments, the fluorescent dopant may include a compound represented by Formula 501:

Formula 501

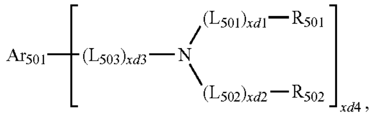

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, in some embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

For example, in some embodiments, the fluorescent dopant may include: one selected from among Compounds FD1 to FD36; 4,4'-bis(2,2-diphenylvinyl)-1,1'-biphenyl (DPVBi); 4,4'-bis[4-(di-phenylamino)styryl]biphenyl (DPAVBi); or any combination thereof:

FD1

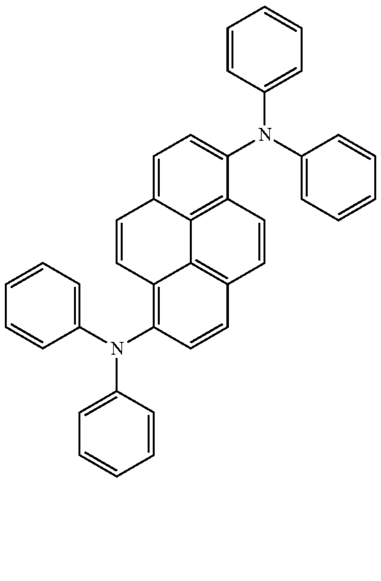

FD2

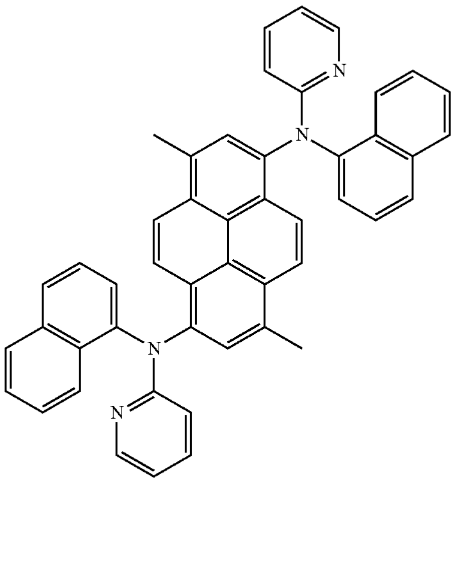

-continued
FD3
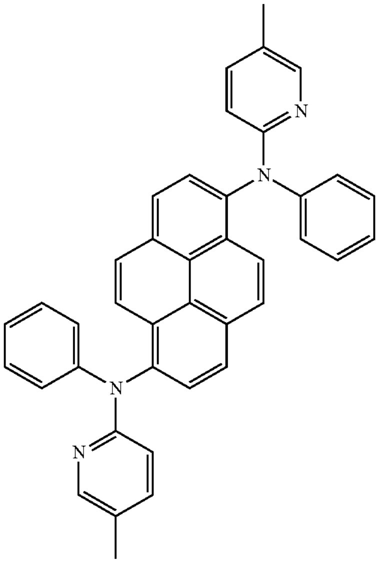
FD4
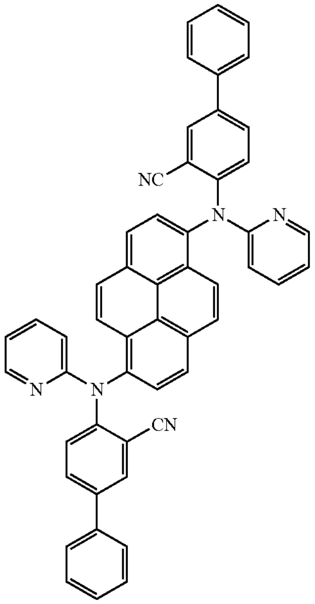
FD5
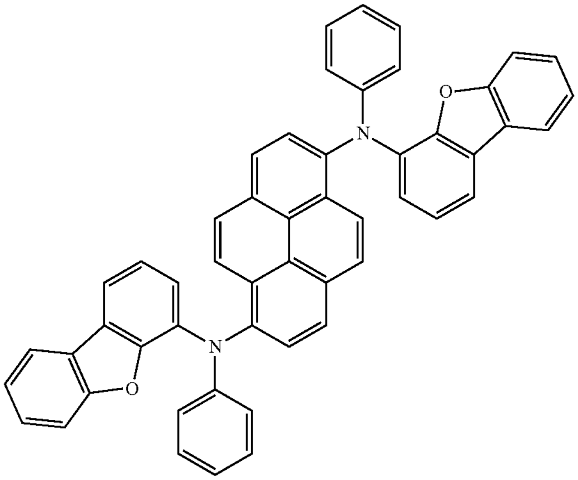
FD6
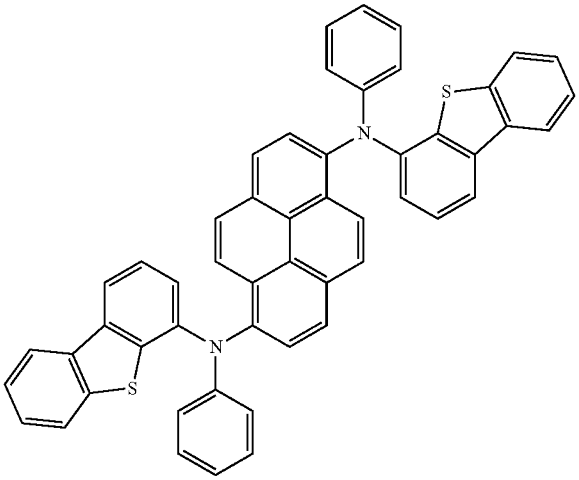

-continued
FD7
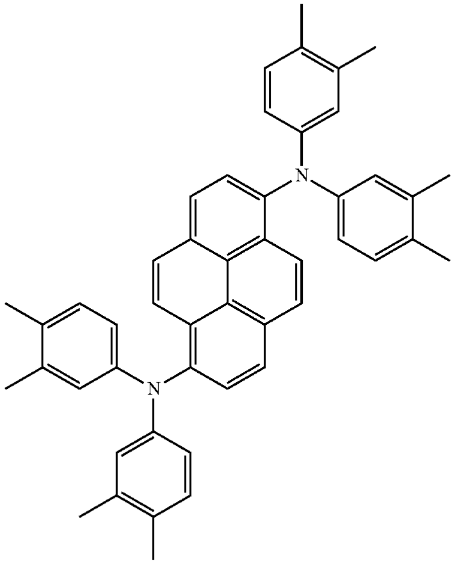
FD8
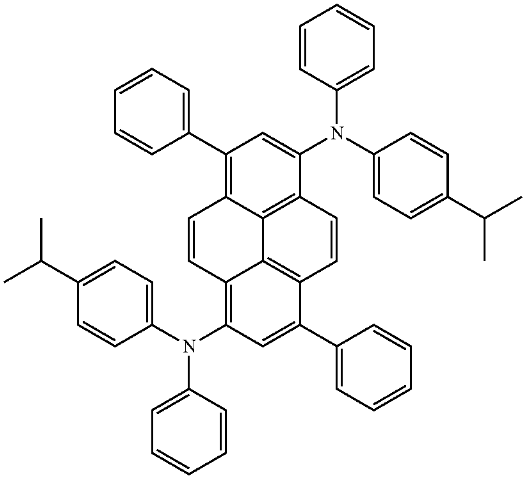
FD9
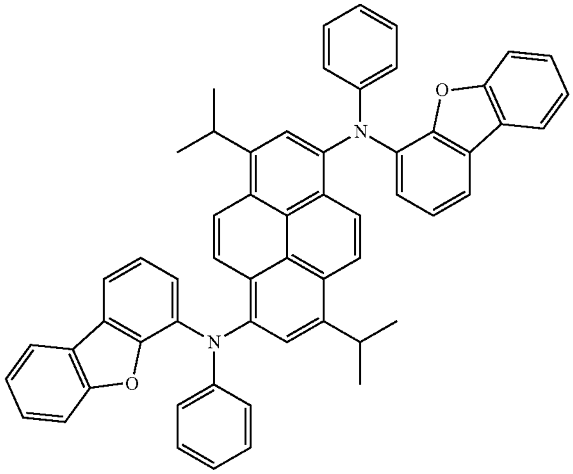
FD10
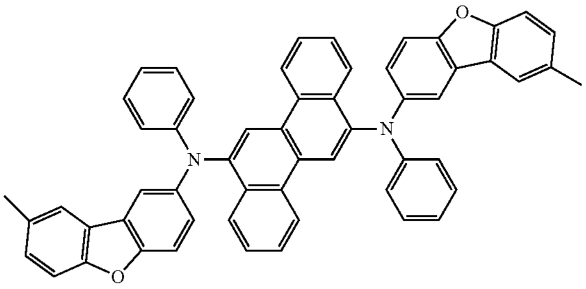
FD11
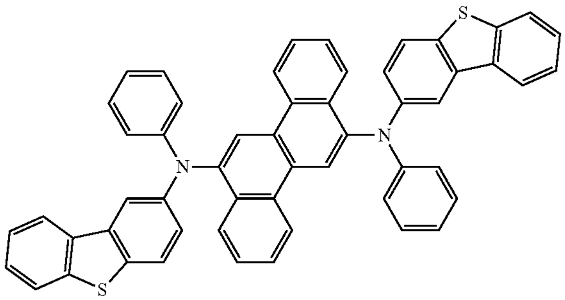
FD12
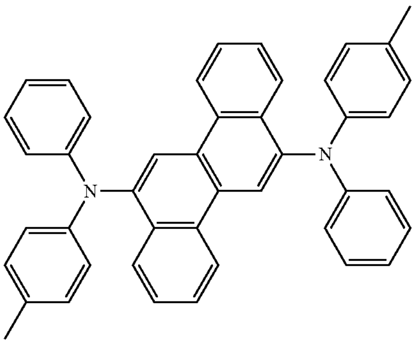

-continued
FD13
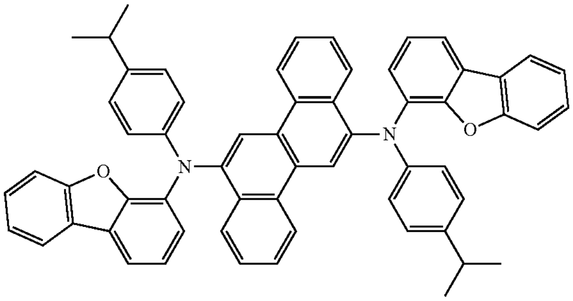
FD14
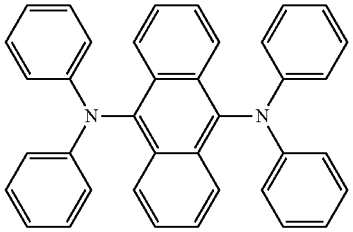
FD15
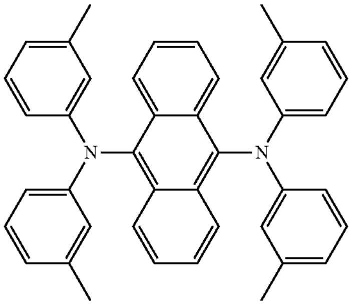
FD16
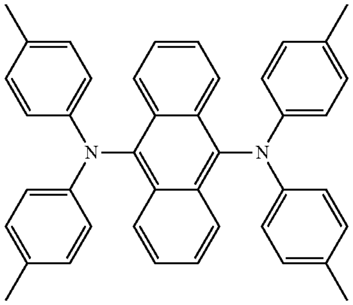
FD17
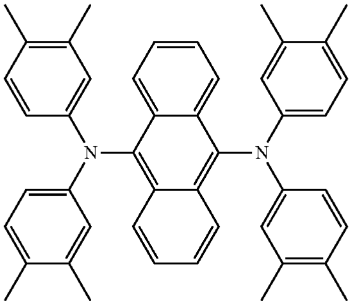
FD18
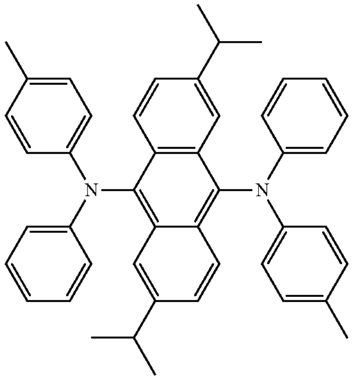
FD19
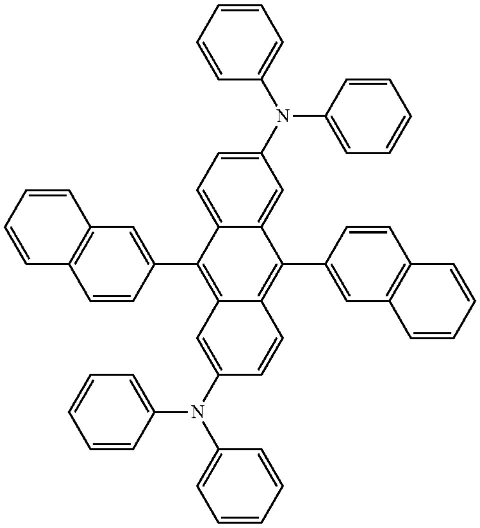
FD20
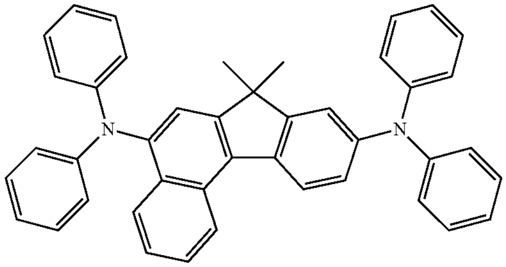

-continued
FD21
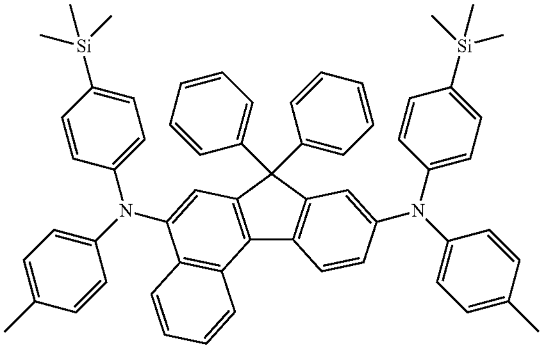
FD22
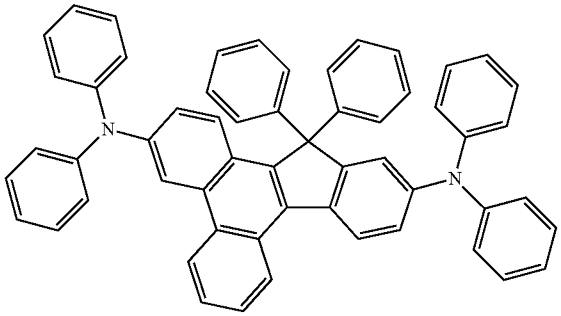
FD23
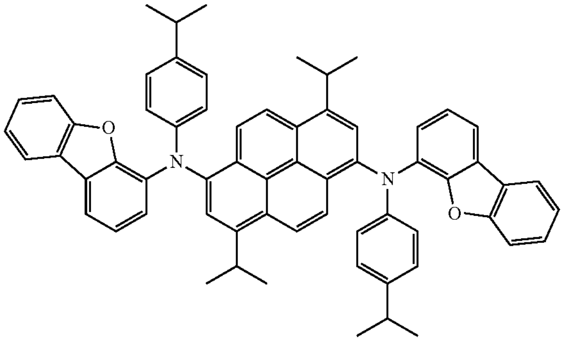
FD24
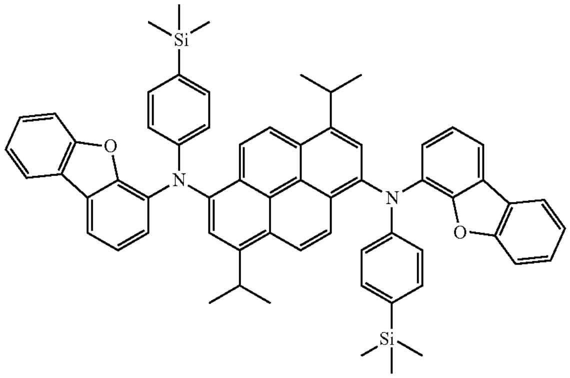
FD25
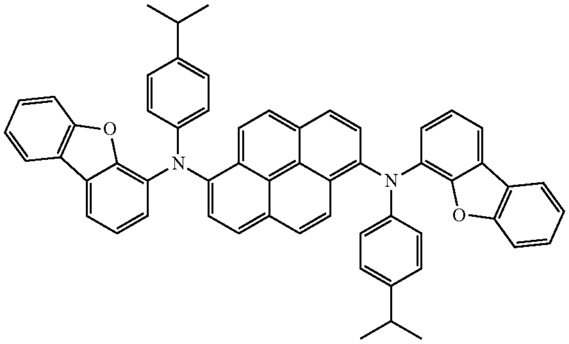
FD26
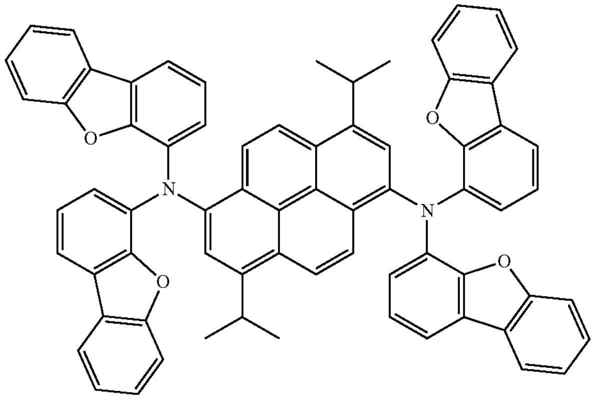
FD27
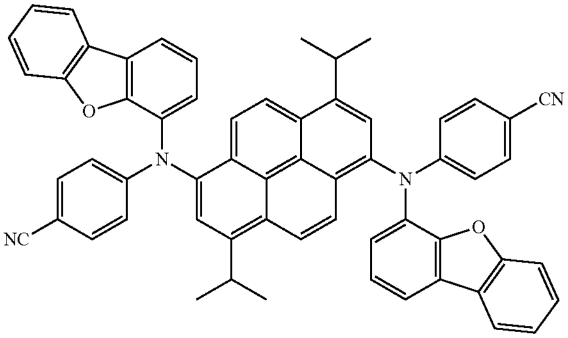
FD28
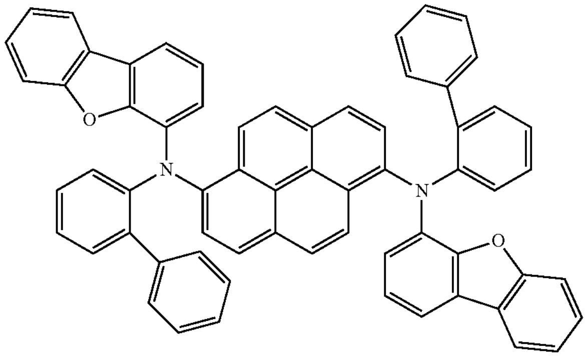

-continued
FD29
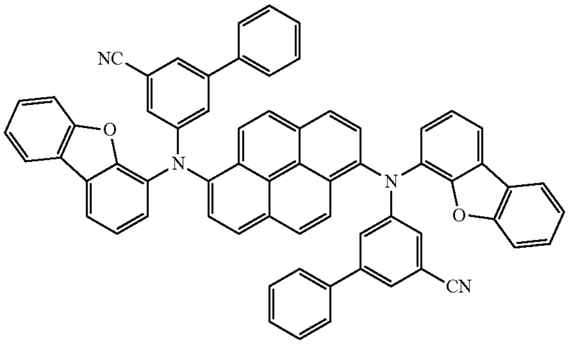
FD30
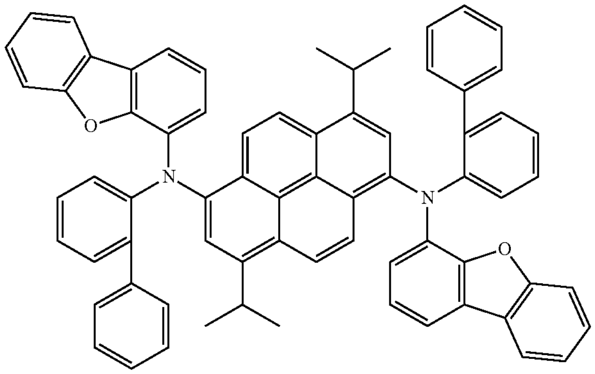
FD31
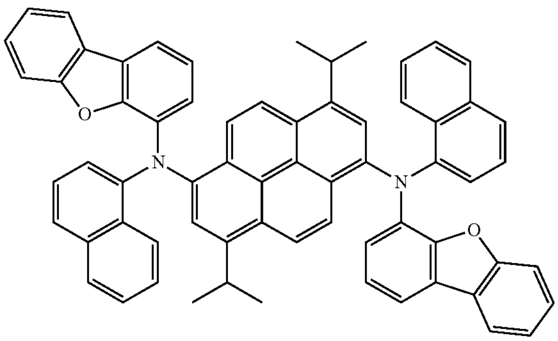
FD32
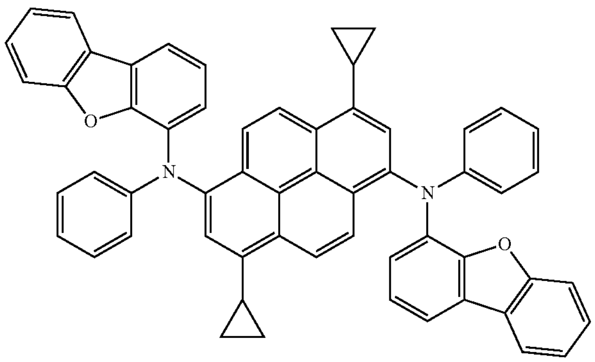
FD33
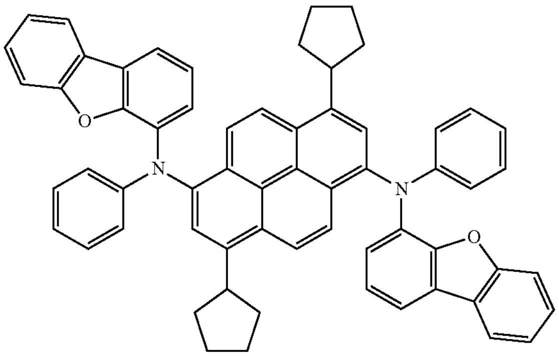
FD34
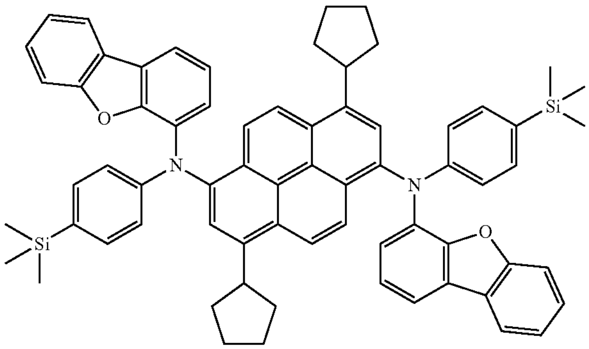
FD35
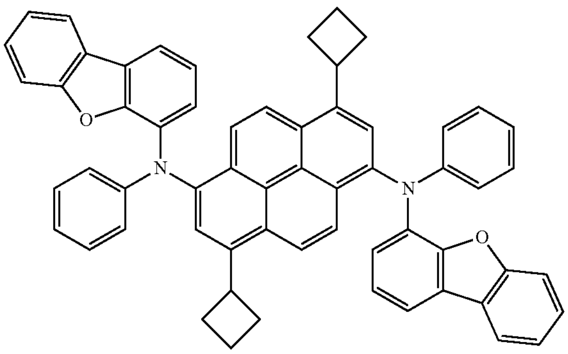
FD36
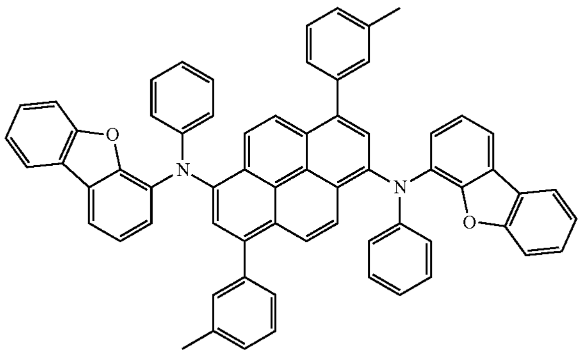

-continued

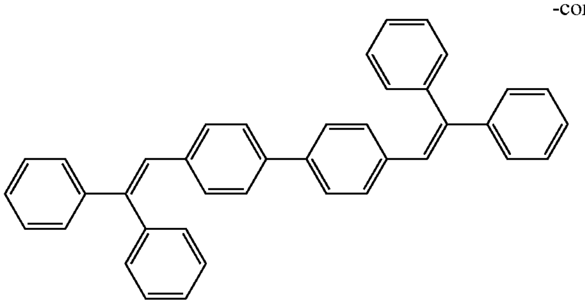

DPVBi

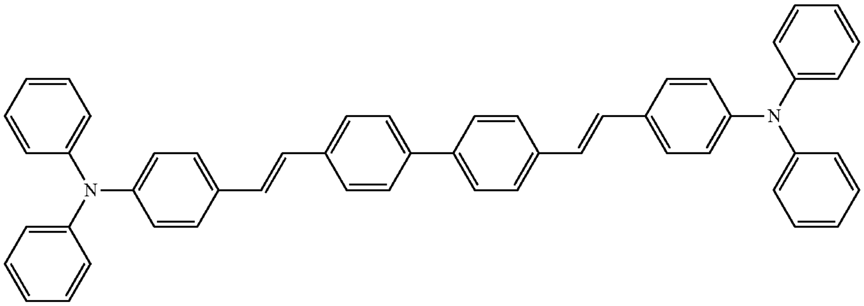

DPAVBi

[Delayed Fluorescence Material]

In one or more embodiments, the emission layer may include a delayed fluorescence material.

In the present disclosure, the delayed fluorescence material may be selected from compounds capable of emitting delayed fluorescent light based on a delayed fluorescence emission mechanism.

The delayed fluorescence material included in the emission layer may act as a host or a dopant depending on the type or kind of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, in some embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Non-limiting examples of the delayed fluorescence material may include at least one selected from among compounds DF1 to DF9:

DF1

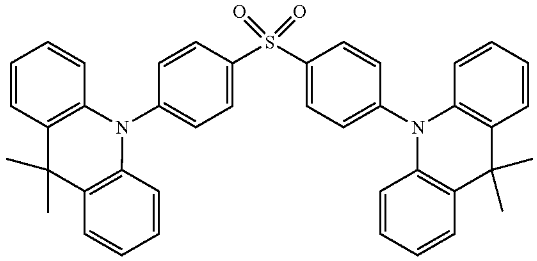

(DMAC-DPS)

DF2

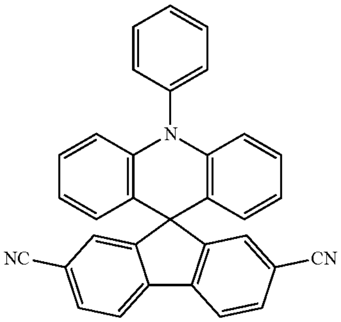

(ACRFLCN)

-continued

DF3

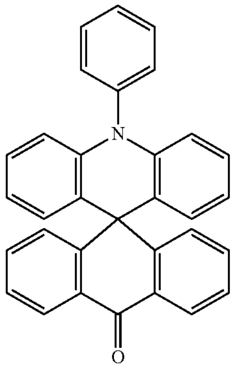

(ACRSA)

DF4

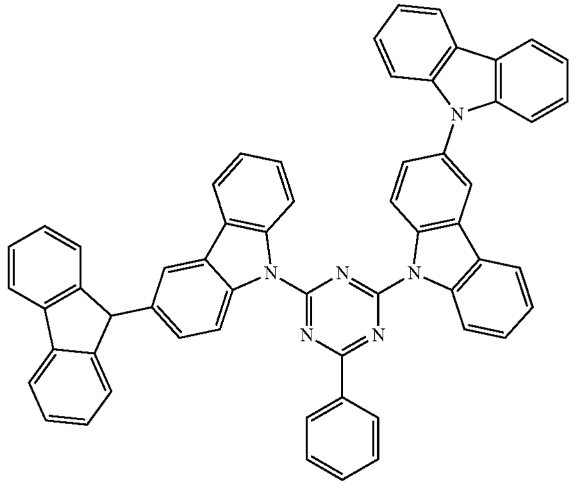

(CC2TA)

DF5

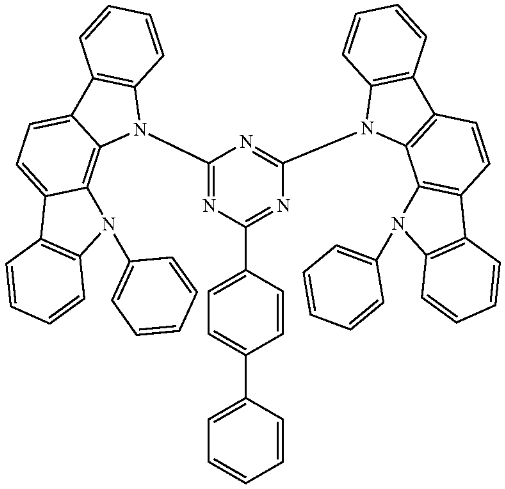

(PIC-TRZ)

-continued

DF6

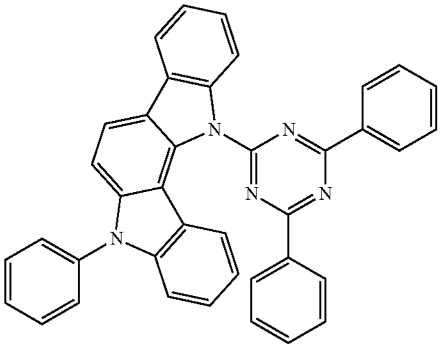

(PIC-TRZ2)

DF7

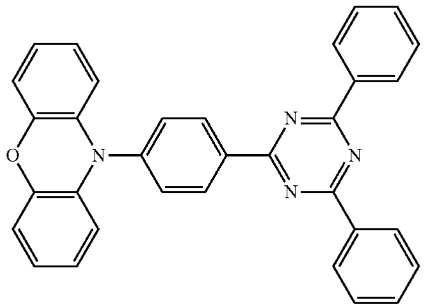

(PXZ-TR2)

DF8

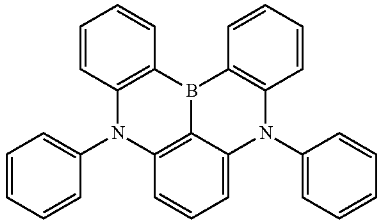

(DABNA-1)

DF9

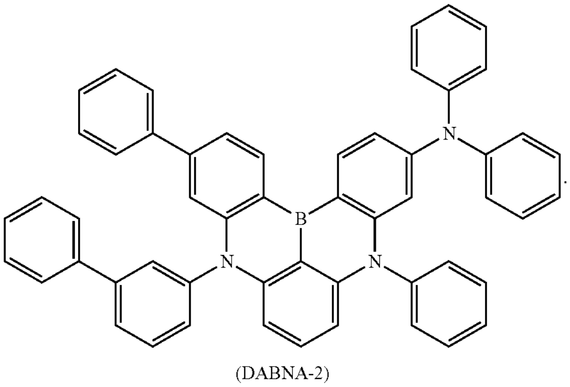

(DABNA-2)

[Quantum Dot]

In one or more embodiments, the emission layer may include a quantum dot.

The term "quantum dot" as utilized herein may refer to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled or selected through a process which costs lower and is easier than vapor deposition methods, such as metal organic chemical vapor deposition (MOCVD) or molecular beam epitaxy (MBE), The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Non-limiting examples of the Group II-VI semiconductor compound may be a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Non-limiting examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In some embodiments, the Group III-V semiconductor compound may further include a Group II element. Non-limiting examples of the Group III-V semiconductor compound further including a Group II element may be InZnP, InGaZnP, InAlZnP, etc.

Non-limiting examples of the Group III-VI semiconductor compound may be: a binary compound, such as GaS, GaSe, $Ga_2Se_3$, GaTe, InS, InSe, $In_2S_3$, $In_2Se_3$, or InTe; a ternary compound, such as $InGaS_3$, or InGaSes; and any combination thereof.

Non-limiting examples of the Group I-III-VI semiconductor compound may be: a ternary compound, such as AgInS, $AgInS_2$, CuInS, $CuInS_2$, $CuGaO_2$, $AgGaO_2$, or $AgAlO_2$; or any combination thereof.

Non-limiting examples of the Group IV-VI semiconductor compound may be: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include: a single element compound, such as Si or Ge; a binary compound, such as SiC or SiGe; or any combination thereof.

Each element included in a multi-element compound such as the binary compound, the ternary compound, and the quaternary compound may be present at a substantially uniform concentration or non-substantially uniform concentration in a particle.

In some embodiments, the quantum dot may have a single structure in which the concentration of each element in the quantum dot is substantially uniform, or a core-shell dual structure. For example, the material included in the core and the material included in the shell may be different from each other.

The shell of the quantum dot may act as a protective layer that prevents chemical degeneration of the core to maintain semiconductor characteristics, and/or as a charging layer that imparts electrophoretic characteristics to the quantum dot. The shell may be a single layer or a multi-layer. The interface between the core and the shell may have a concentration gradient in which the concentration of an element existing in the shell decreases toward the center of the core.

Non-limiting examples of the shell of the quantum dot may be an oxide of metal, metalloid, or non-metal, a semiconductor compound, and any combination thereof. Non-limiting examples of the oxide of metal, metalloid, or non-metal may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Non-limiting examples of the semiconductor compound may be, as described herein, a Group II-VI semiconductor compound; a Group III-V semiconductor compound; a Group III-VI semiconductor compound; a Group I-III-VI semiconductor compound; a Group IV-VI semiconductor compound; and any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle may be improved.

In some embodiments, the quantum dot may be in the form of a substantially spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented. In one or more embodiments, the size of the quantum dot may be selected to emit red, green and/or blue light. In some embodiments, the size of the quantum dot may be configured to emit white light by combination of light of one or more suitable colors.

[Electron Transport Region in Interlayer 130]

The electron transport region may have: i) a single-layered structure including (e.g., consisting of) a single layer consisting of a single material, ii) a single-layered structure including (e.g., consisting of) a single layer including (e.g., consisting of) a plurality of different materials, or iii) a multi-layered structure including a plurality of layers including different materials.

The electron transporting region may include a buffer layer, a hole blocking layer, an electron control layer, an electron transport layer, an electron injection layer, or any combination thereof.

For example, the electron transport region may include an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer in the stated order.

In one or more embodiments, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, in some embodiments, the electron transport region may include a compound represented by Formula 601:

$$[Ar_{601}]_{xe11}\text{-}[(L_{601})_{xe1}\text{-}R_{601}]_{xe21}$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described herein with respect to $Q_1$, xe21 may be 1, 2, 3, 4, or 5, at least one selected from among $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more $Ar_{601}$(s) may be linked to each other via a single bond.

In some embodiments, $Ar_{601}$ in Formula 601 may be a substituted or unsubstituted anthracene group.

In some embodiments, the electron transport region may include a compound represented by Formula 601-1:

Formula 601-1

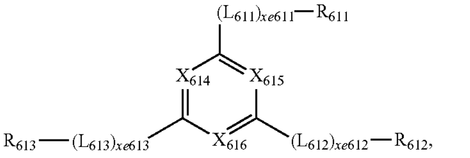

wherein, in Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each be the same as described herein with respect to $L_{601}$, xe611 to xe613 may each be the same as described herein with respect to xe1, $R_{611}$ to $R_{613}$ may each be the same as described herein with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

In one or more embodiments, the electron transport region may include one selected from among Compounds ET1 to ET45, 2,9-dimethyl-4,7-diphenyl-1,10-phenanthroline (BCP), 4,7-diphenyl-1,10-phenanthroline (Bphen), Alq3, bis(2-methyl-8-quinolinolato-N1,O8)-(1,1'-biphenyl-4-olato)aluminum (BAlq), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), or any combination thereof:

ET1

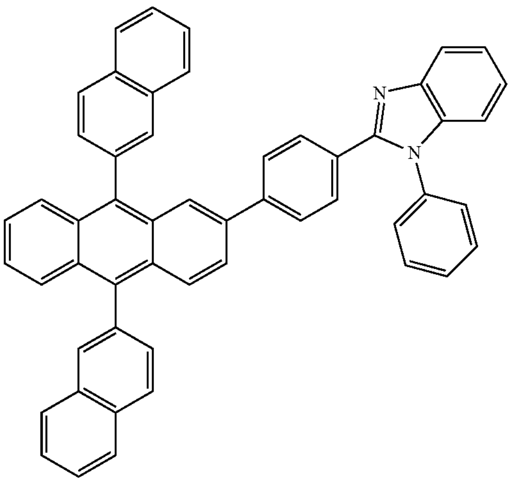

ET2

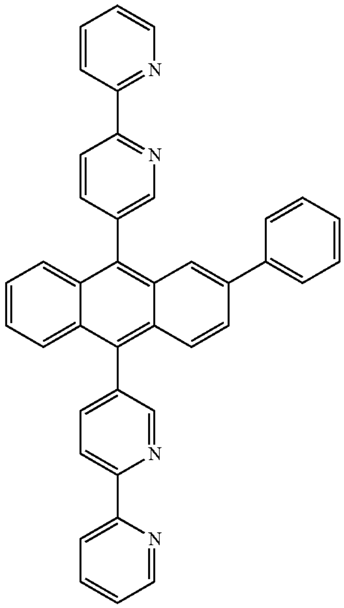

-continued
ET3
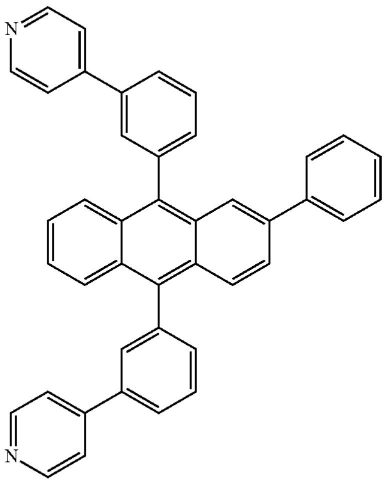
ET4
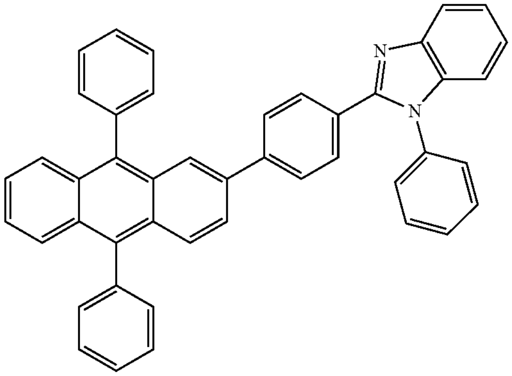
ET5
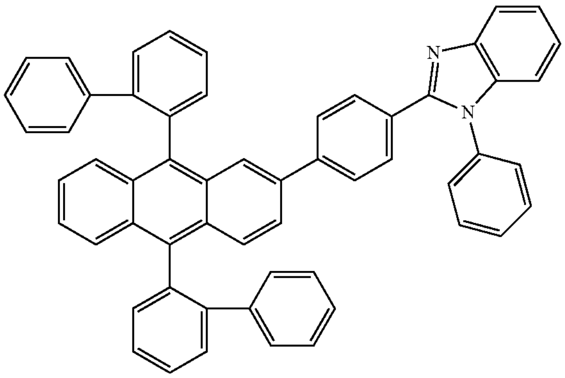
-continued
ET6
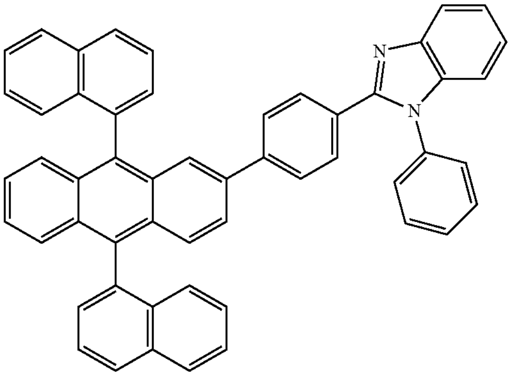
ET7
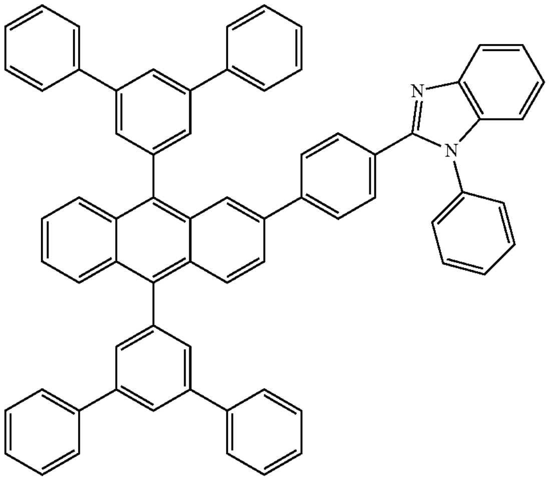
ET8
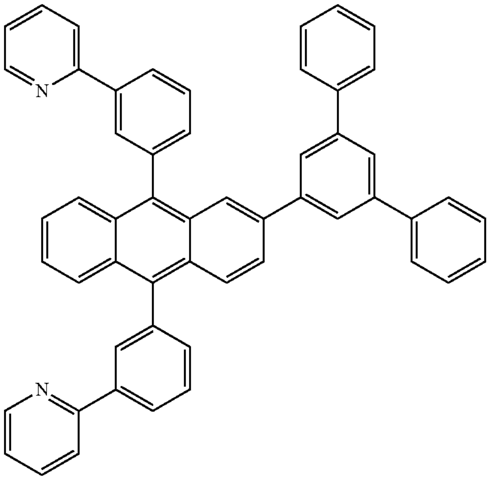

-continued
ET9
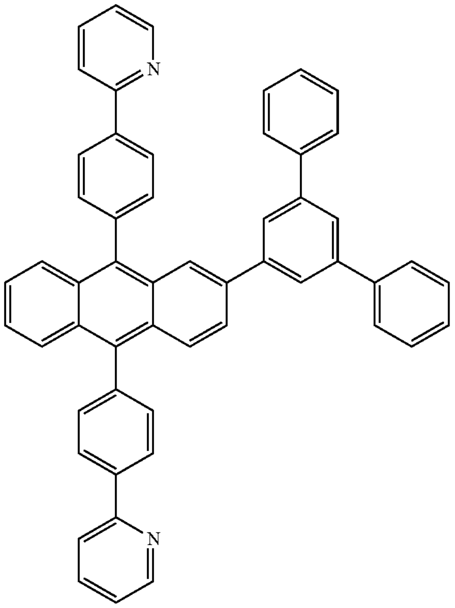
ET10
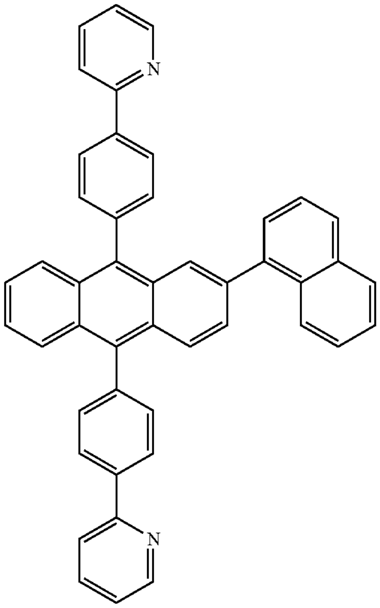
-continued
ET11
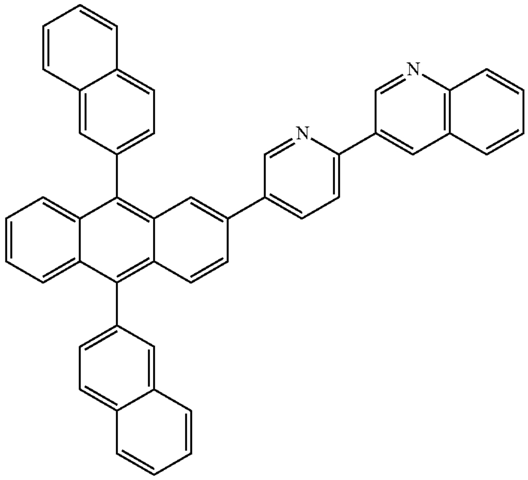
ET12
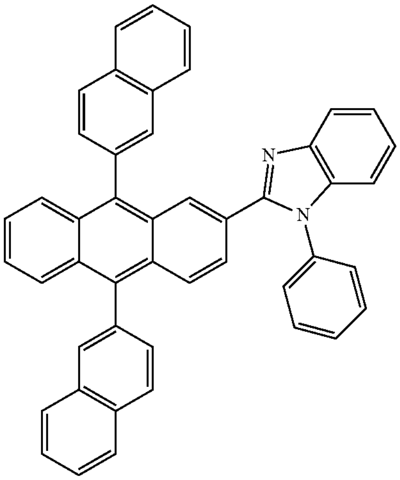
ET13
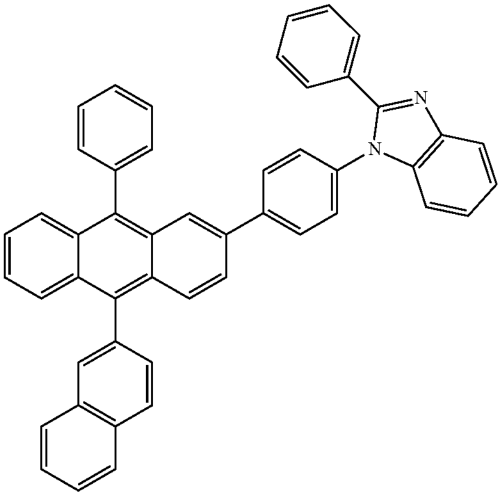

ET14
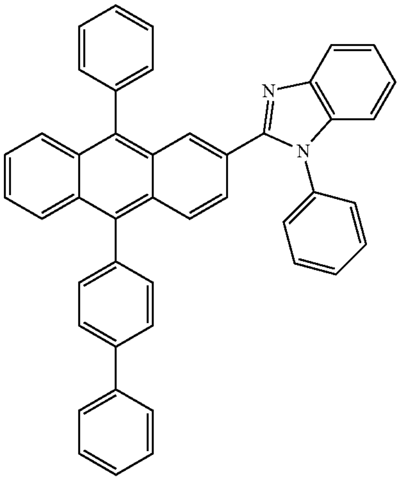
ET15
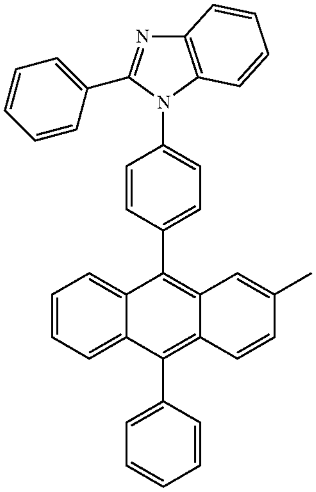
ET16
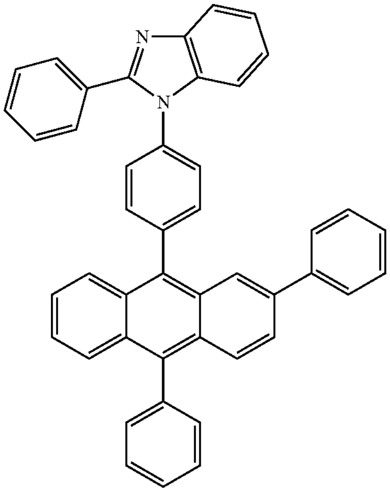
ET17
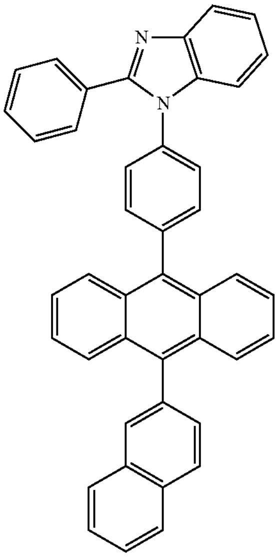
ET18
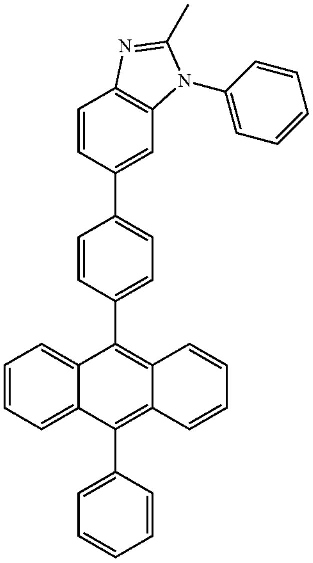
ET19
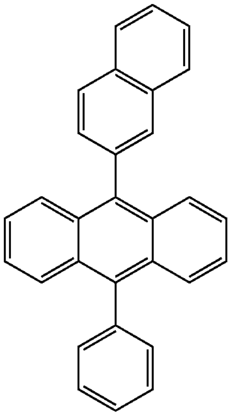

-continued
ET20
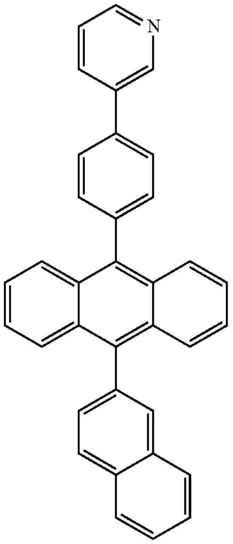
ET21
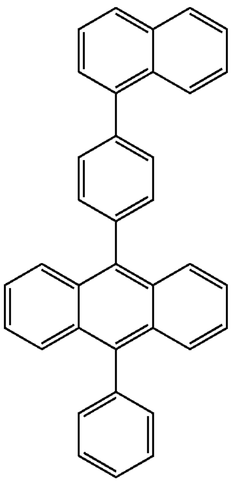
ET22
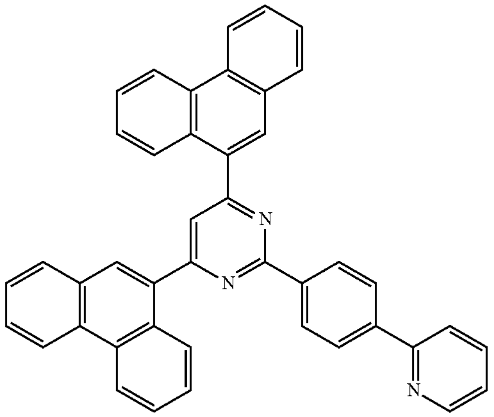
-continued
ET23
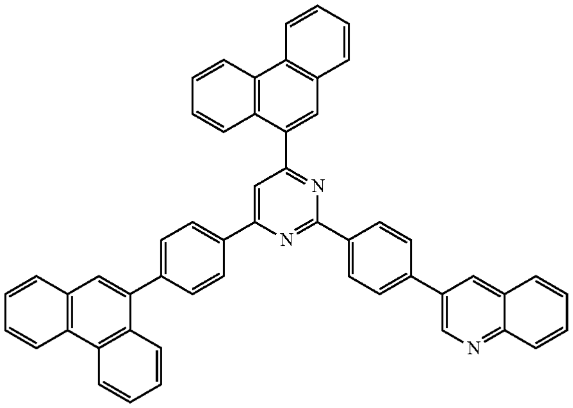
ET24
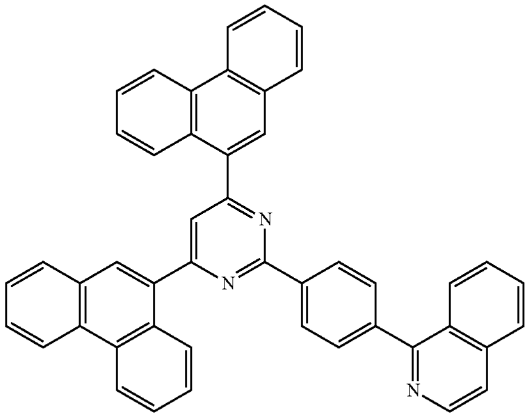
ET25
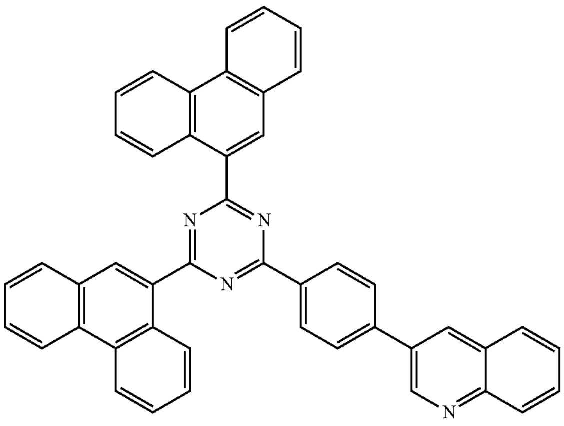

-continued
ET26
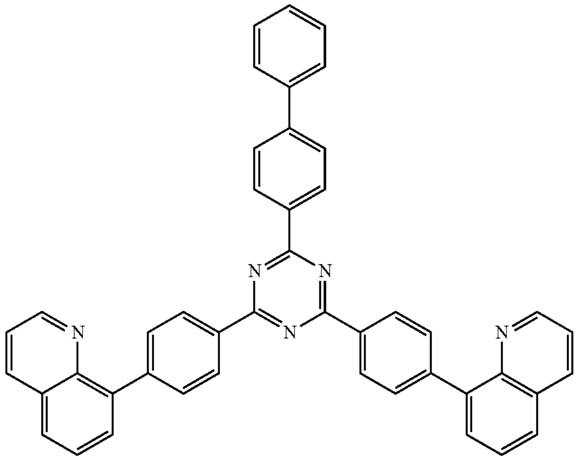
ET27
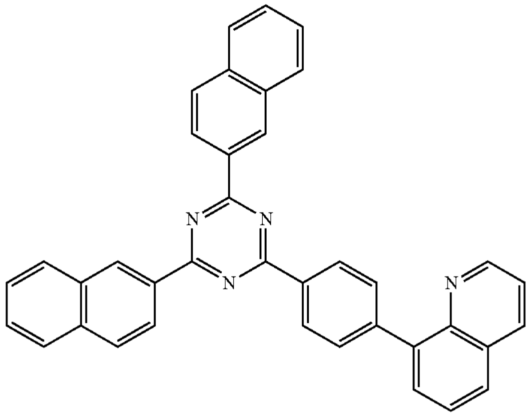
ET28
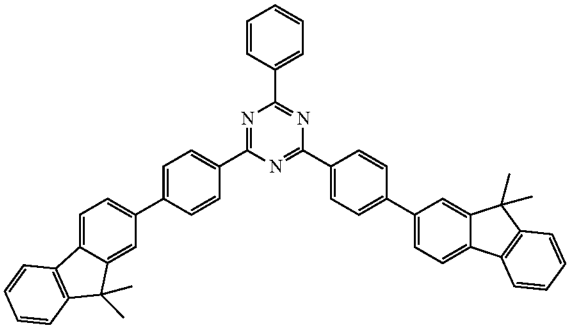
-continued
ET29
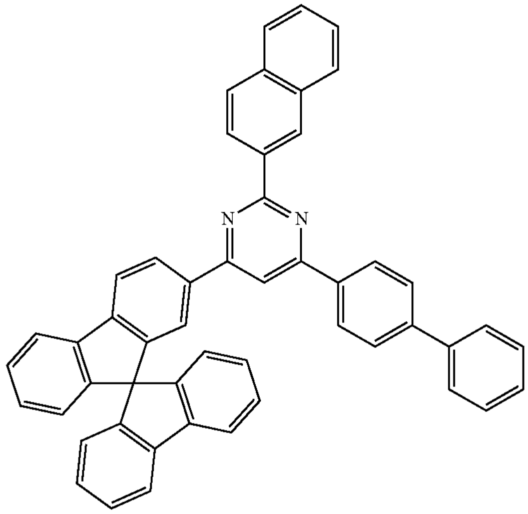
ET30
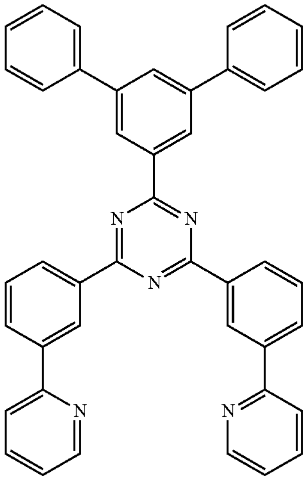
ET31
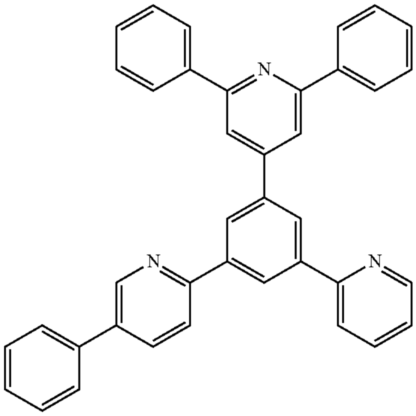

-continued
ET32
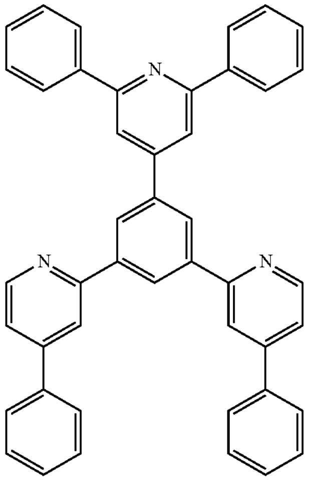
ET33
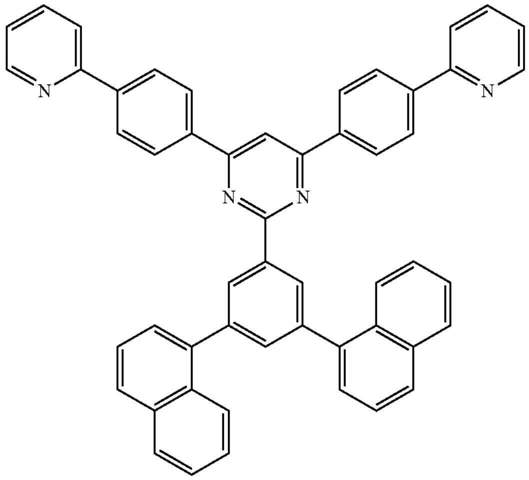
ET34
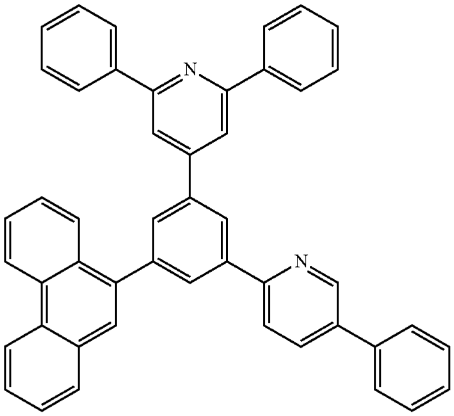
-continued
ET35
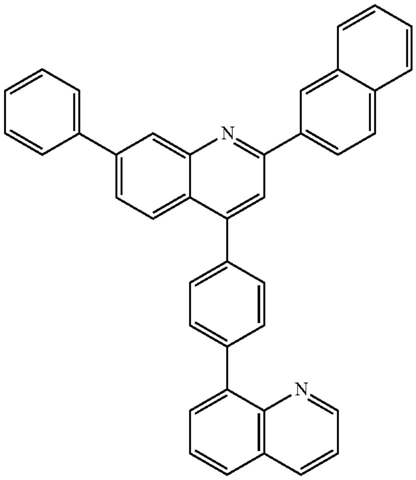
ET36
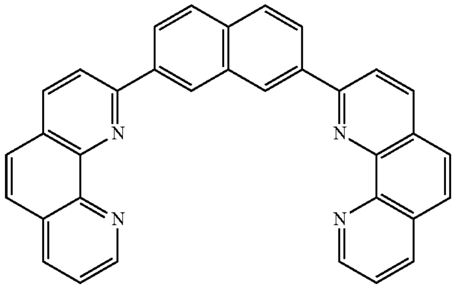
ET37
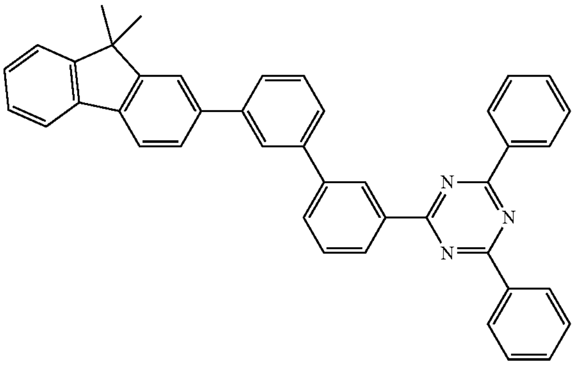
ET38
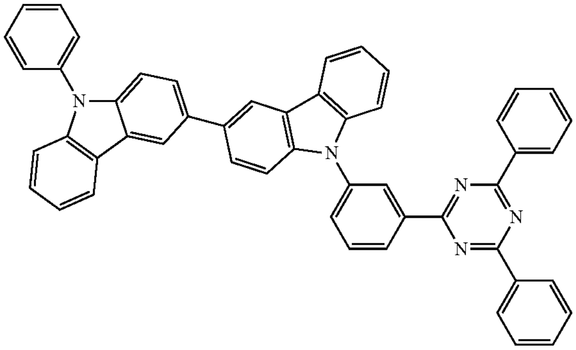

-continued
ET39
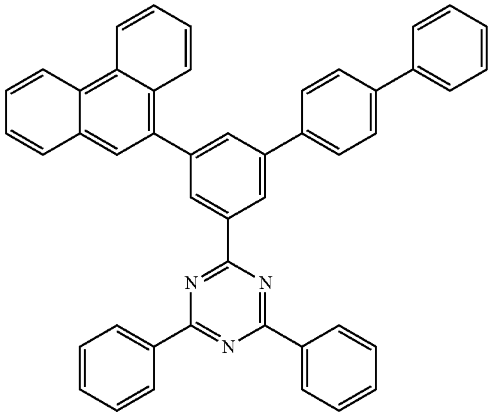
ET40
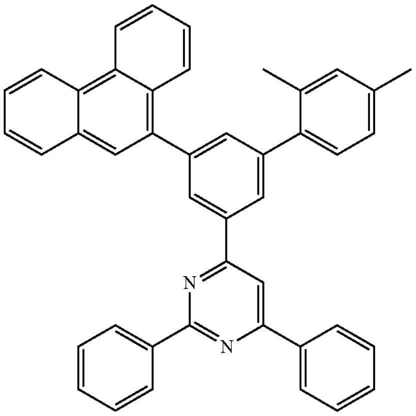
ET41
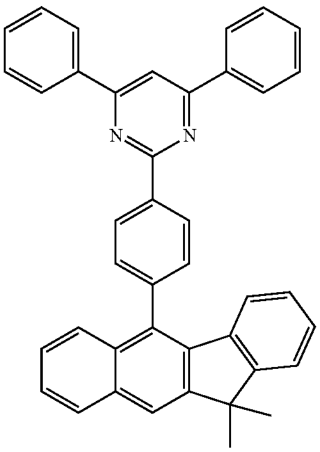
-continued
ET42
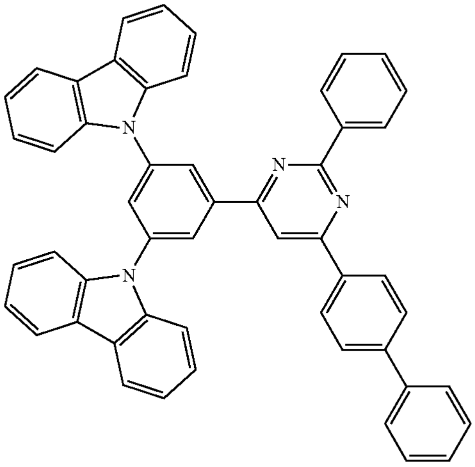
ET43
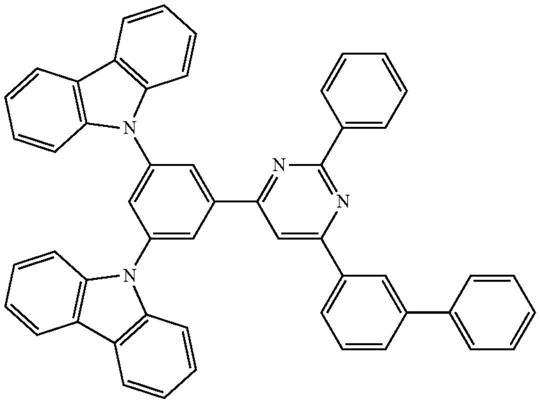
ET44
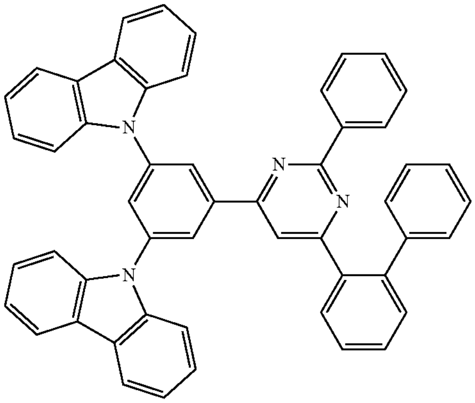
ET45
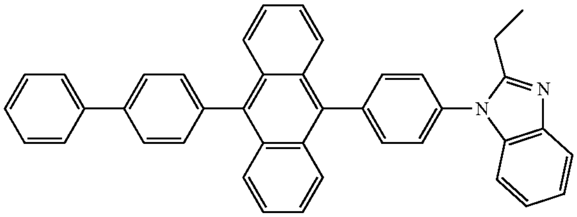

-continued

Alq3

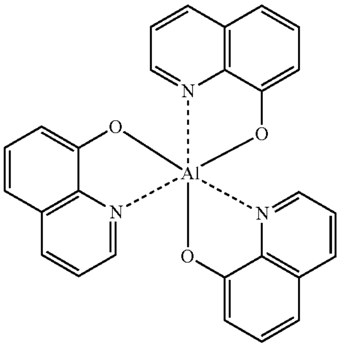

BAlq

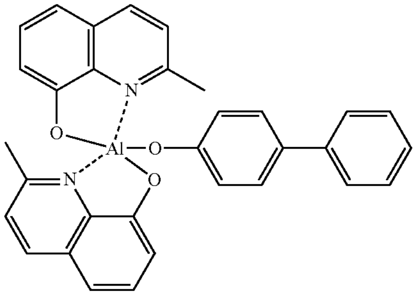

TAZ

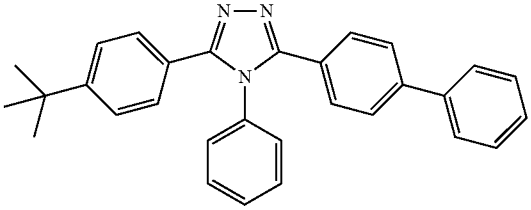

NTAZ

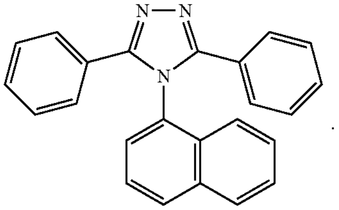

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

In one or more embodiments, the electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, in some embodiments, the metal-containing material may include a Li complex. The Li complex may include, for example, Compound ET-D1 (LiQ) or ET-D2:

ET-D1

ET-D2

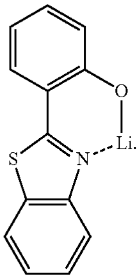

In one or more embodiments, the electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_{20}$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Non-limiting examples of the lanthanide metal telluride may be LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal, respectively and ii) a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of): i) an alkali metal-containing compound (for example, an alkali metal halide); or ii) a) an alkali metal-containing compound (for example, an alkali metal halide), and b) an alkali metal, an alkaline earth metal, a rare earth metal, or any combination thereof. For example, in some embodiments, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

[Second Electrode 150]

The second electrode 150 may be on the interlayer 130 having a structure as described above. The second electrode 150 may be a cathode, which is an electron injection electrode, and as the material for the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

[Capping Layer]

A first capping layer may be located outside the first electrode 110, and/or a second capping layer may be located outside the second electrode 150. In some embodiments, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

In some embodiments, light generated in an emission layer of the interlayer 130 of the light-emitting device 10 may be extracted toward the outside through the first electrode 110 which is a semi-transmissive electrode or a transmissive electrode, and the first capping layer. In some embodiments, light generated in an emission layer of the interlayer 130 of the light-emitting device 10 may be extracted toward the outside through the second electrode 150 which is a semi-transmissive electrode or a transmissive electrode, and the second capping layer.

The first capping layer and the second capping layer may increase external emission efficiency according to the principle of constructive interference. Consequently, the light extraction efficiency of the light-emitting device 10 is increased, so that the luminescence efficiency of the light-emitting device 10 may be improved.

Each of the first capping layer and the second capping layer may include a material having a refractive index of 1.6 or more (at 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. In some embodiments, the carbocyclic compound, the heterocyclic compound, and the amine group-containing compound may be substituted with a substituent including O, N, S, Se, Si, F, Cl, Br, I, or any combination thereof. In one or more embodiments, at least one selected from among the first capping layer and the second capping layer may each independently include an amine group-containing compound.

For example, in some embodiments, at least one selected from among the first capping layer and the second capping layer may each independently include a compound represented by Formula 201, a compound represented by Formula 202, or any combination thereof.

In one or more embodiments, at least one selected from among the first capping layer and the second capping layer may each independently include one or more selected from Compounds HT28 to HT33, one or more selected from Compounds CP1 to CP6, β-NPB, or any combination thereof:

CP1

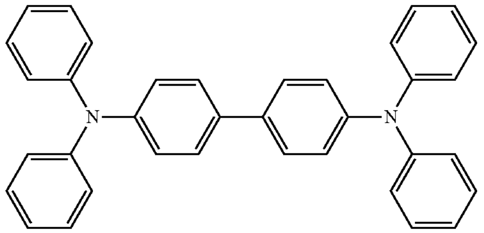

CP2

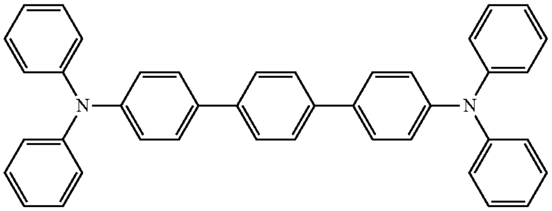

CP3

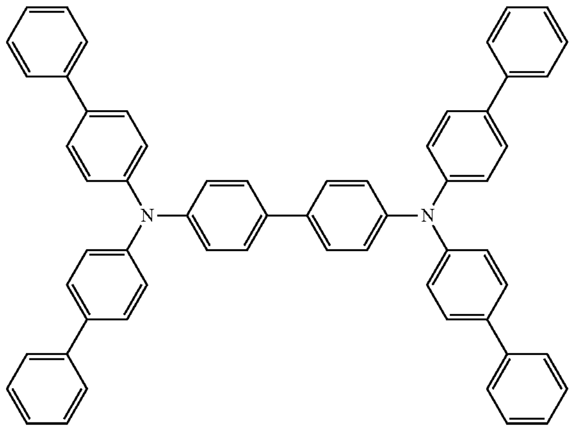

-continued

CP4

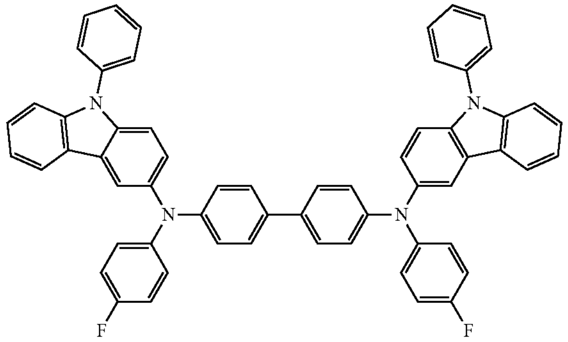

CP5

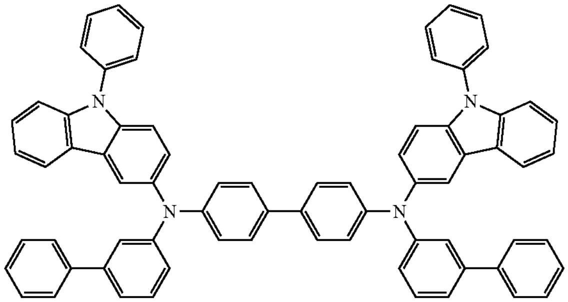

CP6

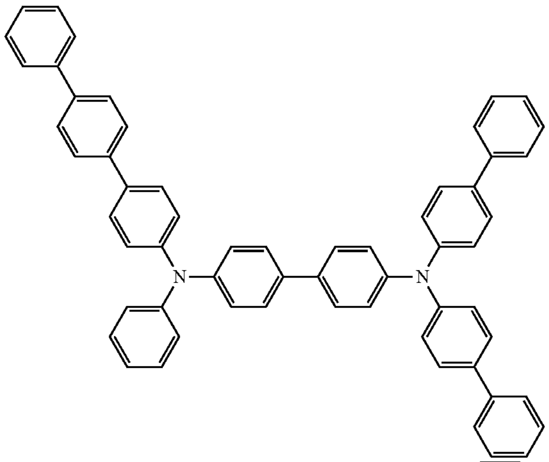

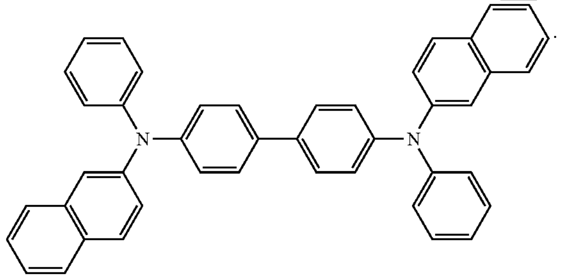

β-NPB

[Film]

The organometallic compound represented by Formula 1 may be included in one or more suitable films. According to one or more embodiments of the present disclosure, a film including an organometallic compound represented by Formula 1 may be provided. The film may be, for example, an optical member (or a light control element) (for example, a color filter, a color conversion member, a capping layer, a light extraction efficiency enhancement layer, a selective light absorbing layer, a polarizing layer, a quantum dot-containing layer, or like), a light blocking member (for example, a light reflective layer, a light absorbing layer, or the like), or a protective member (for example, an insulating layer, a dielectric layer, and/or the like).

[Electronic Apparatus]

The light-emitting device may be included in one or more suitable electronic apparatuses. For example, the electronic apparatus including the light-emitting device may be a light-emitting apparatus, an authentication apparatus, and/or the like.

In one or more embodiments, the electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one direction in which light emitted from the light-emitting device travels. For example, in one or more embodiments, the light emitted from the light-emitting device may be blue light or white light. For details on the light-emitting device, related description provided above may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may further include a plurality of color conversion areas and light-shielding patterns located among the color conversion areas.

The plurality of color filter areas (or the plurality of color conversion areas) may include a first area emitting first color light, a second area emitting second color light, and/or a third area emitting third color light, wherein the first color light, the second color light, and/or the third color light may have different maximum emission wavelengths from one another. For example, in some embodiments, the first color light may be red light, the second color light may be green light, and the third color light may be blue light. For example, in one or more embodiments, the plurality of color filter areas (or the plurality of color conversion areas) may include quantum dots. In some embodiments, the first area may include a red quantum dot emitting red light, the second area may include a green quantum dot emitting green light, and the third area may not include (e.g., may exclude) a quantum dot. For details on the quantum dot, related descriptions provided herein may be referred to. The first area, the second area, and/or the third area may each include a scatterer.

For example, in one or more embodiments, the light-emitting device may be to emit first light, the first area may be to absorb the first light to emit first-first color light, the second area may be to absorb the first light to emit second-first color light, and the third area may be to absorb the first light to emit third-first color light. In this regard, the first-first color light, the second-first color light, and the third-first color light may have different maximum emission wavelengths. In some embodiments, the first light may be blue light, the first-first color light may be red light, the second-first color light may be green light, and the third-first color light may be blue light.

In one or more embodiments, the electronic apparatus may further include a thin-film transistor, in addition to the light-emitting device as described above. The thin-film transistor may include a source electrode, a drain electrode, and an activation layer, wherein any one selected from the source electrode and the drain electrode may be electrically connected to any one selected from the first electrode and the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be located between the color filter and/or the color conversion layer and the light-emitting device. The sealing portion allows light from the light-emitting device to be extracted to the outside, and concurrently (e.g., simultaneously) prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the utilization of the electronic apparatus. The functional layers may include a touch screen layer, a polarizing layer, and/or the like. The touch screen layer may be a pressure-sensitive touch screen layer, a capacitive touch screen layer, or an infrared touch screen layer.

The authentication apparatus may further include, in addition to the light-emitting device as described above, a biometric information collector. The authentication apparatus may be, for example, a biometric authentication apparatus that authenticates an individual by utilizing biometric information of a living body (for example, fingertips, pupils, etc.).

The electronic apparatus may be applied to one or more suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Figure 2:
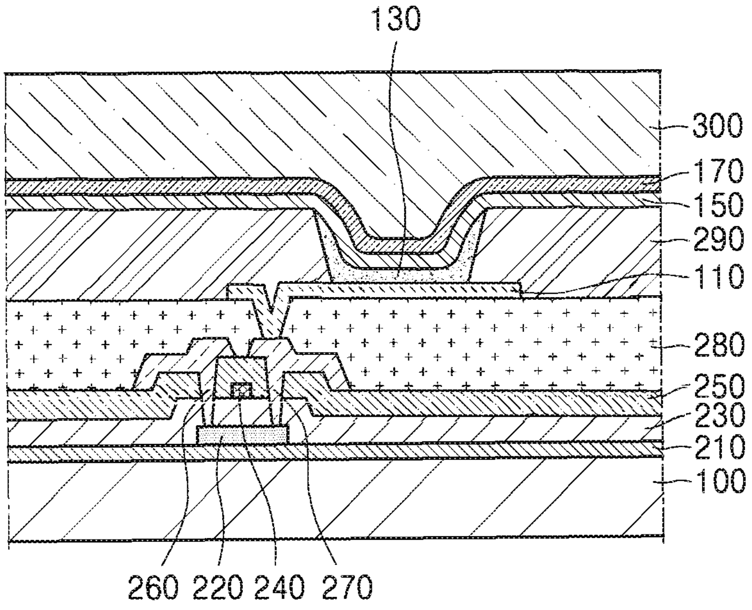
FIG. 2 is a schematic view of a structure of an electronic apparatus according to one or more embodiments of the present disclosure.
Figure 3:
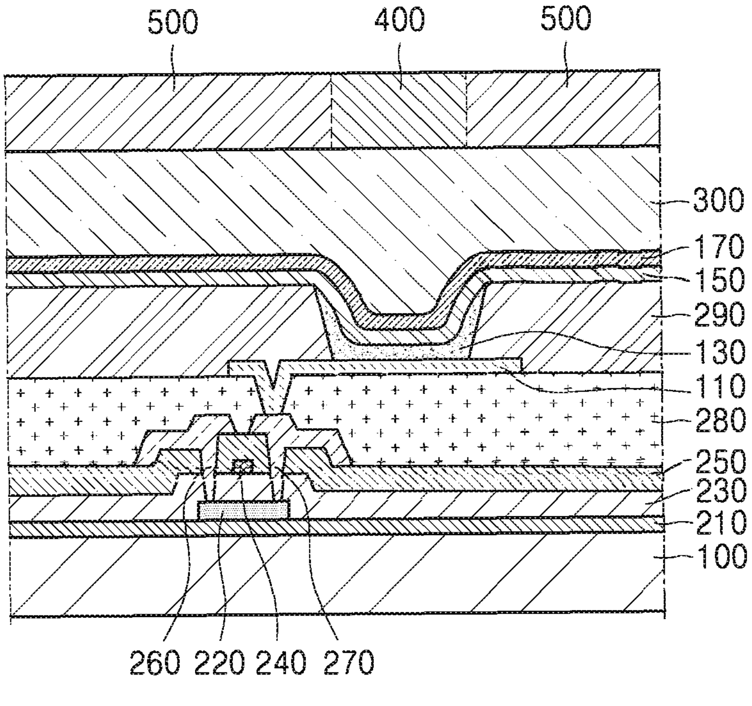
FIG. 3 is a schematic view of a structure of an electronic apparatus according to one or more embodiments of the present disclosure.

[Description of FIGS. 2 and 3]

FIG. 2 is a cross-sectional view showing a light-emitting apparatus according to one or more embodiments of the present disclosure.

The light-emitting apparatus of FIG. 2 may include a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220, respectively.

The TFT may be electrically connected to a light-emitting device to drive the light-emitting device, and may be covered and protected by a passivation layer 280. The passivation layer 280 may include an inorganic insulating film, an organic insulating film, or any combination thereof. The light-emitting device may be provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacrylic organic film. In some embodiments, at least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or any combination of the inorganic films and the organic films.

FIG. 3 shows a cross-sectional view showing a light-emitting apparatus according to one or more embodiments of the present disclosure.

The light-emitting apparatus of FIG. 3 is substantially the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In some embodiments, the light-emitting device included in the light-emitting apparatus of FIG. 3 may be a tandem light-emitting device.

Figure 4:
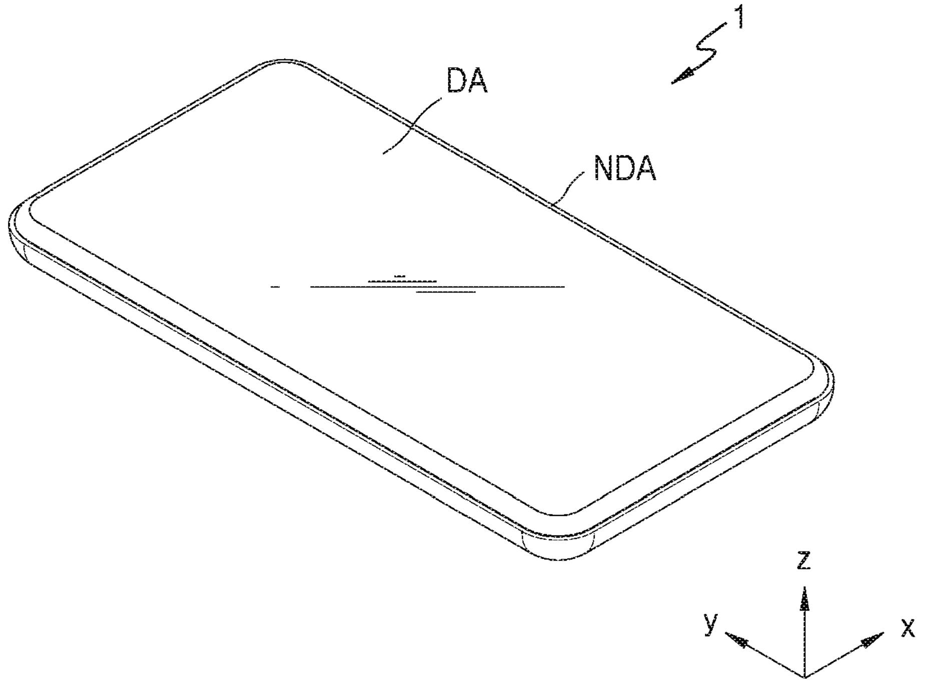
FIG. 4 is a schematic perspective view of an electronic device 1 including a light-emitting device according to one or more embodiments of the present disclosure.

[Description of FIG. 4]

FIG. 4 is a schematic perspective view of an electronic device 1 including a light-emitting device according to one or more embodiments. The electronic device 1 may be, as an apparatus that displays a moving image or still image, a portable electronic device, such as a mobile phone, a smart phone, a tablet personal computer (PC), a mobile communication terminal, an electronic notebook, an electronic book, a portable multimedia player (PMP), a navigation, or a ultra mobile PC (UMPC) as well as one or more suitable products, such as a television, a laptop, a monitor, a billboard, or an Internet of things (IOT). In some embodiments, the electronic device 1 may be such a product above or a part thereof. In some embodiments, the electronic device 1 may be a wearable device, such as a smart watch, a watch phone, a glasses-type or kind display, or a head mounted display (HMD), or a part of the wearable device. However, embodiments of the present disclosure are not limited thereto. For example, the electron device 1 may include a dashboard of a vehicle, a center fascia of a vehicle, a center information display arranged on a dashboard of a vehicle, a room mirror display replacing a side mirror of a vehicle, an entertainment display for the rear seat of a vehicle, or a display arranged on the back of the front seat, or a head up display (HUD) installed in the front of a vehicle or projected on a front window glass, or a computer-generated hologram augmented-reality head up display (CGH AR HUD). FIG. 4 illustrates an embodiment in which the electronic device 1 is a smartphone for convenience of explanation.

The electronic device 1 may include a display area DA and a non-display area NDA outside the display area DA. A display device of the electronic device 1 may implement an image through an array of a plurality of pixels that are two-dimensionally arranged in the display area DA.

The non-display area NDA is an area that does not display an image, and may entirely surround the display area DA. On the non-display area NDA, a driver for providing electrical signals or power to display devices arranged on the display area DA may be arranged. On the non-display area NDA, a pad, which is an area to which an electronic element or a printing circuit board may be electrically connected, may be arranged.

In the electronic device 1, a length in the x-axis direction and a length in the y-axis direction may be different from each other. For example, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

[Description of FIGS. 5 and 6A to 6C]

Figure 5:
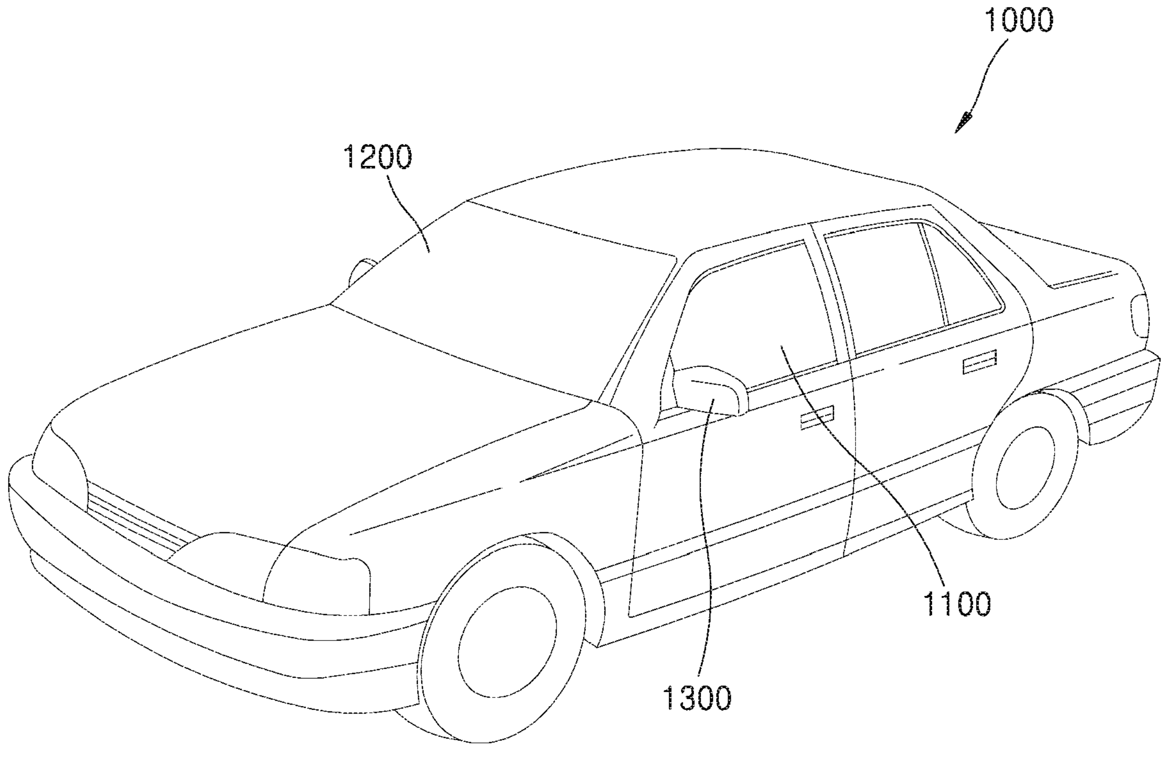
FIG. 5 is a schematic view illustrating an exterior of a vehicle 1000 as an electronic device including a light-emitting device according to one or more embodiments of the present disclosure.
Figure 6A:
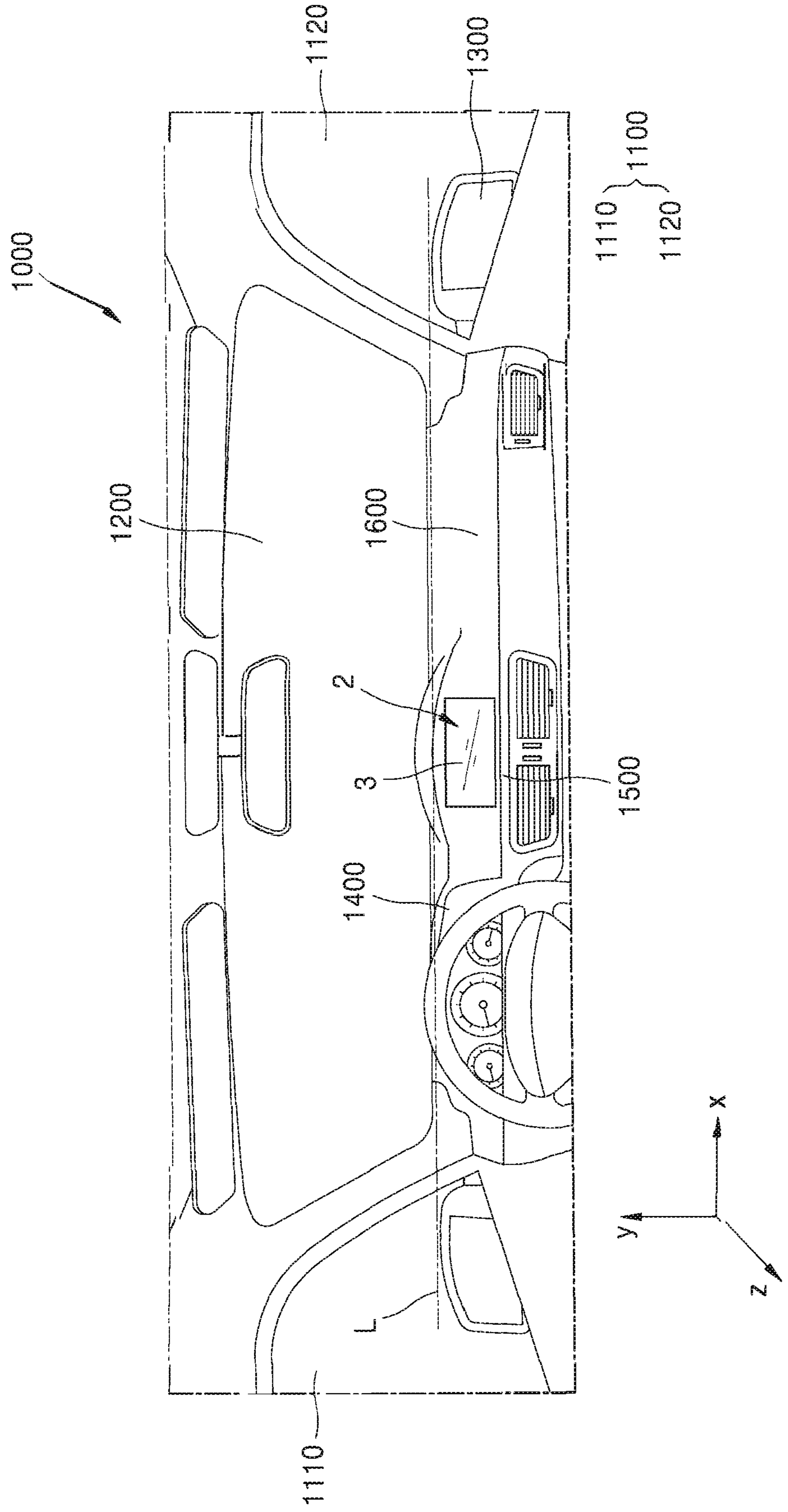
FIGS. 6A-6C are each a schematic view illustrating an interior of a vehicle 1000 according to one or more embodiments of the present disclosure.
Figure 6B:
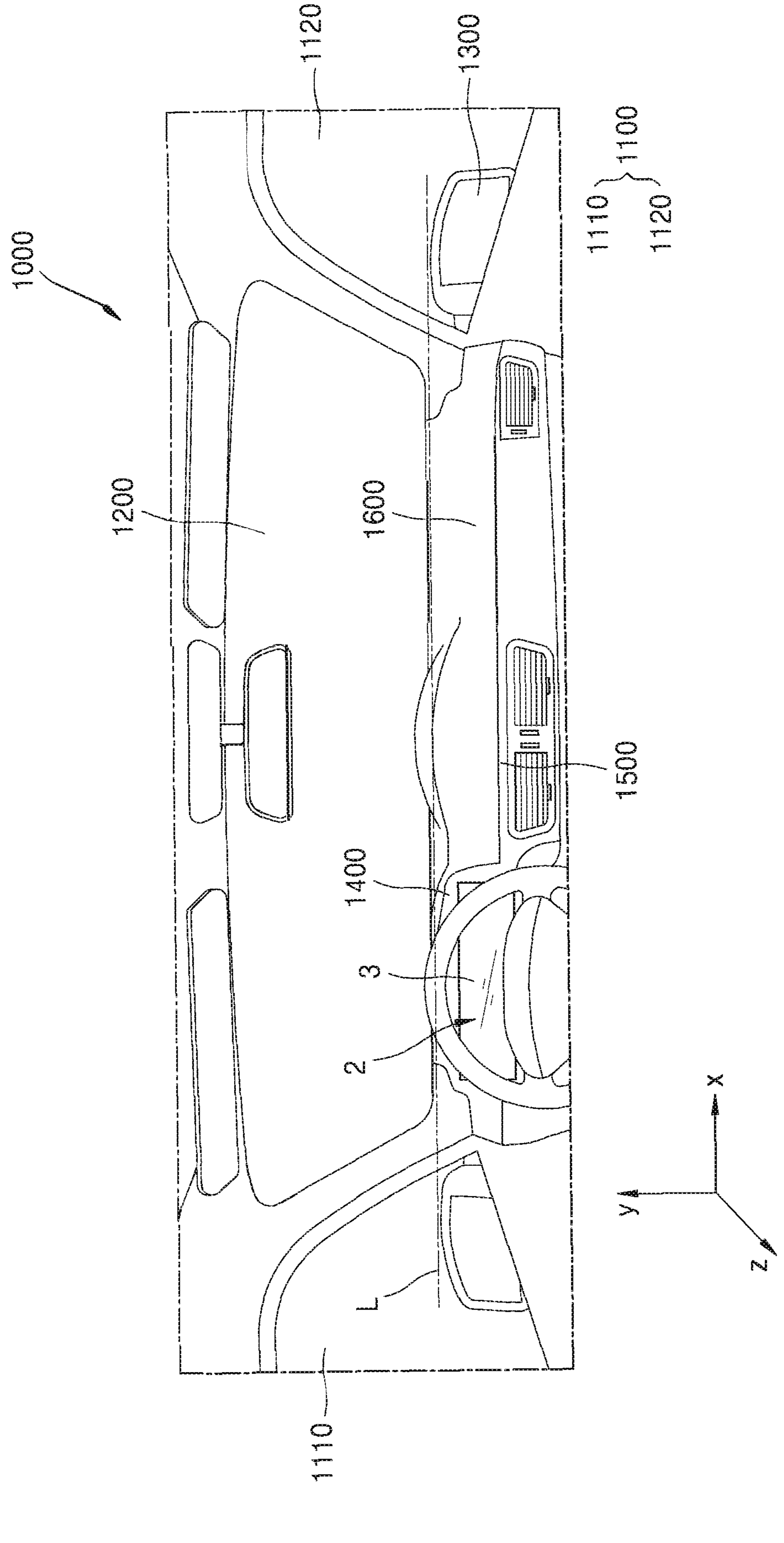
Figure 6C:
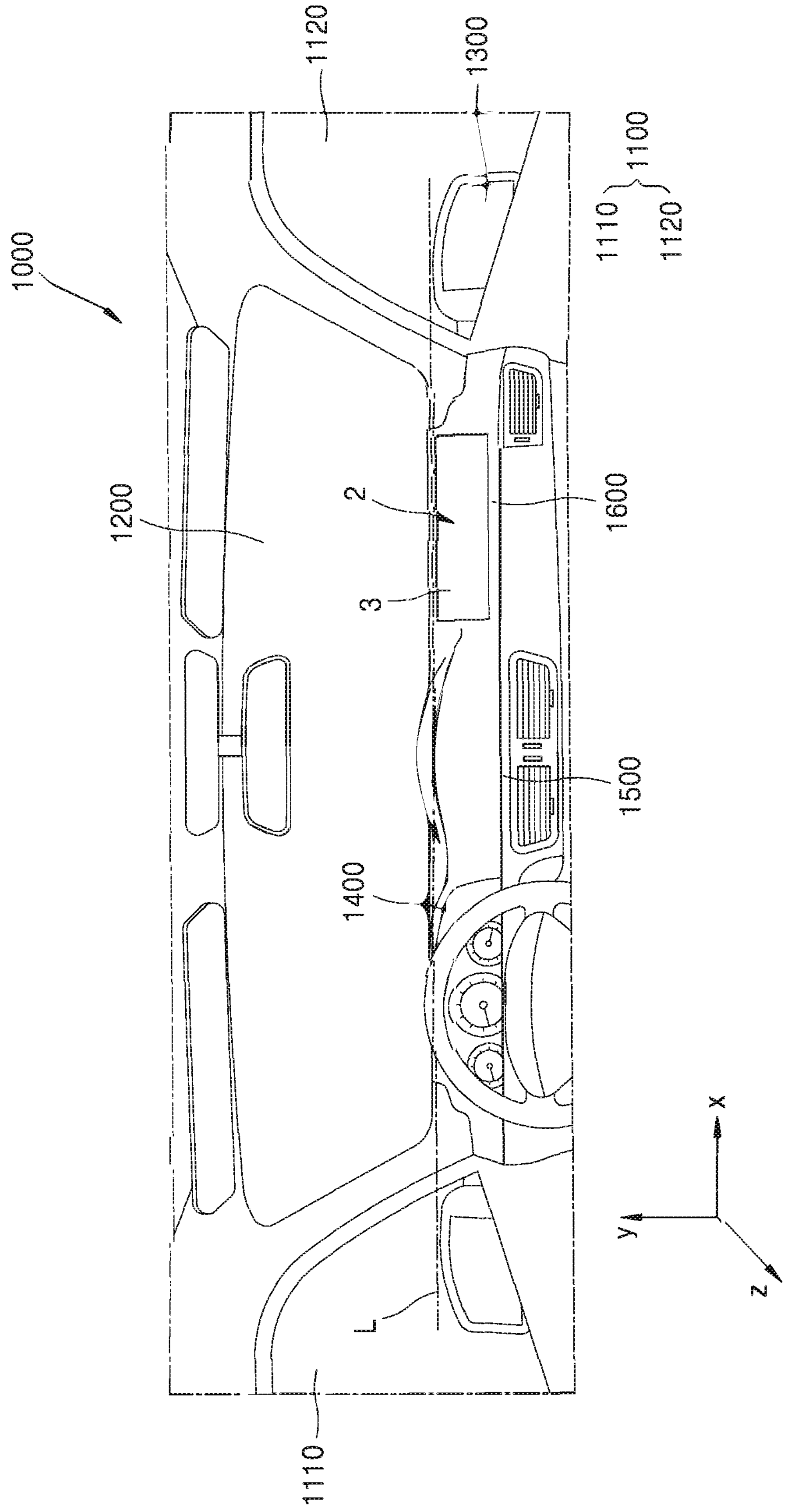

FIG. 5 is a schematic view illustrating an exterior of a vehicle 1000 as an electronic device including a light-emitting device according to one or more embodiments of the present disclosure. FIGS. 6A to 6C are each a schematic view illustrating an interior of a vehicle 1000 according to one or more embodiments of the present disclosure.

Referring to FIGS. 5, 6A, 6B, and 6C, the vehicle 1000 may refer to one or more suitable apparatuses for moving an object to be transported, such as a human, an object, or an animal, from a departure point to a destination. The vehicle 1000 may include a vehicle traveling on a road or a track, a vessel moving over a sea or a river, an airplane flying in the sky utilizing the action of air, and/or the like.

In one or more embodiments, the vehicle 1000 may travel on a road or a track. The vehicle 1000 may move in a set or predetermined direction according to the rotation of at least one wheel. For example, the vehicle 1000 may include a three-wheeled or four-wheeled vehicle, a construction machine, a two-wheeled vehicle, a prime mover device, a bicycle, or a train running on a track.

The vehicle 1000 may include a body having an interior and an exterior, and a chassis in which mechanical apparatuses necessary for driving are installed as other parts except for the body. The exterior of the vehicle body may include a front panel, a bonnet, a roof panel, a rear panel, a trunk, a filler provided at a boundary between doors, and/or the like. The chassis of the vehicle 1000 may include a power generating device, a power transmitting device, a driving device, a steering device, a braking device, a suspension device, a transmission device, a fuel device, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a filler arranged between the side window glass 1100 and the front window glass 1200.

The side window glass 1100 may be installed on the side of the vehicle 1000. In one or more embodiments, the side window glass 1100 may be installed on a door of the vehicle 1000. A plurality of side window glasses 1100 may be provided and may face each other. In one or more embodiments, the side window glass 1100 may include a first side window glass 1110 and a second side window glass 1120. In one or more embodiments, the first side window glass 1110 may be arranged adjacent to the cluster 1400. The second side window glass 1120 may be arranged adjacent to the passenger seat dashboard 1600.

In one or more embodiments, the side window glasses 1100 may be spaced apart from each other in the x-direction or the −x-direction. For example, the first side window glass 1110 and the second side window glass 1120 may be spaced apart from each other in the x direction or the −x direction. In other words, an imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In one embodiment, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge, a turn signal indicator, a high beam indicator, a warning light, a seat belt warning light, an odometer, a driving record system, an automatic transmission selection lever indicator, a door open warning light, an engine oil warning light, and/or a low fuel warning light.

The center fascia 1500 may include a control panel on which a plurality of buttons for adjusting an audio device, an air conditioning device, and/or a heater of a seat are disposed. The center fascia 1500 may be arranged on one side of the cluster 1400.

A passenger seat dashboard 1600 may be spaced apart from the cluster 1400 with the center fascia 1500 arranged therebetween. In one or more embodiments, the cluster 1400 may be arranged to correspond to a driver seat, and the passenger seat dashboard 1600 may be disposed to correspond to a passenger seat. In one or more embodiments, the cluster 1400 may be adjacent to the first side window glass 1110, and the passenger seat dashboard 1600 may be adjacent to the second side window glass 1120.

In one or more embodiments, the display device 2 may include a display panel 3, and the display panel 3 may display an image. The display device 2 may be arranged inside the vehicle 1000. In some embodiments, the display device 2 may be arranged between the side window glasses 1100 facing each other. The display device 2 may be arranged on at least one selected from among the cluster 1400, the center fascia 1500, and the passenger seat dashboard 1600.

The display device 2 may include an organic light-emitting display device, an inorganic electroluminescent (EL) display device, a quantum dot display device, and/or the like. Hereinafter, as the display device 2 according to one or more embodiments, an organic light-emitting display device display including the light-emitting device according to the present disclosure will be described as an example, but one or more suitable types (kinds) of display devices as described above may be utilized in embodiments of the present disclosure.

Referring to FIG. 6A, the display device 2 may be arranged on the center fascia 1500. In one embodiment, the display device 2 may display navigation information. In another embodiment, the display device 2 may display audio, video, or information regarding vehicle settings.

Referring to FIG. 6B, the display device 2 may be arranged on the cluster 1400. When the display device 2 is arranged on the cluster 1400, the cluster 1400 may display driving information and/or the like through the display device 2. For example, in some embodiments, the cluster 1400 may be implemented digitally. The digital cluster 1400 may display vehicle information and driving information as images. For example, a needle and a gauge of a tachometer and/or one or more suitable warning light icons may be displayed by a digital signal.

Referring to FIG. 6C, the display device 2 may be arranged on the dashboard 1600 of the passenger seat. The display device 2 may be embedded in the passenger seat dashboard 1600 or arranged on the passenger seat dashboard 1600. In some embodiments, the display device 2 arranged on the dashboard 1600 for the passenger seat may display an image related to information displayed on the cluster 1400 and/or information displayed on the center fascia 1500. In one or more embodiments, the display device 2 arranged on the passenger seat dashboard 1600 may display information different from information displayed on the cluster 1400 and/or information displayed on the center fascia 1500.

[Manufacturing Method]

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein may refer to a cyclic group consisting of carbon only as a ring-forming atom and having three to sixty carbon atoms, and the term "$C_1$-$C_{60}$ heterocyclic group" as utilized herein may refer to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the $C_1$-$C_{60}$ heterocyclic group has 3 to 61 ring-forming atoms.

The "cyclic group" as utilized herein may include the $C_3$-$C_{60}$ carbocyclic group, and the $C_1$-$C_{60}$ heterocyclic group.

The term "π electron-rich $C_3$-$C_{60}$ cyclic group" as utilized herein may refer to a cyclic group that has three to sixty carbon atoms and does not include *—N=*' as a ring-forming moiety, and the term "π electron-deficient nitrogen-containing $C_1$-$C_{60}$ cyclic group" as utilized herein may refer to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein may refer to a group condensed to any cyclic group, a monovalent group, or a polyvalent group (for example, a divalent group, a trivalent group, a tetravalent group, etc.) according to the structure of a formula for which the corresponding term is utilized. For example, the "benzene group" may be a benzo group, a phenyl group, a phenylene group, and/or the like, which may be easily understood by one of ordinary skill in the art according to the structure of a formula including the "benzene group."

In one or more embodiments, non-limiting examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and non-limiting examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as utilized herein may refer to a linear or branched aliphatic hydrocarbon monovalent group that has one to sixty carbon atoms, and non-limiting examples thereof may be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein may refer to a monovalent hydrocarbon group having at least one carbon-carbon double bond in the middle or at the terminus of the $C_2$-$C_{60}$ alkyl group, and non-limiting examples thereof may be an ethenyl group, a propenyl group, and a butenyl group. The term "$C_2$-$C_{60}$ alkenylene group" as utilized herein may refer to a divalent group having the same structure as the $C_2$-$C_{60}$ alkenyl group.

The term "$C_2$-$C_{60}$ alkynyl group" as utilized herein may refer to a monovalent hydrocarbon group having at least one carbon-carbon triple bond in the middle or at the terminus of the $C_2$-$C_{60}$ alkyl group, and non-limiting examples thereof may include an ethynyl group, a propynyl group, and/or the like. The term "$C_2$-$C_{60}$ alkynylene group" as utilized herein may refer to a divalent group having the same structure as the $C_2$-$C_{60}$ alkynyl group.

The term "$C_1$-$C_{60}$ alkoxy group" as utilized herein may refer to a monovalent group represented by —$OA_{101}$ (wherein $A_{101}$ may be a $C_1$-$C_{60}$ alkyl group), and non-limiting examples thereof may include a methoxy group, an ethoxy group, and an isopropyloxy group.

The term "$C_3$-$C_{10}$ cycloalkyl group" as utilized herein may refer to a monovalent saturated hydrocarbon cyclic group having 3 to 10 carbon atoms, and non-limiting examples thereof may be a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as utilized herein may refer to a divalent group having the same structure as the $C_3$-$C_{10}$ cycloalkyl group.

The term "$C_1$-$C_{10}$ heterocycloalkyl group" as utilized herein may refer to a monovalent cyclic group of 1 to 10 carbon atoms, further including, in addition to carbon atoms, at least one heteroatom, as ring-forming atoms, and non-limiting examples thereof may be a 1,2,3,4-oxatriazolidinyl group, a tetrahydrofuranyl group, and a tetrahydrothiophenyl group. The term "$C_1$-$C_{10}$ heterocycloalkylene group" as utilized herein may refer to a divalent group having the same structure as the $C_1$-$C_{10}$ heterocycloalkyl group.

The term $C_3$-$C_{10}$ cycloalkenyl group utilized herein may refer to a monovalent cyclic group that has three to ten carbon atoms and at least one carbon-carbon double bond in the ring thereof and no aromaticity, and non-limiting examples thereof may be a cyclopentenyl group, a cyclohexenyl group, and a cycloheptenyl group. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein may refer to a monovalent cyclic group of 1 to 10 carbon atoms, further including, in addition to carbon atoms, at least one heteroatom, as ring-forming atoms, and having at least one carbon-carbon double bond in the cyclic structure thereof. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as utilized herein may refer to a divalent group having the same structure as the $C_1$-$C_{10}$ heterocycloalkenyl group.

The term "$C_6$-$C_{60}$ aryl group" as utilized herein may refer to a monovalent group having a carbocyclic aromatic system of 6 to 60 carbon atoms, and the term "$C_6$-$C_{60}$ arylene group" as utilized herein may refer to a divalent group having a carbocyclic aromatic system of 6 to 60 carbon atoms. Non-limiting examples of the $C_6$-$C_{60}$ aryl group may be a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein may refer to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein may refer to a divalent group having a heterocyclic aromatic system of 1 to 60 carbon atoms, further including, in addition to carbon atoms, at least one heteroatom, as ring-forming atoms. Non-limiting examples of the $C_1$-$C_{60}$ heteroaryl group may be a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein may refer to a monovalent group (for example, having 8 to 60 carbon atoms) having two or more rings condensed to each other, only carbon atoms as ring-forming atoms, and no aromaticity in its entire molecular structure as a whole. Non-limiting examples of the monovalent non-aromatic condensed polycyclic group may be an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as utilized herein may refer to a divalent group having the same structure as the monovalent non-aromatic condensed polycyclic group described above.

The term "monovalent non-aromatic condensed heteropolycyclic group" as utilized herein may refer to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure as a whole. Non-limiting examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as utilized herein may refer to a divalent group having the same structure as the monovalent non-aromatic condensed heteropolycyclic group described above.

The term "$C_6$-$C_{60}$ aryloxy group" as utilized herein may refer to —$OA_{102}$ (wherein $A_{102}$ may be a $C_6$-$C_{60}$ aryl group), and the term "$C_6$-$C_{60}$ arylthio group" as utilized herein may refer to —$SA_{103}$ (wherein $A_{103}$ may be a $C_6$-$C_{60}$ aryl group).

The term "$C_7$-$C_{60}$ arylalkyl group" utilized herein may refer to -$A_{104}A_{105}$ (where $A_{104}$ may be a $C_1$-$C_{54}$ alkylene group, and $A_{105}$ may be a $C_6$-$C_{59}$ aryl group), and the term $C_2$-$C_{60}$ heteroarylalkyl group" utilized herein may refer to -$A_{106}A_{107}$ (where $A_{106}$ may be a $C_1$-$C_{59}$ alkylene group, and $A_{107}$ may be a $C_1$-$C_{59}$ heteroaryl group).

The term "$R_{10a}$" as utilized herein may refer to:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ utilized herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as utilized herein may refer to any atom other than a carbon atom. Non-limiting examples of the heteroatom may be O, S, N, P, Si, B, Ge, Se, and any combinations thereof.

The term "third-row transition metal" utilized herein may include hafnium (Hf), tantalum (Ta), tungsten (W), rhenium (Re), osmium (Os), iridium (Ir), platinum (Pt), gold (Au), and/or the like.

"Ph" as utilized herein may refer to a phenyl group, "Me" as utilized herein may refer to a methyl group, "Et" as utilized herein may refer to an ethyl group, "tert-Bu" or "$Bu^t$" as utilized herein may refer to a tert-butyl group, and "OMe" as utilized herein may refer to a methoxy group.

The term "biphenyl group" as utilized herein may refer to "a phenyl group substituted with a phenyl group." In other words, the "biphenyl group" is a substituted phenyl group having a $C_6$-$C_{60}$ aryl group as a substituent.

The term "terphenyl group" as utilized herein may refer to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

In the present disclosure, the x-axis, y-axis, and z-axis are not limited to three axes in an orthogonal coordinate system, and may be interpreted in a broad sense including these axes. For example, the x-axis, y-axis, and z-axis may refer to those orthogonal to each other, or may refer to those in different directions that are not orthogonal to each other.

* and *' as utilized herein, unless defined otherwise, each refer to a binding site to a neighboring atom in a corresponding formula or moiety.

Hereinafter, compounds according to one or more embodiments of the present disclosure and light-emitting devices according to one or more embodiments of the present disclosure will be described in more detail with reference to the following synthesis examples and examples. The wording "B was utilized instead of A" utilized in describing Synthesis Examples may refer to that an identical molar equivalent of B was utilized in place of A.

EXAMPLES

Synthesis Example 1: Synthesis of Compound D11

1. Synthesis of Intermediate Compound 11-3

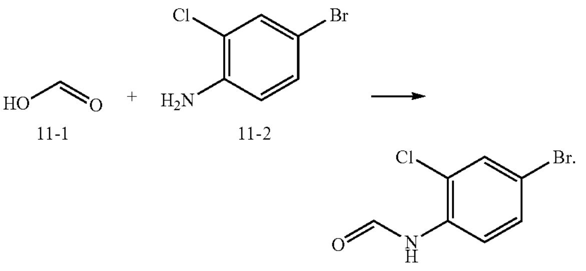

11-1 11-2

11-3

Polyethylene glycol (PEG-400, 2 g) was added to a mixture of Compound 11-1 (3 mmol) and Compound 11-2 (1 mmol), and then was mixed at room temperature. Meanwhile, the reaction was monitored through thin layer chromatography (TLC). After the reaction was completed, the mixture was diluted in 10 mL of distilled water, and was subjected to an extraction process three times with 10 mL of ethyl acetate (EtOAc). An organic material was dried with inorganic $Na_2SO_4$ and was concentrated. The obtained solid was purified by utilizing column chromatography to obtain Intermediate Compound 11-3 (yield of 79%).

2. Synthesis of Intermediate Compound 11-5

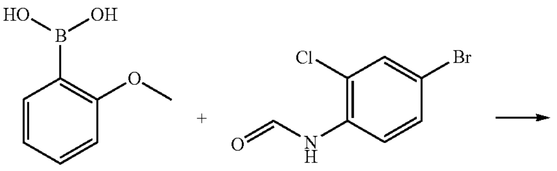

11-4 11-3

-continued

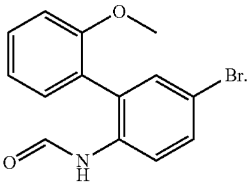

11-5

Intermediate Compound 11-3 (1.0 mmol), $Pd(OAc)_2$ (0.02 mmol), 2-dicyclohexylphosphino-2',6'-dimethoxy-1,1'-biphenyl (S-Phos, 0.04 mmol), Compound 11-4 (1.5 mmol), and inorganic $K_3PO4$ (2.0 mmol) were put into a 14 mL reaction tube, and the reaction tube was slightly shaken to mix the solid mixture therein well. The sealed tube was subjected to three times of vacuum processing and filling with Ar gas. Toluene (1.5 mL) was added utilizing a syringe, and the mixture was heated at 90° C. in an oil bath. To promote the reaction, the tube may be shaken or subjected to sonification. After the reaction was completed, the reaction product was filtered through Celite, and the Celite bed was washed three times with EtOAc (5 mL). The filtered liquid was diluted with EtOAc (10 mL) and washed four times with NaOH (aq. 1 N, 10 mL) solution to remove excess Compound 11-4. The reaction product was dried with inorganic $Na_2SO_4$, concentrated, and purified and separated by column chromatography to obtain Intermediate Compound 11-5 (yield of 95%).

3. Synthesis of Intermediate Compound 11-6

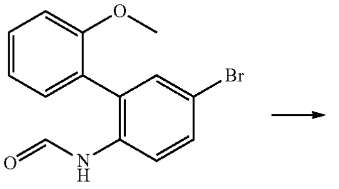

11-5

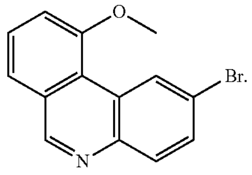

11-6

Intermediate Compound 11-5 (10 mmol) and $POCl_3$ (40 mmol) were refluxed for 2 hours, and a solvent was eliminated in a vacuum environment. NaOH (aq, 2M) solution was added so that the obtained material became basic with a pH of 10 or more, and was subjected to an extraction process three times with $CH_2Cl_2$ (20 mL). The extracted organic layer was washed two times with brine (20 mL), dried with inorganic $MgSO_4$, and purified and separated by silica gel flash chromatography utilizing ethyl acetate/petroleum ether as an eluent to obtain Intermediate Compound 11-6.

4. Synthesis of Intermediate Compound 11-8

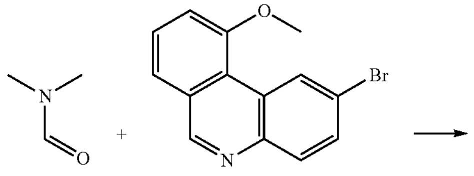

11-7 11-6

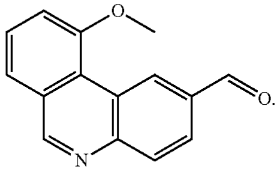

11-8

Tetrahydrofuran (THF) (12 mL) and n-BuLi (2.5 M in Hexane) solution (0.49 mL, 1.22 mmol) were added to a 100 mL two-neck flask, and then mixed at −78° C. under nitrogen gas. A mixed solution containing Intermediate Compound 11-6 (1 mmol) and THF solvent was slowly added to the flask by utilizing a syringe. After the mixture was stirred at −78° C. for about 30 minutes, Compound 11-7 (1.39 mmol) was added to the mixture by utilizing a syringe, and then the mixture was stirred at −78° C. for about 3 hours. The mixture was treated with distilled water (5 mL), subjected to an extraction process three times with EtOAc (15 mL), and washed two times with brine (20 mL) to collect an organic layer. Subsequently, the collected organic layer was dried with $Na_2SO_4$, and concentrated with Rotavapor. The obtained solid was purified by flash column chromatography through silica gel to obtain Intermediate Compound 11-8 (yield of 31%).

5. Synthesis of Intermediate Compound 11-10

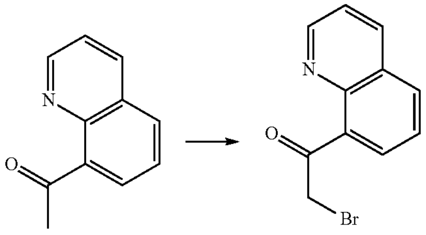

11-9 11-10 .

Intermediate Compound 11-9 (5 mmol), HBr (5.5 mmol, 40% aq.), and 2-methylpyridinium nitrate (5.5 mmol) were put in a reaction flask equipped with a condenser and 02 balloon and stirred at 60° C. for 8 hours. The reaction process was monitored with TLC and gas chromatography. After the reaction was completed, 10 mL of $NaHSO_3$ (aq.) saturated solution was added thereto, and the mixture was subjected to an extraction process three times with ethyl acetate (20 mL). The extracted organic layer was washed with distilled water, dried with $Na_2SO_4$, and then concentrated. The obtained material was purified and separated by column chromatography utilizing silica gel utilizing $CH_2Cl_2$ and hexane as a development solvent to thereby obtain Intermediate Compound 11-10 (yield of 78%).

6. Synthesis of Intermediate Compound 11-12

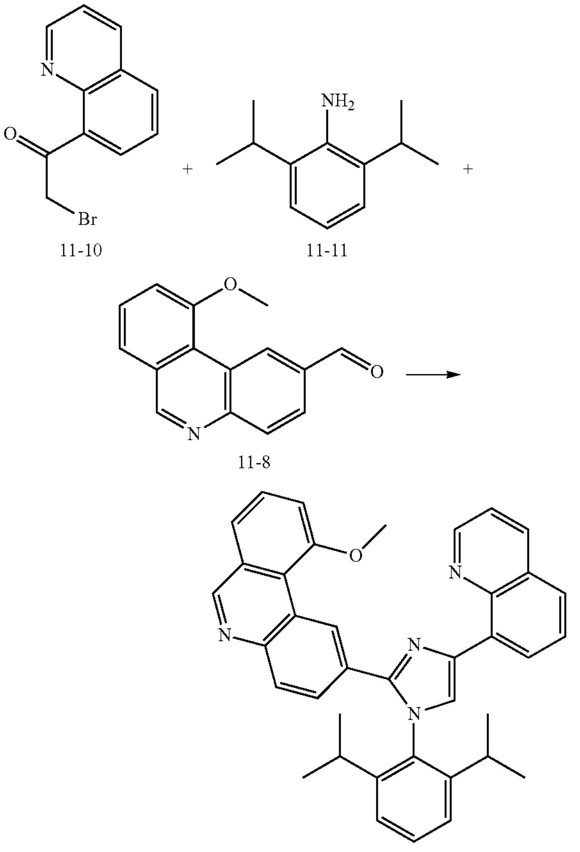

11-10 + 11-11 + 11-8 → 11-12

Intermediate Compound 11-10 (2 mmol), Compound 11-11 (2 mmol), Intermediate Compound 11-8 (2 mmol), and ammonium acetate (3 mmol) were mixed and then stirred at 130° C. for 2 hours. Then, the mixture was cooled to room temperature, was subjected to an extraction process through dilution with acetone-$H_2O$ (Volume ratio 1:1), and recrystallized from n-hexane-EtOAc (Volume ratio 1:1) to obtain Intermediate Compound 11-12 (yield of 92%).

7. Synthesis of Intermediate Compound 11-13

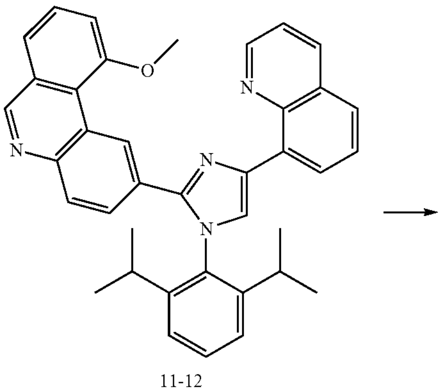

11-12

-continued

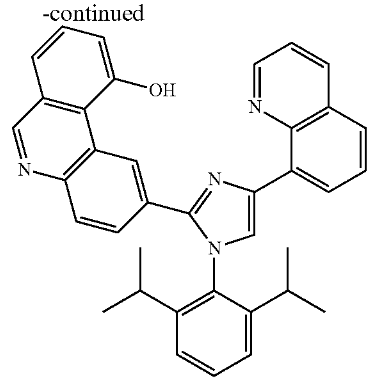

11-13

Intermediate Compound 11-13 (5.7 mmol) and pyridine hydrochloride (34 mmol) were heated at 200° C. for 6 hours. After adding water thereto, the mixture was subjected to an extraction process utilizing ethyl acetate, dried with $Na_2SO_4$, and then purified and separated by column chromatography utilizing silica gel utilizing $CH_2Cl_2$ and hexane as a development solvent to thereby obtain Intermediate Compound 11-13 (yield of 58%).

8. Synthesis of Compound D11

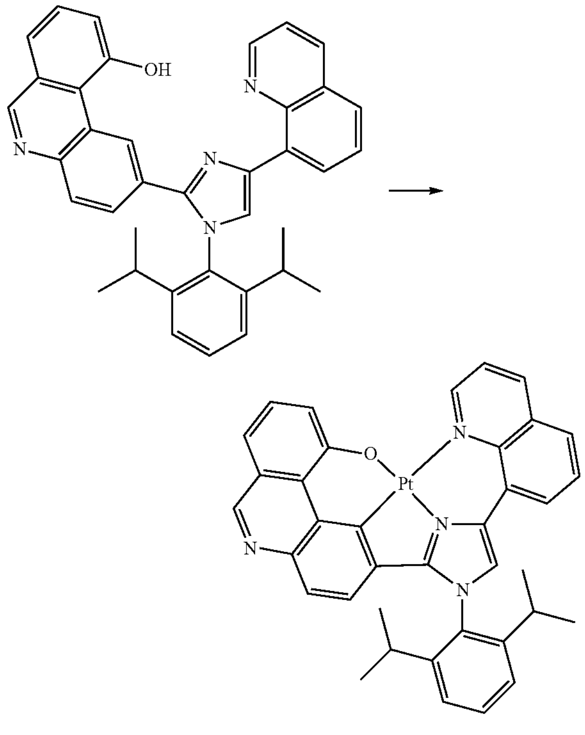

Figure 7:
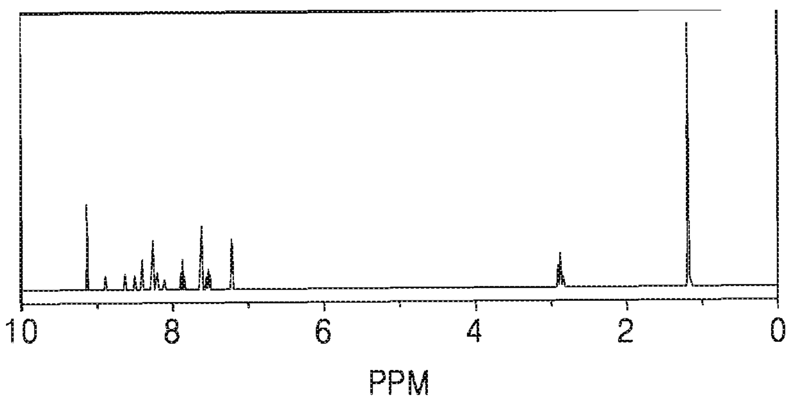
FIG. 7 is a view illustrating an NMR graph of Compound D11 synthesized according to Synthesis Example 1 of the present disclosure.

Acetic acid (30 mL), Intermediate Compound 11-13 (2.50 mmol), and Pt salt (2.8 mmol) were added to a 250 mL round-bottom flask, degassed with nitrogen for 30 minutes, and then heated at 130° C. in an oil bath until Intermediate Compound 11-13 was completely reacted (for about 4 days). After a cooling process was performed thereon, the mixture was mixed with heptane, and the mixed solution was stirred and filtered. The obtained solid was purified by silica gel column chromatography utilizing a mixed solvent including dichloromethane (DCM) and ethyl acetate (2% of ethyl acetate in DCM) to thereby obtain Compound D11 (yield of 42%). The obtained compound was confirmed to be Compound D11 through NMR and liquid chromatography-mass spectroscopy (LC-MS) and $^1$H NMR of Compound D11 is shown in FIG. 7. (LS-MS: (Found) Exact Mass: 725.21, (Calc) Molecular Weight: 725.76)

Methods of synthesizing compounds other than the compounds synthesized in Synthesis Example 1 may be easily understood to those skilled in the art by referring to the synthesis pathways and raw materials described above.

Example 1

As an anode, a 15 Ω/$cm^2$ (1,200 Å) ITO glass substrate available from Corning Inc. was cut to a size of 50 mm×50 mm×0.7 mm, sonicated utilizing isopropyl alcohol and pure water for 5 minutes each, and then cleaned by irradiation of ultraviolet rays and exposure of ozone thereto for 30 minutes. Then, the resultant glass substrate was loaded onto a vacuum deposition apparatus.

2-TNATA was vacuum-deposited on the ITO anode formed on the glass substrate to form a hole injection layer having a thickness of 600 Å, and then, 4,4'-bis[N-(1-naphthyl)-N-phenylamino]biphenyl (NPB) was vacuum-deposited on the hole injection layer to form a hole transport layer having a thickness of 300 Å.

Compound H41 as a host and Compound D01 as a dopant (weight ratio of 90:10) were co-deposited on the hole transport layer to form an emission layer having a thickness of 450 Å.

Diphenyl(4-(triphenylsilyl)phenyl)-phosphine oxide (TSPO1) was vacuum-deposited on the emission layer to form a hole blocking layer having a thickness of 50 Å. Then, Compound ET37 was deposited on the hole blocking layer to form an electron transport layer having a thickness of 300 Å, Yb was deposited on the electron transport layer to form an electron injection layer having a thickness of 10 Å, AgMg was deposited on the electron injection layer to form a cathode having a thickness of 120 Å, and HT28 was deposited on the cathode to form a capping layer having a thickness of 600 Å.

H41

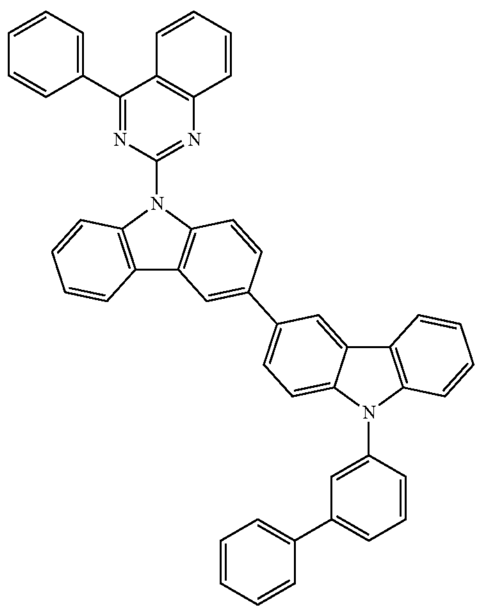

-continued

ET37

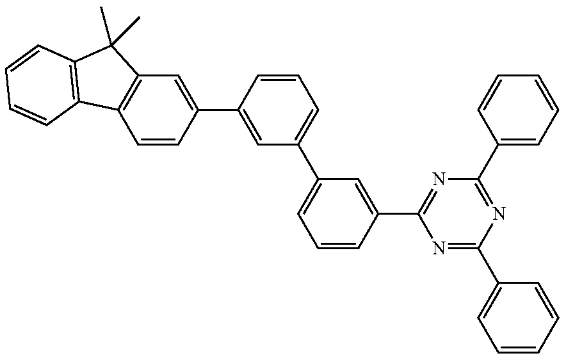

HT28

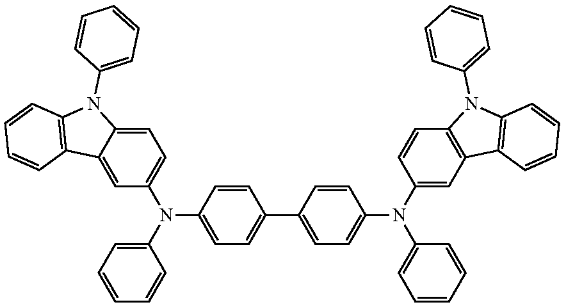

Examples 2 to 10 and Comparative Examples 1 to 6

Organic light-emitting devices were manufactured in substantially the same manner as in Example 1, except that compounds shown in Table 2 were each utilized instead of Compound D01 as a dopant in forming an emission layer:

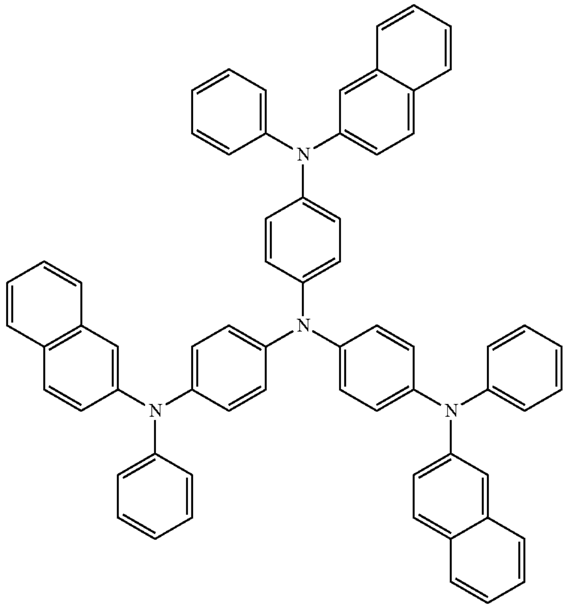

2-TNATA

-continued

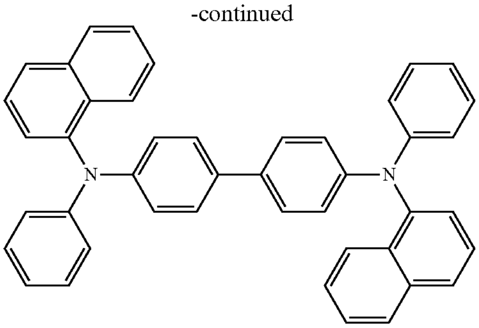

NPB

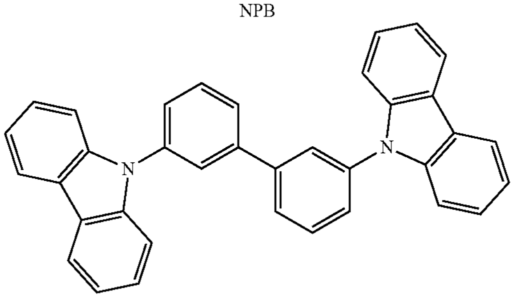

mCBP

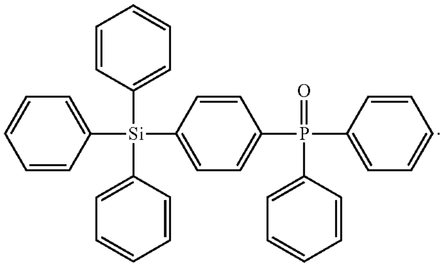

TSPO1

Evaluation Example 1

To evaluate characteristics of the light-emitting devices manufactured according to Examples 1 to 12 and Comparative Examples 1 to 6, the driving voltage at a current density of 50 mA/cm$^2$, luminance, and luminescence efficiency thereof were measured. The driving voltage of the light-emitting devices was measured utilizing a source meter (Keithley Instrument Inc., 2400 series). In addition, an emission spectrum of the light-emitting device was measured utilizing a Quantaurus-QY Absolute PL quantum yield spectrometer of Hamamatsu company (on which a xenon light source, a monochromator, a photonic multichannel analyzer, and an integrating sphere are mounted and which uses a PLQY measurement software (Hamamatsu Photonics, Ltd., Shizuoka, Japan)) to thereby measure the maximum emission wavelength (Amax), and then the color purity (CIEx and CIEy coordinates) at 400 cd/m$^2$ was measured. Table 2 shows the evaluation results of the characteristics of the light-emitting devices.

TABLE 2

| | Dopant | Maximum luminescence efficiency (cd/A) | Driving voltage (V) | $\lambda_{max}$ (nm) | CIE x | CIE y |
|---|---|---|---|---|---|---|
| Example 1 | D01 | 28.59 | 3.13 | 595 | 0.62 | 0.38 |
| Example 2 | D02 | 28.59 | 3.13 | 633 | 10.63 | 0.31 |

TABLE 2-continued

| | Dopant | Maximum luminescence efficiency (cd/A) | Driving voltage (V) | $\lambda_{max}$ (nm) | CIE x | CIE y |
|---|---|---|---|---|---|---|
| Example 3 | D03 | 31.41 | 3.1 | 632 | 0.63 | 0.31 |
| Example 4 | D09 | 33.96 | 3.05 | 621 | 0.68 | 0.32 |
| Example 5 | D11 | 46.43 | 2.9 | 627 | 0.63 | 0.31 |
| Example 6 | D13 | 28.59 | 3.13 | 600 | 0.63 | 0.37 |
| Example 7 | D14 | 28.59 | 3.13 | 638 | 0.70 | 0.30 |
| Example 8 | D15 | 31.41 | 3.1 | 638 | 0.70 | 0.30 |
| Example 9 | D21 | 38.07 | 3.0 | 626 | 0.63 | 0.31 |
| Example 10 | D23 | 46.49 | 2.9 | 626 | 0.68 | 0.32 |
| Example 11 | D25 | 28.59 | 3.13 | 638 | 0.70 | 0.30 |
| Example 12 | D26 | 25.62 | 3.2 | 626 | 0.68 | 0.32 |
| Comparative Example 1 | R01 | 12.77 | 3.47 | 541 | 10.37 | 0.61 |
| Comparative Example 2 | R02 | 12.18 | 3.5 | 517 | 10.23 | 0.63 |
| Comparative Example 3 | R03 | 18.04 | 3.36 | 642 | 0.70 | 0.30 |
| Comparative Example 4 | R04 | 25.62 | 3.2 | 537 | 0.37 | 0.62 |
| Comparative Example 5 | R05 | 19.92 | 3.3 | 517 | 0.23 | 0.63 |
| Comparative Example 6 | R06 | 33.7 | 3.05 | 557 | 0.45 | 0.54 |

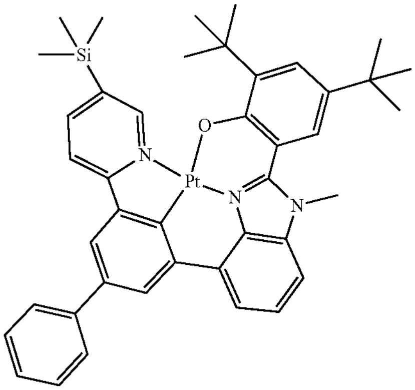

R01

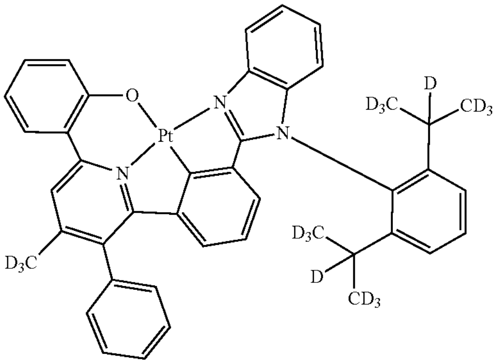

R02

TABLE 2-continued

| Dopant | Maximum luminescence efficiency (cd/A) | Driving voltage (V) | $\lambda_{max}$ (nm) | CIE x | CIE y |
|---|---|---|---|---|---|
| 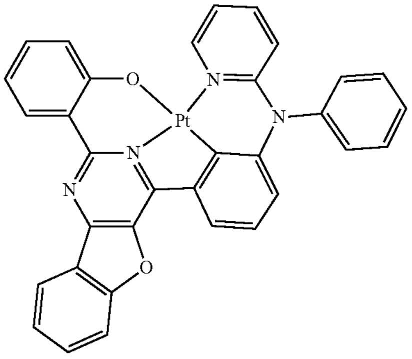 R03 | | | | | |
| 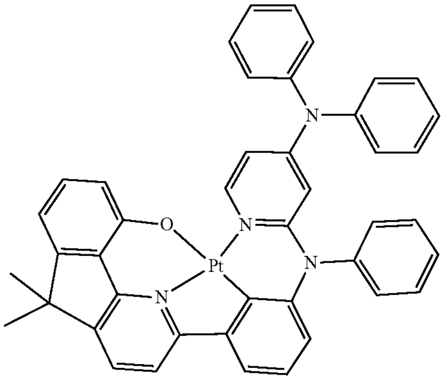 R04 | | | | | |
| 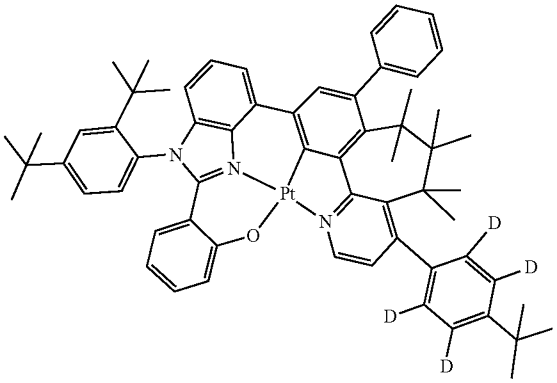 R05 | | | | | |
| 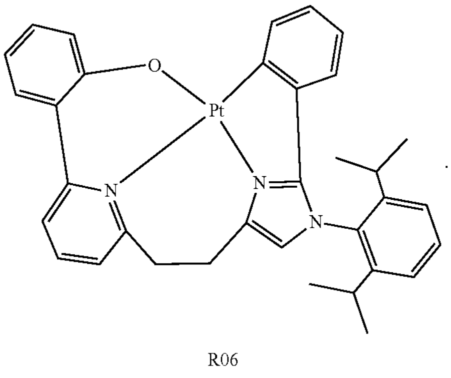 R06 | | | | | |

Referring to Table 2, it was confirmed that the light-emitting devices of Examples 1 to 12 had higher luminescence efficiency and the same as or lower driving voltage than those of the light-emitting devices of Comparative Examples 1 to 6. In addition, it was confirmed that the light-emitting devices of Examples 1 to 12 satisfied the maximum emission wavelength range of about 590 nm to about 670 nm.

Although the present disclosure has been described with reference to the Synthesis Examples and Examples, these examples are provided for illustrative purpose only, and one of ordinary skill in the art may understand that these examples may have one or more suitable modifications and other examples equivalent thereto. Accordingly, the scope of the present disclosure should be determined by the technical concept of the claims, and equivalents thereof.

According to one or more embodiments, an organometallic compound represented by Formula 1 may be utilized in manufacturing a light-emitting device having high efficiency and a long lifespan, and the light-emitting device may be utilized in manufacturing a high-quality electronic apparatus high efficiency and a long lifespan.

Unless otherwise defined, all terms (including technical and scientific terms) utilized herein have the same meaning as commonly understood by one of ordinary skill in the art to which this present disclosure belongs. It will be further understood that terms, such as those defined in commonly utilized dictionaries, should be interpreted as having a meaning that is consistent with their meaning in the context of the relevant art and will not be interpreted in an idealized or overly formal sense unless expressly so defined herein.

In the present disclosure, it will be understood that when an element (or region, layer, part, etc.) is referred to as being "on", "connected to" or "coupled to" another element, it can be directly on, connected or coupled to the other element or a third intervening elements may be present.

In some embodiments, "directly on" may refer to that there are no additional layers, films, regions, plates, etc., between a layer, a film, a region, a plate, etc. and the other part. For example, "directly on" may refer to two layers or two members are disposed without utilizing an additional member such as an adhesive member therebetween.

It will be understood that, although the terms first, second, etc. may be utilized herein to describe one or more suitable elements, these elements should not be limited by these terms. These terms are only utilized to distinguish one element from another element. For example, a first element could be termed a second element without departing from the teachings of the present disclosure. Similarly, a second element could be termed a first element. As utilized herein, the singular forms are intended to include the plural forms as well, unless the context clearly indicates otherwise.

In some embodiments, the terms "below," "beneath," "on," and "above" are utilized for explaining the relation of elements shown in the drawings. The terms are relative concept and are explained based on the direction shown in the drawing. In the present disclosure, when an element is referred to as being disposed "on" another element, it can be disposed under the other element.

In the present disclosure, it will be further understood that the terms "comprise(s)/include(s)" and/or "comprising/including," when utilized in the present disclosure, specify the presence of stated features, numerals, steps, operations, elements, parts, or the combination thereof, but do not preclude the presence or addition of one or more other features, numerals, steps, operations, elements, parts, or the combination thereof.

As utilized herein, the singular forms "a," "an," and "the" are intended to include the plural forms as well, unless the context clearly indicates otherwise. Further, the use of "may" when describing embodiments of the present disclosure refers to "one or more embodiments of the present disclosure".

As utilized herein, the term "substantially," "about," and similar terms are utilized as terms of approximation and not as terms of degree, and are intended to account for the inherent deviations in measured or calculated values that would be recognized by those of ordinary skill in the art. "About," or "substantially," as utilized herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

In the present disclosure, when particles are spherical, "diameter" indicates a particle diameter or an average particle diameter, and when the particles are non-spherical, the "diameter" indicates a major axis length or an average major axis length. The diameter (or size) of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter (or size) is referred to as D50. D50 refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

The light-emitting device, the display device, or any other relevant electronic devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device, comprising:

a first electrode;

a second electrode facing the first electrode;

an interlayer between the first electrode and the second electrode and comprising an emission layer; and at least one organometallic compound represented by Formula 1:

Formula 1

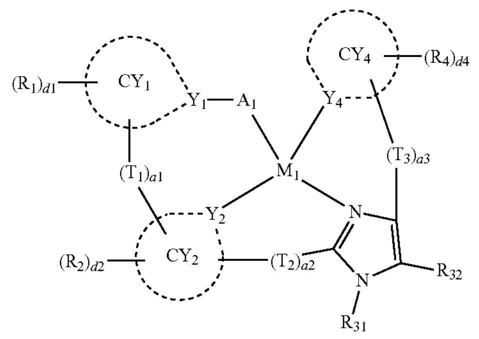

wherein, in Formula 1, $M_1$ is a transition metal, $CY_1$, $CY_2$, and $CY_4$ are each independently a $C_3$-$C_{60}$ carbocyclic group or a $C_1$-$C_{60}$ heterocyclic group, $Y_1$, $Y_2$, and $Y_4$ are each independently C or N, $A_1$ is O or S, $T_1$ to $T_3$ are each independently a single bond, a double bond, $*—N[(L_1)_{b1}-(R_{1a})]—*'$, $*—B(R_{1a})—*'$, $*—P(R_{1a})—*'$, $*—C(R_{1a})(R_{1b})—*'$, $*—Si(R_{1a})(R_1)—*'$, $*—Ge(R_{1a})(R_{1b})—*'$, $*—S—*'$, $*—Se—*'$, $*—O—*$, $*—C(=O)—*'$, $*—S(=O)—*'$, $*—S(=O)_2—*$, $*—C(R_{1a})=*'$, $*=C(R_{1a})—*'$, $*—C(R_{1a})=C(R_{1b})—*'$, $*—C(=S)—*'$, or $*—C\equiv C—*'$, a1 to a3 are each independently an integer from 1 to 3,

* and *' each indicate a binding site to a neighboring atom, $L_1$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b1 is an integer from 1 to 3, $R_1$, $R_2$, $R_{31}$, $R_{32}$, $R_4$, $R_{1a}$, and $R_{1b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), d1, d2, and d4 are each independently an integer from 0 to 20, neighboring two or more groups of $R_1$, $R_2$, $R_{31}$, $R_{32}$, $R_4$, $R_{1a}$, and $R_{1b}$ are optionally bonded to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

2. The light-emitting device of claim 1, wherein the first electrode is an anode, the second electrode is a cathode, the interlayer comprises the at least one organometallic compound, the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region further comprises a hole blocking layer, an electron transport layer, an electron injection layer, or any combination thereof.

3. The light-emitting device of claim 1, wherein the emission layer comprises the at least one organometallic compound represented by Formula 1.

4. The light-emitting device of claim 3, wherein the emission layer further comprises a host, and an amount of the at least one organometallic compound is in a range of 0.01 wt % to 49.99 wt % based on 100 wt % of the emission layer.

5. The light-emitting device of claim 3, wherein the emission layer is to emit light having a maximum emission wavelength of 590 nm to 670 nm.

6. An electronic apparatus comprising the light-emitting device of claim 1.

7. The electronic apparatus of claim 6, further comprising a thin-film transistor, wherein the thin-film transistor comprises a source electrode and a drain electrode, and the first electrode of the light-emitting device is electrically connected to the source electrode or the drain electrode of the thin-film transistor.

8. The electronic apparatus of claim 6, further comprising a color filter, a color conversion layer, a touch screen layer, a polarizing layer, or any combination thereof.

9. The electronic apparatus of claim 6, further comprising:

a thin-film transistor; and a color filter, a color-conversion layer, a touch screen layer, a polarizing layer, or any combination thereof, wherein the thin-film transistor comprises a source electrode and a drain electrode, and the first electrode of the light-emitting device is electrically connected to the source electrode or the drain electrode.

10. An electronic device comprising the light-emitting device of claim 1, wherein the electronic device is a flat panel display, a curved display, a computer monitor, a medical monitor, a television, an advertisement board, an indoor or outdoor lighting and/or signaling light, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a 3D display, a virtual or augmented-reality display, a vehicle, a video wall comprising multiple displays tiled together, a theater or stadium screen, a phototherapy device, or a sign.

11. An organometallic compound represented by Formula 1:

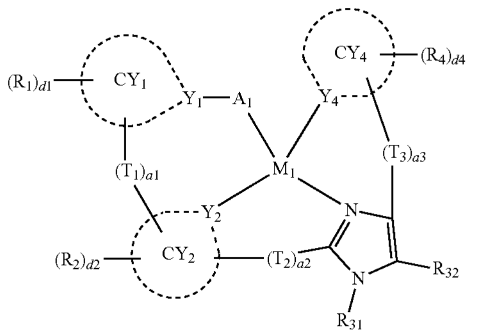

wherein, in Formula 1, $M_1$ is a transition metal, $CY_1$, $CY_2$, and $CY_4$ are each independently a $C_3$-$C_{60}$ carbocyclic group or a $C_1$-$C_{60}$ heterocyclic group, $Y_1$, $Y_2$, and $Y_4$ are each independently C or N, $A_1$ is O or S, $T_1$ to $T_3$ are each independently a single bond, a double bond, *—N[$(L_1)_{b1}$-$(R_{1a})$]—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(=O)—*', *—S(=O)—*', *—S(=O)$_2$—*', *—C($R_{1a}$)=*', *=C($R_{1a}$)—*', *—C($R_{1a}$)=C($R_{1b}$)—*', *—C(=S)—*', or *—C≡C—*', a1 to a3 are each independently an integer from 1 to 3,

* and *' each indicate a binding site to a neighboring atom, and $L_1$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b1 is an integer from 1 to 3, $R_1$, $R_2$, $R_{31}$, $R_{32}$, $R_4$, $R_{1a}$, and $R_{1b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), d1, d2, and d4 are each independently an integer from 0 to 20, neighboring two or more groups of $R_1$, $R_2$, $R_{31}$, $R_{32}$, $R_4$, $R_{1a}$, and $R_{1b}$ are optionally bonded to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

12. The organometallic compound of claim 11, wherein $CY_4$ is a polycyclic group comprising two or more condensed rings of a 6-membered ring.

13. The organometallic compound of claim 11, wherein $CY_4$ is a group represented by Formula 4:

Formula 4

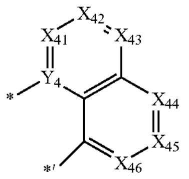

wherein, in Formula 4, $Y_4$ is as defined in Formula 1, $X_{41}$ is C($R_{41}$) or N, $X_{42}$ is C($R_{42}$) or N, $X_{43}$ is C($R_{43}$) or N, $X_{44}$ is C($R_{44}$) or N, $X_{45}$ is C($R_{45}$) or N, and $X_{46}$ is C($R_{46}$) or N, $R_{41}$ to $R_{46}$ are each as defined as $R_4$ in Formula 1, two or more groups of $R_{41}$ to $R_{46}$ are optionally bound to each other to form a $C_5$-$C_{60}$ carbocyclic group that is unsubstituted or substituted with at least one $R_{10a}$ or a $C_2$-$C_{60}$ heterocyclic group that is unsubstituted or substituted with at least one $R_{10a}$, and

*' indicates a binding site to $T_3$ in Formula 1, and

* indicates a binding site to $M_1$ in Formula 1.

14. The organometallic compound of claim 11, wherein at least one of $R_1$ in the number of d1 and at least one of $R_2$ in the number of d2 are linked to each other to form a $C_5$-$C_{60}$ carbocyclic group unsubstituted or substituted with $R_{10a}$ or a $C_2$-$C_{60}$ heterocyclic group unsubstituted or substituted with at least one $R_{10a}$, and $R_{10a}$ is as defined in Formula 1.

15. The organometallic compound of claim 11, wherein a group represented by

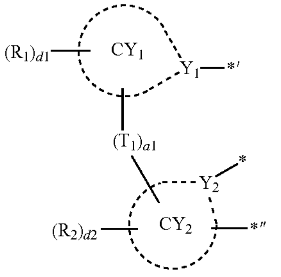

in Formula 1 is represented by

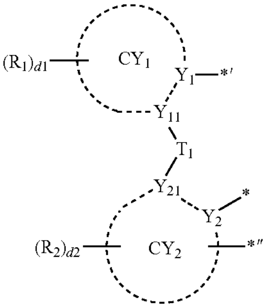

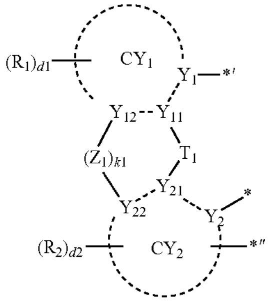

wherein, in Formulae 2-1 and 2-2, $CY_1$, $CY_2$, $Y_1$, $Y_2$, and $T_1$ are each as defined in Formula 1, $Y_{11}$, $Y_{12}$, $Y_{21}$, and $Y_{22}$ are each independently C or N, $Z_1$ is a single bond, a double bond, *'''—N[$(L_{60})_{b60}$-$(R_{60})$]—*'''', *'''—B($R_{60}$)—*'''', *'''—P($R_{60}$)—*'''', *'''—C($R_{60a}$)($R_{60b}$)—*'''', *'''—Si($R_{60a}$)($R_{60b}$)—*'''', *'''—Ge($R_{60a}$)($R_{60b}$)—*'''', *'''—S—, *'''—Se—*'''', *'''—O—*'''', *'''—C(═O)—*'''', *'''—S(═O)—*'''', *'''—S(═O)$_2$—*'''', *'''—C($R_{60}$)═*'''', or *'''═C($R_{60}$)—*'''', k1 is an integer from 1 to 3, $L_{60}$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b60 is an integer from 1 to 3, $R_{60}$, $R_{60a}$, and $R_{60b}$ are each as defined as $R_1$ in Formula 1, and $R_{10a}$ is as defined in Formula 1,

*' indicates a binding site to $A_1$ in Formula 1,

* indicates a binding site to $M_1$ in Formula 1,

*" indicates a binding site to $T_2$ in Formula 1, and

*''' and *'''' each indicate a binding site to a neighboring atom.

16. The organometallic compound of claim 11, wherein a group represented by

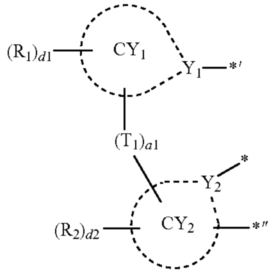

in Formula 1 is a group represented by one selected from among Formulae 2-11 to 2-13:

2-11

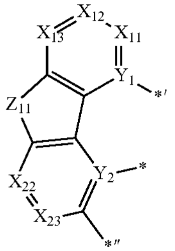

2-12

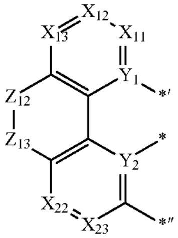

2-13

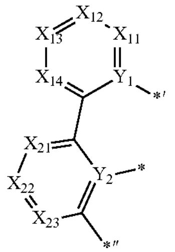

wherein, in Formulae 2-11 to 2-13, $Y_1$ and $Y_2$ are as defined in Formula 1, $X_{11}$ is C($R_{11}$) or N, $X_{12}$ is C($R_{12}$) or N, $X_{13}$ is C($R_{13}$) or N, and $X_{14}$ is C($R_{14}$) or N, $X_{21}$ is C($R_{21}$) or N, $X_{22}$ is C($R_{22}$) or N, and $X_{23}$ is C($R_{23}$) or N, $R_{11}$ to $R_{14}$ are each as defined as $R_1$ in Formula 1, $R_{21}$ to $R_{23}$ are each as defined as $R_2$ in Formula 1, two or more neighboring groups of $R_{11}$ to $R_{14}$ or $R_{21}$ to $R_{23}$ are optionally bonded to each other to form a $C_5$-$C_{60}$ carbocyclic group unsubstituted or substituted with at least one $R_{10a}$ or a $C_2$-$C_{60}$ heterocyclic group unsubstituted or substituted with at least one $R_{10a}$, $Z_{11}$ is *'''—N[$(L_{61})_{b61}$-$(R_{61})$]—*'''', *'''—S—*'''', —*'''—Se—*'''', or *'''—C($R_{61a}$)($R_{61b}$)—*'''', $Z_{12}$ is *'''—N[$(L_{62})_{b62}$-$(R_{62})$]—*'''', *'''—C($R_{62a}$)($R_{62b}$)—*'''', *'''—C($R_{62}$)═*'''', or *'''═C($R_{62}$)—*'''', $Z_{13}$ is *'''—N[$(L_{63})_{b63}$-$(R_{63})$]—*'''', *'''—C($R_{63a}$)($R_{63b}$)—*'''', *'''—C($R_{63}$)═*'''', or *'''═C($R_{63}$)—*'''', $L_{61}$ to $L_{63}$ are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b61 to b63 are each independently an integer from 1 to 3, $R_{61}$, $R_{61a}$, $R_{61b}$, $R_{62}$, $R_{62a}$, $R_{62b}$, $R_{63}$, $R_{63a}$, and $R_{63b}$ are each the same as defined as $R_1$ in Formula 1, and $R_{10a}$ is as defined in Formula 1,

*' indicates a binding site to $A_1$ in Formula 1,

* indicates a binding site to $M_1$ in Formula 1,

*'' indicates a binding site to $T_2$ in Formula 1, and

*''' and *'''' each indicate a binding site to a neighboring atom.

17. The organometallic compound of claim 11, wherein an $^3$MLCT value (a ratio of presence of triplet metal-to-ligand charge transfer) of the organometallic compound represented by Formula 1 is 10% or more.

18. The organometallic compound of claim 11, wherein at least one selected from among $Y_2$ and $Y_4$ is N.

19. The organometallic compound of claim 11, wherein $R_{31}$ is a group represented by Formula 3:

Formula 3

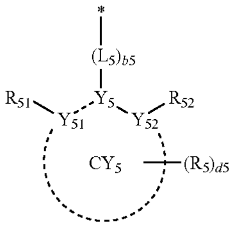

wherein, in Formula 3, $Y_5$, $Y_{51}$, and $Y_{52}$ are each independently C or N, $CY_5$ is a $C_3$-$C_{60}$ carbocyclic group or a $C_1$-$C_{60}$ heterocyclic group, $L_5$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, b5 is an integer from 1 to 3, $R_5$, $R_{51}$, and $R_{52}$ are each as defined as $R_1$ in Formula 1, d5 is an integer from 0 to 10, and

* indicates a binding site to a neighboring atom.

20. The organometallic compound of claim 11, wherein the organometallic compound is one selected from among Compounds D01 to D36:

D01

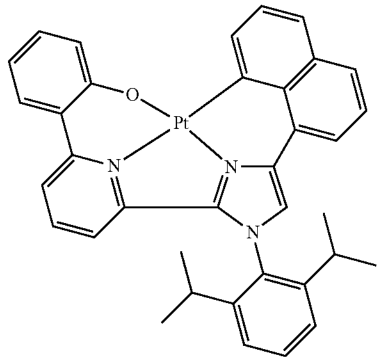

D02

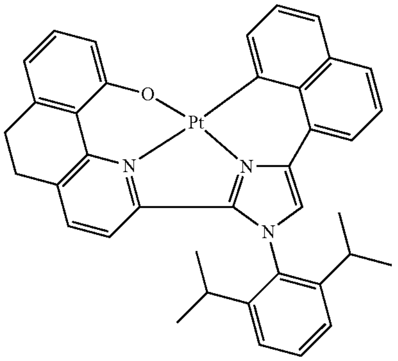

D03

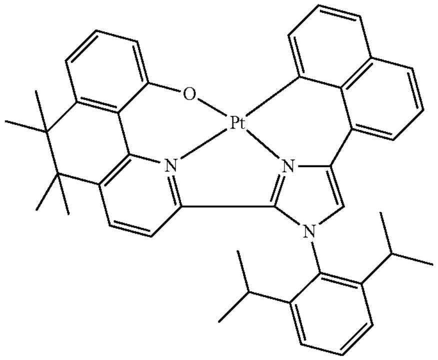

D04

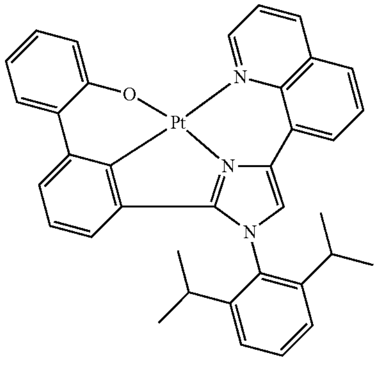

-continued
D05
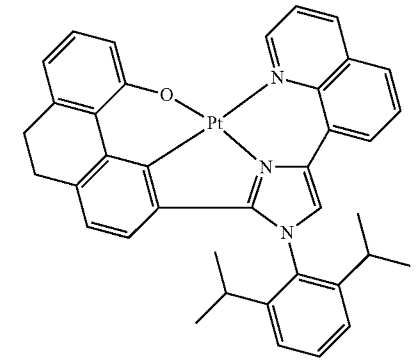
D06
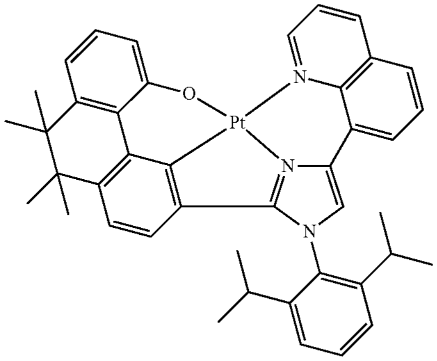
D07
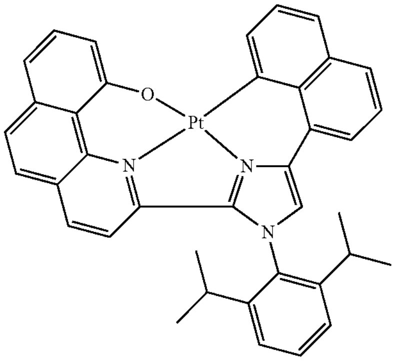
D08
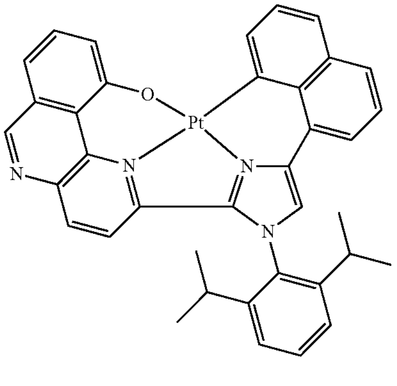
-continued
D09
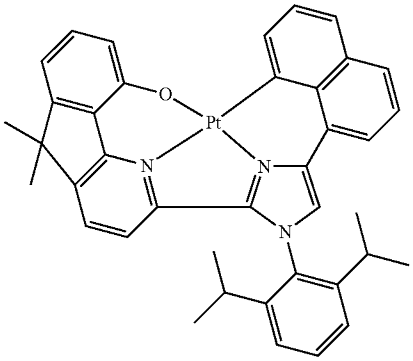
D10
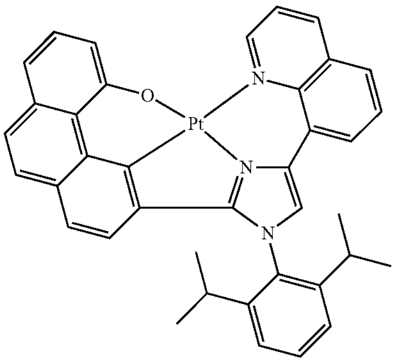
D11
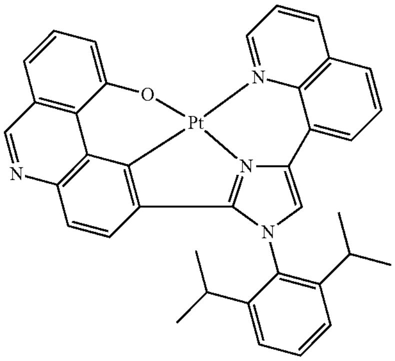
D12
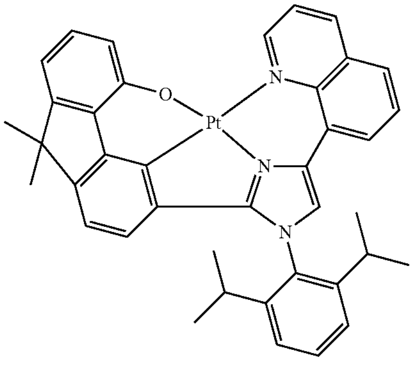

-continued
D13
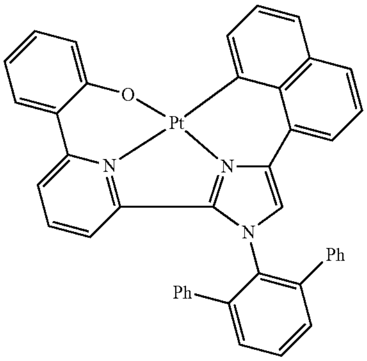
D14
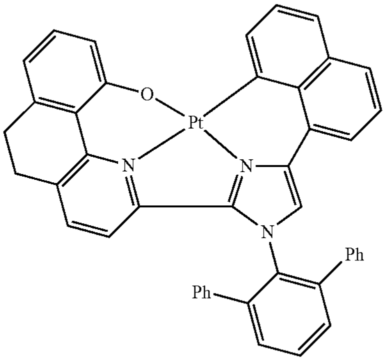
D15
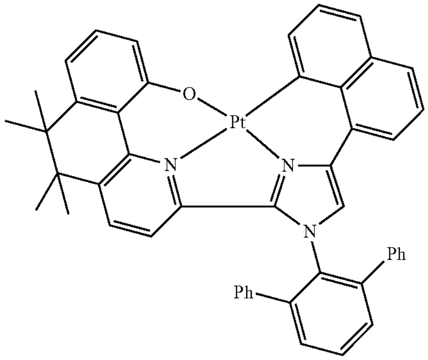
D16
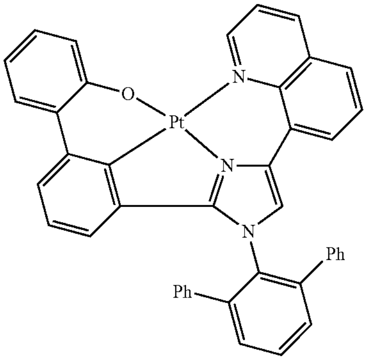
-continued
D17
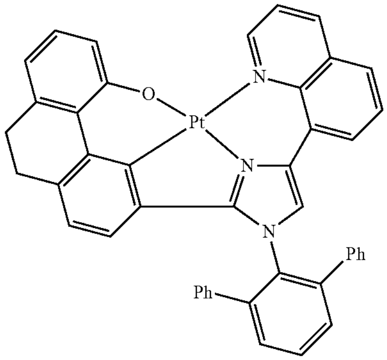
D18
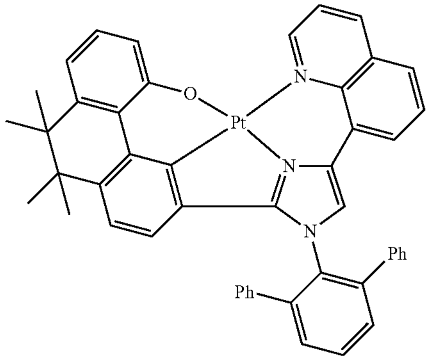
D19
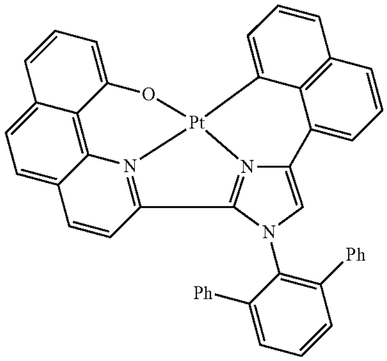
D20
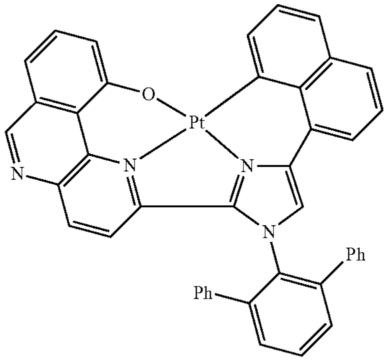

-continued
D21
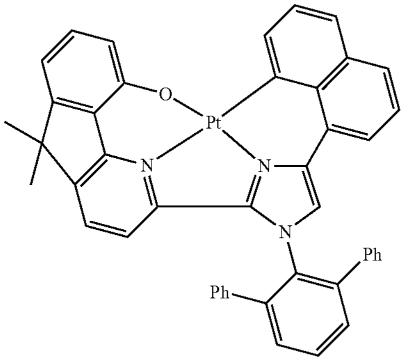
D22
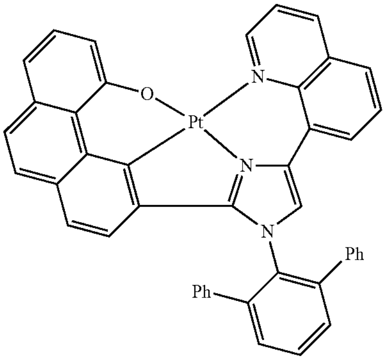
D23
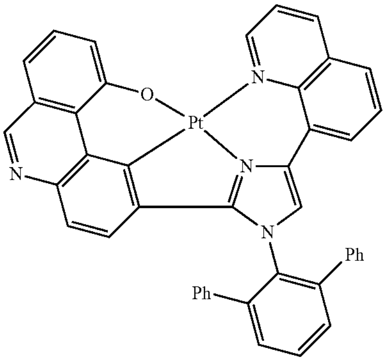
D24
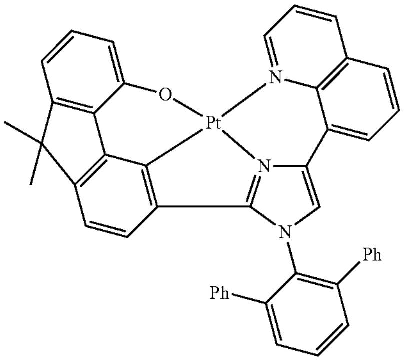
-continued
D25
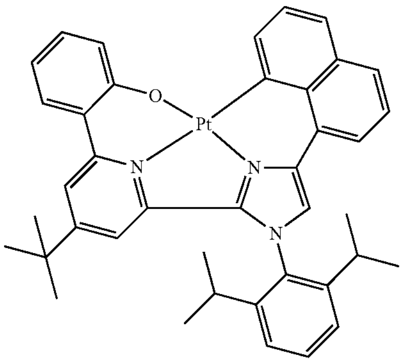
D26
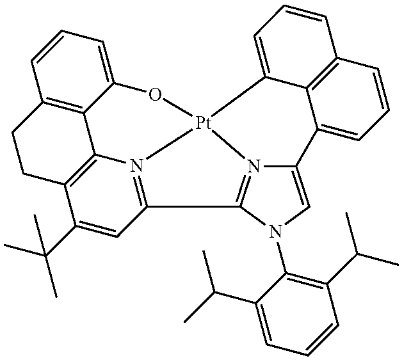
D27
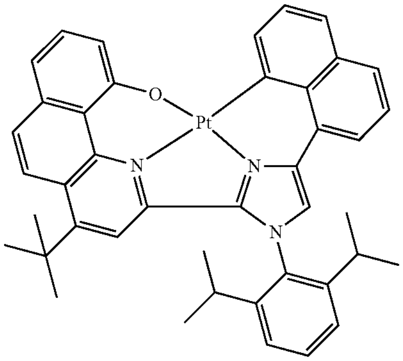
D28
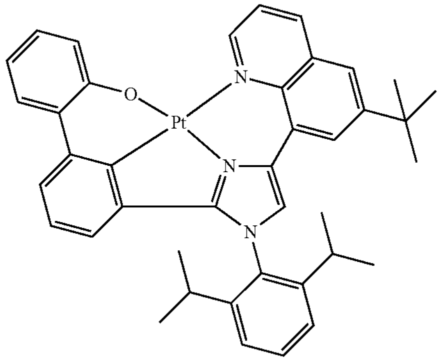

-continued
D29
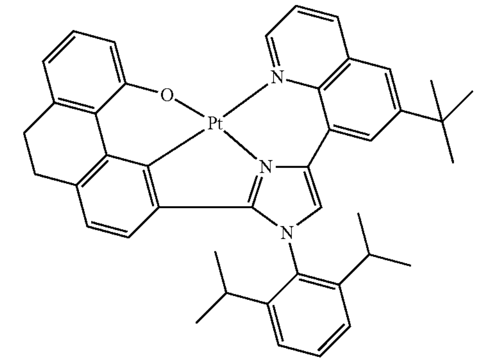
D30
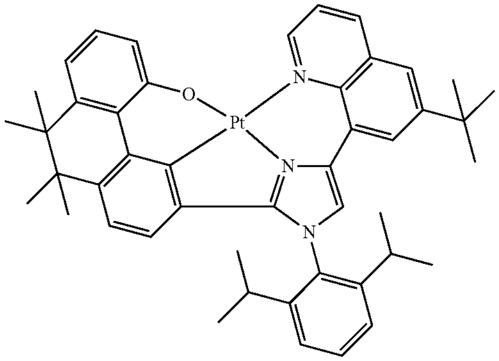
D31
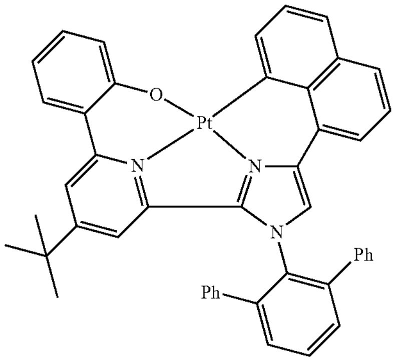
D32
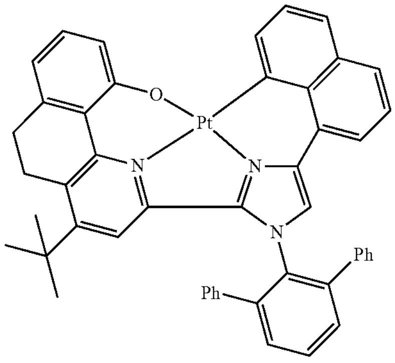
-continued
D33
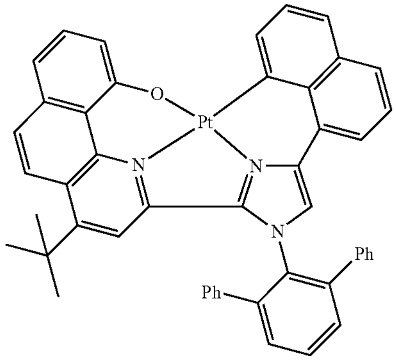
D34
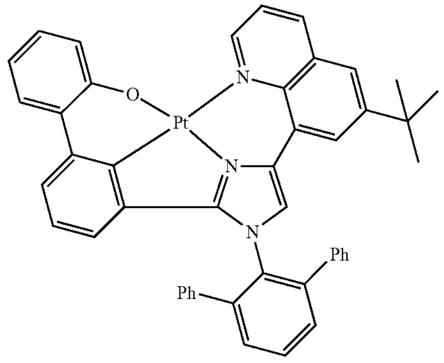
D35
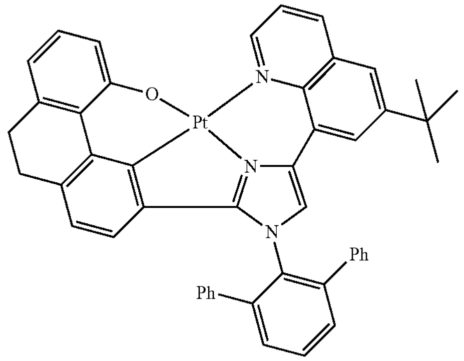
D36
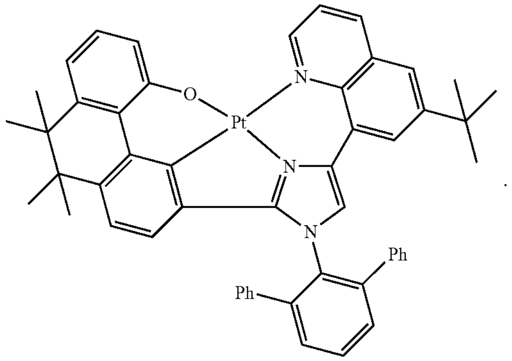
* * * * *